(12) United States Patent
Li et al.

(10) Patent No.: US 11,945,985 B2
(45) Date of Patent: Apr. 2, 2024

(54) METAL ASSISTED DELAYED FLUORESCENT EMITTERS FOR ORGANIC LIGHT-EMITTING DIODES

(71) Applicant: Arizona Board of Regents on behalf of Arizona State University, Scottsdale, AZ (US)

(72) Inventors: Jian Li, Tempe, AZ (US); Jiang Wu, Chandler, AZ (US)

(73) Assignee: Arizona Board of Regents on behalf of Arizona State University, Scottsdale, AZ (US)

(*) Notice: Subject to any disclaimer, the term of this patent is extended or adjusted under 35 U.S.C. 154(b) by 93 days.

(21) Appl. No.: 17/316,800

(22) Filed: May 11, 2021

(65) Prior Publication Data

US 2021/0363420 A1 Nov. 25, 2021

Related U.S. Application Data

(60) Provisional application No. 63/026,806, filed on May 19, 2020.

(51) Int. Cl.
| | | |
|---|---|---|
| C07F 15/00 | (2006.01) | |
| C09K 11/06 | (2006.01) | |
| H01L 51/00 | (2006.01) | |
| H10K 85/30 | (2023.01) | |
| H10K 50/11 | (2023.01) | |
| H10K 101/10 | (2023.01) | |

(52) U.S. Cl.
CPC ............ *C09K 11/06* (2013.01); *C07F 15/006* (2013.01); *C07F 15/0086* (2013.01); *H10K 85/341* (2023.02); *H10K 85/346* (2023.02); *C09K 2211/1007* (2013.01); *C09K 2211/1014* (2013.01); *C09K 2211/1022* (2013.01); *C09K 2211/1029* (2013.01); *C09K 2211/1044* (2013.01); *C09K 2211/1051* (2013.01); *C09K 2211/1059* (2013.01); *C09K 2211/1074* (2013.01); *H10K 50/11* (2023.02); *H10K 2101/10* (2023.02)

(58) Field of Classification Search
CPC .... C07F 15/006; C07F 15/0086; H01L 51/50; H01L 51/00; H10K 50/00
USPC .................................. 546/10; 313/504, 498
See application file for complete search history.

(56) References Cited

U.S. PATENT DOCUMENTS

| | | | |
|---|---|---|---|
| 4,769,292 A | 9/1988 | Tang | |
| 5,451,674 A | 9/1995 | Silver | |
| 5,641,878 A | 6/1997 | Dandliker | |
| 5,707,745 A | 1/1998 | Forrest | |
| 5,844,363 A | 12/1998 | Gu | |
| 6,200,695 B1 | 3/2001 | Arai | |
| 6,303,238 B1 | 10/2001 | Thompson | |
| 6,780,528 B2 | 8/2004 | Tsuboyama | |
| 7,002,013 B1 | 2/2006 | Chi | |
| 7,037,599 B2 | 5/2006 | Culligan | |
| 7,064,228 B1 | 6/2006 | Yu | |
| 7,268,485 B2 | 9/2007 | Tyan | |
| 7,279,704 B2 | 10/2007 | Walters | |
| 7,332,232 B2 | 2/2008 | Ma | |
| 7,442,797 B2 | 10/2008 | Itoh | |
| 7,501,190 B2 | 3/2009 | Ise | |
| 7,635,792 B1 | 12/2009 | Cella | |
| 7,655,322 B2 | 2/2010 | Forrest | |
| 7,854,513 B2 | 12/2010 | Quach | |
| 7,947,383 B2 | 5/2011 | Ise | |
| 8,106,199 B2 | 1/2012 | Jabbour | |
| 8,133,597 B2 | 3/2012 | Yasukawa | |
| 8,389,725 B2 | 3/2013 | Li | |
| 8,617,723 B2 | 12/2013 | Stoessel | |
| 8,669,364 B2 | 3/2014 | Li | |
| 8,778,509 B2 | 7/2014 | Yasukawa | |
| 8,816,080 B2 | 8/2014 | Li | |
| 8,846,940 B2 | 9/2014 | Li | |
| 8,871,361 B2 | 10/2014 | Xia | |
| 8,927,713 B2 | 1/2015 | Li | |
| 8,933,622 B2 | 1/2015 | Kawami | |
| 8,946,417 B2 | 2/2015 | Jian | |
| 8,987,451 B2 | 3/2015 | Tsai | |
| 9,059,412 B2 | 6/2015 | Zeng | |
| 9,076,974 B2 | 7/2015 | Li | |
| 9,082,989 B2 | 7/2015 | Li | |
| 9,203,039 B2 | 12/2015 | Li | |
| 9,221,857 B2 | 12/2015 | Li | |
| 9,224,963 B2 | 12/2015 | Li | |
| 9,238,668 B2 | 1/2016 | Li | |
| 9,312,502 B2 | 4/2016 | Li | |

(Continued)

FOREIGN PATENT DOCUMENTS

| | | |
|---|---|---|
| CN | 1680366 A | 10/2005 |
| CN | 1777663 | 5/2006 |

(Continued)

OTHER PUBLICATIONS

Adachi, C. et al., "High-efficiency organic electrophosphorescent devices with tris(2-phenylpyridine)iridium doped into electron-transporting materials", Applied Physics Letters, Aug. 2000, vol. 77, No. 6, pp. 904-906 <DOI:10.1063/1.1306639>.

Ayan Maity et al., "Room-temperature synthesis of cyclometalated iridium(III) complexes; kinetic isomers and reactive functionalities" Chem. Sci., vol. 4, pp. 1175-1181 (2013).

Baldo et al., "Very High-Efficiency Green Organic Light-Emitting Devices Based on Electrophosphorescence", Appl Phys Lett, 75(3):4-6 (1999).

Baldo et al., "Highly Efficient Phosphorescent Emission from Organic Electroluminescent Devices," Nature, vol. 395, Sep. 10, 1998, pp. 151-154.

(Continued)

*Primary Examiner* — Charanjit Aulakh
(74) *Attorney, Agent, or Firm* — Riverside Law LLP

(57) ABSTRACT

Compounds of General Formula I may harvest electrogenerated excitons via metal-assisted delayed fluorescence (MADF). The compounds have utility in light emitting diodes and light emitting devices.

17 Claims, 7 Drawing Sheets

(56) References Cited

U.S. PATENT DOCUMENTS

| | | |
|---|---|---|
| 9,312,505 B2 | 4/2016 | Brooks |
| 9,318,725 B2 | 4/2016 | Li |
| 9,324,957 B2 | 4/2016 | Li |
| 9,382,273 B2 | 7/2016 | Li |
| 9,385,329 B2 | 7/2016 | Li |
| 9,425,415 B2 | 8/2016 | Li |
| 9,461,254 B2 | 10/2016 | Tsai |
| 9,493,698 B2 | 11/2016 | Beers |
| 9,502,671 B2 | 11/2016 | Jian |
| 9,550,801 B2 | 1/2017 | Li |
| 9,598,449 B2 | 3/2017 | Li |
| 9,617,291 B2 | 4/2017 | Li |
| 9,666,822 B2 | 5/2017 | Forrest |
| 9,673,409 B2 | 6/2017 | Li |
| 9,698,359 B2 | 7/2017 | Li |
| 9,711,739 B2 | 7/2017 | Li |
| 9,711,741 B2 | 7/2017 | Li |
| 9,711,742 B2 | 7/2017 | Li |
| 9,735,397 B2 | 8/2017 | Riegel |
| 9,755,163 B2 | 9/2017 | Li |
| 9,818,959 B2 | 11/2017 | Li |
| 9,865,825 B2 | 1/2018 | Li |
| 9,879,039 B2 | 1/2018 | Li |
| 9,882,150 B2 | 1/2018 | Li |
| 9,899,614 B2 | 2/2018 | Li |
| 9,920,242 B2 | 3/2018 | Li |
| 9,923,155 B2 | 3/2018 | Li |
| 9,941,479 B2 | 4/2018 | Li |
| 9,947,881 B2 | 4/2018 | Li |
| 9,985,224 B2 | 5/2018 | Li |
| 10,020,455 B2 | 7/2018 | Li |
| 10,033,003 B2 | 7/2018 | Li |
| 10,056,564 B2 | 8/2018 | Li |
| 10,056,567 B2 | 8/2018 | Li |
| 10,158,091 B2 | 12/2018 | Li |
| 10,177,323 B2 | 1/2019 | Li |
| 10,211,411 B2 | 2/2019 | Li |
| 10,211,414 B2 | 2/2019 | Li |
| 10,263,197 B2 | 4/2019 | Li |
| 10,294,417 B2 | 5/2019 | Li |
| 10,392,387 B2 | 8/2019 | Li |
| 10,411,202 B2 | 9/2019 | Li |
| 10,414,785 B2 | 9/2019 | Li |
| 10,516,117 B2 | 12/2019 | Li |
| 10,566,553 B2 | 2/2020 | Li |
| 10,566,554 B2 | 2/2020 | Li |
| 10,615,349 B2 | 4/2020 | Li |
| 10,622,571 B2 | 4/2020 | Li |
| 10,727,422 B2 | 7/2020 | Li |
| 10,745,615 B2 | 8/2020 | Li |
| 10,790,457 B2 | 9/2020 | Li |
| 10,793,546 B2 | 10/2020 | Li |
| 10,804,475 B2 | 10/2020 | Zeng |
| 10,804,476 B2 | 10/2020 | Li |
| 10,822,363 B2 | 11/2020 | Li |
| 10,836,785 B2 | 11/2020 | Li |
| 10,851,106 B2 | 12/2020 | Li |
| 10,886,478 B2 | 1/2021 | Li |
| 10,930,865 B2 | 2/2021 | Li |
| 10,937,976 B2 | 3/2021 | Li |
| 10,944,064 B2 | 3/2021 | Li |
| 10,964,897 B2 | 3/2021 | Li |
| 10,991,897 B2 | 4/2021 | Li |
| 10,995,108 B2 | 5/2021 | Li |
| 11,011,712 B2 | 5/2021 | Li |
| 11,063,228 B2 | 7/2021 | Li |
| 11,101,435 B2 | 8/2021 | Li |
| 11,114,626 B2 | 9/2021 | Li |
| 11,121,328 B2 | 9/2021 | Li |
| 11,145,830 B2 | 10/2021 | Li |
| 11,183,670 B2 | 11/2021 | Li |
| 11,594,688 B2 | 2/2023 | Li |
| 2001/0019782 A1 | 9/2001 | Igarashi |
| 2002/0068190 A1 | 6/2002 | Tsuboyama |
| 2003/0062519 A1 | 4/2003 | Yamazaki |
| 2003/0180574 A1 | 9/2003 | Huang |
| 2003/0186077 A1 | 10/2003 | Chen |
| 2004/0230061 A1 | 11/2004 | Seo |
| 2005/0037232 A1 | 2/2005 | Tyan |
| 2005/0139810 A1 | 6/2005 | Kuehl |
| 2005/0170207 A1 | 8/2005 | Ma |
| 2005/0260446 A1 | 11/2005 | Mackenzie |
| 2006/0024522 A1 | 2/2006 | Thompson |
| 2006/0032528 A1 | 2/2006 | Wang |
| 2006/0066228 A1 | 3/2006 | Antoniadis |
| 2006/0073359 A1 | 4/2006 | Ise |
| 2006/0094875 A1 | 5/2006 | Itoh |
| 2006/0127696 A1 | 6/2006 | Stossel |
| 2006/0182992 A1 | 8/2006 | Nii |
| 2006/0202197 A1 | 9/2006 | Nakayama |
| 2006/0210831 A1 | 9/2006 | Sano |
| 2006/0255721 A1 | 11/2006 | Igarashi |
| 2006/0263635 A1 | 11/2006 | Ise |
| 2006/0286406 A1 | 12/2006 | Igarashi |
| 2007/0057630 A1 | 3/2007 | Nishita |
| 2007/0059551 A1 | 3/2007 | Yamazaki |
| 2007/0082284 A1 | 4/2007 | Stoessel |
| 2007/0103060 A1 | 5/2007 | Itoh |
| 2007/0160905 A1 | 7/2007 | Morishita |
| 2007/0252140 A1 | 11/2007 | Limmert |
| 2008/0001530 A1 | 1/2008 | Ise |
| 2008/0036373 A1 | 2/2008 | Itoh |
| 2008/0054799 A1 | 3/2008 | Satou |
| 2008/0079358 A1 | 4/2008 | Satou |
| 2008/0102310 A1 | 5/2008 | Thompson |
| 2008/0111476 A1 | 5/2008 | Choi |
| 2008/0241518 A1 | 10/2008 | Satou |
| 2008/0241589 A1 | 10/2008 | Fukunaga |
| 2008/0269491 A1 | 10/2008 | Jabbour |
| 2008/0315187 A1 | 12/2008 | Bazan |
| 2009/0026936 A1 | 1/2009 | Satou |
| 2009/0026939 A1 | 1/2009 | Kinoshita |
| 2009/0032989 A1 | 2/2009 | Karim |
| 2009/0039768 A1 | 2/2009 | Igarashi |
| 2009/0079340 A1 | 3/2009 | Kinoshita |
| 2009/0126796 A1 | 5/2009 | Yang |
| 2009/0128008 A1 | 5/2009 | Ise |
| 2009/0136779 A1 | 5/2009 | Cheng |
| 2009/0153045 A1 | 6/2009 | Kinoshita |
| 2009/0167167 A1 | 7/2009 | Aoyama |
| 2009/0205713 A1 | 8/2009 | Mitra |
| 2009/0218561 A1 | 9/2009 | Kitamura |
| 2009/0261721 A1 | 10/2009 | Murakami |
| 2009/0267500 A1 | 10/2009 | Kinoshita |
| 2010/0000606 A1 | 1/2010 | Thompson |
| 2010/0013386 A1 | 1/2010 | Thompson |
| 2010/0043876 A1 | 2/2010 | Tuttle |
| 2010/0093119 A1 | 4/2010 | Shimizu |
| 2010/0127246 A1 | 5/2010 | Nakayama |
| 2010/0141127 A1 | 6/2010 | Xia |
| 2010/0147386 A1 | 6/2010 | Benson-Smith |
| 2010/0171111 A1 | 7/2010 | Takada |
| 2010/0171418 A1 | 7/2010 | Kinoshita |
| 2010/0200051 A1 | 8/2010 | Triani |
| 2010/0204467 A1 | 8/2010 | Lamarque |
| 2010/0270540 A1 | 10/2010 | Chung |
| 2010/0288362 A1 | 11/2010 | Hatwar |
| 2010/0297522 A1 | 11/2010 | Creeth |
| 2010/0301315 A1 | 12/2010 | Masui |
| 2010/0307594 A1 | 12/2010 | Zhu |
| 2011/0028723 A1 | 2/2011 | Li |
| 2011/0049496 A1 | 3/2011 | Fukuzaki |
| 2011/0062858 A1 | 3/2011 | Yersin |
| 2011/0132440 A1 | 6/2011 | Sivarajan |
| 2011/0217544 A1 | 9/2011 | Young |
| 2011/0227058 A1 | 9/2011 | Masui |
| 2011/0301351 A1 | 12/2011 | Li |
| 2012/0024383 A1 | 2/2012 | Kaiho |
| 2012/0025588 A1 | 2/2012 | Humbert |
| 2012/0039323 A1 | 2/2012 | Hirano |
| 2012/0095232 A1 | 4/2012 | Li |
| 2012/0108806 A1 | 5/2012 | Li |
| 2012/0146012 A1 | 6/2012 | Limmert |
| 2012/0181528 A1 | 7/2012 | Takada |

(56) References Cited

U.S. PATENT DOCUMENTS

| | | |
|---|---|---|
| 2012/0199823 A1 | 8/2012 | Molt |
| 2012/0202997 A1 | 8/2012 | Parham |
| 2012/0204960 A1 | 8/2012 | Kato |
| 2012/0215001 A1 | 8/2012 | Li |
| 2012/0223634 A1 | 9/2012 | Xia |
| 2012/0264938 A1 | 10/2012 | Li |
| 2012/0273736 A1 | 11/2012 | James |
| 2012/0302753 A1 | 11/2012 | Li |
| 2013/0048963 A1 | 2/2013 | Beers |
| 2013/0082245 A1 | 4/2013 | Kottas |
| 2013/0137870 A1 | 5/2013 | Li |
| 2013/0168656 A1 | 7/2013 | Tsai |
| 2013/0172561 A1 | 7/2013 | Tsai |
| 2013/0200340 A1 | 8/2013 | Otsu |
| 2013/0203996 A1 | 8/2013 | Li |
| 2013/0237706 A1 | 9/2013 | Li |
| 2013/0341600 A1 | 12/2013 | Lin |
| 2014/0014922 A1 | 1/2014 | Lin |
| 2014/0014931 A1 | 1/2014 | Riegel |
| 2014/0027733 A1 | 1/2014 | Zeng |
| 2014/0042475 A1 | 2/2014 | Park |
| 2014/0066628 A1 | 3/2014 | Li |
| 2014/0073798 A1 | 3/2014 | Li |
| 2014/0084261 A1 | 3/2014 | Brooks |
| 2014/0114072 A1 | 4/2014 | Li |
| 2014/0147996 A1 | 5/2014 | Vogt |
| 2014/0148594 A1 | 5/2014 | Li |
| 2014/0191206 A1 | 7/2014 | Cho |
| 2014/0203248 A1 | 7/2014 | Zhou |
| 2014/0249310 A1 | 9/2014 | Li |
| 2014/0326960 A1 | 11/2014 | Kim |
| 2014/0330019 A1 | 11/2014 | Li |
| 2014/0364605 A1 | 12/2014 | Li |
| 2015/0008419 A1 | 1/2015 | Li |
| 2015/0018558 A1 | 1/2015 | Li |
| 2015/0028323 A1 | 1/2015 | Xia |
| 2015/0060804 A1 | 3/2015 | Kanitz |
| 2015/0069334 A1 | 3/2015 | Xia |
| 2015/0105556 A1 | 4/2015 | Li |
| 2015/0123047 A1 | 5/2015 | Maltenberger |
| 2015/0162552 A1 | 6/2015 | Li |
| 2015/0194616 A1 | 7/2015 | Li |
| 2015/0207086 A1 | 7/2015 | Li |
| 2015/0228914 A1 | 8/2015 | Li |
| 2015/0274762 A1 | 10/2015 | Li |
| 2015/0287938 A1 | 10/2015 | Li |
| 2015/0311456 A1 | 10/2015 | Li |
| 2015/0318500 A1 | 11/2015 | Li |
| 2015/0349279 A1 | 12/2015 | Li |
| 2015/0380666 A1 | 12/2015 | Szigethy |
| 2016/0028028 A1 | 1/2016 | Li |
| 2016/0028029 A1 | 1/2016 | Li |
| 2016/0043331 A1 | 2/2016 | Li |
| 2016/0072082 A1 | 3/2016 | Brooks |
| 2016/0130225 A1 | 5/2016 | Tasaki |
| 2016/0133861 A1 | 5/2016 | Li |
| 2016/0133862 A1 | 5/2016 | Li |
| 2016/0181529 A1 | 6/2016 | Tsai |
| 2016/0194344 A1 | 7/2016 | Li |
| 2016/0197285 A1 | 7/2016 | Zeng |
| 2016/0197291 A1 | 7/2016 | Li |
| 2016/0204358 A1 | 7/2016 | Stoessel |
| 2016/0285015 A1 | 9/2016 | Li |
| 2016/0359120 A1 | 12/2016 | Li |
| 2016/0359125 A1 | 12/2016 | Li |
| 2017/0005278 A1 | 1/2017 | Li |
| 2017/0012224 A1 | 1/2017 | Li |
| 2017/0040555 A1 | 2/2017 | Li |
| 2017/0047533 A1 | 2/2017 | Li |
| 2017/0066792 A1 | 3/2017 | Li |
| 2017/0069855 A1 | 3/2017 | Li |
| 2017/0077420 A1 | 3/2017 | Li |
| 2017/0125708 A1 | 5/2017 | Li |
| 2017/0267923 A1 | 9/2017 | Li |
| 2017/0271611 A1 | 9/2017 | Li |
| 2017/0301871 A1 | 10/2017 | Li |
| 2017/0305881 A1 | 10/2017 | Li |
| 2017/0309943 A1 | 10/2017 | Angell |
| 2017/0331056 A1 | 11/2017 | Li |
| 2017/0342098 A1 | 11/2017 | Li |
| 2017/0373260 A1 | 12/2017 | Li |
| 2018/0006246 A1 | 1/2018 | Li |
| 2018/0013096 A1 | 1/2018 | Hamada |
| 2018/0037812 A1 | 2/2018 | Pegington |
| 2018/0052366 A1 | 2/2018 | Hao |
| 2018/0053904 A1 | 2/2018 | Li |
| 2018/0062084 A1 | 3/2018 | Watabe |
| 2018/0130960 A1 | 5/2018 | Li |
| 2018/0138428 A1 | 5/2018 | Li |
| 2018/0148464 A1 | 5/2018 | Li |
| 2018/0159051 A1 | 6/2018 | Li |
| 2018/0166655 A1 | 6/2018 | Li |
| 2018/0175329 A1 | 6/2018 | Li |
| 2018/0194790 A1 | 7/2018 | Li |
| 2018/0198081 A1 | 7/2018 | Zeng |
| 2018/0219161 A1 | 8/2018 | Li |
| 2018/0226592 A1 | 8/2018 | Li |
| 2018/0226593 A1 | 8/2018 | Li |
| 2018/0277777 A1 | 9/2018 | Li |
| 2018/0301641 A1 | 10/2018 | Li |
| 2018/0312750 A1 | 11/2018 | Li |
| 2018/0331307 A1 | 11/2018 | Li |
| 2018/0334459 A1 | 11/2018 | Li |
| 2018/0337345 A1 | 11/2018 | Li |
| 2018/0337349 A1 | 11/2018 | Li |
| 2018/0337350 A1 | 11/2018 | Li |
| 2018/0353771 A1 | 12/2018 | Kim |
| 2019/0013485 A1 | 1/2019 | Li |
| 2019/0058137 A1 | 2/2019 | Ko |
| 2019/0067602 A1 | 2/2019 | Li |
| 2019/0109288 A1 | 4/2019 | Li |
| 2019/0119312 A1 | 4/2019 | Chen |
| 2019/0157352 A1 | 5/2019 | Li |
| 2019/0194536 A1 | 6/2019 | Li |
| 2019/0221757 A1 | 7/2019 | Tarran |
| 2019/0259963 A1 | 8/2019 | Li |
| 2019/0276485 A1 | 9/2019 | Li |
| 2019/0312217 A1 | 10/2019 | Li |
| 2019/0367546 A1 | 12/2019 | Li |
| 2019/0389893 A1 | 12/2019 | Li |
| 2020/0006678 A1 | 1/2020 | Li |
| 2020/0055885 A1 | 2/2020 | Tarran |
| 2020/0071330 A1 | 3/2020 | Li |
| 2020/0075868 A1 | 3/2020 | Li |
| 2020/0119288 A1 | 4/2020 | Li |
| 2020/0119289 A1 | 4/2020 | Lin |
| 2020/0140471 A1 | 5/2020 | Chen |
| 2020/0152891 A1 | 5/2020 | Li |
| 2020/0227656 A1 | 7/2020 | Li |
| 2020/0227660 A1 | 7/2020 | Li |
| 2020/0239505 A1 | 7/2020 | Li |
| 2020/0243776 A1 | 7/2020 | Li |
| 2020/0287153 A1 | 9/2020 | Li |
| 2020/0332185 A1 | 10/2020 | Li |
| 2020/0365819 A1 | 11/2020 | Seo |
| 2020/0373505 A1 | 11/2020 | Li |
| 2020/0403167 A1 | 12/2020 | Li |
| 2021/0024526 A1 | 1/2021 | Li |
| 2021/0024559 A1 | 1/2021 | Li |
| 2021/0047296 A1 | 2/2021 | Li |
| 2021/0091316 A1 | 3/2021 | Li |
| 2021/0104687 A1 | 4/2021 | Li |
| 2021/0111355 A1 | 4/2021 | Li |
| 2021/0126208 A1 | 4/2021 | Li |
| 2021/0193936 A1 | 6/2021 | Li |
| 2021/0193947 A1 | 6/2021 | Li |
| 2021/0206785 A1 | 7/2021 | Hamze |
| 2021/0217973 A1 | 7/2021 | Li |
| 2021/0230198 A1 | 7/2021 | Li |
| 2021/0261589 A1 | 8/2021 | Li |
| 2021/0273182 A1 | 9/2021 | Li |

(56) References Cited

U.S. PATENT DOCUMENTS

| | | | |
|---|---|---|---|
| 2021/0292351 A1 | 9/2021 | Macinnis | |
| 2021/0376260 A1 | 12/2021 | Li | |
| 2022/0059786 A1 | 2/2022 | Seo | |

FOREIGN PATENT DOCUMENTS

| | | |
|---|---|---|
| CN | 1894267 | 1/2007 |
| CN | 1894269 A | 1/2007 |
| CN | 101142223 A | 3/2008 |
| CN | 101667626 | 3/2010 |
| CN | 102449108 A | 5/2012 |
| CN | 102892860 A | 1/2013 |
| CN | 102971396 A | 3/2013 |
| CN | 103102372 | 5/2013 |
| CN | 104232076 A | 12/2014 |
| CN | 104377231 | 2/2015 |
| CN | 104576934 | 4/2015 |
| CN | 104693243 A | 6/2015 |
| CN | 105367605 A | 3/2016 |
| CN | 105418591 A | 3/2016 |
| CN | 106783922 | 5/2017 |
| EP | 1617493 | 1/2006 |
| EP | 1808052 A1 | 7/2007 |
| EP | 1874893 A1 | 1/2008 |
| EP | 1874894 A1 | 1/2008 |
| EP | 1919928 A1 | 5/2008 |
| EP | 1968131 | 9/2008 |
| EP | 2020694 | 2/2009 |
| EP | 2036907 A1 | 3/2009 |
| EP | 2096690 | 9/2009 |
| EP | 2112213 A2 | 10/2009 |
| EP | 2417217 A2 | 2/2012 |
| EP | 2684932 | 1/2014 |
| EP | 2711999 A2 | 3/2014 |
| EP | 3032293 | 6/2016 |
| JP | 2002010505 | 1/2002 |
| JP | 2002105055 | 4/2002 |
| JP | 2003342284 | 12/2003 |
| JP | 2005031073 | 2/2005 |
| JP | 2005267557 | 9/2005 |
| JP | 2005310733 A | 11/2005 |
| JP | 2006047240 A | 2/2006 |
| JP | 2006232784 A | 9/2006 |
| JP | 2006242080 | 9/2006 |
| JP | 2006242081 A | 9/2006 |
| JP | 2006256999 A | 9/2006 |
| JP | 2006257238 A | 9/2006 |
| JP | 2006261623 A | 9/2006 |
| JP | 2006290988 A | 10/2006 |
| JP | 2006313796 A | 11/2006 |
| JP | 2006332622 A | 12/2006 |
| JP | 2006351638 A | 12/2006 |
| JP | 2007019462 A | 1/2007 |
| JP | 2007031678 | 2/2007 |
| JP | 2007042875 A | 2/2007 |
| JP | 2007051243 A | 3/2007 |
| JP | 2007053132 A | 3/2007 |
| JP | 2007066581 | 3/2007 |
| JP | 2007073620 A | 3/2007 |
| JP | 2007073845 A | 3/2007 |
| JP | 2007073900 A | 3/2007 |
| JP | 2007080593 | 3/2007 |
| JP | 2007080677 A | 3/2007 |
| JP | 2007088105 | 4/2007 |
| JP | 2007088164 A | 4/2007 |
| JP | 2007096259 A | 4/2007 |
| JP | 2007099765 A | 4/2007 |
| JP | 2007110067 | 4/2007 |
| JP | 2007110102 A | 4/2007 |
| JP | 2007519614 | 7/2007 |
| JP | 2007258550 A | 10/2007 |
| JP | 2007324309 A | 12/2007 |
| JP | 2008010353 A | 1/2008 |
| JP | 2008091860 A | 4/2008 |
| JP | 2008103535 A | 5/2008 |
| JP | 2008108617 A | 5/2008 |
| JP | 2008109085 | 5/2008 |
| JP | 2008109103 A | 5/2008 |
| JP | 2008116343 A | 5/2008 |
| JP | 2008117545 A | 5/2008 |
| JP | 2008160087 A | 7/2008 |
| JP | 2008198801 A | 8/2008 |
| JP | 2008270729 A | 11/2008 |
| JP | 2008270736 | 11/2008 |
| JP | 2008310220 A | 12/2008 |
| JP | 2009016184 A | 1/2009 |
| JP | 2009016579 | 1/2009 |
| JP | 2009032977 A | 2/2009 |
| JP | 2009032988 A | 2/2009 |
| JP | 2009059997 | 3/2009 |
| JP | 2009076509 | 4/2009 |
| JP | 2009161524 A | 7/2009 |
| JP | 2009247171 | 10/2009 |
| JP | 2009266943 A | 11/2009 |
| JP | 2009267171 A | 11/2009 |
| JP | 2009267244 A | 11/2009 |
| JP | 2009272339 A | 11/2009 |
| JP | 2009283891 A | 12/2009 |
| JP | 4460952 | 5/2010 |
| JP | 2010135689 A | 6/2010 |
| JP | 2010171205 A | 8/2010 |
| JP | 2011071452 A | 4/2011 |
| JP | 2012074444 A | 4/2012 |
| JP | 2012079895 A | 4/2012 |
| JP | 2012079898 A | 4/2012 |
| JP | 5604505 | 9/2012 |
| JP | 2012522843 | 9/2012 |
| JP | 2012207231 A | 10/2012 |
| JP | 2012222255 A | 11/2012 |
| JP | 2012231135 A | 11/2012 |
| JP | 2013023500 A | 2/2013 |
| JP | 2013048256 A | 3/2013 |
| JP | 2013053149 A | 3/2013 |
| JP | 2013525436 | 6/2013 |
| JP | 2014019701 A | 2/2014 |
| JP | 2014058504 A | 4/2014 |
| JP | 2014520096 | 8/2014 |
| JP | 2012709899 | 11/2014 |
| JP | 2014221807 A | 11/2014 |
| JP | 2014239225 A | 12/2014 |
| JP | 2015081257 A | 4/2015 |
| KR | 20060011537 | 2/2006 |
| KR | 20060015371 | 2/2006 |
| KR | 20060115371 | 11/2006 |
| KR | 20070061830 | 6/2007 |
| KR | 20070112465 | 11/2007 |
| KR | 20130043460 | 4/2013 |
| KR | 101338250 | 12/2013 |
| KR | 20140052501 | 5/2014 |
| TW | 200701835 | 1/2007 |
| TW | 201249851 | 12/2012 |
| TW | 201307365 A | 2/2013 |
| TW | 201710277 | 3/2017 |
| WO | 0070655 A2 | 11/2000 |
| WO | 2000070655 | 11/2000 |
| WO | 2004003108 | 1/2004 |
| WO | 2004070655 | 8/2004 |
| WO | 2004085450 | 10/2004 |
| WO | 2004108857 | 12/2004 |
| WO | 2005042444 A2 | 5/2005 |
| WO | 2005042550 A1 | 5/2005 |
| WO | 2005113704 | 12/2005 |
| WO | 2006033440 A1 | 3/2006 |
| WO | 2006067074 | 6/2006 |
| WO | 2006081780 | 8/2006 |
| WO | 2006098505 A1 | 9/2006 |
| WO | 2006113106 | 10/2006 |
| WO | 2006115299 A1 | 11/2006 |
| WO | 2006115301 | 11/2006 |
| WO | 2007034985 A1 | 3/2007 |
| WO | 2007069498 A1 | 6/2007 |
| WO | 2008054578 | 5/2008 |
| WO | 2008066192 A1 | 6/2008 |
| WO | 2008066195 A1 | 6/2008 |

(56) References Cited

FOREIGN PATENT DOCUMENTS

| WO | 2008066196 A1 | 6/2008 |
|---|---|---|
| WO | 2008101842 A1 | 8/2008 |
| WO | 2008117889 | 10/2008 |
| WO | 2008123540 | 10/2008 |
| WO | 2008131932 A1 | 11/2008 |
| WO | 2009003455 | 1/2009 |
| WO | 2009008277 | 1/2009 |
| WO | 2009011327 | 1/2009 |
| WO | 2009017211 A1 | 2/2009 |
| WO | 2009023667 | 2/2009 |
| WO | 2009086209 | 7/2009 |
| WO | 2009111299 | 9/2009 |
| WO | 2010007098 A1 | 1/2010 |
| WO | 2010056669 | 5/2010 |
| WO | 2010093176 | 8/2010 |
| WO | 2010105141 | 9/2010 |
| WO | 2010118026 A2 | 10/2010 |
| WO | 2011064335 A1 | 6/2011 |
| WO | 2011070989 A1 | 6/2011 |
| WO | 2011089163 | 7/2011 |
| WO | 2011137429 A2 | 11/2011 |
| WO | 2011137431 A2 | 11/2011 |
| WO | 2012074909 | 6/2012 |
| WO | 2012112853 A1 | 8/2012 |
| WO | 2012116231 | 8/2012 |
| WO | 2012142387 | 10/2012 |
| WO | 2012162488 A1 | 11/2012 |
| WO | 2012163471 A1 | 12/2012 |
| WO | 2013130483 A1 | 9/2013 |
| WO | 2014009310 | 1/2014 |
| WO | 2014016611 | 1/2014 |
| WO | 2014031977 | 2/2014 |
| WO | 2014047616 A1 | 3/2014 |
| WO | 2014109814 | 7/2014 |
| WO | 2014208271 | 12/2014 |
| WO | 2015027060 A1 | 2/2015 |
| WO | 2015131158 | 9/2015 |
| WO | 2016025921 | 2/2016 |
| WO | 2016029137 | 2/2016 |
| WO | 2016029186 | 2/2016 |
| WO | 2016088354 A1 | 6/2016 |
| WO | 2016197019 | 12/2016 |
| WO | 2017117935 | 7/2017 |
| WO | 2018071697 | 4/2018 |
| WO | 2018140765 | 8/2018 |
| WO | 2019079505 | 4/2019 |
| WO | 2019079508 | 4/2019 |
| WO | 2019079509 | 4/2019 |
| WO | 2019236541 | 12/2019 |
| WO | 2020018476 | 1/2020 |

OTHER PUBLICATIONS

Baldo et al., "Very high-efficiency green organic light-emitting devices based on electrophosphorescence," Applied Physics Letters, vol. 75, No. 1, Jul. 5, 1999, pp. 4-6.

Baldo, M. et al., "Excitonic singlet-triplet ratio in a semiconducting organic thin film", Physical Review B, Nov. 1999, vol. 60, No. 20, pp. 14422-14428 <DOI: 10.1103/PhysRevB.60.14422>.

Baldo, M. et al., "High-efficiency fluorescent organic light-emitting devices using a phosphorescent sensitizer", Nature, Feb. 2000, vol. 403, pp. 750-753.

Barry O'Brien et al.: White organic light emitting diodes using Pt-based red, green and blue phosphorescent dopants. Proc. SPIE, vol. 8829, pp. 1-6, Aug. 25, 2013.

Barry O'Brien et al., "High efficiency white organic light emitting diodes employing blue and red platinum emitters," Journal of Photonics for Energy, vol. 4, 2014, pp. 043597-1-8.

Berson et al. (2007). "Poly(3-hexylthiophene) fibers for photovoltaic applications," Adv. Funct. Mat., 17, 1377-84.

Bouman et al. (1994). "Chiroptical properties of regioregular chiral polythiophenes," Mol. Cryst. Liq. Cryst., 256, 439-48.

Brian W. D'Andrade et al., "Controlling Exciton Diffusion in Multilayer White Phosphorescent Organic Light Emitting Devices", Adv. Mater., vol. 14, No. 2, Jan. 16, 2002, pp. 147-151.

Bronner; "Dipyrrin based luminescent cyclometallated palladium and platinum complexes", Dalton Trans., 2010, 39, 180-184. DOI: 10.1039/b908424j (Year: 2010) (5 pages).

Brooks, J. et al., "Synthesis and Characterization of Phosphorescent Cyclometalated Platinum Complexes", Inorganic Chemistry, May 2002, vol. 41, No. 12, pp. 3055-3066 <DOI:10.1021/ic0255508>.

Brown, A. et al., "Optical spectroscopy of triplet excitons and charged excitations in poly(p-phenylenevinylene) light-emitting diodes", Chemical Physics Letters, Jul. 1993, vol. 210, No. 1-3, pp. 61-66 <DOI:10.1016/0009-2614(93)89100-V>.

Burroughes, J. et al., "Light-emitting diodes based on conjugated polymers", Nature, Oct. 1990, vol. 347, pp. 539-541.

Campbell et al. (2008). "Low-temperature control of nanoscale morphology for high performance polymer photovoltaics," Nano Lett., 8, 3942-47.

Chen, F. et al., "High-performance polymer light-emitting diodes doped with a red phosphorescent iridium complex", Applied Physics Letters, Apr. 2002 [available online Mar. 2002], vol. 80, No. 13, pp. 2308-2310 <10.1063/1.1462862>.

Chen, X., et al., "Fluorescent Chemosensors Based on Spiroring-Opening of Xanthenes and Related Derivatives", Chemical Reviews, 2012 [available online Oct. 2011], vol. 112, No. 3, pp. 1910-1956 <DOI:10.1021/cr200201z>.

Chew, S. et al: Photoluminescence and electroluminescence of a new blue-emitting homoleptic iridium complex. Applied Phys. Letters; vol. 88, pp. 093510-1-093510-3, 2006.

Chi et al.; Transition-metal phosphors with cyclometalating ligands: fundamentals and applications, Chemical Society Reviews, vol. 39, No. 2, Feb. 2010, pp. 638-655.

Chi-Ming Che et al. "Photophysical Properties and OLEO Applications of Phosphorescent Platinum(II) Schiff Base Complexes," Chem. Eur. J., vol. 16, 2010, pp. 233-247.

Chow; "Strongly Phosphorescent Palladium (II) Complexes of Tetradentate Ligands with Mixed Oxygen, Carbon, and Nitrogen Donor Atoms: Photophysics, Photochemistry, and Applications", Angew. Chem. Int. Ed. 2013, 52, 11775-11779. DOI: 10.1002/anie. 201305590 (Year: 2013) (5 pages).

Christoph Ulbricht et al., "Synthesis and Characterization of Oxetane-Functionalized Phosphorescent Ir(III)-Complexes", Macromol. Chem. Phys. 2009, 210, pp. 531-541.

Coakley et al. (2004). "Conjugated polymer photovoltaic cells," Chem. Mater., 16, 4533-4542.

Colombo, M. et al., "Synthesis and high-resolution optical spectroscopy of bis[2-(2-thienyl)pyridinato-C3,N'](2,2'-bipyridine)iridium(III)", Inorganic Chemistry, Jul. 1993, vol. 32, No. 14, pp. 3081-3087 <DOI:10.1021/ic00066a019>.

D.F. O'Brien et al., "Improved energy transfer in electrophosphorescent devices," Appl. Phys. Lett., vol. 74, No. 3, Jan. 18, 1999, pp. 442-444.

D'Andrade, B. et al., "Operational stability of electrophosphorescent devices containing p and n doped transport layers ", Applied Physics Letters, Nov. 2003, vol. 83, No. 19, pp. 3858-3860 <DOI:10.1063/1.1624473>.

Dan Wang et al., "Carbazole and arylamine functionalized iridium complexes for efficient electro-phosphorescent light-emitting diodes", Inorganica Chimica Acta 370 (2011) pp. 340-345.

Dileep A. K. Vezzu et al., "Highly Luminescent Tetradentate Bis-Cyclometalated Platinum Complexes: Design, Synthesis, Structure, Photophysics, and Electroluminescence Application," Inorg. Chem., vol. 49, 2010, pp. 5107-5119.

Dorwald, Side Reactions in Organic Synthesis 2005, Wiley:VCH Weinheim Preface, pp. 1-15 & Chapter 1, pp. 279-308.

Dorwald; "Side Reactions in Organic Synthesis: A Guide to Successful Synthesis Design," Chapter 1, 2005 Wiley-VCH Verlag GmbH & Co. KGaA, Wienheim, 32 pages.

Dsouza, R., et al., "Fluorescent Dyes and Their Supramolecular Host/Guest Complexes with Macrocycles in Aqueous Solution", Oct. 2011, vol. 111, No. 12, pp. 7941-7980 <DOI:10.1021/cr200213s>.

(56) References Cited

OTHER PUBLICATIONS

Eric Turner et al., "Cyclometalated Platinum Complexes with Luminescent Quantum Yields Approaching 100%," Inorg. Chem., 2013, vol. 52, pp. 7344-7351.
Evan L. Williams et al., "Excimer-Based White Phosphorescent Organic Light Emitting Diodes with Nearly 100% Internal Quantum Efficiency," Adv. Mater., vol. 19, 2007, pp. 197-202.
Finikova, M.A. et al., New Selective Synthesis of Substituted Tetrabenzoporphyris, Doklady Chemistry, 2003, vol. 391, No. 4-6, pp. 222-224.
Fuchs, C. et al., "Enhanced light emission from top-emitting organic light-emitting diodes by optimizing surface plasmon polariton losses", arXiv, submitted Mar. 2015, 11 pages, arXiv:1503.01309.
Fuchs, C. et al., "Enhanced light emission from top-emitting organic light-emitting diodes by optimizing surface plasmon polariton losses", Physical Review B, Dec. 2015, vol. 92, No. 24, pp. 245306-1-245306-10 <DOI:10.1103/PhysRevB.92.245306>.
Galanin et al. Synthesis and Properties of meso-Phenyl-Substituted Tetrabenzoazaporphines Magnesium Complexes. Russian Journal of Organic Chemistry (Translation of Zhurnal Organicheskoi Khimii) (2002), 38(8), 1200-1203.
Galanin et al., meso-Phenyltetrabenzoazaporphyrins and their zinc complexes. Synthesis and spectral properties, Russian Journal of General Chemistry (2005), 75(4), 651-655.
Gather, M. et al., "Recent advances in light outcoupling from white organic light-emitting diodes," Journal of Photonics for Energy, May 2015, vol. 5, No. 1, 057607-1-057607-20 <DOI:10.1117/1.JPE.5.057607>.
Glauco Ponterini et al., "Comparison of Radiationless Decay Processes in Osmium and Platinum Porphyrins," J. Am. Chem. Soc., vol. 105, No. 14, 1983, pp. 4639-4645.
Gong et al., Highly Selective Complexation of Metal Ions by the Self-Tuning Tetraazacalixpyridine macrocycles, Tetrahedron, 65(1): 87-92 (2009).
Gottumukkala, V. et al., Synthesis, cellular uptake and animal toxicity of a tetra carboranylphenyl N-tetrabenzoporphyrin, Bioorganic & Medicinal Chemistry, 2006, vol. 14, pp. 1871-1879.
Graf, A. et al., "Correlating the transition dipole moment orientation of phosphorescent emitter molecules in OLEDs with basic material properties", Journal of Materials Chemistry C, Oct. 2014, vol. 2, No. 48, pp. 10298-10304 <DOI:10.1039/c4tc00997e>.
Guijie Li et al., "Efficient and stable red organic light emitting devices from a tetradentate cyclometalated platinum complex," Organic Electronics, 2014, vol. 15 pp. 1862-1867.
Guijie Li et al., "Modifying Emission Spectral Bandwidth of Phosphorescent Platinum(II) Complexes Through Synthetic Control," Inorg. Chem. 2017, 56, 8244-8256.
Guijie Li et al., Efficient and Stable White Organic Light-Emitting Diodes Employing a Single Emitter, Adv. Mater., 2014, vol. 26, pp. 2931-2936.
Hansen (1969). "The universality of the solubility parameter," I & EC Product Research and Development, 8, 2-11.
Hatakeyama, T. et al., "Ultrapure Blue Thermally Activated Delayed Fluorescence Molecules: Efficient HOMO-LUMO Separation by the Multiple Resonance Effect", Advanced Materials, Apr. 2016, vol. 28, No. 14, pp. 2777-2781, <DOI:10.1002/adma.201505491>.
Hirohiko Fukagawa et al., "Highly Efficient and Stable Red Phosphorescent Organic Light-Emitting Diodes Using Platinum Complexes," Adv. Mater., 2012, vol. 24, pp. 5099-5103.
Hoe-Joo Seo et al., "Blue phosphorescent iridium(III) complexes containing carbazole-functionalized phenyl pyridine for organic light-emitting diodes: energy transfer from carbazolyl moieties to iridium(III) cores", RSC Advances, 2011, 1, pp. 755-757.
Holmes, R. et al., "Efficient, deep-blue organic electrophosphorescence by guest charge trapping", Applied Physics Letters, Nov. 2003 [available online Oct. 2003], vol. 83, No. 18, pp. 3818-3820 <DOI:10.1063/1.1624639>.
Huaijun Tang et al., "Novel yellow phosphorescent iridium complexes containing a carbazoleeoxadiazole unit used in polymeric light-emitting diodes", Dyes and Pigments 91 (2011) pp. 413-421.
Imre et al (1996). "Liquid-liquid demixing ffrom solutions of polystyrene. 1. A review. 2. Improved correlation with solvent properties," J. Phys. Chem. Ref. Data, 25, 637-61.
Ivaylo Ivanov et al., "Comparison of the INDO band structures of polyacetylene, polythiophene, polyfuran, and polypyrrole," Synthetic Metals, vol. 116, Issues 1-3, Jan. 1, 2001, pp. 111-114.
Jack W. Levell et al., "Carbazole/iridium dendrimer side-chain phosphorescent copolymers for efficient light emitting devices", New J. Chem., 2012, vol. 36, pp. 407-413.
Jan Kalinowski et al., "Light-emitting devices based on organometallic platinum complexes as emitters," Coordination Chemistry Reviews, vol. 255, 2011, pp. 2401-2425.
Jeong et al. (2010). "Improved efficiency of bulk heterojunction poly (3-hexylthiophene): [6,6]-phenyl-C61-butyric acid methyl ester photovoltaic devices using discotic liquid crystal additives," Appl. Phys. Lett . . . 96, 183305. (3 pages).
Jeonghun Kwak et al., "Bright and Efficient Full-Color Colloidal Quantum Dot Light-Emitting Diodes Using an Inverted Device Structure," Nano Letters 12, Apr. 2, 2012, pp. 2362-2366.
Ji Hyun Seo et al., "Efficient blue-green organic light-emitting diodes based on heteroleptic tris-cyclometalated iridium (III) complexes". Thin Solid Films, vol. 517, pp. 1807-1810 (2009).
Kai Li et al., "Light-emitting platinum(II) complexes supported by tetradentate dianionic bis(N-heterocyclic carbene) ligands: towards robust blue electrophosphors," Chem. Sci., 2013, vol. 4, pp. 2630-2644.
Ke Feng et al., "Norbornene-Based Copolymers Containing Platinum Complexes and Bis(carbazolyl)benzene Groups in Their Side-Chains," Macromolecules, vol. 42, 2009, pp. 6855-6864.
Kim et al (2009). "Altering the thermodynamics of phase separation in inverted bulk-heterojunction organic solar cells," Adv. Mater., 21, 3110-15.
Kim et al. (2005). "Device annealing effect in organic solar cells with blends of regioregular poly (3-hexylthiophene) and soluble fullerene," Appl. Phys. Lett. 86, 063502. (3 pages).
Kim, HY. et al., "Crystal Organic Light-Emitting Diodes with Perfectly Oriented Non-Doped Pt-Based Emitting Layer", Advanced Functional Materials, Feb. 2016, vol. 28, No. 13, pp. 2526-2532 <DOI:10.1002/adma.201504451>.
Kim, JJ., "Setting up the new efficiency limit of OLEDs; Abstract" [online], Electrical Engineering—Princeton University, Aug. 2014 [retrieved on Aug. 24, 2016], retrieved from the internet: <URL:http://ee.princeton.edu/events/setting-new-efficiency-limit-oled> 2 pages.
Kim, SY. et al., "Organic Light-Emitting Diodes with 30% External Quantum Efficiency Based on a Horizontally Oriented Emitter", Advanced Functional Materials, Mar. 2013, vol. 23, No. 31, pp. 3896-3900 <DOI:10.1002/adfm.201300104 >.
Kroon et al. (2008). "Small bandgap olymers for organic solar cells," Polymer Reviews, 48, 531-82.
Kwon-Hyeon Kim et al., "Controlling Emitting Dipole Orientation with Methyl Substituents on Main Ligand of Iridium Complexes for Highly Efficient Phosphorescent Organic Light-Emitting Diodes", Adv. Optical Mater. 2015, 3, pp. 1191-1196.
Kwon-Hyeon Kim et al., "Crystal Organic Light-Emitting Diodes with Perfectly Oriented Non-Doped Pt-Based Emitting Layer", Adv. Mater. 2016, 28, pp. 2526-2532.
Kwong, R. et al., "High operational stability of electrophosphorescent devices", Applied Physics Letters, Jul. 2002 [available online Jun. 2002], vol. 81, No. 1, pp. 162-164 <DOI:10.1063/1.1489503>.
Lamansky, S. et al., "Cyclometalated Ir complexes in polymer organic light-emitting devices", Journal of Applied Physics, Aug. 2002 [available online Jul. 2002], vol. 92, No. 3, pp. 1570-1575 <10.1063/1.1491587>.
Lamansky, S. et al., "Synthesis and Characterization of Phosphorescent Cyclometalated Iridium Complexes", Inorganic Chemistry, Mar. 2001, vol. 40, No. 7, pp. 1704-1711 <DOI:10.1021/ic0008969>.
Lampe, T. et al., "Dependence of Phosphorescent Emitter Orientation on Deposition Technique in Doped Organic Films", Chemistry of Materials, Jan. 2016, vol. 28, pp. 712-715 <DOI:10.1021/acs.chemmater.5b04607>.
Lee et al. (2008). "Processing additives for inproved efficiency from bulk heterojunction solar cells," J. Am. Chem. Soc, 130, 3619-23.

(56) References Cited

OTHER PUBLICATIONS

Li et al. (2005). "Investigation of annealing effects and film thickness dependence of polymer solar cells based on poly (3-hexylthiophene)," J. Appl. Phys., 98, 043704. (5 pages).

Li et al. (2007). "Solvent annealing effect in polymer solar cells based on poly(3-hexylthiophene) and methanofullerenes," Adv. Funct. Mater, 17, 1636-44.

Li, J. et al., "Synthesis and characterization of cyclometalated Ir(III) complexes with pyrazolyl ancillary ligands", Polyhedron, Jan. 2004, vol. 23, No. 2-3, pp. 419-428 <DOI: 10.1016/j.poly.2003.11.028>.

Li, J., "Efficient and Stable OLEDs Employing Square Planar Metal Complexes and Inorganic Nanoparticles", in DOE SSL R&D Workshop (Raleigh, North Carolina, 2016), Feb. 2016, 15 pages.

Li, J., et al., "Synthetic Control of Excited-State Properties in Cyclometalated Ir(III) Complexes Using Ancillary Ligands", Inorganic Chemistry, Feb. 2005, vol. 44, No. 6, pp. 1713-1727 <DOI:10.1021/ic048599h>.

Liang, et al. (2010). "For the bright future-bulk heterojunction polymer solar cells with power conversion efficiency of 7.4%," Adv. Mater. 22, E135-38.

Lin, TA et al., " Sky-Blue Organic Light Emitting Diode with 37% External Quantum Efficiency Using Thermally Activated Delayed Fluorescence from Spiroacridine-Triazine Hybrid", Advanced Materials, Aug. 2016, vol. 28, No. 32, pp. 6876-6983 <DOI: 10.1002/adma.201601675>.

Maestri et al., "Absorption Spectra and Luminescence Properties of Isomeric Platinum (II) and Palladium (II) Complexes Containing 1,1'-Biphenyldiyl, 2-Phenylpyridine, and 2,2'-Bipyridine as Ligands," Helvetica Chimica Acta, vol. 71, Issue 5, Aug. 10, 1988, pp. 1053-1059.

Marc Lepeltier et al., "Efficient blue green organic light-emitting devices based on a monofluorinated heteroleptic iridium(III) complex," Synthetic Metals, vol. 199, 2015, pp. 139-146.

Markham, J. et al., "High-efficiency green phosphorescence from spin-coated single-layer dendrimer light-emitting diodes ", Applied Physics Lettersm Apr. 2002, vol. 80, vol. 15, pp. 2645-2647 <DOI:10.1063/1.1469218>.

Matthew J. Jurow et al., "Understanding and predicting the orientation of heteroleptic phosphors in organic light-emitting materials", Nature Materials, vol. 15, Jan. 2016, pp. 85-93.

Michl, J., "Relationship of bonding to electronic spectra", Accounts of Chemical Research, May 1990, vol. 23, No. 5, pp. 127-128 <DOI:10.1021/ar00173a001>.

Miller, R. et al., "Polysilane high polymers", Chemical Reviews, Sep. 1989, vol. 89, No. 6, pp. 1359-1410 <DOI:10.1021/cr00096a006>.

Morana et al. (2007). "Organic field-effect devices as tool to characterize the bipolar transport in polymer-fullerene blends: the case of P3HT-PCBM," Adv. Funct. Mat., 17, 3274-83.

Moule et al. (2008). "Controlling morphology in Polymer-Fullerene mixtures," Adv. Mater., 20, 240-45.

Murakami; JP 2007324309, English machine translation from EPO, dated Dec. 13, 2007, 89 pages.

Nazeeruddin, M. et al., "Highly Phosphorescence Iridium Complexes and Their Application in Organic Light-Emitting Devices", Journal of the American Chemical Society, Jun. 2003, vol. 125, No. 29, pp. 8790-8797 <DOI:10.1021/ja021413y>.

Nicholas R. Evans et al., "Triplet Energy Back Transfer in Conjugated Polymers with Pendant Phosphorescent Iridium Complexes," J. Am. Chem. Soc., vol. 128, 2006, pp. 6647-6656.

Nillson et al. (2007). "Morphology and phase segregation of spin-casted films of polyfluorene/PCBM Blends," Macromolecules, 40, 8291-8301.

Office Action dated Jan. 24, 2020 for U.S. Appl. No. 15/984,036 (pp. 1-24).

Olynick et al. (2009). "The link between nanoscale feature development in a negative resist and the Hansen solubility sphere," Journal of Polymer Science: Part B: Polymer Physics, 47, 2091-2105.

Peet et al. (2007). "Efficiency enhancement in low-bandgap polymer solar cells by processing with alkane dithiols," Nature Materials, 6, 497-500.

Pivrikas et al. (2008). "Substituting the postproduction treatment for bulk-heterojunction solar cells using chemical additives," Organic Electronics, 9, 775-82.

Pui Keong Chow et al., "Strongly Phosphorescent Palladium(II) Complexes of Tetradentate Ligands with Mixed Oxygen, Carbon, and Nitrogen Donor Atoms: Photophysics, Photochemistry, and Applications," Angew. Chem. Int. Ed. 2013, 52, 11775-11779.

Pui-Keong Chow et al., "Highly luminescent palladium(II) complexes with sub-millisecond blue to green phosphorescent excited states. Photocatalysis and highly efficient PSF-OLEDs," Chem. Sci., 2016, 7, 6083-6098.

Results from SciFinder Compound Search on Dec. 8, 2016. (17 pages).

Rui Zhu et al., "Color tuning based on a six-membered chelated iridium (III) complex with aza-aromatic ligand," Chemistry Letters, vol. 34, No. 12, 2005, pp. 1668-1669.

Russell J. Holmes et al., "Blue and Near-UV Phosphorescence from Iridium Complexes with Cyclometalated Pyrazolyl or N-Heterocyclic Carbene Ligands," Inorganic Chemistry, 2005, vol. 44, No. 22, pp. 7995-8003.

Sajoto, T. et al., "Temperature Dependence of Blue Phosphorescent Cyclometalated Ir(III) Complexes", Journal of the American Chemical Society, Jun. 2009, vol. 131, No. 28, pp. 9813-9822 <DOI:10.1021/ja903317w>.

Sakai, Y. et al., "Simple model-free estimation of orientation order parameters of vacuum-deposited and spin-coated amorphous films used in organic light-emitting diodes", Applied Physics Express, Aug. 2015, vol. 8, No. 9, pp. 096601-1-096601-4 <DOI:10.7567/APEX.8.096601>.

Saricifci et al. (1993). "Semiconducting polymerbuckminsterfullerene heterojunctions: diodes photodiodes, and photovoltaic cells," Appl. Phys. Lett., 62, 585-87.

Satake et al., "Interconvertible Cationic and Neutral Pyridinylimidazole η3-Allylpalladium Complexes. Structural Assignment by 1H, 13C, and 15N NMR and X-ray Diffraction", Organometallics, vol. 18, No. 24, 1999, pp. 5108-5111.

Saunders et al. (2008). "Nanoparticle-polymer photovoltaic cells," Advances in Colloid and Interface Science, 138, 1-23.

Senes, A. et al., "Transition dipole moment orientation in films of solution processed fluorescent oligomers: investigating the influence of molecular anisotropy", Journal of Materials Chemistry C, Jun. 2016, vol. 4, No. 26, pp. 6302-6308 <DOI: 10.1039/c5tc03481g>.

Shih-Chun Lo et al. "High-Triplet-Energy Dendrons: Enhancing the Luminescence of Deep Blue Phosphorescent Indium(III) Complexes" J. Am. Chem. Soc., vol. 131, 2009, pp. 16681-16688.

Shin et al. (2010). "Abrupt morphology change upon thermal annealing in Poly(3-hexathiophene)/soluble fullerene blend films for polymer solar cells," Adv. Funct. Mater., 20, 748-54.

Shiro Koseki et al., "Spin-orbit coupling analyses of the geometrical effects on phosphorescence in Ir(ppy)3 and its derivatives", J. Phys. Chem. C, vol. 117, pp. 5314-5327 (2013).

Shizuo Tokito et al. "Confinement of triplet energy on phosphorescent molecules for highly-efficient organic blue-light-emitting devices" Applied Physics Letters, vol. 83, No. 3, Jul. 21, 2003, pp. 569-571.

Stefan Bernhard, "The First Six Years: A Report," Department of Chemistry, Princeton University, May 2008, 11 pages.

Stephen R. Forrest, "The path to ubiquitous and low-cost organic electronic appliances on plastic," Nature, vol. 428, Apr. 29, 2004, pp. 911-918.

Steven C. F. Kui et al., "Robust phosphorescent platinum(II) complexes with tetradentate O^N^C^N ligands: high efficiency OLEDs with excellent efficiency stability," Chem. Commun., 2013, vol. 49, pp. 1497-1499.

Steven C. F. Kui et al., "Robust Phosphorescent Platinum(II) Complexes Containing Tetradentate O^N^C^N Ligands: Excimeric Excited State and Application in Organic White-Light-Emitting Diodes," Chem. Eur. J., 2013, vol. 19, pp. 69-73.

Strouse, G. et al., "Optical Spectroscopy of Single Crystal [Re(bpy)(CO)4](PF6): Mixing between Charge Transfer and Ligand

(56) References Cited

OTHER PUBLICATIONS

Centered Excited States", Inorganic Chemistry, Oct. 1995, vol. 34, No. 22, pp. 5578-5587 <DOI:10.1021/ic00126a031>.
Supporting Information: Xiao-Chun Hang et al., "Highly Efficient Blue-Emitting Cyclometalated Platinum(II) Complexes by Judicious Molecular Design," Wiley-VCH 2013, 7 pages.
Sylvia Bettington et al. "Tris-Cyclometalated Iridium(III) Complexes of Carbazole(fluorenyl)pyridine Ligands: Synthesis, Redox and Photophysical Properties, and Electrophosphorescent Light-Emitting Diodes" Chemistry: A European Journal, 2007, vol. 13, pp. 1423-1431.
Tang, C. et al., "Organic electroluminescent diodes", Applied Physics Letters, Jul. 1987, vol. 51, No. 12, pp. 913-915 <DOI: 10.1063/1.98799>.
Tsuoboyama, A. et al., "Homoleptic Cyclometalated Iridium Complexes with Highly Efficient Red Phosphorescence and Application to Organic Light-Emitting Diode", Journal of the American Chemical Society, Sep. 2003, vol. 125, No. 42, pp. 12971-12979 <DOI:10.1021/ja034732d>.
Turro, N., "Modern Molecular Photochemistry" (Sausalito, California, University Science Books, 1991), p. 48. (3 pages).
Tyler Fleetham et al., "Efficient "pure" blue OLEDs employing tetradentate Pt complexes with a narrow spectral bandwidth," Advanced Materials (Weinheim, Germany), Vo. 26, No. 41, 2014, pp. 7116-7121.
Tyler Fleetham et al., "Efficient Red-Emitting Platinum Complex with Long Operational Stability," ACS Appl. Mater. Interfaces 2015, 7, 16240-16246.
V. Adamovich et al., "High efficiency single dopant white electrophosphorescent light emitting diodes", New J. Chem, vol. 26, pp. 1171-1178. 2002.
V. Thamilarasan et al., "Green-emitting phosphorescent iridium(III) complex: Structural, photophysical and electrochemical properties," Inorganica Chimica Acta, vol. 408, 2013, pp. 240-245.
Vanessa Wood et al., "Colloidal quantum dot light-emitting devices," Nano Reviews 1, Jul. 2010, pp. 5202. (7 pages).
Vezzu, D. et al.: Highly luminescent tridentate platinum complexes featured in fused five-six-membered metallocycle and diminishing quenching. Inorganic Chem., vol. 50 (17), pp. 8261-8273, 2011.
Wang et al. (2010). "The development of nanoscale morphology in polymer: fullerene photovoltaic blends during solvent casting," Soft Matter, 6, 4128-4134.
Wang et al., C(aryl)-C(alkyl) bond formation from Cu(CI04)2-mediated oxidative cross coupling reaction between arenes and alkyllithium reagents through structurally well-defined Ar—Cu(III) intermediates, Chem Commun, 48: 9418-9420 (2012).
Williams, E. et al., "Excimer☐Based White Phosphorescent Organic Light☐Emitting Diodes with Nearly 100 % Internal Quantum Efficiency", Advanced Materials, Jan. 2007, vol. 19, No. 2, pp. 197-202 <DOI:10.1002/adma.200602174>.
Williams, E. et al., "Organic light-emitting diodes having exclusive near-infrared electrophosphorescence", Applied Physics Letters, Aug. 2006, vol. 89, No. 8, pp. 083506-1-083506-3 <DOI:10.1063/1.2335275>.
Wong. Challenges in organometallic research—Great opportunity for solar cells and OLEDs. Journal of Organometallic Chemistry 2009, vol. 694, pp. 2644-2647.
Xiao-Chu Hang et al., "Highly Efficient Blue-Emitting Cyclometalated Platinum(II) Complexes by Judicious Molecular Design," Angewandte Chemie, International Edition, vol. 52, Issue 26, Jun. 24, 2013, pp. 6753-6756.
Xiaofan Ren et al., "Ultrahigh Energy Gap Hosts in Deep Blue Organic Electrophosphorescent Devices," Chem. Mater., vol. 16, 2004, pp. 4743-4747.

Xin Li et al., "Density functional theory study of photophysical properties of iridium (III) complexes with phenylisoquinoline and phenylpyridine ligands", The Journal of Physical Chemistry C, 2011, vol. 115, No. 42, pp. 20722-20731.
Yakubov, L.A. et al., Synthesis and Properties of Zinc Complexes of mesoHexadecyloxy-Substituted Tetrabenzoporphyrin and Tetrabenzoazaporphyrins, Russian Journal of Organic Chemistry, 2008, vol. 44, No. 5, pp. 755-760.
Yang et al. (2005). "Nanoscale morphology of high-performance polymer solar cells," Nano Lett., 5, 579-83.
Yang, X. et al., "Efficient Blue☐ and White☐Emitting Electrophosphorescent Devices Based on Platinum(II) [1,3☐Difluoro☐4,6☐di(2☐pyridinyl)benzene] Chloride", Advanced Materials, Jun. 2008, vol. 20, No. 12, pp. 2405-2409 <DOI:10.1002/adma.200702940>.
Yao et al. (2008). "Effect of solvent mixture on nanoscale phase separation in polymer solar cells," Adv. Funct. Mater., 18, 1783-89.
Yao et al., Cu(CI04)2-Mediated Arene C—H Bond Halogenations of Azacalixaromatics Using Alkali Metal Halides as Halogen Sources, The Journal of Organic Chemistry, 77(7): 3336-3340 (2012).
Ying Yang et al., "Induction of Circularly Polarized Electroluminescence from an Achiral Light-Emitting Polymer via a Chiral Small-Molecule Dopant," Advanced Materials, vol. 25, Issue 18, May 14, 2013, pp. 2624-2628.
Yu et al. (1995). "Polymer Photovoltaic Cells: Enhanced efficiencies via a network of internal donor-acceptor heterojunctions," Science, 270, 1789-91.
Z Liu et al., "Green and blue-green phosphorescent heteroleptic iridium complexes containing carbazole-functionalized beta-diketonate for non-doped organic light-emitting diodes", Organic Electronics 9 (2008) pp. 171-182.
Z Xu et al., "Synthesis and properties of iridium complexes based 1,3,4-oxadiazoles derivatives", Tetrahedron 64 (2008) pp. 1860-1867.
Zhi-Qiang Zhu et. al., "Efficient Cyclometalated Platinum(II) Complex with Superior Operational Stability," Adv. Mater. 29 (2017) 1605002, pp. 1-5.
Zhi-Qiang Zhu et.al., "Harvesting All Electrogenerated Excitons through Metal Assisted Delayed Fluorescent Materials," Adv. Mater. 27 (2015) 2533-2537.
Zhu, W. et al., "Highly efficient electrophosphorescent devices based on conjugated polymers doped with iridium complexes", Applied Physics Letters, Mar. 2002, vol. 80, No. 12, pp. 2045-2047 <DOI:10.1063/1.1461418>.
Dong Ryun Lee et al. "Emitting Materials for Thermally Activated Delayed Fluorescent Organic Light-Emitting Diodes Using Benzofurocarbazole and Benzothienocarbazole as Donor Moieties" SID 2015 Digest, vol. 46, p. 502-504 (Year: 2015).
Fleetham et al., "Phosphorescent Pt(II) and Pd(II) Complexes for Efficient, High-Color-Quality, and Stable OLEDs", Advanced Mater., 29, 1601861, 2017, 16 pages.
Tyler Fleetham, "Phosphorescent Pt(II) and Pd(II) Complexes for Efficient, High-Color-Quality, and Stable OLEDs", 52 pages, Material Science and Engineering, Arizona State University (Year: 2016).
J. Park et al., 26 Semicond. Sci. Technol., 1-9 (2011) (Year: 2011).
S. Kunic et al., 54th International Symposium ELMAR—2012, 31-35 (2012) (Year: 2012).
T. Fleetham et al., 25 Advanced Materials, 2573-2576 (2013) (Year: 2013).
Y. Karzazi, 5 J. Mater. Environ. Sci., 1-12 (2014) (Year: 2014).
Myoung-Seon Gong et al. "Synthesis and device properties of mCP analogues based on fused-ring carbazole moiety", Org. Electronics, 2017, vol. 42, p. 66-74 (Year: 2017).

METAL ASSISTED DELAYED FLUORESCENT EMITTERS FOR ORGANIC LIGHT-EMITTING DIODES

CROSS-REFERENCE TO RELATED APPLICATIONS

The present application claims priority to U.S. Provisional Application No. 63/026,806, filed May 19, 2020, which is incorporated by reference herein in its entirety.

STATEMENT REGARDING FEDERALLY SPONSORED RESEARCH OR DEVELOPMENT

This invention was made with government support under DE-EE0008721 awarded by the Department of Energy. The government has certain rights in the invention.

BACKGROUND OF THE INVENTION

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

In recent years, organic light emitting diodes (OLEDs) have attracted great attention from both academic and industrial areas due to their outstanding merits, like high color quality, wide-viewing angle, low cost fabrication, low power consumption, fast respond speed and high electron to photon conversion efficiency. Most of the organic light emitting diodes (OLEDs) are phosphorescent OLEDs using Iridium (Ir), palladium (Pd) and platinum (Pt) complexes, as these metal complexes have strong Spin-Orbital Coupling, they can efficiently emit light from their triplet exited state and reach nearly 100% internal efficiency.

There remains a need in the art for efficient and stable OLED components. This invention addresses this unmet need.

SUMMARY OF THE INVENTION

In one aspect, the present disclosure relates to a of General Formula I;

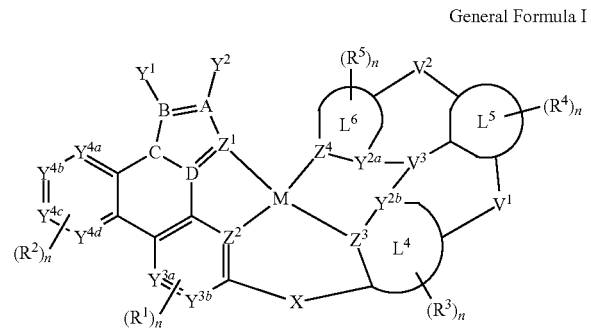

General Formula I wherein:
M represents Pt(II) or Pd(II);
each of $R^1$, $R^2$, $R^3$, $R^4$, $R^5$, and $R^6$ is independently absent or present as a single substituent or multiple substituents, valency permitting, and each of $R^1$, $R^3$, $R^4$, $R^5$, $R^6$ and $R^8$ independently represents hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof;
wherein two adjacent substituents $R^2$ are present, the groups $Y^{4a}$, $Y^{4b}$, $Y^{4c}$, or $Y^{4d}$ to which the groups $R^2$ are bound are each C, and the two adjacent groups $R^2$ are represented by Formula A:

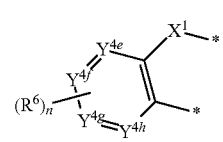

Formula A wherein * represents the bond to General Formula I;
X represents a single bond, O, S, Se, P=O, As=O, Bi=O, $CR^7R^8$, C=O, $SiR^7R^8$, $GeR^7R^8$, $NR^7$, $PR^7$, $PR^7R^8$, $R^7P$=O, $AsR^7$, $R^7As$=O, S=O, $SO_2$, Se=O, $SeO_2$, $BR^7$, $BR^7R^8$, $AlR^7$, $AlR^7R^8$, $R^7Bi$=O, or $BiR^7$, or X is not present, wherein when X is not present, no bond exists between $L^4$ and the ring comprising $Z^2$;
$X^1$ represents a single bond, O, S, Se, P=O, As=O, Bi=O, $CR^7R^8$, C=O, $SiR^7R^8$, $GeR^7R^8$, $NR^7$, $PR^7$, $PR^7R^8$, $R^7P$=O, $AsR^7$, $R^7As$=O, S=O, $SO_2$, Se=O, $SeO_2$, $BR^7$, $BR^7R^8$, $AlR^7$, $AlR^7R^8$, $R^7Bi$=O, or $BiR^7$;
each occurrence of $R^7$ and $R^8$ is independently absent or present as a single substituent or multiple substituents, valency permitting, and each of $R^7$ and $R^8$ independently represents hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof; or any two of $R^1$, $R^2$, $R^3$, $R^4$, $R^5$, $R^6$, $R^7$, and $R^8$ represent a covalent bond;
any two of $R^1$, $R^2$, $R^3$, $R^4$, $R^5$, $R^6$, $R^7$, $R^8$, X, and $X^1$ may together form a fused ring;
A, B, C, and D each independently represents C, N, O, or S;
$Y^1$ and $Y^2$ each independently represents hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof; wherein $Y^1$ and $Y^2$ may optionally together form a fused aromatic or heteroaromatic ring; $Y^{3a}$, $Y^{3b}$, $Y^{4a}$, $Y^{4b}$, $Y^{4c}$, $Y^{4d}$, $Y^{4e}$, $Y^{4f}$, $Y^{4g}$, $Y^{4h}$ each independently represents C or N;

$Z^1$, $Z^2$, $Z^3$ and $Z^4$ each independently represents C or N;

$L^4$, $L^5$ and $L^6$ each independently represents a 5- to 10-membered aryl, heteroaryl, fused aryl, or fused heteroaryl;

$L^5$ is present or absent;

$V^1$ and $V^2$ are independently present or absent; wherein each of $V^1$ and $V^2$, if present, independently represents a covalent bond, O, S, Se, P=O, As=O, Bi=O, $CR^7R^8$, C=O, $SiR^7R^8$, $GeR^7R^8$, $NR^7$, $PR^7$, $PR^7R^8$, $R^7P$=O, $AsR^7$, $R^7As$=O, S=O, $SO_2$, Se=O, $SeO_2$, $BR^7$, $BR^7R^8$, $AlR^7$, $AlR^7R^8$, $R^7Bi$=O, or $BiR^7$; wherein when $V^1$ is not present, then $L^4$ is not bound to $L^5$; and when $V^2$ is not present, then $L^6$ is not bound to $L^5$;

$V^3$ is present or absent, wherein $V^3$, if present, represents a covalent bond, C, N, Si, O, S, Ge, P, As, Se, B, Al, or Bi, or if valency permits, each independently represents $CR^7$, $SiR^7$, $GeR^7$, $NR^7$, P=O, As=O, B, $BR^7$, $AlR^7$, Bi=O, $CR^7R^8$, C=O, $SiR^7R^8$, $GeR^7R^8$, $NR^7$, $PR^7$, $PR^7R^8$, $R^7P$=O, $AsR^7$, $R^7As$=O, S=O, $SO_2$, Se=O, $SeO_2$, $BR^7$, $BR^7R^8$, $AlR^7$, $AlR^7R^8$, $R^7Bi$=O, or $BiR^7$; wherein when $V^3$ is not present, then a $Y^{2a}$ is directly bound to $Y^{2b}$; and each n is independently an integer, valency permitting.

In one embodiment, an organic light emitting diode (OLED) including the compound is provided. According to another embodiment, a light emitting device comprising the light emitting diode is provided.

BRIEF DESCRIPTION OF THE DRAWINGS

The following detailed description of preferred embodiments of the disclosure will be better understood when read in conjunction with the appended drawings. For the purpose of illustrating the invention, there are shown in the drawings embodiments which are presently preferred. It should be understood, however, that the invention is not limited to the precise arrangements and instrumentalities of the embodiments shown in the drawings.

DETAILED DESCRIPTION

Figure 1:
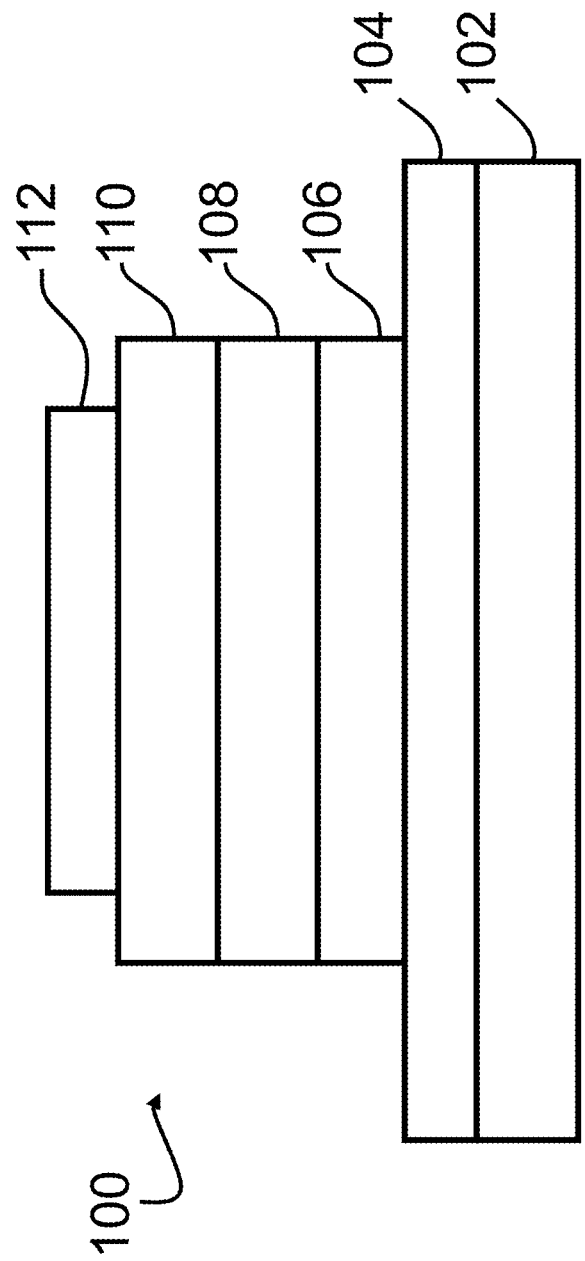
FIG. 1 is a schematic diagram of an organic light emitting device.

The present disclosure relates in part to the unexpected discovery that increased conjugation increases MADF efficiency.

Definitions

It is to be understood that the figures and descriptions in the present disclosure have been simplified to illustrate elements that are relevant for a clear understanding of the present invention, while eliminating, for the purpose of clarity, many other elements found in the art related to phosphorescent organic light emitting devices and the like. Those of ordinary skill in the art may recognize that other elements and/or steps are desirable and/or required in implementing the disclosed embodiments. However, because such elements and steps are well known in the art, and because they do not facilitate a better understanding of the present disclosure, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this disclosure belongs. Although any methods, materials and components similar or equivalent to those described herein can be used in the practice or testing of the disclosed embodiments, the preferred methods, and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of 20%, ±10%, ±5%, +1%, or +0.1% from the specified value, as such variations are appropriate.

Throughout this disclosure, various aspects of the invention can be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, 6 and any whole and partial increments therebetween. This applies regardless of the breadth of the range.

Disclosed are the components to be used to prepare the compositions of the disclosure as well as the compositions themselves to be used within the methods disclosed herein. These and other materials are disclosed herein, and it is understood that when combinations, subsets, interactions, groups, etc. of these materials are disclosed that while specific reference of each various individual and collective combinations and permutation of these compounds cannot be explicitly disclosed, each is specifically contemplated and described herein. For example, if a particular compound is disclosed and discussed and a number of modifications that can be made to a number of molecules including the compounds are discussed, specifically contemplated is each and every combination and permutation of the compound and the modifications that are possible unless specifically indicated to the contrary. Thus, if a class of molecules A, B, and C are disclosed as well as a class of molecules D, E, and F and an example of a combination molecule, A-D is disclosed, then even if each is not individually recited each is individually and collectively contemplated meaning combinations, A-E, A-F, B-D, B-E, B-F, C-D, C-E, and C-F are considered disclosed. Likewise, any subset or combination of these is also disclosed. Thus, for example, the sub-group of A-E, B-F, and C-E would be considered disclosed. This concept applies to all aspects of this application including, but not limited to, steps in methods of making and using the compositions of the invention. Thus, if there are a variety of additional steps that can be performed it is understood that each of these additional steps can be performed with any specific embodiment or combination of embodiments of the methods of the invention.

As referred to herein, a linking atom or a linking group can connect two groups such as, for example, an N and C group. The linking atom can optionally, if valency permits, have other chemical moieties attached. For example, in one aspect, an oxygen would not have any other chemical groups attached as the valency is satisfied once it is bonded to two groups (e.g., N and/or C groups). In another aspect, when carbon is the linking atom, two additional chemical moieties can be attached to the carbon. Suitable chemical moieties include, but are not limited to, hydrogen, hydroxyl, alkyl, alkoxy, =O, halogen, nitro, amine, amide, thiol, aryl, heteroaryl, cycloalkyl, and heterocyclyl.

The term "cyclic structure" or the like terms used herein refer to any cyclic chemical structure which includes, but is not limited to, aryl, heteroaryl, cycloalkyl, cycloalkenyl, and heterocyclyl.

As used herein, the term "substituted" is contemplated to include all permissible substituents of organic compounds. In a broad aspect, the permissible substituents include acyclic and cyclic, branched and unbranched, carbocyclic and heterocyclic, and aromatic and nonaromatic substituents of organic compounds. Illustrative substituents include, for example, those described below. The permissible substituents can be one or more and the same or different for appropriate organic compounds. For purposes of this disclosure, the heteroatoms, such as nitrogen, can have hydrogen substituents and/or any permissible substituents of organic compounds described herein which satisfy the valences of the heteroatoms. This disclosure is not intended to be limited in any manner by the permissible substituents of organic compounds. Also, the terms "substitution" or "substituted with" include the implicit proviso that such substitution is in accordance with permitted valence of the substituted atom and the substituent, and that the substitution results in a stable compound, e.g., a compound that does not spontaneously undergo transformation such as by rearrangement, cyclization, elimination, etc. It is also contemplated that, in certain aspects, unless expressly indicated to the contrary, individual substituents can be further optionally substituted (i.e., further substituted or unsubstituted).

The term "alkyl" as used herein is a branched or unbranched saturated hydrocarbon group of 1 to 24 carbon atoms, such as methyl, ethyl, n-propyl, isopropyl, n-butyl, isobutyl, s-butyl, t-butyl, n-pentyl, isopentyl, s-pentyl, neopentyl, hexyl, heptyl, octyl, nonyl, decyl, dodecyl, tetradecyl, hexadecyl, eicosyl, tetracosyl, and the like. The alkyl group can be cyclic or acyclic. The alkyl group can be branched or unbranched. The alkyl group can also be substituted or unsubstituted. For example, the alkyl group can be substituted with one or more groups including, but not limited to, alkyl, cycloalkyl, alkoxy, amino, ether, halide, hydroxy, nitro, silyl, sulfo-oxo, or thiol, as described herein.

A "lower alkyl" group is an alkyl group containing from one to six (e.g., from one to four) carbon atoms.

Throughout the specification "alkyl" is generally used to refer to both unsubstituted alkyl groups and substituted alkyl groups; however, substituted alkyl groups are also specifically referred to herein by identifying the specific substituent (s) on the alkyl group. For example, the term "halogenated alkyl" or "haloalkyl" specifically refers to an alkyl group that is substituted with one or more halide, e.g., fluorine, chlorine, bromine, or iodine. The term "alkoxyalkyl" specifically refers to an alkyl group that is substituted with one or more alkoxy groups, as described below. The term "alkylamino" specifically refers to an alkyl group that is substituted with one or more amino groups, as described below, and the like. When "alkyl" is used in one instance and a specific term such as "alkylalcohol" is used in another, it is not meant to imply that the term "alkyl" does not also refer to specific terms such as "alkylalcohol" and the like.

This practice is also used for other groups described herein. That is, while a term such as "cycloalkyl" refers to both unsubstituted and substituted cycloalkyl moieties, the substituted moieties can, in addition, be specifically identified herein; for example, a particular substituted cycloalkyl can be referred to as, e.g., an "alkylcycloalkyl." Similarly, a substituted alkoxy can be specifically referred to as, e.g., a "halogenated alkoxy," a particular substituted alkenyl can be, e.g., an "alkenylalcohol," and the like. Again, the practice of using a general term, such as "cycloalkyl," and a specific term, such as "alkylcycloalkyl," is not meant to imply that the general term does not also include the specific term.

The term "cycloalkyl" as used herein is a non-aromatic carbon-based ring composed of at least three carbon atoms. Examples of cycloalkyl groups include, but are not limited to, cyclopropyl, cyclobutyl, cyclopentyl, cyclohexyl, norbornyl, and the like. The term "heterocycloalkyl" is a type of cycloalkyl group as defined above, and is included within the meaning of the term "cycloalkyl," where at least one of the carbon atoms of the ring is replaced with a heteroatom such as, but not limited to, nitrogen, oxygen, sulfur, or phosphorus. The cycloalkyl group and heterocycloalkyl group can be substituted or unsubstituted. The cycloalkyl group and heterocycloalkyl group can be substituted with one or more groups including, but not limited to, alkyl, cycloalkyl, alkoxy, amino, ether, halide, hydroxy, nitro, silyl, sulfo-oxo, or thiol as described herein.

The term "polyalkylene group" as used herein is a group having two or more $CH_2$ groups linked to one another. The polyalkylene group can be represented by the formula $-(CH_2)_a-$, where "a" is an integer of from 2 to 500.

The terms "alkoxy" and "alkoxyl" as used herein to refer to an alkyl or cycloalkyl group bonded through an ether linkage; that is, an "alkoxy" group can be defined as $-OA^1$ where $A^1$ is alkyl or cycloalkyl as defined above. "Alkoxy" also includes polymers of alkoxy groups as just described; that is, an alkoxy can be a polyether such as $-OA^1-OA^2$ or $-OA^1-(OA^2)_a-OA^3$, where "a" is an integer of from 1 to 200 and $A^1$, $A^2$, and $A^3$ are alkyl and/or cycloalkyl groups.

The term "alkenyl" as used herein is a hydrocarbon group of from 2 to 24 carbon atoms with a structural formula containing at least one carbon-carbon double bond. Asymmetric structures such as $(A^1A^2)C=C(A^3A^4)$ are intended to include both the E and Z isomers. This can be presumed in structural formulae herein wherein an asymmetric alkene is present, or it can be explicitly indicated by the bond symbol C=C. The alkenyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol, as described herein.

The term "cycloalkenyl" as used herein is a non-aromatic carbon-based ring composed of at least three carbon atoms and containing at least one carbon-carbon double bond, i.e., C=C. Examples of cycloalkenyl groups include, but are not limited to, cyclopropenyl, cyclobutenyl, cyclopentenyl, cyclopentadienyl, cyclohexenyl, cyclohexadienyl, norbornenyl, and the like. The term "heterocycloalkenyl" is a type of cycloalkenyl group as defined above, and is included within the meaning of the term "cycloalkenyl," where at least one of the carbon atoms of the ring is replaced with a heteroatom such as, but not limited to, nitrogen, oxygen, sulfur, or phosphorus. The cycloalkenyl group and heterocycloalkenyl group can be substituted or unsubstituted. The cycloalkenyl group and heterocycloalkenyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein.

The term "alkynyl" as used herein is a hydrocarbon group of 2 to 24 carbon atoms with a structural formula containing at least one carbon-carbon triple bond. The alkynyl group can be unsubstituted or substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol, as described herein.

The term "cycloalkynyl" as used herein is a non-aromatic carbon-based ring composed of at least seven carbon atoms and containing at least one carbon-carbon triple bound. Examples of cycloalkynyl groups include, but are not limited to, cycloheptynyl, cyclooctynyl, cyclononynyl, and the like. The term "heterocycloalkynyl" is a type of cycloalkenyl group as defined above, and is included within the meaning of the term "cycloalkynyl," where at least one of the carbon atoms of the ring is replaced with a heteroatom such as, but not limited to, nitrogen, oxygen, sulfur, or phosphorus. The cycloalkynyl group and heterocycloalkynyl group can be substituted or unsubstituted. The cycloalkynyl group and heterocycloalkynyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein.

The term "aryl" as used herein is a group that contains any carbon-based aromatic group including, but not limited to, benzene, naphthalene, phenyl, biphenyl, phenoxybenzene, and the like. The term "aryl" also includes "heteroaryl," which is defined as a group that contains an aromatic group that has at least one heteroatom incorporated within the ring of the aromatic group. Examples of heteroatoms include, but are not limited to, nitrogen, oxygen, sulfur, and phosphorus. Likewise, the term "non-heteroaryl," which is also included in the term "aryl," defines a group that contains an aromatic group that does not contain a heteroatom. The aryl group can be substituted or unsubstituted. The aryl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein. The term "biaryl" is a specific type of aryl group and is included in the definition of "aryl." Biaryl refers to two aryl groups that are bound together via a fused ring structure, as in naphthalene, or are attached via one or more carbon-carbon bonds, as in biphenyl.

The term "aldehyde" as used herein is represented by the formula —C(O)H. Throughout this specification "C(O)" is a short hand notation for a carbonyl group, i.e., C=O.

The terms "amine" or "amino" as used herein are represented by the formula —$NA^1A^2$, where $A^1$ and $A^2$ can be, independently, hydrogen or alkyl, cycloalkyl, alkenyl, cycloalkenyl, alkynyl, cycloalkynyl, aryl, or heteroaryl group as described herein.

The term "alkylamino" as used herein is represented by the formula —NH(-alkyl) where alkyl is a described herein. Representative examples include, but are not limited to, methylamino group, ethylamino group, propylamino group, isopropylamino group, butylamino group, isobutylamino group, (sec-butyl)amino group, (tert-butyl)amino group, pentylamino group, isopentylamino group, (tert-pentyl) amino group, hexylamino group, and the like.

The term "dialkylamino" as used herein is represented by the formula —$N(-alkyl)_2$ where alkyl is a described herein. Representative examples include, but are not limited to, dimethylamino group, diethylamino group, dipropylamino group, diisopropylamino group, dibutylamino group, diisobutylamino group, di(sec-butyl)amino group, di(tert-butyl)amino group, dipentylamino group, diisopentylamino group, di(tert-pentyl)amino group, dihexylamino group, N-ethyl-N-methylamino group, N-methyl-N-propylamino group, N-ethyl-N-propylamino group and the like.

The term "carboxylic acid" as used herein is represented by the formula —C(O)OH.

The term "ester" as used herein is represented by the formula —OC(O)$A^1$ or —C(O)O$A^1$, where $A^1$ can be alkyl, cycloalkyl, alkenyl, cycloalkenyl, alkynyl, cycloalkynyl, aryl, or heteroaryl group as described herein. The term "polyester" as used herein is represented by the formula -($A^1$O(O)C-$A^2$-C(O)O)—, or -($A^1$O(O)C-$A^2$-OC(O))$_a$—, where $A^1$ and $A^2$ can be, independently, an alkyl, cycloalkyl, alkenyl, cycloalkenyl, alkynyl, cycloalkynyl, aryl, or heteroaryl group described herein and "a" is an integer from 1 to 500. "Polyester" is as the term used to describe a group that is produced by the reaction between a compound having at least two carboxylic acid groups with a compound having at least two hydroxyl groups.

The term "ether" as used herein is represented by the formula $A^1OA^2$, where $A^1$ and $A^2$ can be, independently, an alkyl, cycloalkyl, alkenyl, cycloalkenyl, alkynyl, cycloalkynyl, aryl, or heteroaryl group described herein. The term "polyether" as used herein is represented by the formula -($A^1$O-$A^2$O)$_a$—, where $A^1$ and $A^2$ can be, independently, an alkyl, cycloalkyl, alkenyl, cycloalkenyl, alkynyl, cycloalkynyl, aryl, or heteroaryl group described herein and "a" is an integer of from 1 to 500. Examples of polyether groups include polyethylene oxide, polypropylene oxide, and polybutylene oxide.

The term "halide" as used herein refers to the halogens fluorine, chlorine, bromine, and iodine.

The term "heterocyclyl," as used herein refers to single and multi-cyclic non-aromatic ring systems and "heteroaryl" as used herein refers to single and multi-cyclic aromatic ring systems: in which at least one of the ring members is other than carbon. The term "heterocyclyl" includes azetidine, dioxane, furan, imidazole, isothiazole, isoxazole, morpholine, oxazole, oxazole, including, 1,2,3-oxadiazole, 1,2,5-oxadiazole and 1,3,4-oxadiazole, piperazine, piperidine, pyrazine, pyrazole, pyridazine, pyridine, pyrimidine, pyrrole, pyrrolidine, tetrahydrofuran, tetrahydropyran, tetrazine, including 1,2,4,5-tetrazine, tetrazole, including 1,2,3,4-tetrazole and 1,2,4,5-tetrazole, thiadiazole, including, 1,2,3-thiadiazole, 1,2,5-thiadiazole, and 1,3,4-thiadiazole, thiazole, thiophene, triazine, including 1,3,5-triazine and 1,2,4-triazine, triazole, including, 1,2,3-triazole, 1,3,4-triazole, and the like.

The term "hydroxyl" as used herein is represented by the formula —OH.

The term "ketone" as used herein is represented by the formula $A^1C(O)A^2$, where $A^1$ and $A^2$ can be, independently, an alkyl, cycloalkyl, alkenyl, cycloalkenyl, alkynyl, cycloalkynyl, aryl, or heteroaryl group as described herein.

The term "azide" as used herein is represented by the formula —$N_3$.

The term "nitro" as used herein is represented by the formula —$NO_2$.

The term "nitrile" as used herein is represented by the formula —CN.

The term "ureido" as used herein refers to a urea group of the formula —$NHC(O)NH_2$ or —NHC(O)NH—.

The term "phosphoramide" as used herein refers to a group of the formula —$P(O)(NA^1A^2)_2$, where $A^1$ and $A^2$ can be, independently, hydrogen or an alkyl, cycloalkyl, alkoxy, alkenyl, cycloalkenyl, alkynyl, cycloalkynyl, aryl, or heteroaryl group as described herein.

The term "carbamoyl" as used herein refers to an amide group of the formula —$CONA^1A^2$, where $A^1$ and $A^2$ can be, independently, hydrogen or an alkyl, cycloalkyl, alkoxy, alkenyl, cycloalkenyl, alkynyl, cycloalkynyl, aryl, or heteroaryl group as described herein.

The term "sulfamoyl" as used herein refers to a group of the formula —$S(O)_2NA^1A^2$, where $A^1$ and $A^2$ can be, independently, hydrogen or an alkyl, cycloalkyl, alkoxy, alkenyl, cycloalkenyl, alkynyl, cycloalkynyl, aryl, or heteroaryl group as described herein.

The term "silyl" as used herein is represented by the formula —$SiA^1A^2A^3$, where $A^1$, $A^2$, and $A^3$ can be, independently, hydrogen or an alkyl, cycloalkyl, alkoxy, alkenyl, cycloalkenyl, alkynyl, cycloalkynyl, aryl, or heteroaryl group as described herein.

The term "sulfo-oxo" as used herein is represented by the formulas —$S(O)A1$, —$S(O)_2A^1$, —$OS(O)_2A^1$, or —$OS(O)_2OA^1$, where $A^1$ is hydrogen or an alkyl, cycloalkyl, alkenyl, cycloalkenyl, alkynyl, cycloalkynyl, aryl, or heteroaryl group as described herein. Throughout this specification "S(O)" is a short hand notation for S=O. The term "sulfonyl" is used herein to refer to the sulfo-oxo group represented by the formula —$S(O)_2A^1$, where Al is hydrogen or an alkyl, cycloalkyl, alkenyl, cycloalkenyl, alkynyl, cycloalkynyl, aryl, or heteroaryl group as described herein. The term "sulfone" as used herein is represented by the formula $A'S(O)_2A^2$, where $A^1$ and $A^2$ can be, independently, an alkyl, cycloalkyl, alkenyl, cycloalkenyl, alkynyl, cycloalkynyl, aryl, or heteroaryl group as described herein. The term "sulfoxide" as used herein is represented by the formula $A'S(O)A^2$, where Aland $A^2$ can be, independently, an alkyl, cycloalkyl, alkenyl, cycloalkenyl, alkynyl, cycloalkynyl, aryl, or heteroaryl group as described herein.

The term "thiol" as used herein is represented by the formula —SH.

The term "polymeric" includes polyalkylene, polyether, polyester, and other groups with repeating units, such as, but not limited to —$(CH_2O)_n$—$CH_3$, —$(CH_2CH_2O)_n$—$CH_3$, —$[CH_2CH(CH_3)]_n$—$CH_3$, —$[CH_2CH(COOCH_3)]_n$—$CH_3$, —$[CH_2CH(COOCH_2CH_3)]_n$—$CH_3$, and —$[CH_2CH(COO^tBu)]_n$—$CH_3$, where n is an integer (e.g., n>1 or n>2).

"R," "$R^1$," "$R^2$," "$R^3$," "$R^n$," where n is an integer, as used herein can, independently, include hydrogen or one or more of the groups listed above. For example, if $R^1$ is a straight chain alkyl group, one of the hydrogen atoms of the alkyl group can optionally be substituted with a hydroxyl group, an alkoxy group, an alkyl group, a halide, and the like. Depending upon the groups that are selected, a first group can be incorporated within a second group or, alternatively, the first group can be pendant (i.e., attached) to the second group. For example, with the phrase "an alkyl group comprising an amino group," the amino group can be incorporated within the backbone of the alkyl group. Alternatively, the amino group can be attached to the backbone of the alkyl group. The nature of the group(s) that is (are) selected will determine if the first group is embedded or attached to the second group.

As described herein, compounds of the disclosure may contain "optionally substituted" moieties. In general, the term "substituted," whether preceded by the term "optionally" or not, means that one or more hydrogens of the designated moiety are replaced with a suitable substituent. Unless otherwise indicated, an "optionally substituted" group may have a suitable substituent at each substitutable position of the group, and when more than one position in any given structure may be substituted with more than one substituent selected from a specified group, the substituent may be either the same or different at every position. Combinations of substituents envisioned by this disclosure are preferably those that result in the formation of stable or chemically feasible compounds. It is also contemplated that, in certain aspects, unless expressly indicated to the contrary, individual substituents can be further optionally substituted (i.e., further substituted or unsubstituted).

In some aspects, a structure of a compound can be represented by a formula:

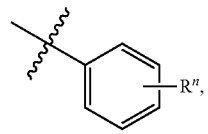

which is understood to be equivalent to a formula:

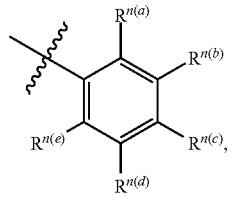

wherein n is typically an integer. That is, $R^n$ is understood to represent five independent substituents, $R^{n(a)}$, $R^{n(b)}$, $R^{n(c)}$, $R^{n(d)}$, $R^{n(e)}$. By "independent substituents," it is meant that each R substituent can be independently defined. For example, if in one instance $R^{n(a)}$ is halogen, then $R^{n(b)}$ is not necessarily halogen in that instance.

Several references to R, $R^1$, $R^2$, $R^3$, $R^4$, $R^5$, $R^6$, etc. are made in chemical structures and moieties disclosed and described herein. Any description of R, $R^1$, $R^2$, $R^3$, $R^4$, $R^5$, $R^6$, etc. in the specification is applicable to any structure or moiety reciting R, $R^1$, $R^2$, $R^3$, $R^4$, $R^5$, $R^6$, etc. respectively.

Compounds

The compounds disclosed herein are suited for use in a wide variety of optical and electro-optical devices, including, but not limited to, photo-absorbing devices such as solar- and photo-sensitive devices, organic light emitting devices (OLEDs), photo-emitting devices, or devices capable of both photo-absorption and emission and as markers for bio-applications.

The compounds disclosed herein are useful in a variety of applications. As light emitting materials, the compounds can be useful in organic light emitting devices (OLEDs), luminescent devices and displays, and other light emitting devices.

In another aspect, the compounds can provide improved efficiency, improved operational lifetimes, or both in lighting devices, such as, for example, organic light emitting devices, as compared to conventional materials.

The compounds of the disclosure can be made using a variety of methods, including, but not limited to those recited in the examples provided herein.

Compounds of the Invention

In one aspect, the present invention relates to a compound of General Formula I:

General Formula I

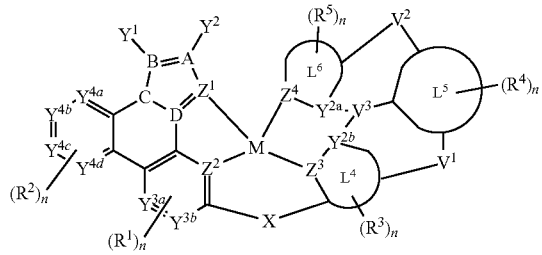

wherein:
M represents Pt(II) or Pd(II);
each of $R^1$, $R^2$, $R^3$, $R^4$, $R^5$, and $R^6$ is independently absent or present as a single substituent or multiple substituents, valency permitting, and each of $R^1$, $R^3$, $R^4$, $R^5$, $R^6$ and $R^8$ independently represents hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof;

wherein two adjacent substituents $R^2$ are present, the groups $Y^{4a}$, $Y^{4b}$, $Y^{4c}$, or $Y^{4d}$ to which the groups $R^2$ are bound are each C, and the two adjacent groups $R^2$ are represented by Formula A:

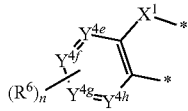
Formula A wherein * represents the bond to General Formula I;
X represents a single bond, O, S, Se, P=O, As=O, Bi=O, $CR^7R^8$, C=O, $SiR^7R^8$, $GeR^7R^8$, $NR^7$, $PR^7$, $PR^7R^8$, $R^7P$=O, $AsR^7$, $R^7As$=O, S=O, $SO_2$, Se=O, $SeO_2$, $BR^7$, $BR^7R^8$, $AlR^7$, $AlR^7R^8$, $R^7Bi$=O, or $BiR^7$, or X is not present, wherein when X is not present, no bond exists between $L^4$ and the ring comprising $Z^2$;
$X^1$ represents a single bond, O, S, Se, P=O, As=O, Bi=O, $CR^7R^8$, C=O, $SiR^7R^8$, $GeR^7R^8$, $NR^7$, $PR^7$, $PR^7R^8$, $R^7P$=O, $AsR^7$, $R^7As$=O, S=O, $SO_2$, Se=O, $SeO_2$, $BR^7$, $BR^7R^8$, $AlR^7$, $AlR^7R^8$, $R^7Bi$=O, or $BiR^7$;
each occurrence of $R^7$ and $R^8$ is independently absent or present as a single substituent or multiple substituents, valency permitting, and each of $R^7$ and $R^8$ independently represents hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof; or any two of $R^1$, $R^2$, $R^3$, $R^4$, $R^5$, $R^6$, $R^7$, and $R^8$ represent a covalent bond;
any two of $R^1$, $R^2$, $R^3$, $R^4$, $R^5$, $R^6$, $R^7$, $R^8$, X, and $X^1$ may together form a fused ring;
A, B, C, and D each independently represents C, N, O, or S;
$Y^1$ and $Y^2$ each independently represents hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof; wherein $Y^1$ and $Y^2$ may optionally together form a fused aromatic or heteroaromatic ring;
$Y^{3a}$, $Y^{3b}$, $Y^{4a}$, $Y^{4b}$, $Y^{4c}$, $Y^{4d}$, $Y^{4e}$, $Y^{4f}$, $Y^{4g}$, $Y^{4h}$ each independently represents C or N;
$Z^1$, $Z^2$, $Z^3$ and $Z^4$ each independently represents C or N;
$L^4$, $L^5$ and $L^6$ each independently represents a 5- to 10-membered aryl, heteroaryl, fused aryl, or fused heteroaryl;
$L^5$ is present or absent;
$V^1$ and $V^2$ are independently present or absent; wherein each of $V^1$ and $V^2$, if present, independently represents a covalent bond, O, S, Se, P=O, As=O, Bi=O, $CR^7R^8$, C=O, $SiR^7R^8$, $GeR^7R^8$, $NR^7$, $PR^7$, $PR^7R^8$, $R^7P$=O, $AsR^7$, $R^7As$=O, S=O, $SO_2$, Se=O, $SeO_2$, $BR^7$, $BR^7R^8$, $AlR^7$, $AlR^7R^8$, $R^7Bi$=O, or $BiR^7$;
wherein when $V^1$ is not present, then $L^4$ is not bound to $L^5$; and when $V^2$ is not present, then $L^6$ is not bound to $L^5$;
$V^3$ is present or absent, wherein $V^3$, if present, represents a covalent bond, C, N, Si, O, S, Ge, P, As, Se, B, Al, or Bi, or if valency permits, each independently represents $CR^7$, $SiR^7$, $GeR^7$, $NR^7$, P=O, As=O, B, $BR^7$, $AlR^7$, Bi=O, $CR^7R^8$, C=O, $SiR^7R^8$, $GeR^7R^8$, $NR^7$, $PR^7$, $PR^7R^8$, $R^7P$=O, $AsR^7$, $R^7As$=O, S=O, $SO_2$, Se=O, $SeO_2$, $BR^7$, $BR^7R^8$, $AlR^7$, $AlR^7R^8$, $R^7Bi=O$, or $BiR^7$;
wherein when $V^3$ is not present, then a $Y^{2a}$ is directly bound to $Y^{2b}$; and each n is independently an integer, valency permitting.

In one embodiment, two additional adjacent groups $R^2$ together are represented by Formula B:

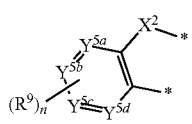

Formula B wherein $X^2$ represents a single bond, O, S, Se, P=O, As=O, Bi=O, $CR^7R^8$, C=O, $SiR^7R^8$, $GeR^7R^8$, $NR^7$, $PR^7$, $PR^7R^8$, $R^7P=O$, $AsR^7$, $R^7As=O$, S=O, $SO_2$, Se=O, $SeO_2$, $BR^7$, $BR^7R^8$, $AlR^7$, $AlR^7R^8$, $R^7Bi=O$, or $BiR^7$;

$Y^{5a}$ $Y^{5b}$ $Y^{5c}$ $Y^{5d}$ each independently represents C or N;

$R^9$ represents hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof; or any two of $R^1$, $R^2$, $R^3$, $R^4$, $R^5$, $R^6$, $R^7$, $R^8$, and $R^9$ represent a covalent bond; and each n is independently an integer, valency permitting.

In one embodiment, the compound is represented by General Formula II, General Formula III, General Formula IV, General Formula V, General Formula VI, or General Formula VII:

General Formula II

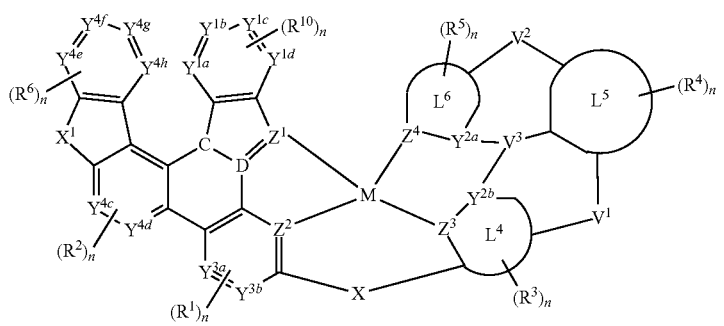

General Formula III

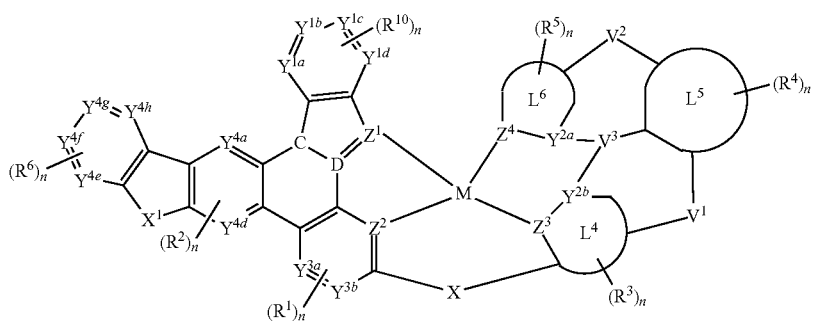

General Formula IV

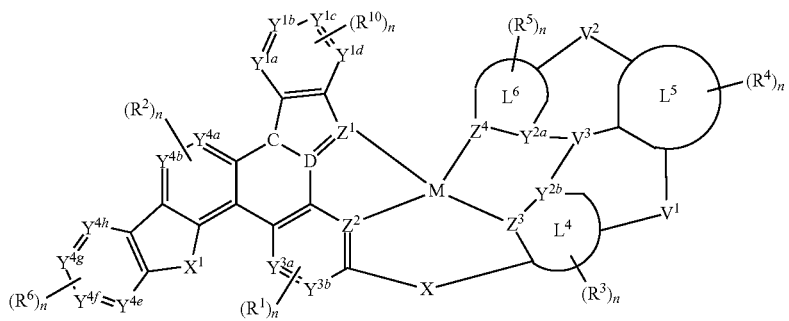

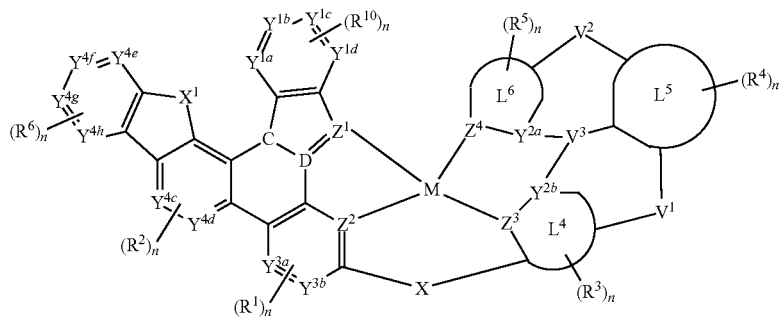

General Formula V

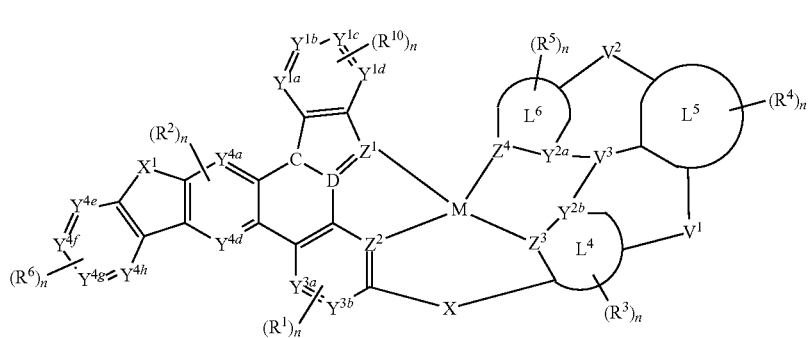

General Formula VI

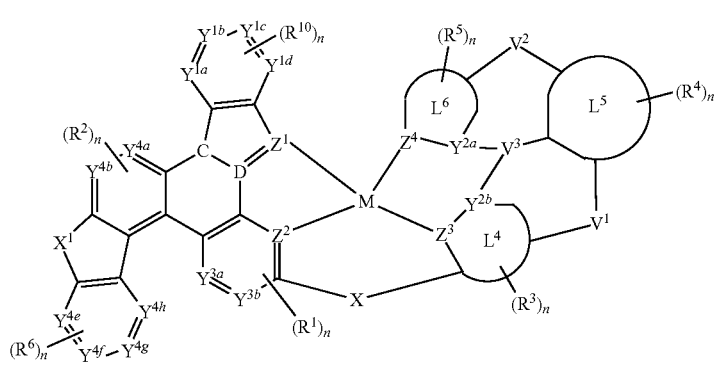

General Formula VII wherein:
$Y^{1a}, Y^{1b}, Y^{1c}, Y^{1d}, Y^{2a}, Y^{2b}, Y^{3a}, Y^{3b}, Y^{4a}, Y^{4b}, Y^{4c}, Y^{4d}, Y^{4e}, Y^{4f}, Y^{4g}$, and $Y^{4h}$ each independently represents C or N;

$Z^1$, $Z^2$, $Z^3$ and $Z^4$ each independently represents C or N;

C and D each independently represents C, N, O, or S;

X represents a single bond, O, S, Se, P=O, As=O, Bi=O, $CR^7R^8$, C=O, $SiR^7R^8$, $GeR^7R^8$, $NR^7$, $PR^7$, $PR^7R^8$, $R^7P$=O, $AsR^7$, $R^7As$=O, S=O, $SO_2$, Se=O, $SeO_2$, $BR^7$, $BR^7R^8$, $AlR^7$, $AlR^7R^8$, $R^7Bi$=O, or $BiR^7$, or X is not present, wherein when X is not present, no bond exists between $L^4$ and the ring comprising $Z^2$;

$X^1$ represents a single bond, O, S, Se, P=O, As=O, Bi=O, $CR^7R^8$, C=O, $SiR^7R^8$, $GeR^7R^8$, $NR^7$, $PR^7$, $PR^7R^8$, $R^7P$=O, $AsR^7$, $R^7As$=O, S=O, $SO_2$, Se=O, $SeO_2$, $BR^7$, $BR^7R^8$, $AlR^7$, $AlR^7R^8$, $R^7Bi$=O, or $BiR^7$;

each of $R^1$, $R^2$, $R^3$, $R^4$, $R^5$, $R^6$, $R^7$, and $R^8$ is independently absent or present as a single substituent or multiple substituents, valency permitting, and each of $R^1$, $R^3$, $R^4$, $R^5$, $R^6$ and $R^7$ independently represents deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof; or any two of $R^1$, $R^2$, $R^3$, $R^4$, $R^5$, $R^6$, $R^7$, and $R^8$ represent a covalent bond;

any two of $R^1$, $R^2$, $R^3$, $R^4$, $R^5$, $R^6$, $R^7$, $R^8$, X, and $X^1$ may together form a fused ring;

L⁴, L⁵ and L⁶ each independently represents a 5- to 10-membered aryl, heteroaryl, fused aryl, or fused heteroaryl;

L⁵ is present or absent;

V¹ and V² are independently present or absent; wherein each of V¹ and V², if present, independently represents a covalent bond, O, S, Se, P=O, As=O, Bi=O, CR⁷R⁸, C=O, SiR⁷R⁸, GeR⁷R⁸, NR⁷, PR⁷, PR⁷R⁸, R⁷P=O, AsR⁷, R⁷As=O, S=O, SO₂, Se=O, SeO₂, BR⁷, BR⁷R⁸, AlR⁷, AlR⁷R⁸, R⁷Bi=O, or BiR⁷; wherein when V¹ is not present, then L⁴ is not bound to L⁵; and when V² is not present, then L⁶ is not bound to L⁵;

V³ is present or absent, wherein V³, if present, represents a covalent bond, C, N, Si, O, S, Ge, P, As, Se, B, Al, or Bi, or if valency permits, each independently represents CR⁷, SiR⁷, GeR⁷, NR⁷, P=O, As=O, B, BR⁷, AlR⁷, Bi=O, CR⁷R⁸, C=O, SiR⁷R⁸, GeR⁷R⁸, NR⁷, PR⁷, PR⁷R⁸, R⁷P=O, AsR⁷, R⁷As=O, S=O, SO₂, Se=O, SeO₂, BR⁷, BR⁷R⁸, AlR⁷, AlR⁷R⁸, R⁷Bi=O, or BiR⁷; wherein when V³ is not present, then a Y²ᵃ is directly bound to Y²ᵇ; and each n is independently an integer, valency permitting.

In one embodiment, the compound is represented by General Formula VIII, General Formula IX, General Formula X, General Formula XI, General Formula XII, or General Formula XIII:

General Formula VIII

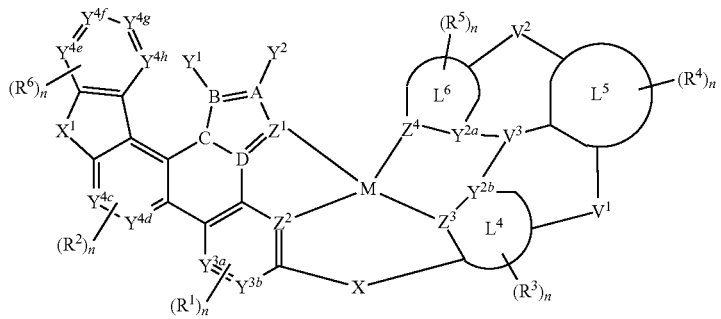

General Formula IX

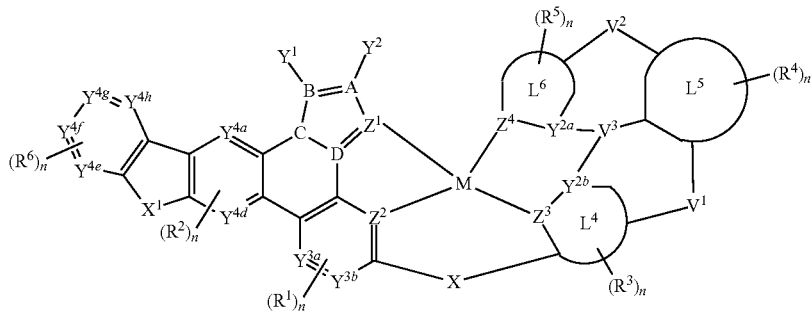

General Formula X

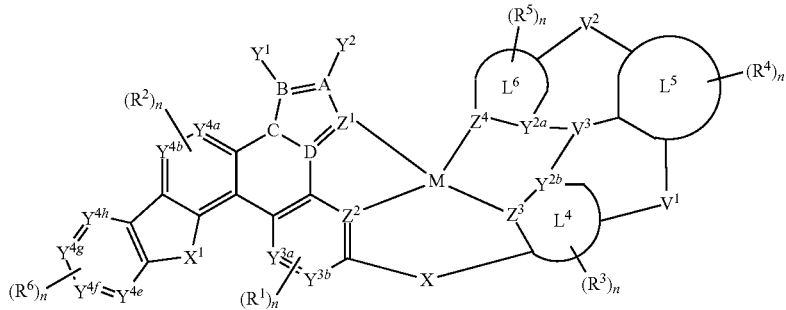

General Formula XI

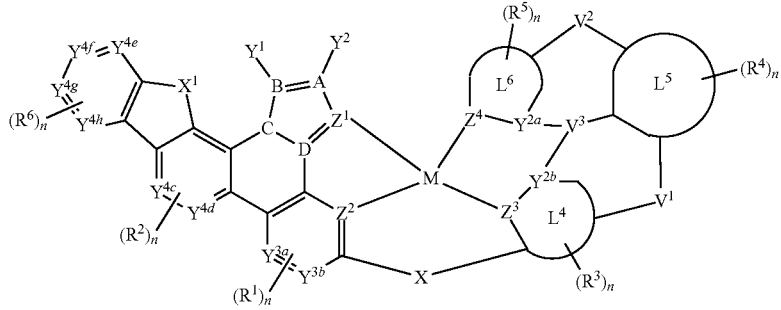

-continued

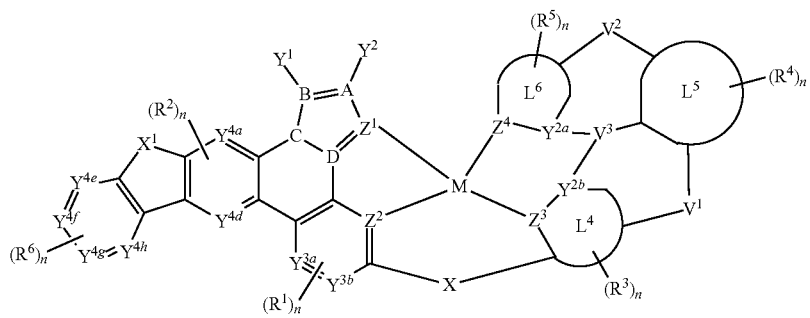

General Formula XII

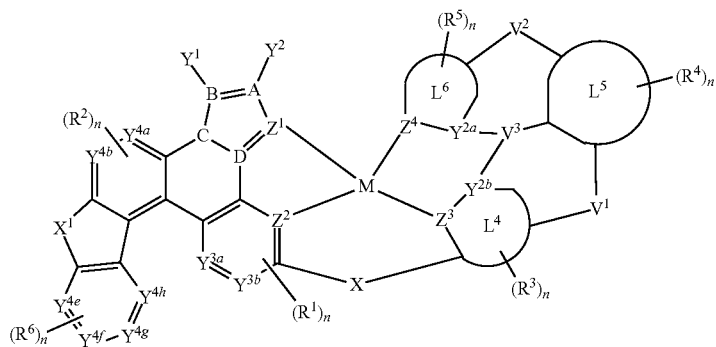

General Formula XIII wherein:
$Y^{2a}$, $Y^{2b}$, $Y^{3a}$, $Y^{3b}$, $Y^{4a}$, $Y^{4b}$, $Y^{4c}$, $Y^{4d}$, $Y^{4e}$, $Y^{4f}$, $Y^{4g}$, and $Y^{4h}$ each independently represents C or N;

$Z^1$, $Z^2$, $Z^3$ and $Z^4$ each independently represents C or N;

A, B, C and D each independently represents C, N, O, or S;

X represents a single bond, O, S, Se, P=O, As=O, Bi=O, $CR^7R^8$, C=O, $SiR^7R^8$, $GeR^7R^8$, $NR^7$, $PR^7$, $PR^7R^8$, $R^7P$=O, $AsR^7$, $R^7As$=O, S=O, $SO_2$, Se=O, $SeO_2$, $BR^7$, $BR^7R^8$, $AlR^7$, $AlR^7R^8$, $R^7Bi$=O, or $BiR^7$, or X is not present, wherein when X is not present, no bond exists between $L^4$ and the ring comprising $Z^2$;

$X^1$ represents a single bond, O, S, Se, P=O, As=O, Bi=O, $CR^7R^8$, C=O, $SiR^7R^8$, $GeR^7R^8$, $NR^7$, $PR^7$, $PR^7R^8$, $R^7P$=O, $AsR^7$, $R^7As$=O, S=O, $SO_2$, Se=O, $SeO_2$, $BR^7$, $BR^7R^8$, $AlR^7$, $AlR^7R^8$, $R^7Bi$=O, or $BiR^7$;

$Y^1$ and $Y^2$ each independently represents hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof; wherein $Y^1$ and $Y^2$ may optionally together form a fused aromatic or heteroaromatic ring;

each of $R^1$, $R^2$, $R^3$, $R^4$, $R^5$, $R^6$, $R^7$, and $R^8$ is independently absent or present as a single substituent or multiple substituents, valency permitting, and each of $R^1$, $R^3$, $R^4$, $R^5$, $R^6$, $R^7$, and $R^8$ independently represents deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof; or any two of $R^1$, $R^2$, $R^3$, $R^4$, $R^5$, $R^6$, $R^7$, and $R^8$ represent a covalent bond;

any two of $R^1$, $R^2$, $R^3$, $R^4$, $R^5$, $R^6$, $R^7$, $R^8$, X, and $X^1$ may together form a fused ring;

$L^4$, $L^5$ and $L^6$ each independently represents a 5- to 10-membered aryl, heteroaryl, fused aryl, or fused heteroaryl;

$L^5$ is present or absent;

$V^1$ and $V^2$ are independently present or absent; wherein each of $V^1$ and $V^2$, if present, independently represents a covalent bond, O, S, Se, P=O, As=O, Bi=O, $CR^7R^8$, C=O, $SiR^7R^8$, $GeR^7R^8$, $NR^7$, $PR^7$, $PR^7R^8$, $R^7P$=O, $AsR^7$, $R^7As$=O, S=O, $SO_2$, Se=O, $SeO_2$, $BR^7$, $BR^7R^8$, $AlR^7$, $AlR^7R^8$, $R^7Bi$=O, or $BiR^7$; wherein when $V^1$ is not present, then $L^4$ is not bound to $L^5$; and when $V^2$ is not present, then $L^6$ is not bound to $L^5$;

$V^3$ is present or absent, wherein $V^3$, if present, represents a covalent bond, C, N, Si, O, S, Ge, P, As, Se, B, Al, or Bi, or if valency permits, each independently represents $CR^7$, $SiR^7$, $GeR^7$, $NR^7$, P=O, As=O, B, $BR^7$, $AlR^7$, Bi=O, $CR^7R^8$, C=O, $SiR^7R^8$, $GeR^7R^8$, $NR^7$, $PR^7$, $PR^7R^8$, $R^7P$=O, $AsR^7$, $R^7As$=O, S=O, $SO_2$, Se=O, $SeO_2$, $BR^7$, $BR^7R^8$, $AlR^7$, $AlR^7R^8$, $R^7Bi$=O, or $BiR^7$; wherein when $V^3$ is not present, then a $Y^{2a}$ is directly bound to $Y^{2b}$; and each n is independently an integer, valency permitting.

In one embodiment, the compound is represented by General Formula XIV, General Formula XV, General Formula XVI, or General Formula XVII:
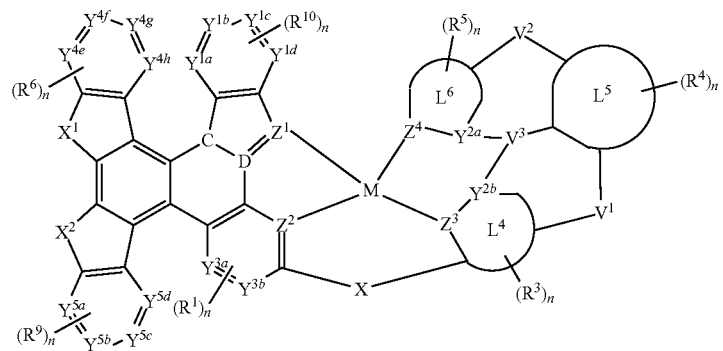
General Formula XIV
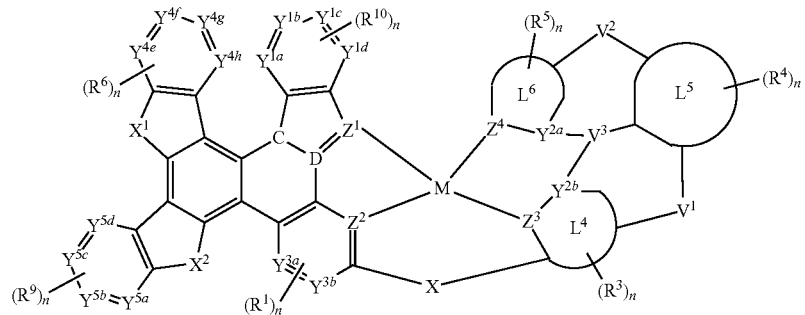
General Formula XV
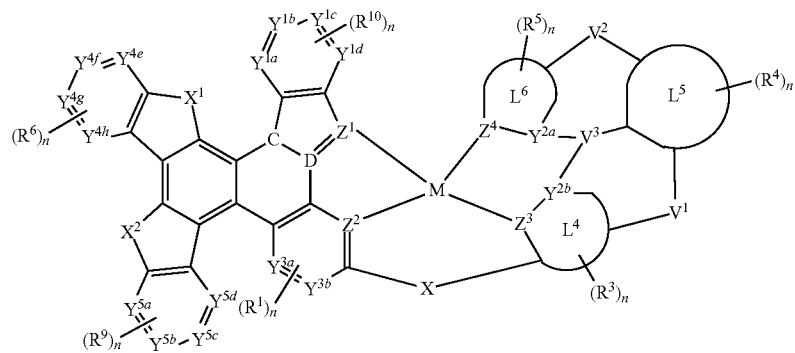
General Formula XVI
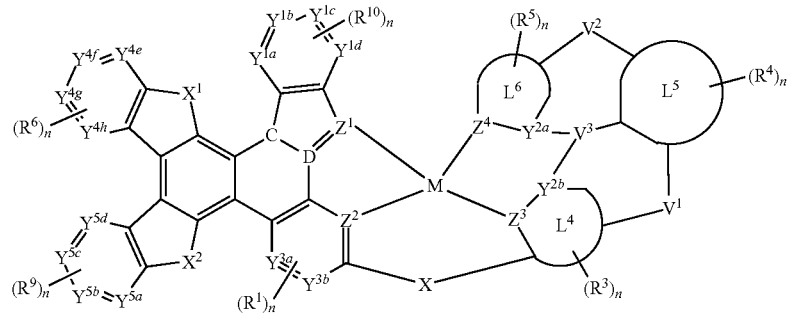
General Formula XVII wherein:
$Y^{1a}, Y^{1b}, Y^{1c}, Y^{1d}, Y^{2a}, Y^{2b}, Y^{3a}, Y^{3b}, Y^{4e}, Y^{4f}, Y^{4g}, Y^{4h}, Y^{5a}, Y^{5b}, Y^{5c}$ and $Y^{5d}$ each independently represents C or N;

$Z^1, Z^2, Z^3$ and $Z^4$ each independently represents C or N;

C and D each independently represents C, N, O, or S;

X represents a single bond, O, S, Se, P=O, As=O, Bi=O, $CR^7R^8$, C=O, $SiR^7R^8$, $GeR^7R^8$, $NR^7$, $PR^7$, $PR^7R^8$, $R^7P$=O, $AsR^7$, $R^7As$=O, S=O, $SO_2$, Se=O, $SeO_2$, $BR^7$, $BR^7R^8$, $AlR^7$, $AlR^7R^8$, $R^7Bi$=O, or $BiR^7$, or X is not present, wherein when X is not present, no bond exists between $L^4$ and the ring comprising $Z^2$;

$X^1$ and $X^2$ each independently represents a single bond, O, S, Se, P=O, As=O, Bi=O, $CR^7R^8$, C=O, $SiR^7R^8$, $GeR^7R^8$, $NR^7$, $PR^7$, $PR^7R^8$, $R^7P$=O, $AsR^7$, $R^7As$=O, S=O, $SO_2$, Se=O, $SeO_2$, $BR^7$, $BR^7R^8$, $AlR^7$, $AlR^7R^8$, $R^7Bi$=O, or $BiR^7$;

each of $R^1, R^2, R^3, R^4, R^5, R^6, R^7, R^8, R^9$, and $R^{10}$ is independently absent or present as a single substituent or multiple substituents, valency permitting, and each of $R^1, R^2, R^3, R^4, R^5, R^6, R^7, R^8, R^9$, and $R^{10}$ independently represents hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof, or any two of $R^1, R^2, R^3, R^4, R^5, R^6, R^7, R^8, R^9$, and $R^{10}$ represent a covalent bond;

any two of $R^1, R^2, R^3, R^4, R^5, R^6, R^7, R^8, R^9, R^{10}, X, X^1$, and $X^2$ may together form a fused ring;

$L^4, L^5$ and $L^6$ each independently represents a 5- to 10-membered aryl, heteroaryl, fused aryl, or fused heteroaryl;

$L^5$ is present or absent;

$V^1$ and $V^2$ are independently present or absent; wherein each of $V^1$ and $V^2$, if present, independently represents a covalent bond, O, S, Se, P=O, As=O, Bi=O, $CR^7R^8$, C=O, $SiR^7R^8$, $GeR^7R^8$, $NR^7$, $PR^7$, $PR^7R^8$, $R^7P$=O, $AsR^7$, $R^7As$=O, S=O, $SO_2$, Se=O, $SeO_2$, $BR^7$, $BR^7R^8$, $AlR^7$, $AlR^7R^8$, $R^7Bi$=O, or $BiR^7$; wherein when $V^1$ is not present, then $L^4$ is not bound to $L^5$; and when $V^2$ is not present, then $L^6$ is not bound to $L^5$;

$V^3$ is present or absent, wherein $V^3$, if present, represents a covalent bond, C, N, Si, O, S, Ge, P, As, Se, B, Al, or Bi, or if valency permits, each independently represents $CR^7$, $SiR^7$, $GeR^7$, $NR^7$, P=O, As=O, B, $BR^7$, $AlR^7$, Bi=O, $CR^7R^8$, C=O, $SiR^7R^8$, $GeR^7R^8$, $NR^7$, $PR^7$, $PR^7R^8$, $R^7P$=O, $AsR^7$, $R^7As$=O, S=O, $SO_2$, Se=O, $SeO_2$, $BR^7$, $BR^7R^8$, $AlR^7$, $AlR^7R^8$, $R^7Bi$=O, or $BiR^7$; wherein when $V^3$ is not present, then a $Y^{2a}$ is directly bound to $Y^{2b}$; and each n is independently an integer, valency permitting.

In one embodiment, the compound is represented by General Formula XVIII, General Formula XIX, General Formula XX, or General Formula XXI.

General Formula XVIII

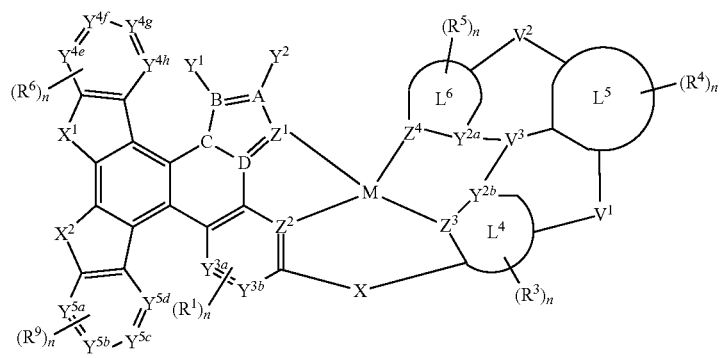

General Formula XIX

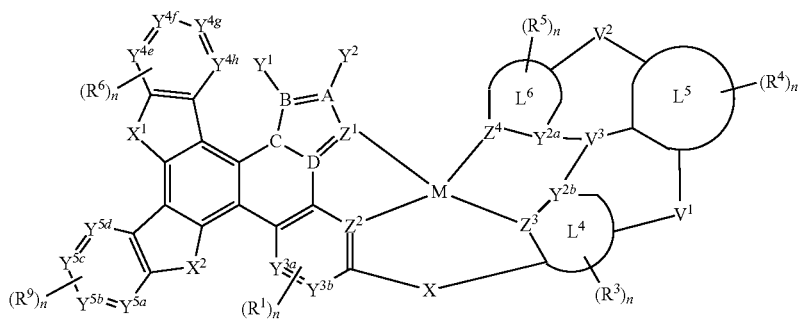

General Formula XX

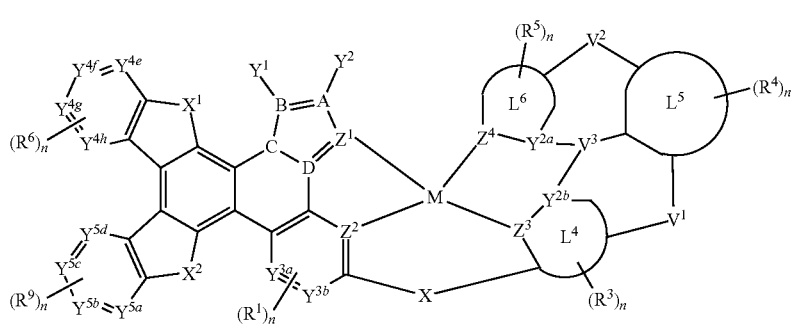

General Formula XXI

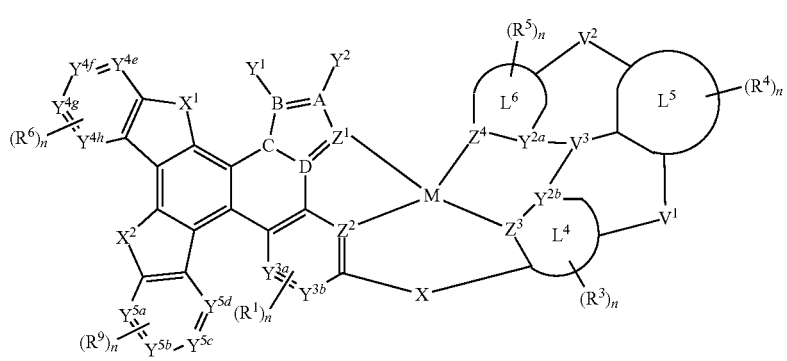

wherein:
$Y^{2a}$, $Y^{2b}$, $Y^{3a}$, $Y^{3b}$, $Y^{4e}$, $Y^{4f}$, $Y^{4g}$, $Y^{4h}$, $Y^{5a}$, $Y^{5b}$, $Y^{5c}$, and $Y^{5d}$ each independently represents C or N;

$Z^1$, $Z^2$, $Z^3$ and $Z^4$ each independently represents C or N;

A, B, C and D each independently represents C, N, O, or S;

X represents a single bond, O, S, Se, P=O, As=O, Bi=O, $CR^7R^8$, C=O, $SiR^7R^8$, $GeR^7R^8$, $NR^7$, $PR^7$, $PR^7R^8$, $R^7P$=O, $AsR^7$, $R^7As$=O, S=O, $SO_2$, Se=O, $SeO_2$, $BR^7$, $BR^7R^8$, $AlR^7$, $AlR^7R^8$, $R^7Bi$=O, or $BiR^7$, or X is not present, wherein when X is not present, no bond exists between $L^4$ and the ring comprising $Z^2$;

$X^1$ and $X^2$ each independently represents a single bond, O, S, Se, P=O, As=O, Bi=O, $CR^7R^8$, C=O, $SiR^7R^8$, $GeR^7R^8$, $NR^7$, $PR^7$, $PR^7R^8$, $R^7P$=O, $AsR^7$, $R^7As$=O, S=O, $SO_2$, Se=O, $SeO_2$, $BR^7$, $BR^7R^8$, $AlR^7$, $AlR^7R^8$, $R^7Bi$=O, or $BiR^7$;

$Y^1$ and $Y^2$ each independently represents hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof, wherein $Y^1$ and $Y^2$ may optionally together form a fused aromatic or heteroaromatic ring;

each of $R^1$, $R^2$, $R^3$, $R^4$, $R^5$, $R^6$, $R^7$, $R^8$, and $R^9$ is independently absent or present as a single substituent or multiple substituents, valency permitting, and each of $R^1$, $R^2$, $R^3$, $R^4$, $R^5$, $R^6$, $R^7$, $R^8$, and $R^9$ independently represents hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof, or any two of $R^1$, $R^2$, $R^3$, $R^4$, $R^5$, $R^6$, $R^7$, $R^8$, and $R^9$ represent a covalent bond;

any two of $R^1$, $R^2$, $R^3$, $R^4$, $R^5$, $R^6$, $R^7$, $R^8$, $R^9$, X, $X^1$, and $X^2$ may together form a fused ring;

$L^4$, $L^5$ and $L^6$ each independently represents a 5- to 10-membered aryl, heteroaryl, fused aryl, or fused heteroaryl;

$L^5$ is present or absent;

$V^1$ and $V^2$ are independently present or absent; wherein each of $V^1$ and $V^2$, if present, independently represents a covalent bond, O, S, Se, P=O, As=O, Bi=O, $CR^7R^8$, C=O, $SiR^7R^8$, $GeR^7R^8$, $NR^7$, $PR^7$, $PR^7R^8$, $R^7P$=O, $AsR^7$, $R^7As$=O, S=O, $SO_2$, Se=O, $SeO_2$, $BR^7$, $BR^7R^8$, $AlR^7$, $AlR^7R^8$, $R^7Bi$=O, or $BiR^7$; wherein when $V^1$ is not present, then $L^4$ is not bound to $L^5$; and when $V^2$ is not present, then $L^6$ is not bound to $L^5$;

$V^3$ is present or absent, wherein $V^3$, if present, represents a covalent bond, C, N, Si, O, S, Ge, P, As, Se, B, Al, or Bi, or if valency permits, each independently represents $CR^7$, $SiR^7$, $GeR^7$, $NR^7$, P=O, As=O, B, $BR^7$, $AlR^7$, Bi=O, $CR^7R^8$, C=O, $SiR^7R^8$, $GeR^7R^8$, $NR^7$, $PR^7$, $PR^7R^8$, $R^7P$=O, $AsR^7$, $R^7As$=O, S=O, $SO_2$, Se=O, $SeO_2$, $BR^7$, $BR^7R^8$, $AlR^7$, $AlR^7R^8$, $R^7Bi$=O, or $BiR^7$; wherein when $V^3$ is not present, then a $Y^{2a}$ is directly bound to $Y^{2b}$; and each n is independently an integer, valency permitting.

In one embodiment,
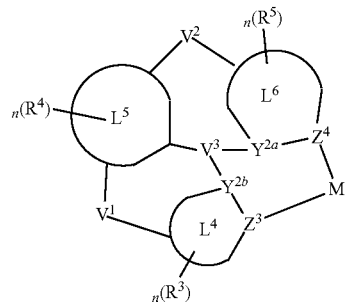
is represented by one of the following structures:
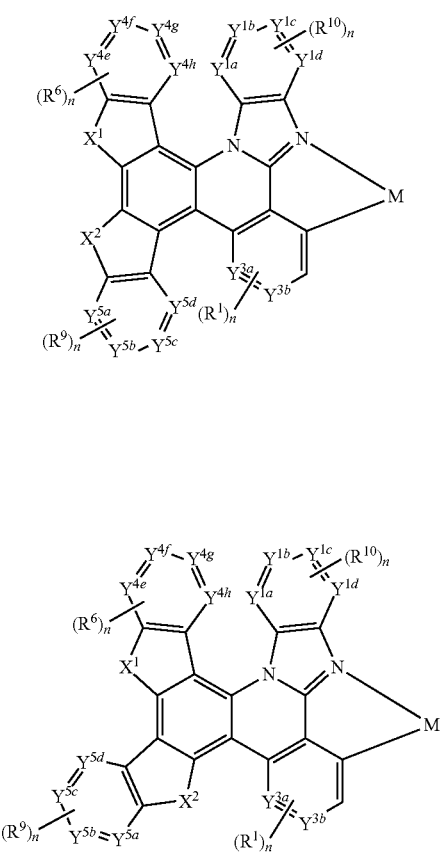
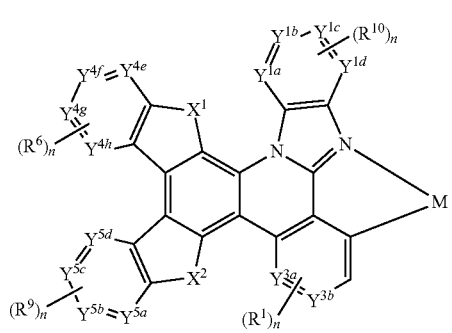
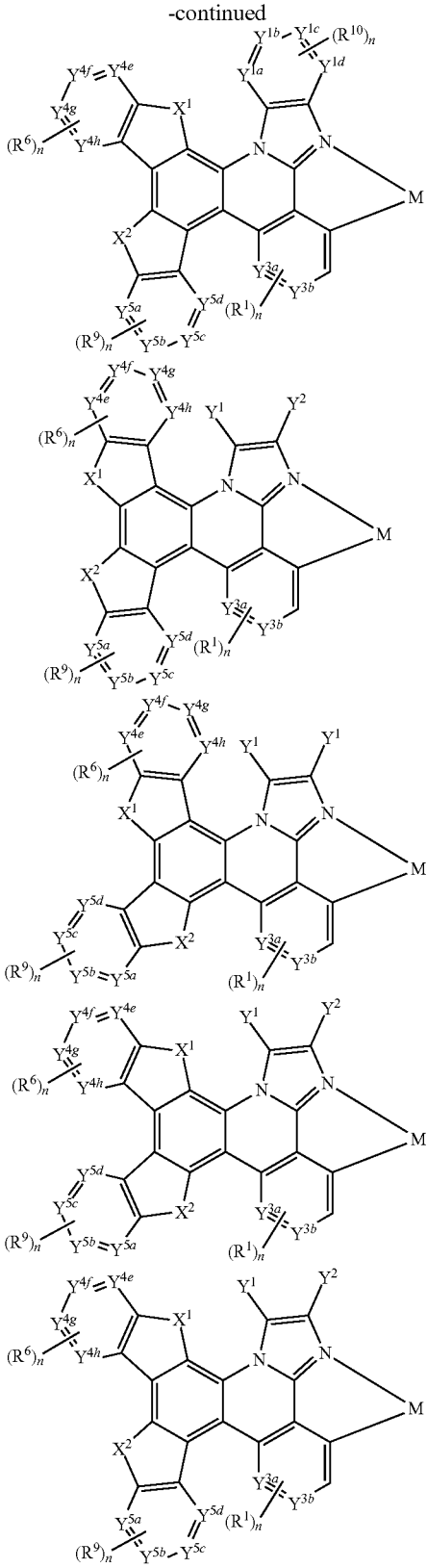
wherein:
M represents Pt(II) or Pd(II);
$Y^{1a}$, $Y^{1b}$, $Y^{1c}$, $Y^{1d}$, $Y^{3a}$, $Y^{3b}$, $Y^{4e}$, $Y^{4f}$, $Y^{4g}$, $Y^{4h}$, $Y^{5a}$, $Y^{5b}$, $Y^{5c}$, and $Y^{5d}$ each independently represents C or N;

$X^1$ and $X^2$ each independently represents a single bond, O, S, Se, P=O, As=O, Bi=O, $CR^7R^8$, C=O, $SiR^7R^8$, $GeR^7R^8$, $NR^7$, $PR^7$, $PR^7R^8$, $R^7P$=O, $AsR^7$, $R^7As$=O, S=O, $SO_2$, Se=O, $SeO_2$, $BR^7$, $BR^7R^8$, $AlR^7$, $AlR^7R^8$, $R^7Bi$=O, or $BiR^7$;

each of $R^1$, $R^6$, $R^7$, $R^8$, $R^9$, and $R^{10}$ is independently absent or present as a single substituent or multiple substituents, valency permitting, and each of $R^1$, $R^6$, $R^9$, and $R^{10}$ independently represents hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof; or any two of $R^1$, $R^6$, $R^9$, and $R^{10}$ represent a covalent bond;

any two of $R^1$, $R^6$, $R^9$, and $R^{10}$ may together form a fused ring;

each n is independently an integer, valency permitting.

In one embodiment,

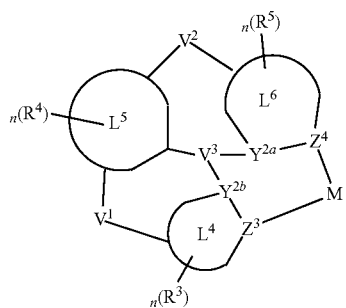

is represented by one of the following structures:

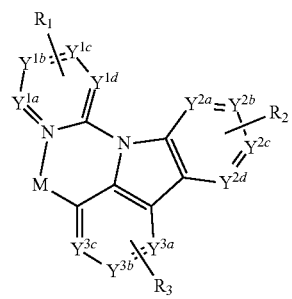

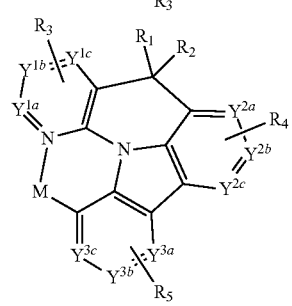

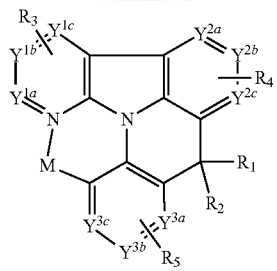

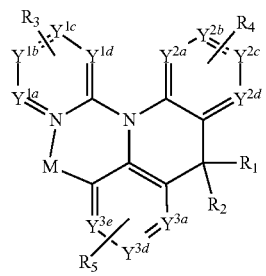

wherein:

$Y^{1a}$, $Y^{1b}$, $Y^{1c}$, $Y^{1d}$, $Y^{2a}$, $Y^{2b}$, $Y^{2c}$, $Y^{2d}$, $Y^{3a}$, $Y^{3b}$ and $Y^{3c}$ each independently represents C or N;

each of $R^1$, $R^2$, $R^3$, $R^4$, $R^5$ is independently absent or present as a single substituent or multiple substituents, valency permitting, and each of $R^1$, $R^3$, $R^4$, $R^5$, $R^6$ and $R^7$ independently represents deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof.

In one embodiment,

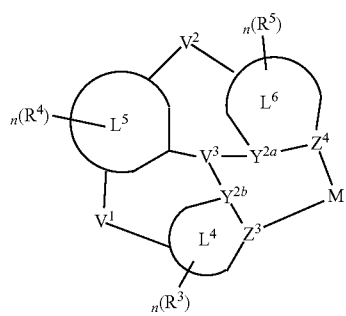

is represented by one of the following structures:

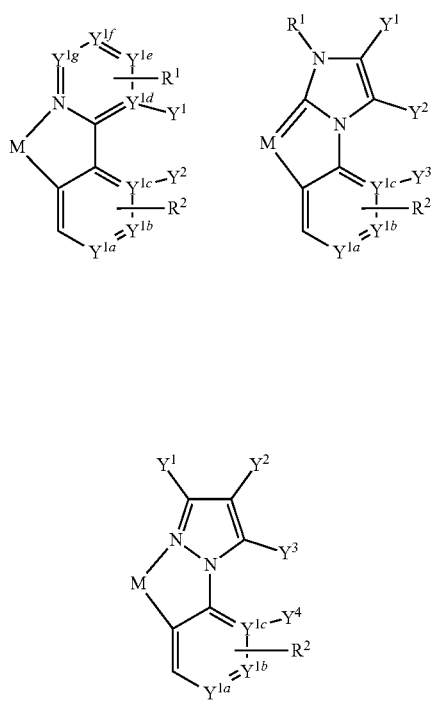

wherein:
- $Y^{1a}$, $Y^{1b}$, $Y^{1c}$, $Y^{1d}$, $Y^{1e}$, $Y^{1f}$, and $Y^{1g}$ each independently represents C or N;
- each of $R^1$ and $R^2$ is independently absent or present as a single substituent or multiple substituents, valency permitting, and each of $R^1$ and $R^2$ independently represents deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxy carbonylamino, sulfonylamino, sulfamoyl, carbamoyl, alkylthio, ureido, phosphoramide, silyl, polymeric; or any conjugate or combination thereof; and any two of $R^1$ and $R^2$ may together join to form a ring;
- each of $Y^1$, $Y^2$, $Y^3$ and $Y^4$ is independently absent or present, and each of $Y^1$, $Y^2$, $Y^3$ and $Y^4$ independently represents hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof; and
- any two of $Y^1$, $Y^2$, $Y^3$, and $Y^4$ may together join to form a ring.

In one embodiment, the compound is selected from following structures:

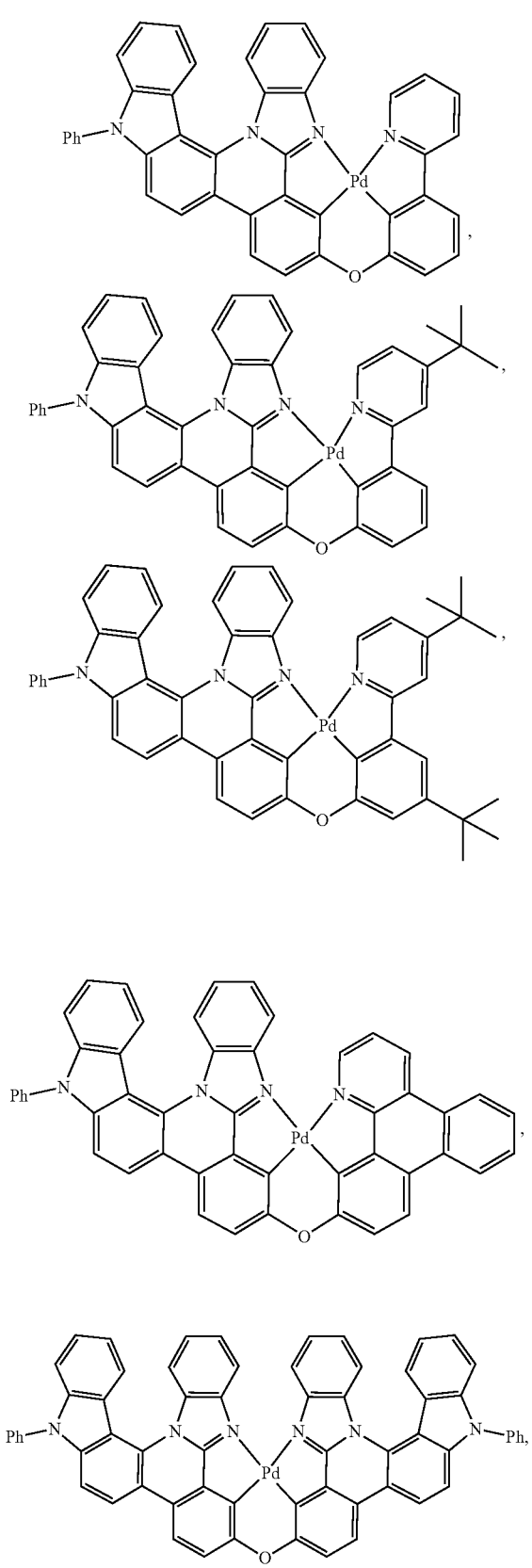

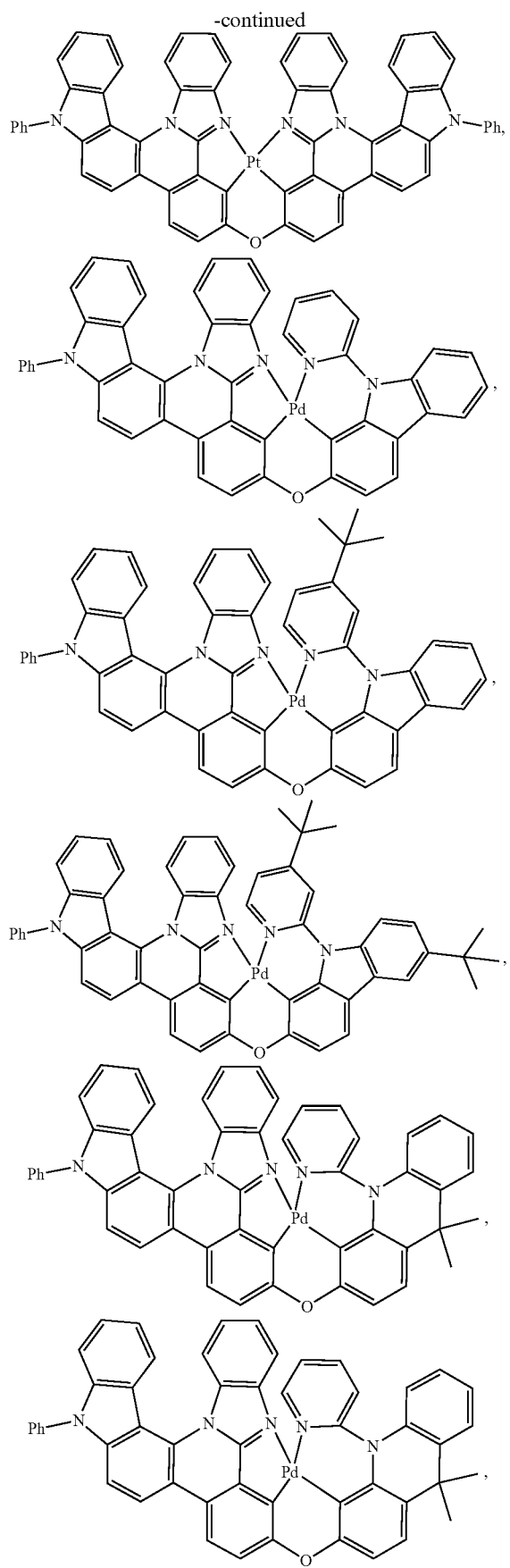
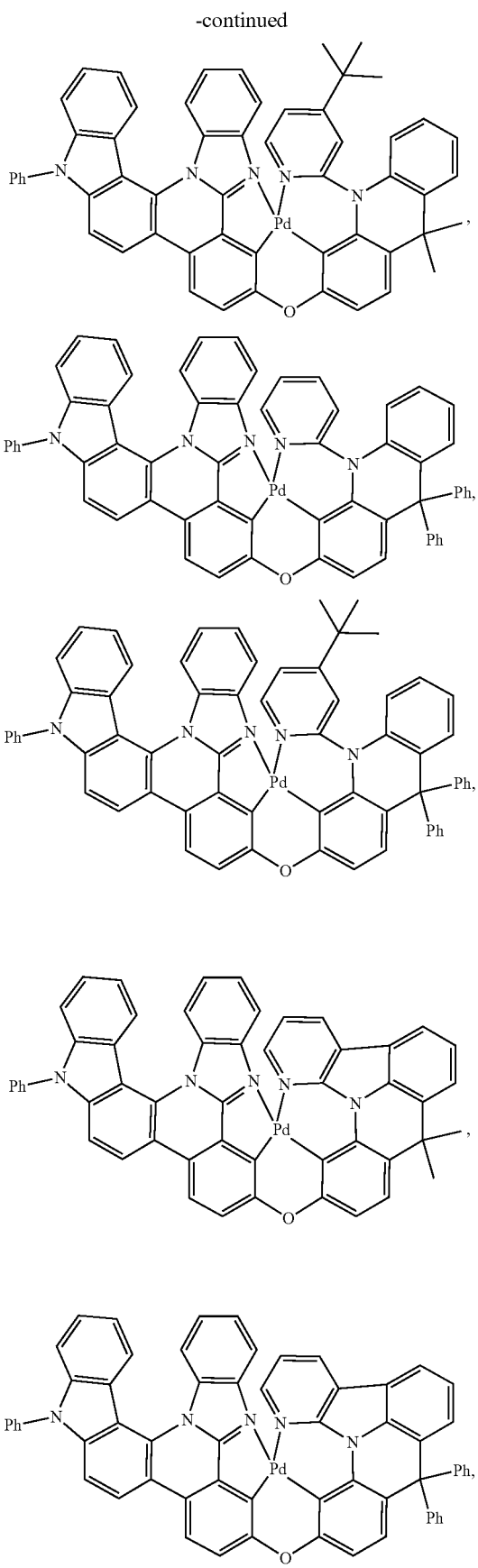

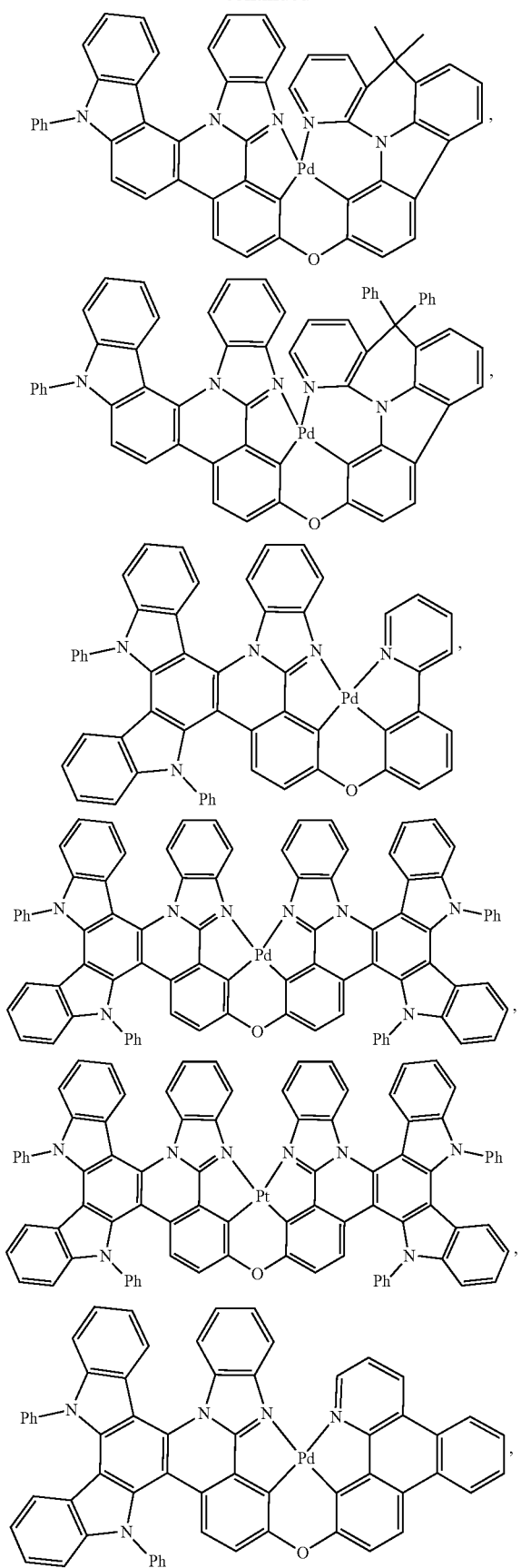

37
-continued
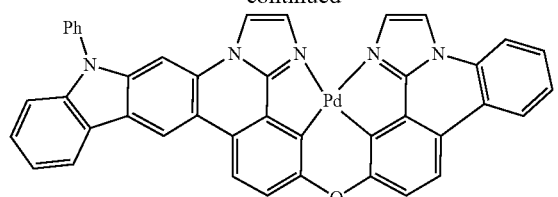
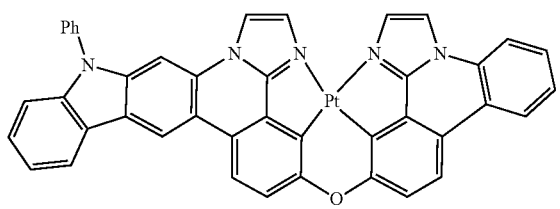
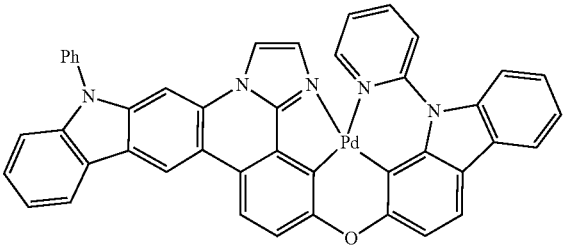
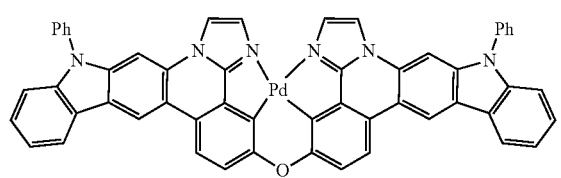
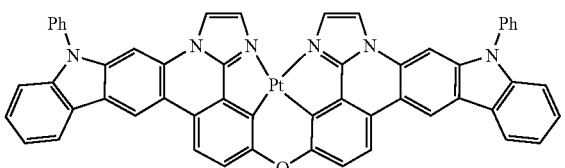
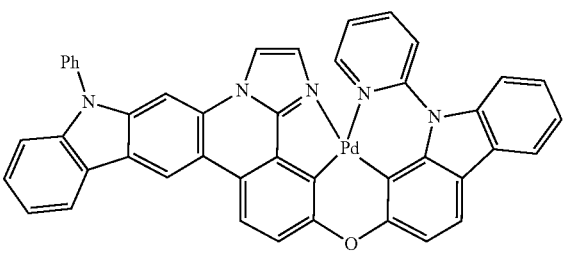
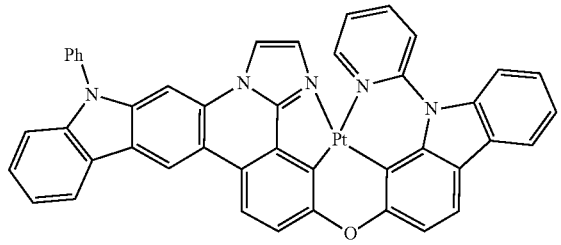
38
-continued
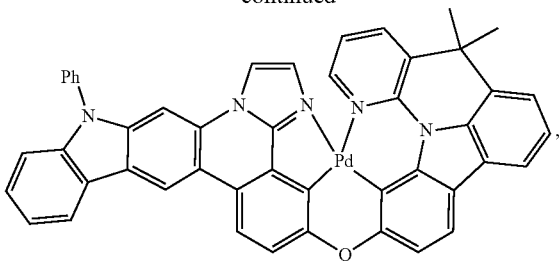
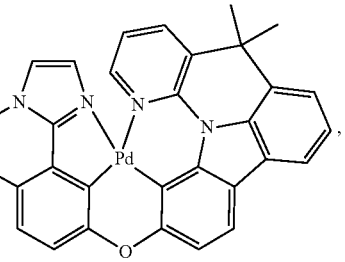
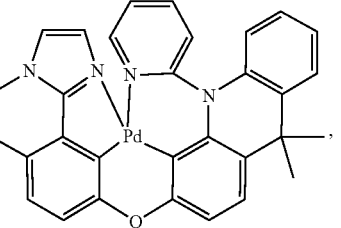
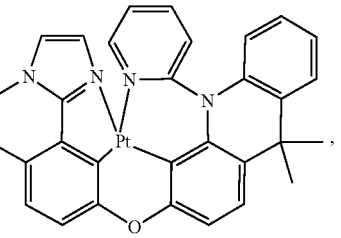
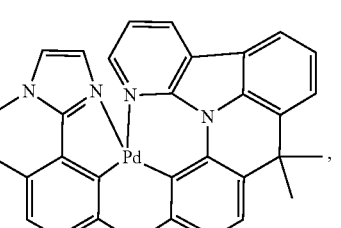
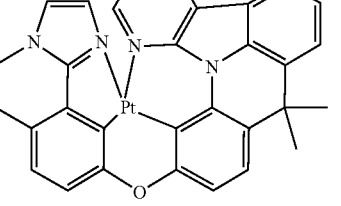

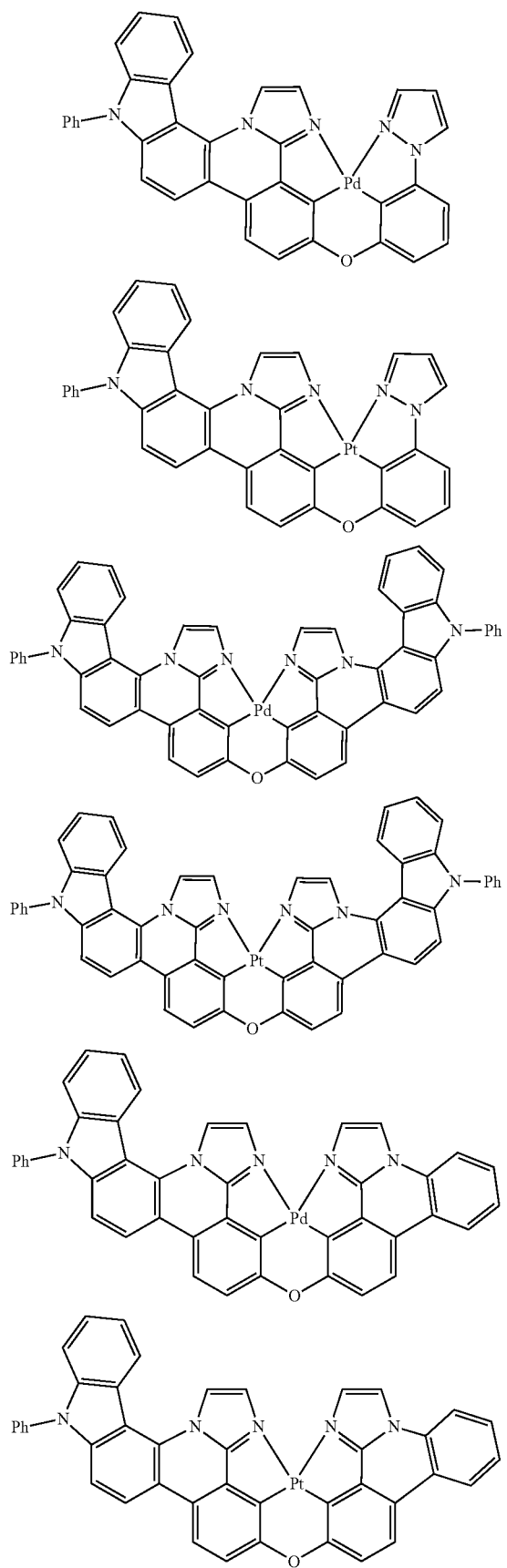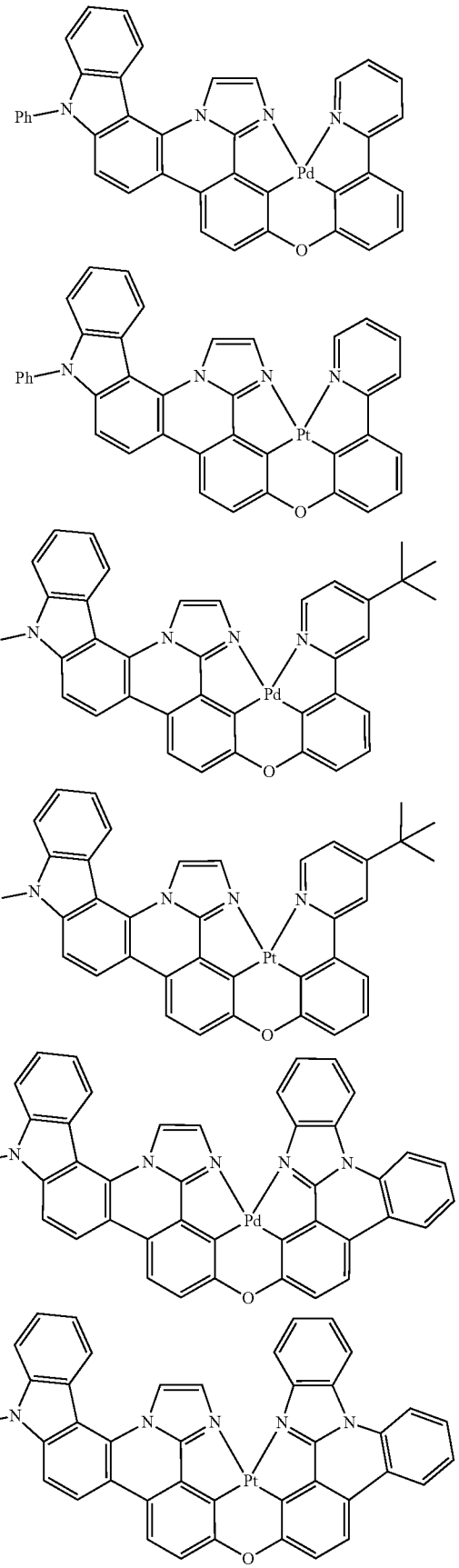

41
-continued
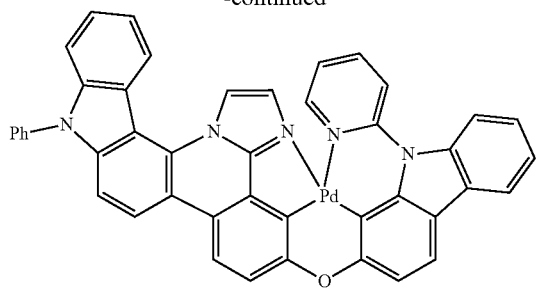
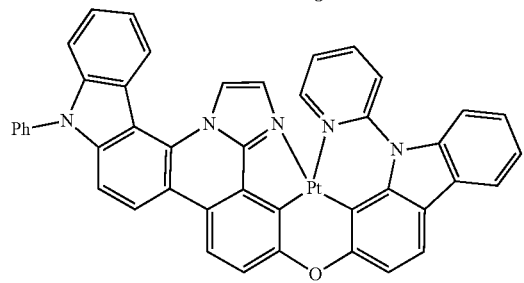
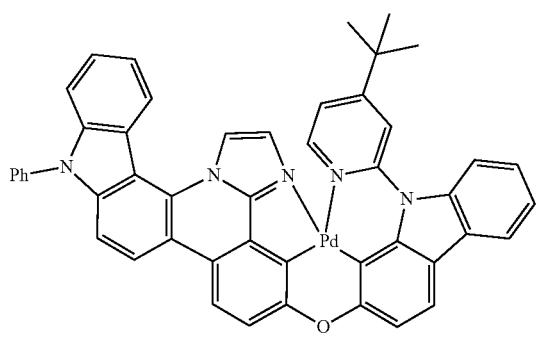
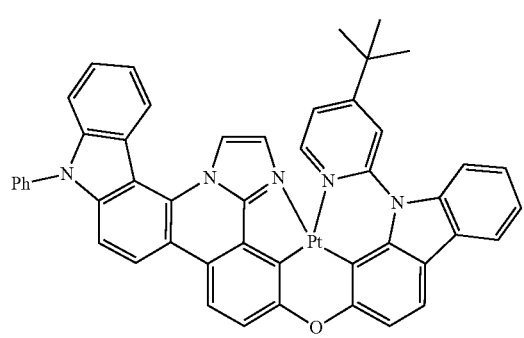
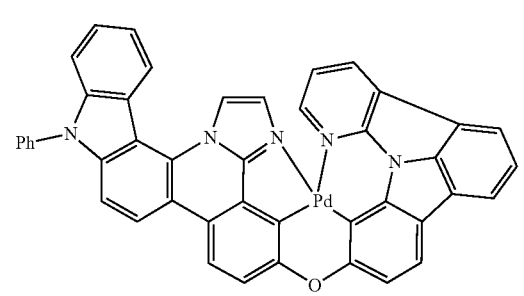
42
-continued
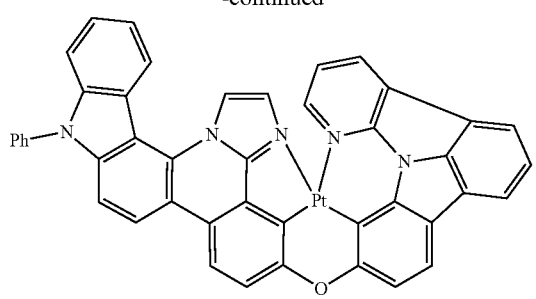
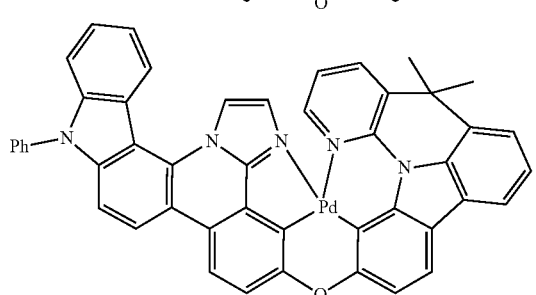
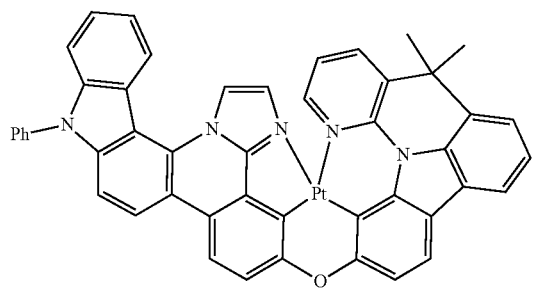
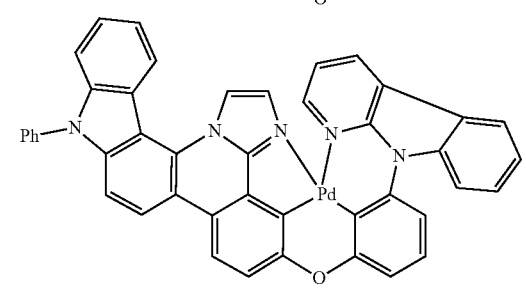
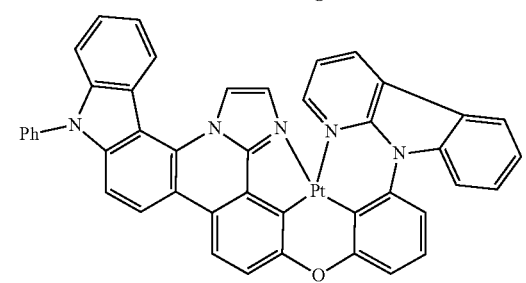
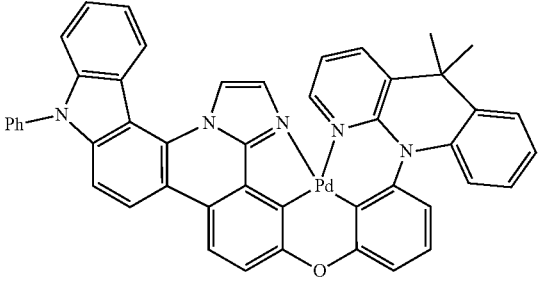

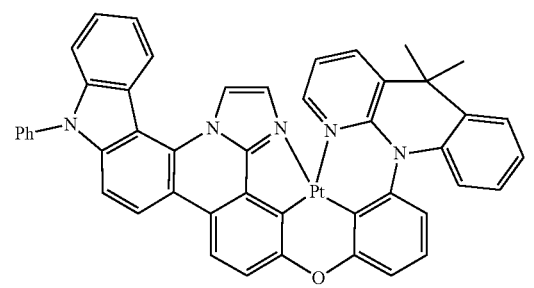
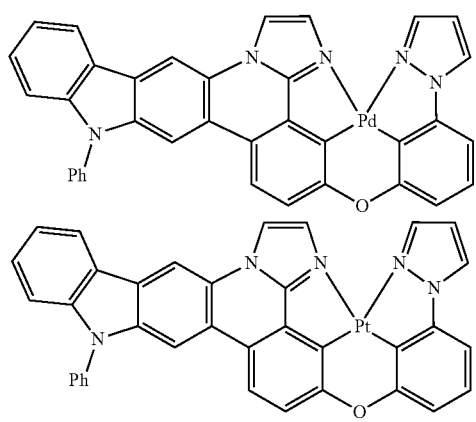
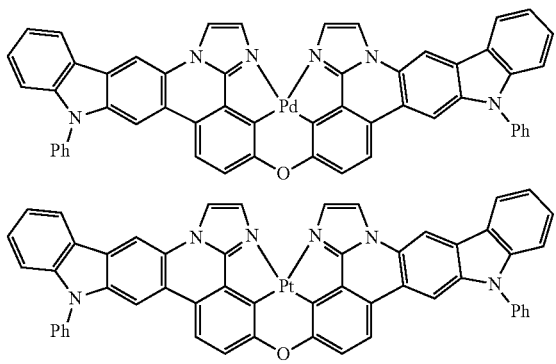
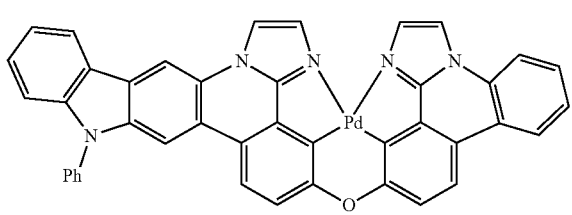
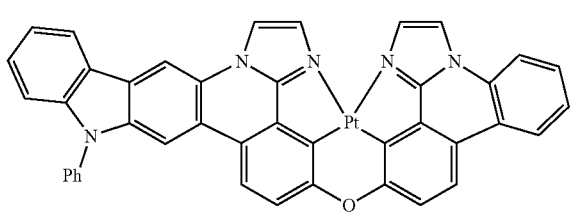
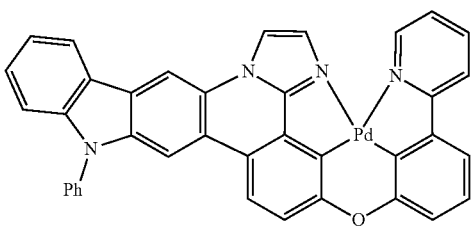
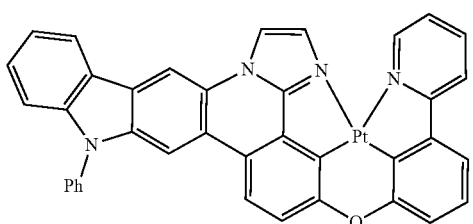
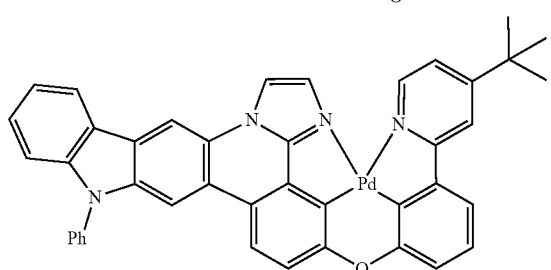
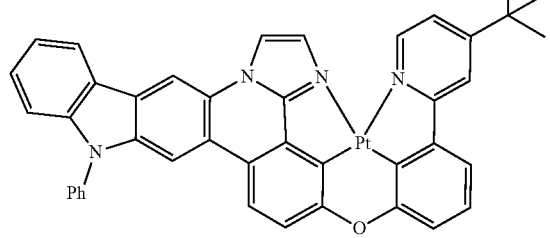
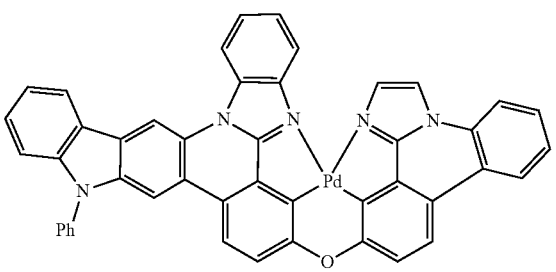
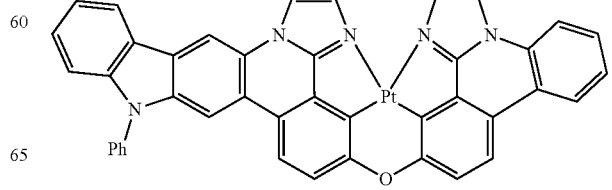

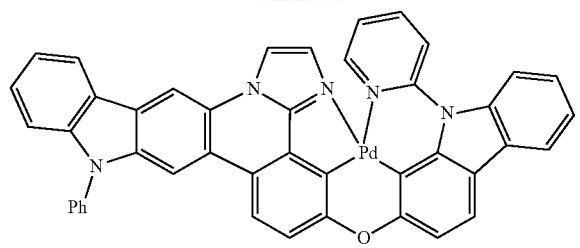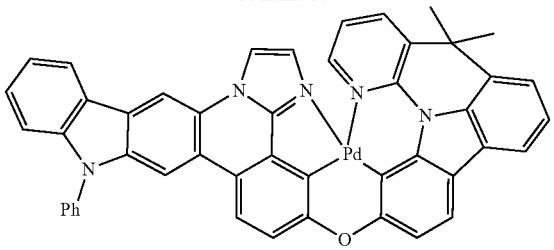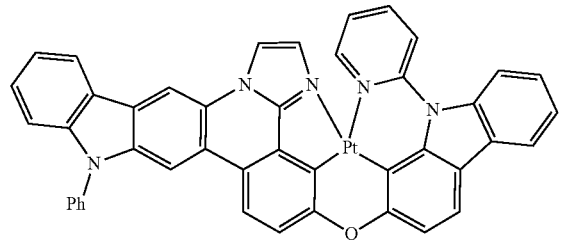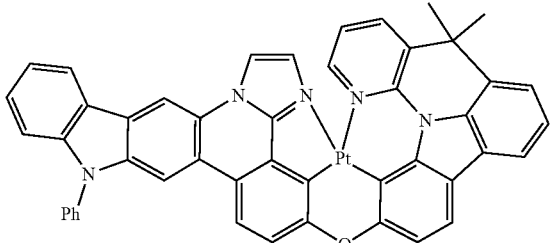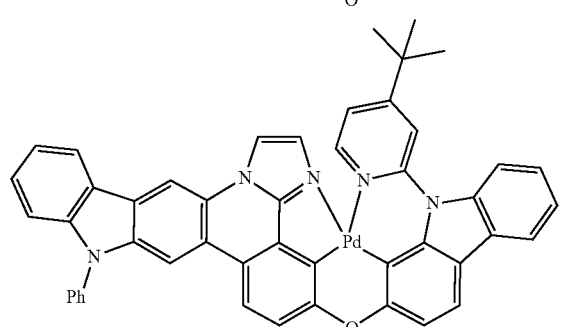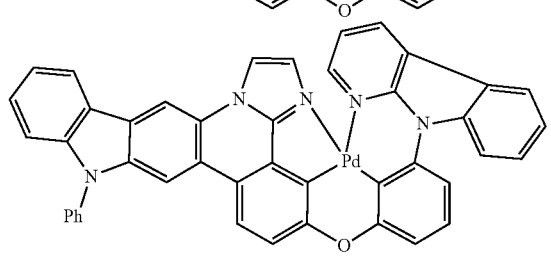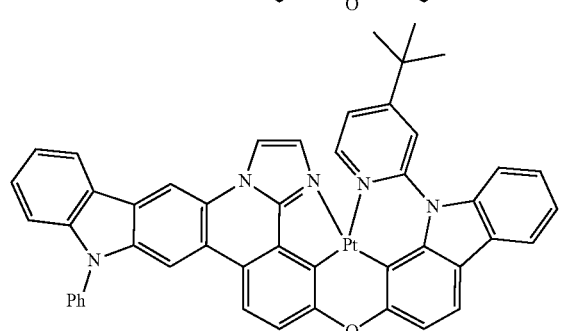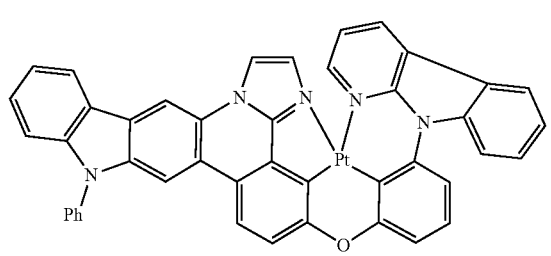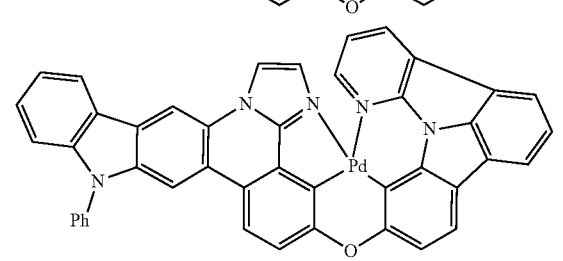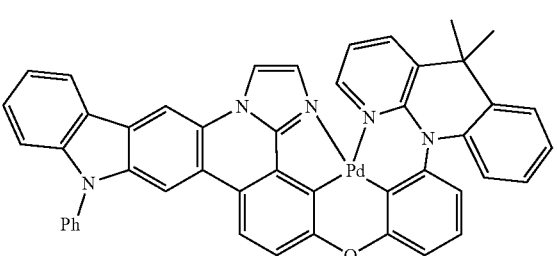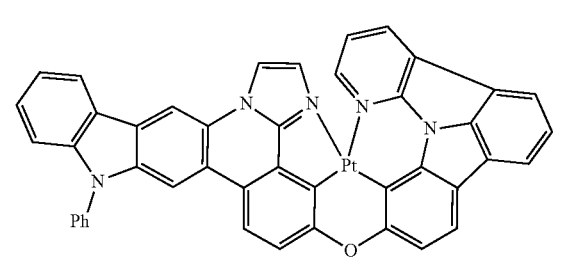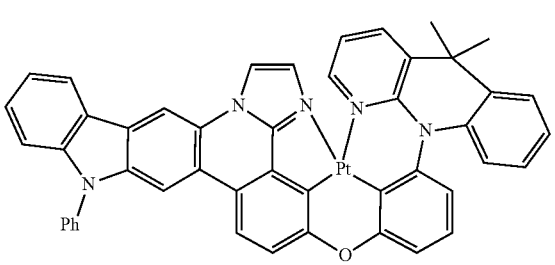

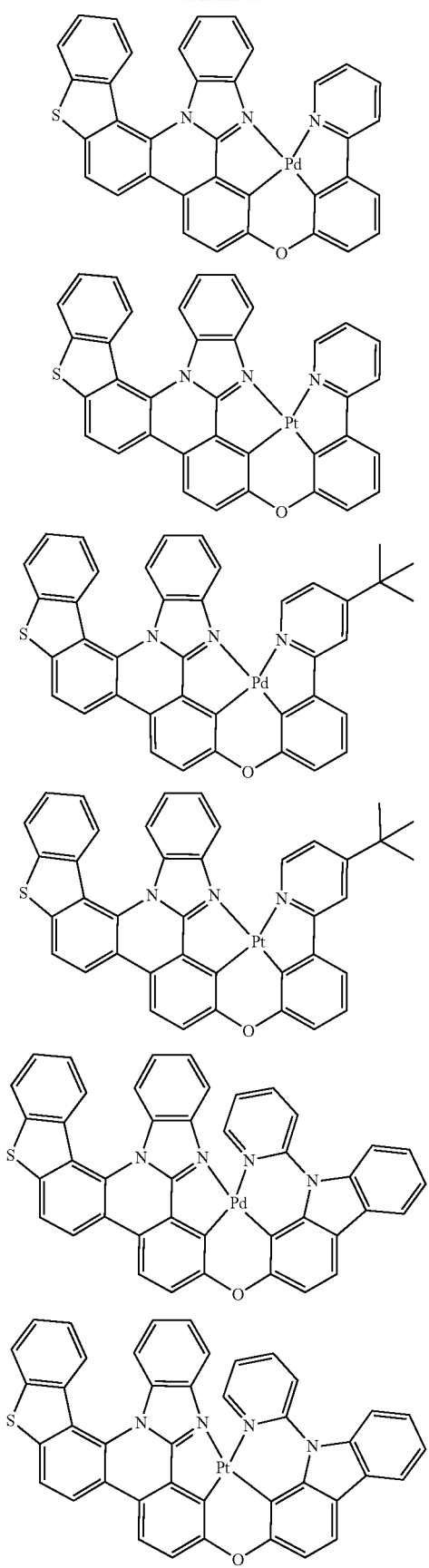
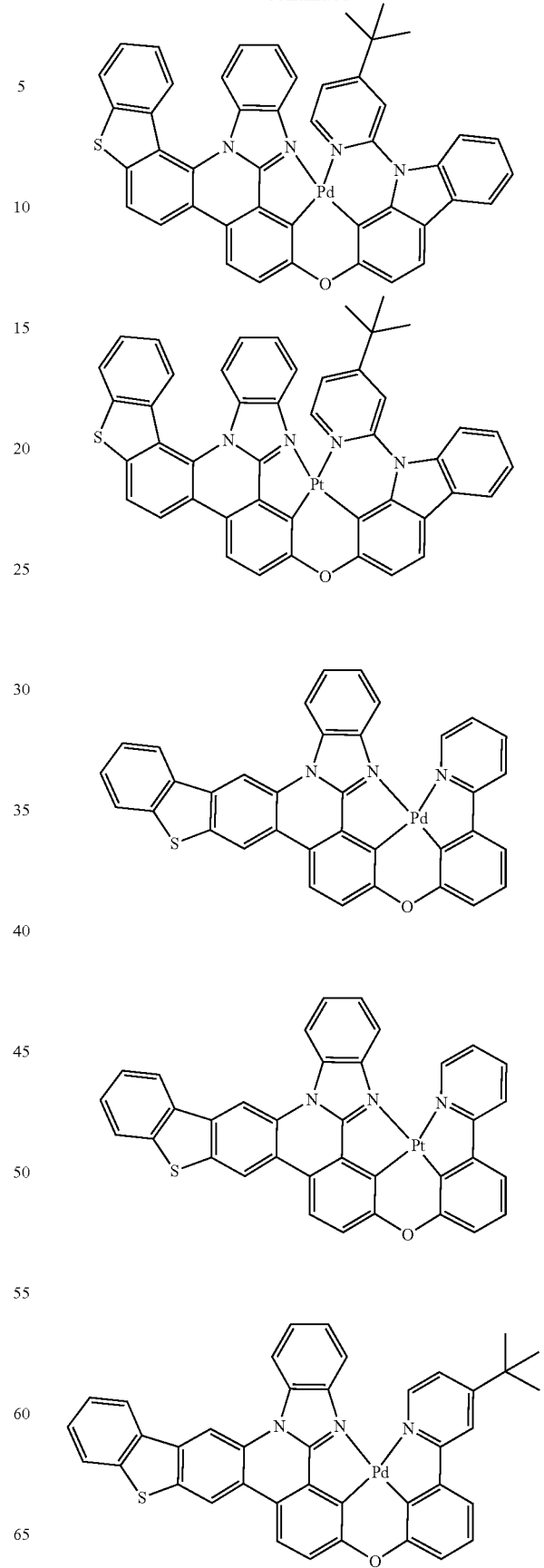

-continued
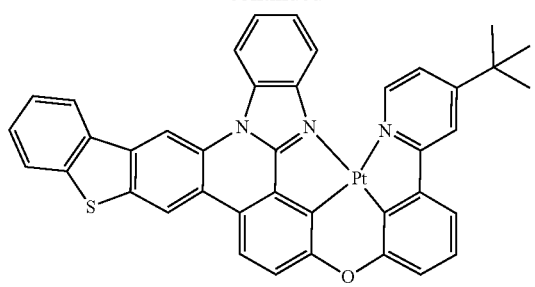
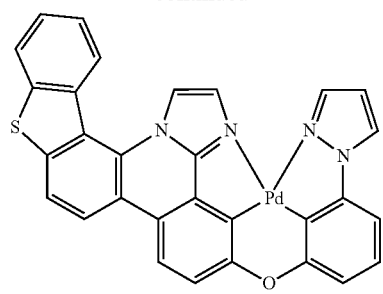
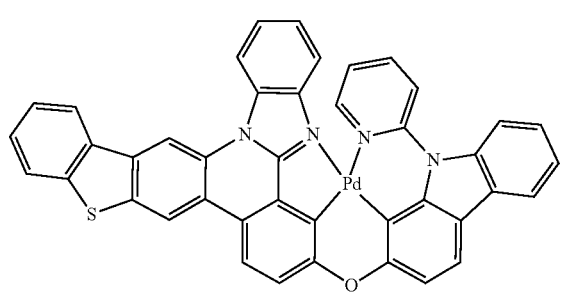
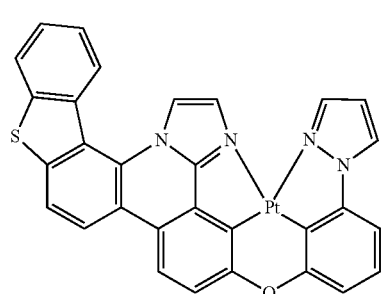
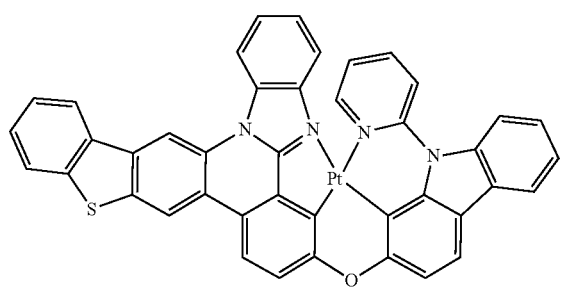
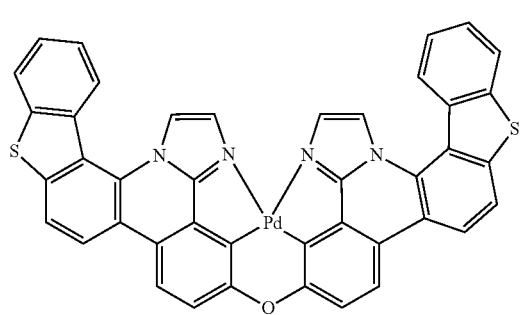
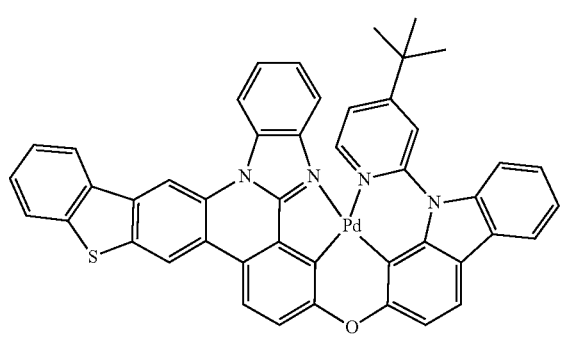
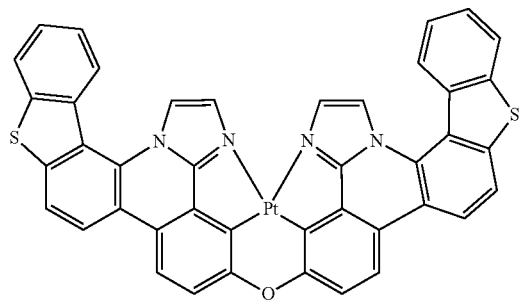
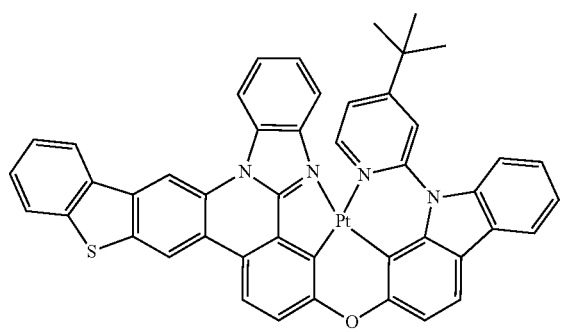
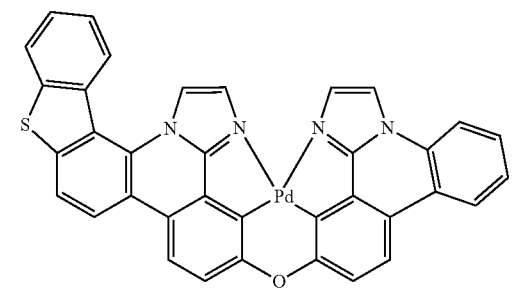

51
-continued
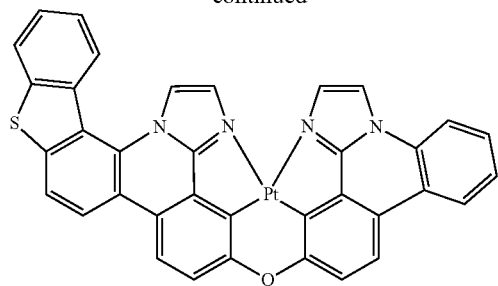
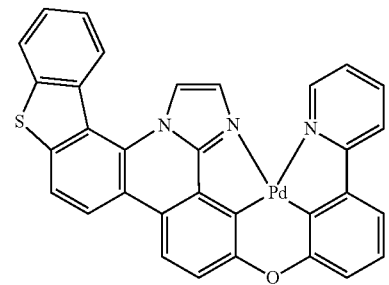
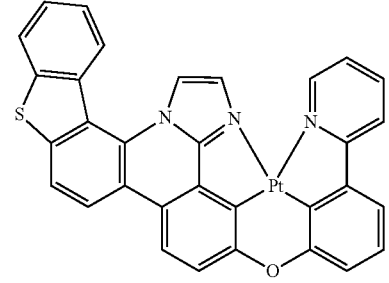
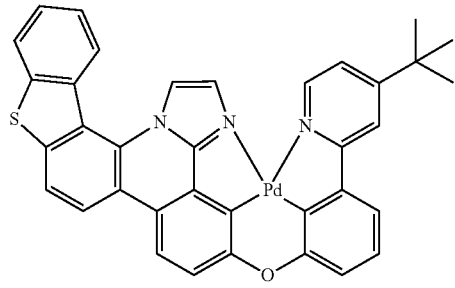
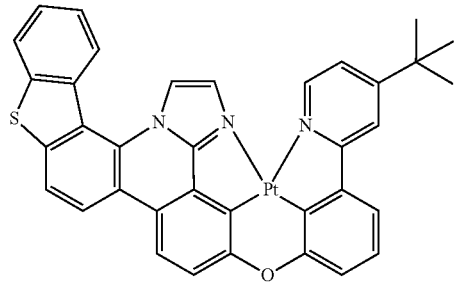
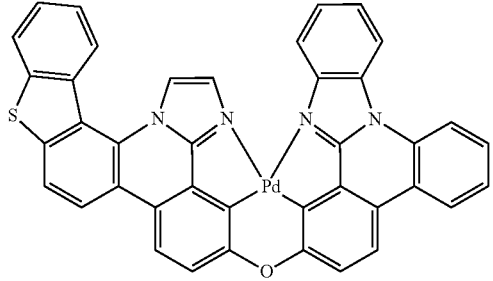
52
-continued
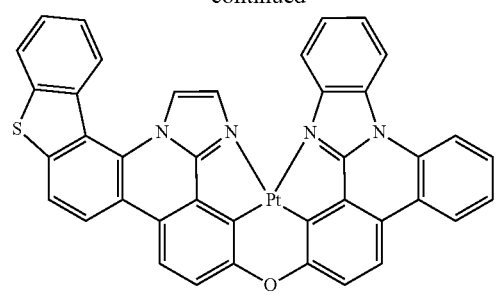
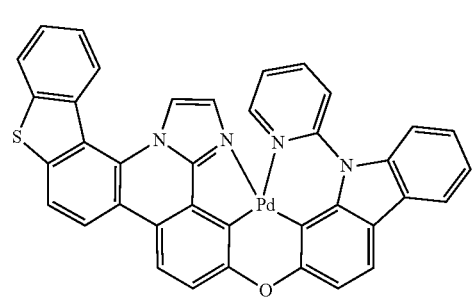
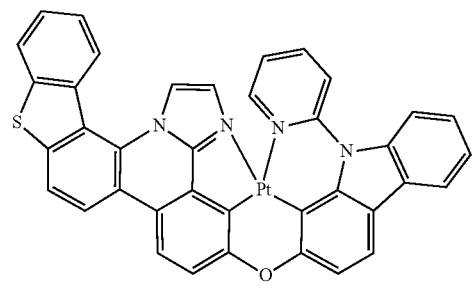
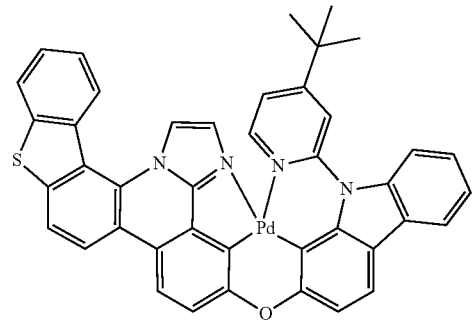
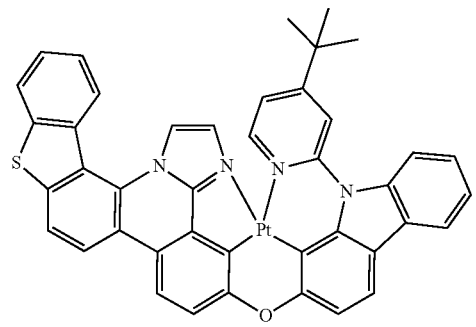

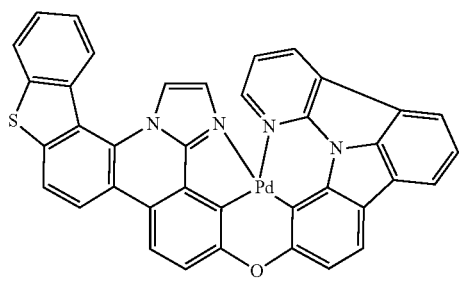
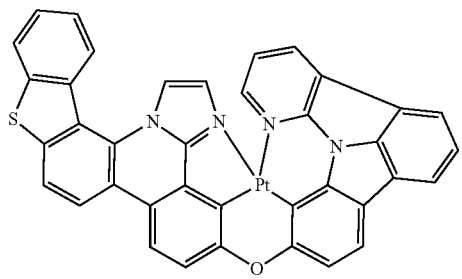
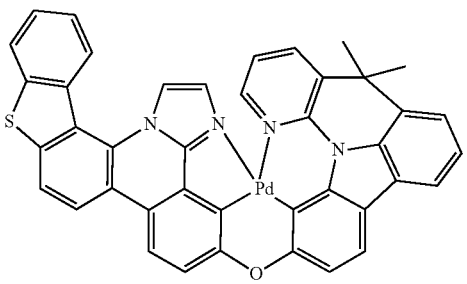
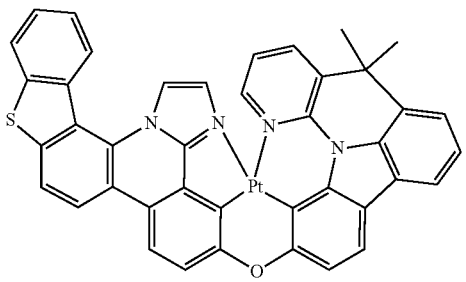
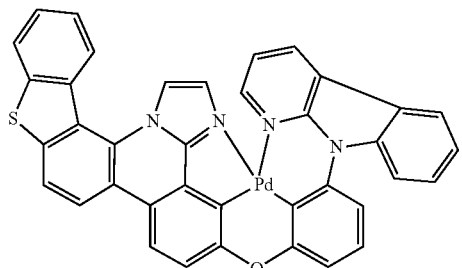
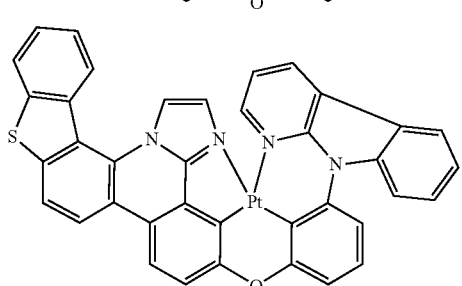
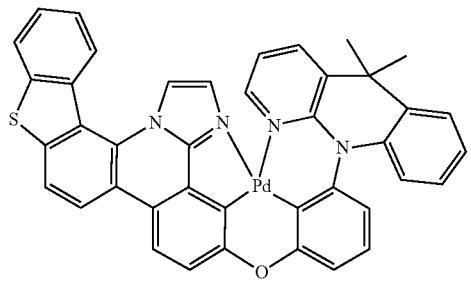
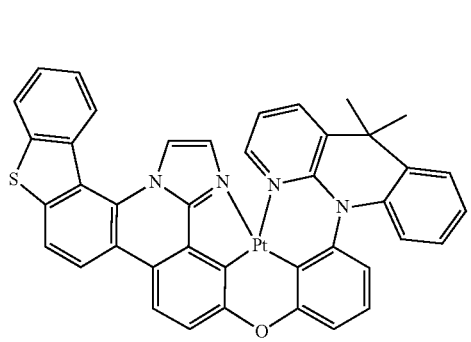
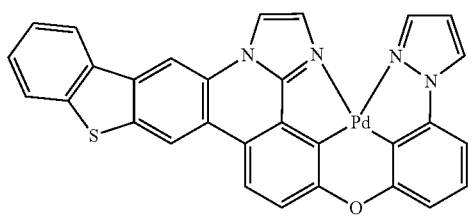
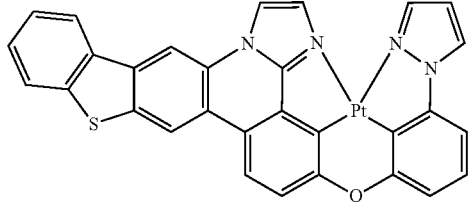
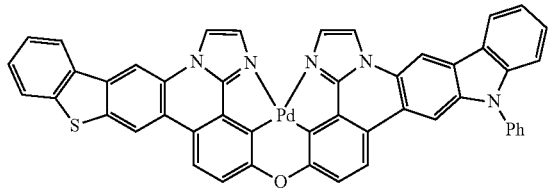
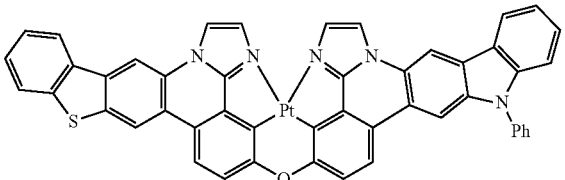
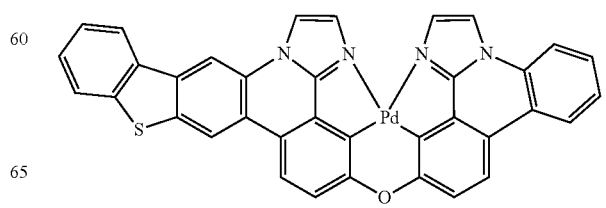

55
-continued
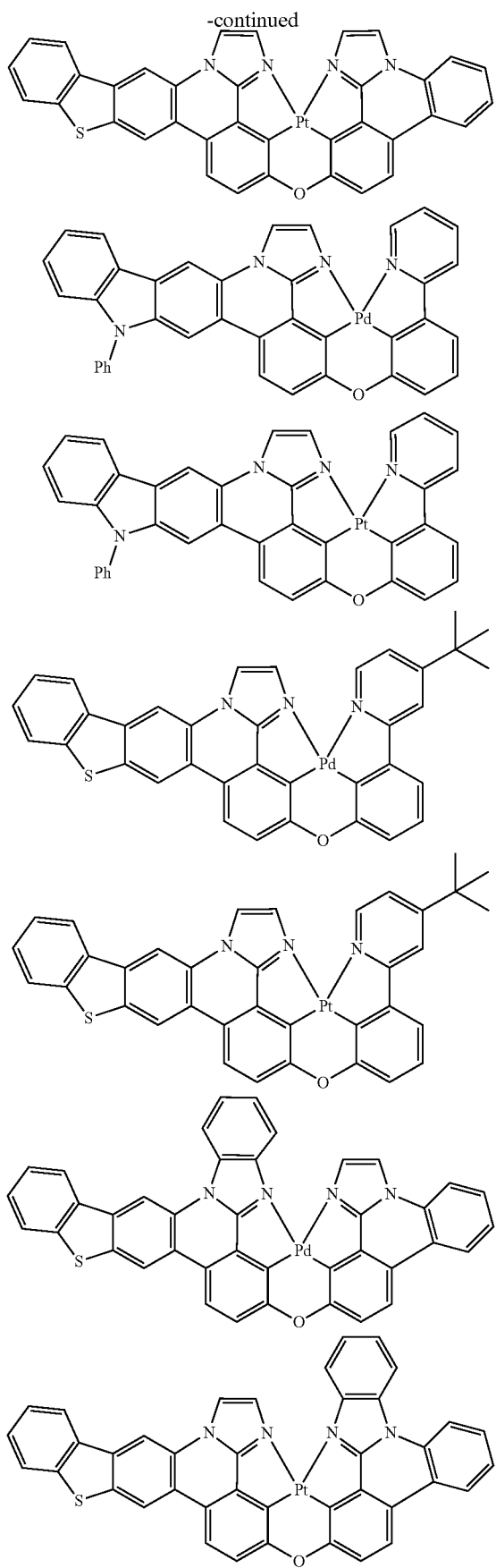
56
-continued
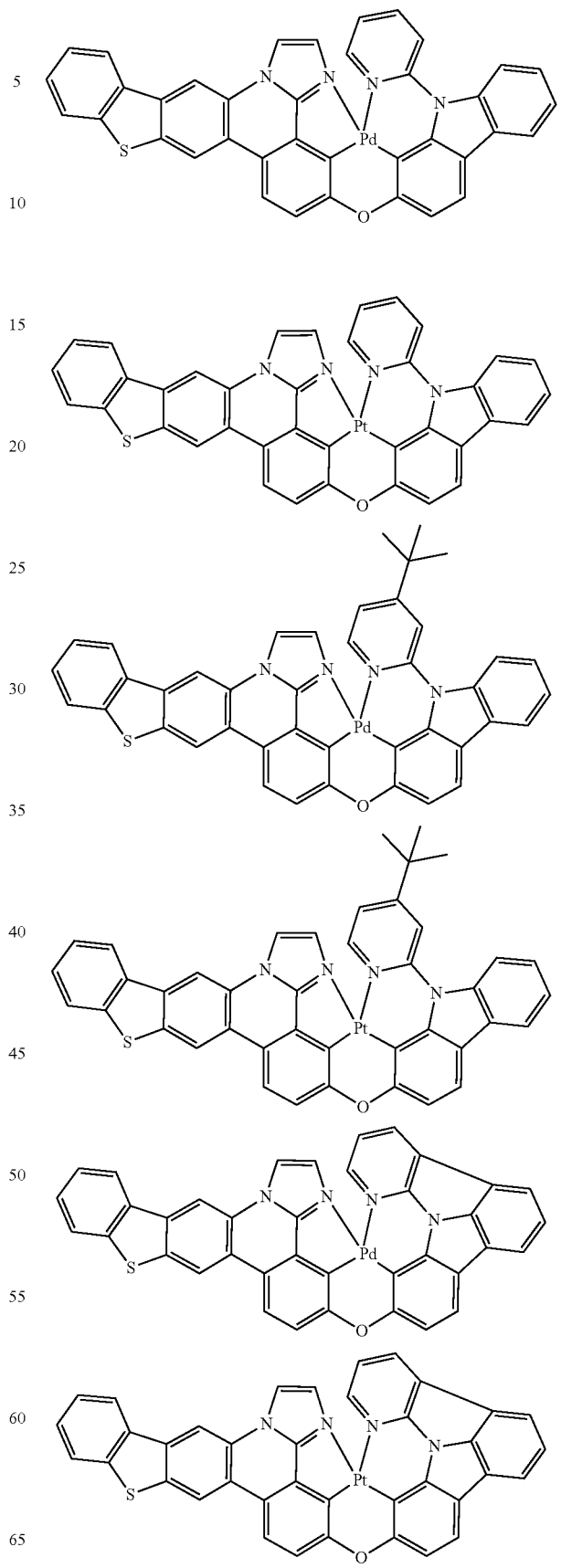

-continued

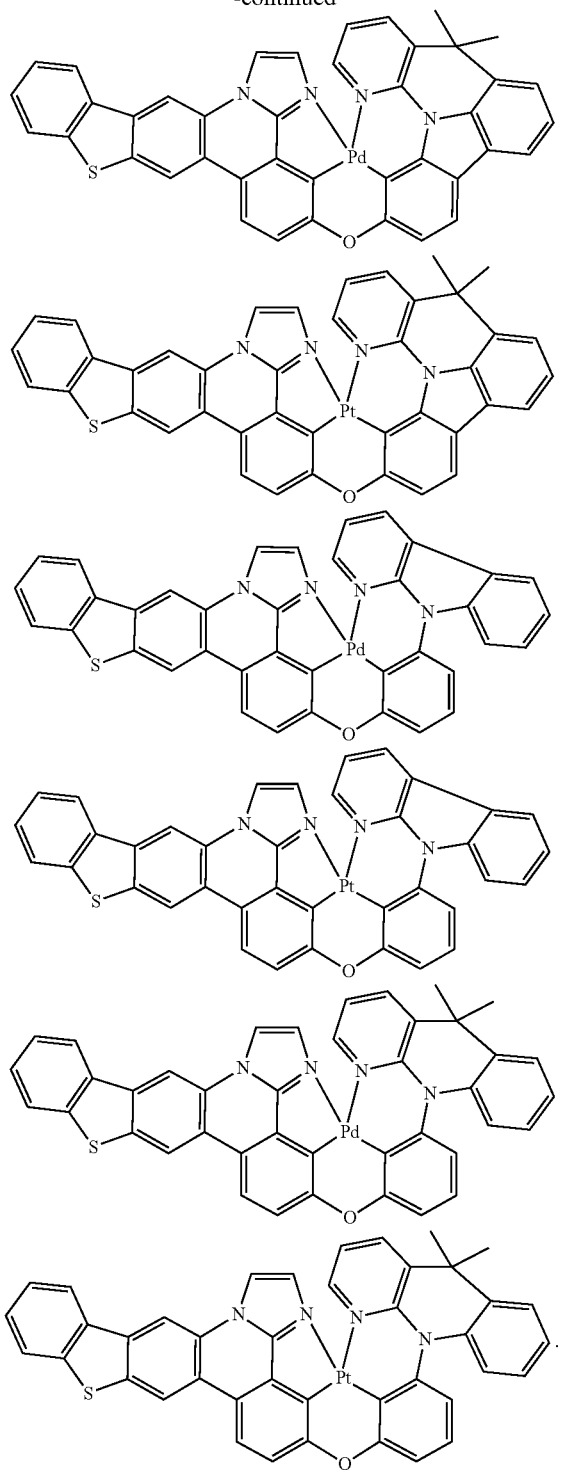

Compositions and Devices of the Invention

Also disclosed herein are organic emitting diodes or light emitting devices comprising one or more compound and/or compositions disclosed herein.

In one aspect, the device is an electro-optical device. Electro-optical devices include, but are not limited to, photo-absorbing devices such as solar- and photo-sensitive devices, organic light emitting devices, photo-emitting devices, or devices capable of both photo-absorption and emission and as markers for bio-applications. For example, the device can be an OLED.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art. Such devices are disclosed herein which comprise one or more of the compounds or compositions disclosed herein.

OLEDs can be produced by methods known to those skilled in the art. In general, the OLED is produced by successive vapor deposition of the individual layers onto a suitable substrate. Suitable substrates include, for example, glass, inorganic materials such as ITO or IZO or polymer films. For the vapor deposition, customary techniques may be used, such as thermal evaporation, chemical vapor deposition (CVD), physical vapor deposition (PVD) and others.

In an alternative process, the organic layers may be coated from solutions or dispersions in suitable solvents, in which case coating techniques known to those skilled in the art are employed. Suitable coating techniques are, for example, spin-coating, the casting method, the Langmuir-Blodgett ("LB") method, the inkjet printing method, dip-coating, letterpress printing, screen printing, doctor blade printing, slit-coating, roller printing, reverse roller printing, offset lithography printing, flexographic printing, web printing, spray coating, coating by a brush or pad printing, and the like. Among the processes mentioned, in addition to the aforementioned vapor deposition, preference is given to spin-coating, the inkjet printing method and the casting method since they are particularly simple and inexpensive to perform. In the case that layers of the OLED are obtained by the spin-coating method, the casting method or the inkjet printing method, the coating can be obtained using a solution prepared by dissolving the composition in a concentration of 0.0001 to 90% by weight in a suitable organic solvent such as benzene, toluene, xylene, tetrahydrofuran, methyltetrahydrofuran, N,N-dimethylformamide, acetone, acetonitrile, anisole, dichloromethane, dimethyl sulfoxide, water and mixtures thereof.

Compounds described herein can be used in a light emitting device such as an OLED. FIG. 1 depicts a cross-sectional view of an OLED 100. OLED 100 includes substrate 102, anode 104, hole-transporting material(s) (HTL) 106, light processing material 108, electron-transporting material(s) (ETL) 110, and a metal cathode layer 112. Anode 104 is typically a transparent material, such as indium tin oxide. Light processing material 108 may be an emissive material (EML) including an emitter and a host.

In various aspects, any of the one or more layers depicted in FIG. 1 may include indium tin oxide (ITO), poly(3,4-ethylenedioxythiophene) (PEDOT), polystyrene sulfonate (PSS), N,N'-di-1-naphthyl-N,N-diphenyl-1,1'-biphenyl-4,4' diamine (NPD), 1,1-bis((di-4-tolylamino)phenyl)cyclohexane (TAPC), 2,6-Bis(N-carbazolyl)pyridine (mCpy), 2,8-bis(diphenylphosphoryl)dibenzothiophene (PO15), LiF, Al, or a combination thereof.

Light processing material 108 may include one or more compounds of the present disclosure optionally together with a host material. The host material can be any suitable host material known in the art. The emission color of an OLED is determined by the emission energy (optical energy gap) of the light processing material 108, which can be tuned by tuning the electronic structure of the emitting compounds, the host material, or both. Both the hole-transporting material in the HTL layer 106 and the electron-transporting material(s) in the ETL layer 110 may include any suitable hole-transporter known in the art.

Compounds described herein may exhibit phosphorescence. Phosphorescent OLEDs (i.e., OLEDs with phosphorescent emitters) typically have higher device efficiencies than other OLEDs, such as fluorescent OLEDs. Light emitting devices based on electrophosphorescent emitters are described in more detail in WO2000/070655 to Baldo et al., which is incorporated herein by this reference for its teaching of OLEDs, and in particular phosphorescent OLEDs.

As contemplated herein, an OLED of the present invention may include an anode, a cathode, and an organic layer disposed between the anode and the cathode. The organic layer may include a host and a phosphorescent dopant. The organic layer can include a compound of the invention and its variations as described herein.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In one embodiment, the consumer product is selected from the group consisting of a flat panel display, a computer monitor, a medical monitor, a television, a billboard, a light for interior or exterior illumination and/or signaling, a heads-up display, a fully or partially transparent display, a flexible display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video wall comprising multiple displays tiled together, a theater or stadium screen, and a sign.

In some embodiments of the emissive region, the emissive region further comprises a host, wherein the host comprises at least one selected from the group consisting of metal complex, triphenylene, carbazole, dibenzothiophene, dibenzofuran, dibenzoselenophene, aza-triphenylene, aza-carbazole, aza-dibenzothiophene, aza-dibenzofuran, and aza-dibenzoselenophene.

The organic layer can also include a host. In some embodiments, two or more hosts are preferred. In some embodiments, the hosts used may be a) bipolar, b) electron transporting, c) hole transporting or d) wide band gap materials that play little role in charge transport. In some embodiments, the host can include a metal complex. The host can be a triphenylene containing benzo-fused thiophene or benzo-fused furan. Any substituent in the host can be an unfused substituent independently selected from the group consisting of CnH2n+1, OCnH2n+1, OAr1, N(CnH2n+1)2, N(Ar1)(Ar2), CH=CH—CnH2n+1, C≡C—CnH2n+1, Ar1, Ar1-Ar2, and CnH2n-Ar1, or the host has no substitutions. In the preceding substituents n can range from 1 to 10; and Ar1 and Ar2 can be independently selected from the group consisting of benzene, biphenyl, naphthalene, triphenylene, carbazole, and heteroaromatic analogs thereof. The host can be an inorganic compound. For example, a Zn containing inorganic material e.g. ZnS.

Suitable hosts may include, but are not limited to, mCP (1,3-bis(carbazol-9-yl)benzene), mCPy (2,6-bis(N-carbazolyl)pyridine), TCP (1,3,5-tris(carbazol-9-yl)benzene), TCTA (4,4',4"-tris(carbazol-9-yl)triphenylamine), TPBi (1,3,5-tris(1-phenyl-1-H-benzimidazol-2-yl)benzene), mCBP (3,3-di(9H-carbazol-9-yl)biphenyl), pCBP (4,4'-bis(carbazol-9-yl)biphenyl), CDBP (4,4'-bis(9-carbazolyl)-2,2'-dimethylbiphenyl), DMFL-CBP (4,4'-bis(carbazol-9-yl)-9,9-dimethylfluorene), FL-4CBP (4,4'-bis(carbazol-9-yl)-9,9-bis(9-phenyl-9H-carbazole)fluorene), FL-2CBP (9,9-bis(4-carbazol-9-yl)phenyl)fluorene, also abbreviated as CPF), DPFL-CBP (4,4'-bis(carbazol-9-yl)-9,9-ditolylfluorene), FL-2CBP (9,9-bis(9-phenyl-9H-carbazole)fluorene), Spiro-CBP (2,2',7,7'-tetrakis(carbazol-9-yl)-9,9'-spirobifluorene), ADN (9,10-di(naphth-2-yl)anthracene), TBADN (3-tert-butyl-9,10-di(naphth-2-yl)anthracene), DPVBi (4,4'-bis(2,2-diphenylethen-1-yl)-4,4'-dimethylphenyl), p-DMDPVBi (4,4'-bis(2,2-diphenylethen-1-yl)-4,4'-dimethylphenyl), TDAF (tert(9,9-diarylfluorene)), BSBF (2-(9,9'-spirobifluoren-2-yl)-9,9'-spirobifluorene), TSBF (2,7-bis(9,9'-spirobifluoren-2-yl)-9,9'-spirobifluorene), BDAF (bis(9,9-diarylfluorene)), p-TDPVBi (4,4'-bis(2,2-diphenylethen-1-yl)-4,4'-di-(tert-butyl)phenyl), TPB3 (1,3,5-tri(pyren-1-yl)

benzene, PBD (2-(4-biphenylyl)-5-(4-tert-butylphenyl)-1,3,4-oxadiazole), BCP (2,9-dimethyl-4,7-diphenyl-1,10-phenanthroline), BP-OXD-Bpy (6,6'-bis[5-(biphenyl-4-yl)-1,3,4-oxadiazo-2-yl]-2,2'-bipyridyl), NTAZ (4-(naphth-1-yl)-3,5-diphenyl-4H-1,2,4-triazole), Bpy-OXD (1,3-bis[2-(2,2'-bipyrid-6-yl)-1,3,4oxadiazo-5-yl]benzene), BPhen (4,7-diphenyl-1,10-phenanthroline), TAZ (3-(4-biphenylyl)-4-phenyl-5-tert-butylphenyl-1,2,4-triazole), PADN (2-phenyl-9,10-di(naphth-2-yl)anthracene), Bpy-FOXD (2,7-bis[2-(2,2'-bipyrid-6-yl)-1,3,4-oxadiazol-5-yl]-9,9-dimethylfluorene), OXD-7 (1,3-bis[2-(4-tert-butylphenyl)-1,3,4-oxadiazol-5-yl]benzene), HNBphen (2-(naphth-2-yl)-4,7-diphenyl-1,10-phenanthroline), NBphen (2,9-bis(naphth-2-yl)-4,7-diphenyl-1,10-phenanthroline), 3TPYMB (tris(2,4,6-trimethyl-3-(pyrid-3-yl)phenyl)borane), 2-NPIP (1-methyl-2-(4-(naphth-2-yl)phenyl)-1H-imidazo[4,5-f]-[1,10]phenanthroline), Liq (8-hydroxyquinolinolatolithium), and Alq (bis(2-methyl-8-quinolinolate)-4-(phenylphenolato) aluminum), and also of mixtures of the aforesaid substances.

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804, US20150123047, and US2012146012.

A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and/or higher triplet energy than one or more of the hosts closest to the EBL interface. In one aspect, the compound used in EBL contains the same molecule or the same functional groups used as one of the hosts described below.

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and/or higher triplet energy than the emitter closest to the HBL interface. In some embodiments, the HBL material has a lower HOMO (further from the vacuum level) and/or higher triplet energy than one or more of the hosts closest to the HBL interface.

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

In yet another aspect of the present disclosure, a formulation that comprises the novel compound disclosed herein is described. The formulation can include one or more components selected from the group consisting of a solvent, a host, a hole injection material, hole transport material, and an electron transport layer material, disclosed herein.

EXPERIMENTAL EXAMPLES

The invention is further described in detail by reference to the following experimental examples. These examples are provided for purposes of illustration only, and are not intended to be limiting unless otherwise specified. Thus, the invention should in no way be construed as being limited to the following examples, but rather, should be construed to encompass any and all variations which become evident as a result of the teaching provided herein.

Without further description, it is believed that one of ordinary skill in the art can, using the preceding description and the following illustrative examples, make and utilize the composite materials of the present invention and practice the claimed methods. The following working examples therefore, specifically point out the preferred embodiments of the present invention, and are not to be construed as limiting in any way the remainder of the disclosure.

Example 1: Increased Conjugation in MADF Processes

Figure 2:
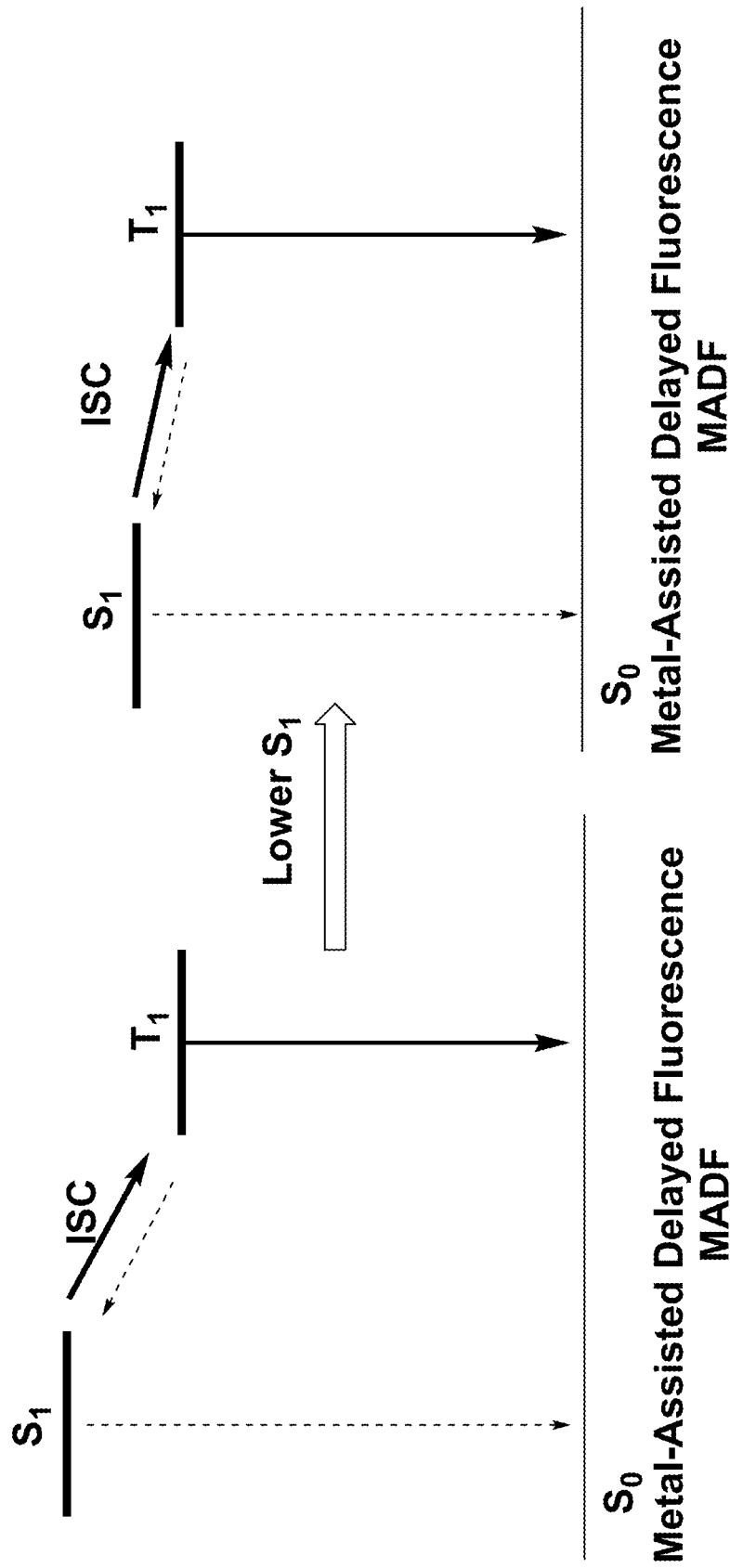
FIG. 2 is a schematic diagram depicting the delayed fluorescence process.

The metal-assisted delayed fluorescence (MADF) emission process is capable of harvesting all electrogenerated excitons. As illustrated in FIG. 2, when the energy levels of the lowest triplet excited state ($T_1$) and the lowest singlet excited state ($S_1$) are close, the triplet excitons can decay radiatively through the combination of intersystem crossing ($T_1 \rightarrow S_1$) and delayed fluorescence ($S_1 \rightarrow S_0$) processes. When the energy $S_1$ energy level is brought closer to the $T_1$ energy levels, the metal assisted delayed fluorescent process is more effective.

Figure 3:
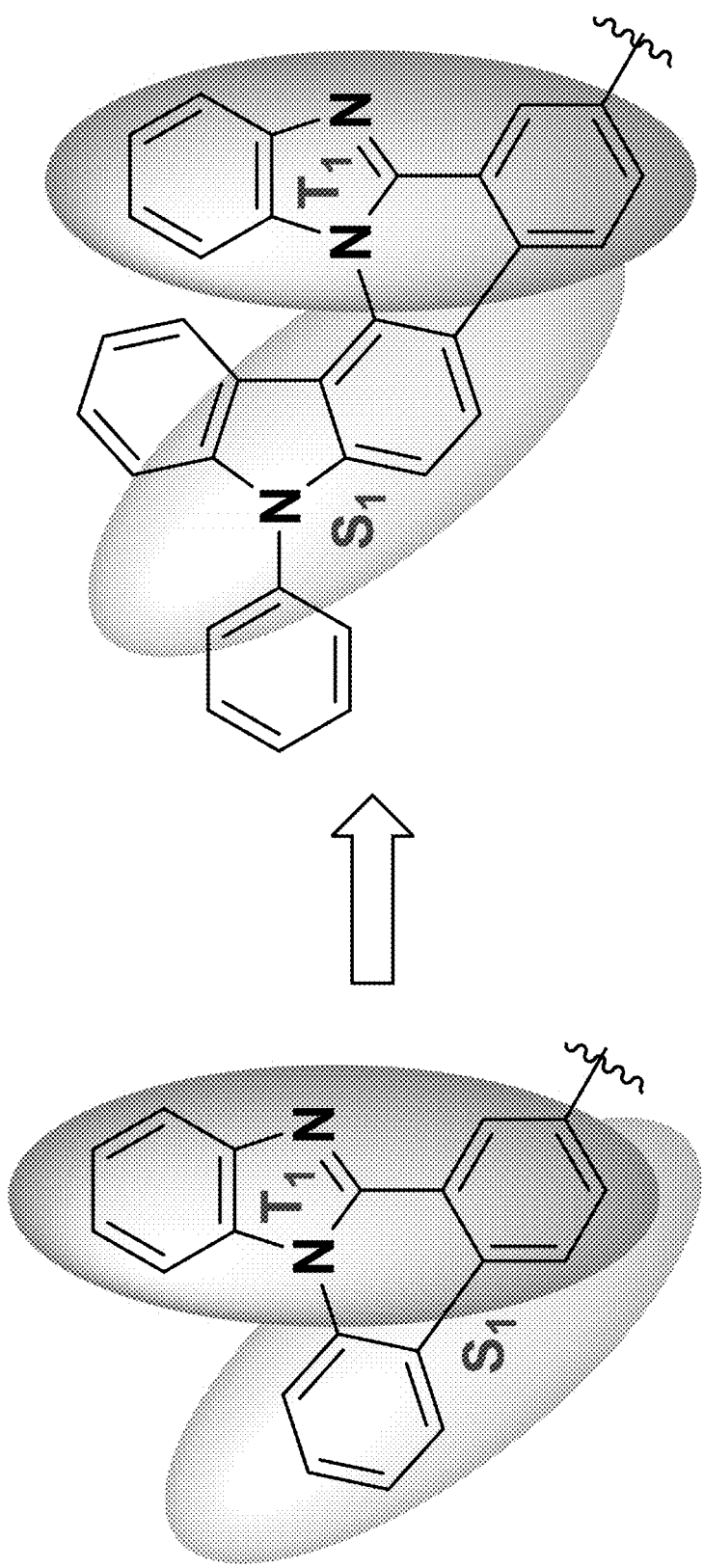
FIG. 3 depicts an exemplary compound.

Ligands designed under this protocol are focused on 8-base or 2-base ligands. The $T_1$ energy level is kept relatively constant, while an expansion of conjugation lowers the $S_1$ energy level (FIG. 3).

Figure 4:
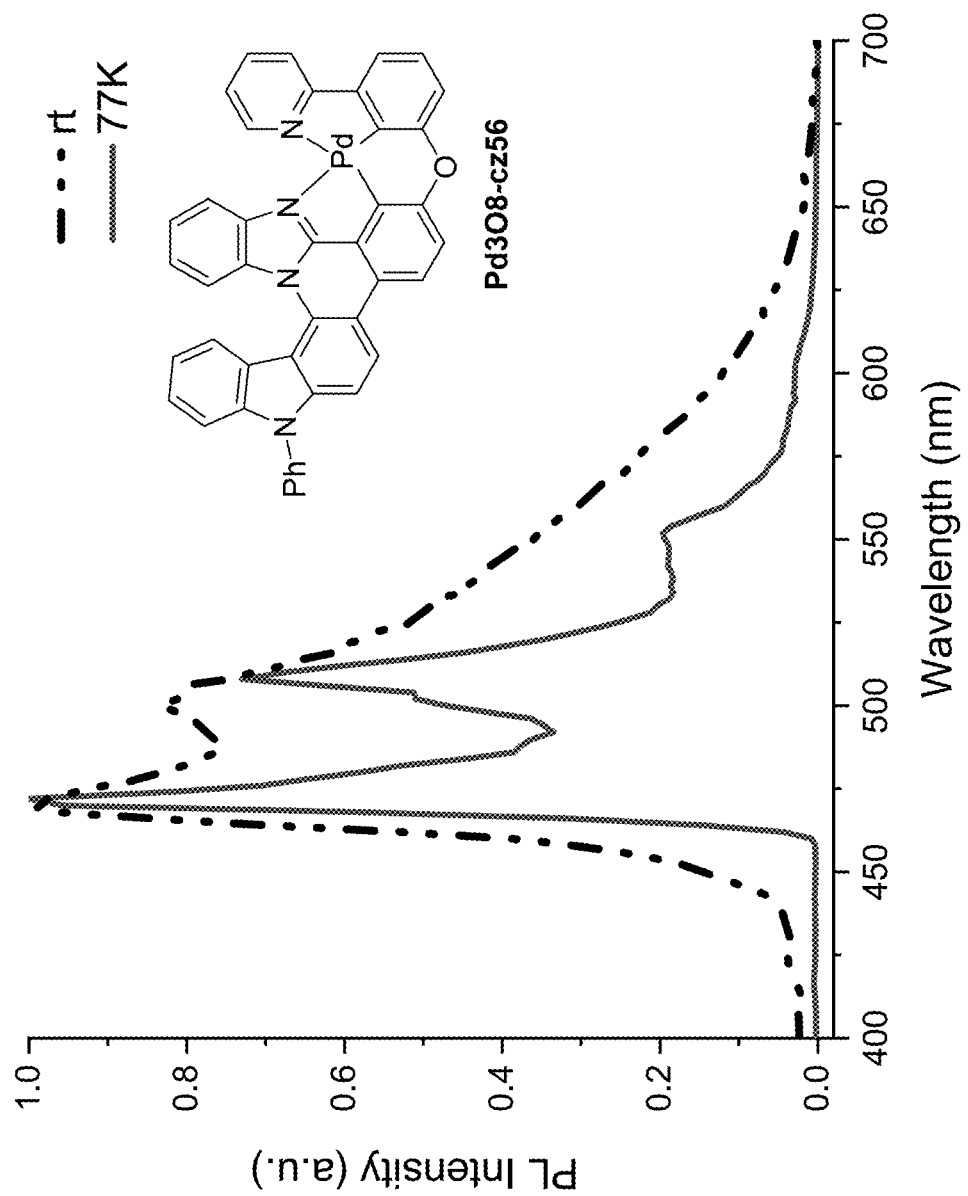
FIG. 4 is a graph of photoluminescence of exemplary compound Pd3O8-cz56.

In one embodiment, an exemplary compound may be prepared according to the following scheme. PL data for this compound is presented in FIG. 4.

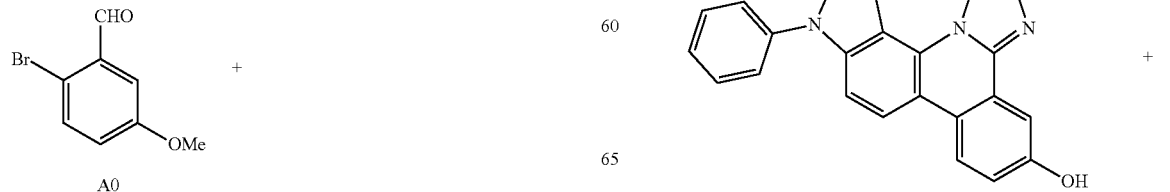

-continued

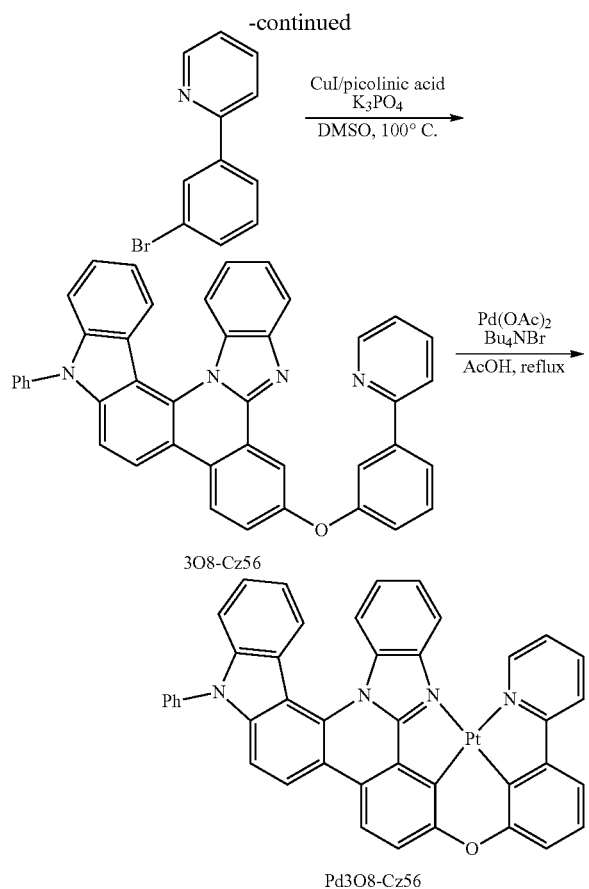

3O8-Cz56

Pd3O8-Cz56

A0 (10 mmol, 1.0 eq), B0 (12 mmol, 1.2 eq), Pd(dppf)Cl$_2$ (0.8 mmol, 0.08 eq), and K$_2$CO$_3$ (30 mmol, 3.0 eq) were added to a dry Shlenck tube equipped with a magnetic stir bar. The tube was evacuated and backfilled with nitrogen. The evacuation and backfill procedure was repeated for a total of three times. Then solvent THF/H$_2$O (5/3, 80 mL) was added under the protection of nitrogen. The mixture was stirred in an oil bath at reflux overnight and then cooled down to ambient temperature. The solvent was removed under reduced pressure, and the residue was purified through column chromatography on silica gel using hexane/ethyl acetate as eluent to obtain the desired product C0 in 95% yield.

C0 (8 mmol, 1.0 eq), D0 (8 mmol, 1.0 eq), 45 mL of DMF and 5 mL of distilled water were added to a flask equipped with a magnetic stir bar. The mixture was stirred in an oil bath at 90° C. for 2 days and then cooled down to ambient temperature. 200 mL of distilled water was added in the mixture. Then the system was filtered and washed with ethyl acetate and acetone to obtain the desired product E0 in 86% yield.

E0 (1 mmol, 1.0 eq), Pd(OAc)$_2$ (0.1 mmol, 0.1 eq), Xphos (0.2 mmol, 0.2 eq), K$_2$CO$_3$ (3 mmol, 3.0 eq), and 15 mL of DMF were added to a flask equipped with a magnetic stir bar. The flask was evacuated and backfilled with nitrogen. The evacuation and backfill procedure was repeated for a total of three times. The mixture was stirred in an oil bath at 160° C. for 2 days and then cooled down to ambient temperature. The solvent was removed under reduced pressure, and the residue was purified through column chromatography on silica using hexane/ethyl acetate as eluent to obtain the desired product F0 in 43% yield.

F0 (0.4 mmol, 1.0 eq), and 6 mL of HOAc and 2 mL of HBr were added to a flask equipped with a magnetic stir bar. The mixture was stirred in an oil bath at reflux for several; days and then cooled down to ambient temperature. The solvent was neutralized with K$_2$CO$_3$, and then filtered and washed with distilled water to obtain the desired product 7-phenyl-7H-benzo[4,5]imidazo[1,2-f]indolo[2,3-c]phenanthridin-2-ol in 95% yield.

7-phenyl-7H-benzo[4,5]imidazo[1,2-f]indolo[2,3-c]phenanthridin-2-ol (1 mmol, 1.0 eq), 2-(3-bromophenyl)pyridine (1.2 mmol, 1.2 eq), CuI (0.2 mmol, 0.2 eq), picolinic acid (0.4 mmol, 0.4 eq) and K$_3$PO$_4$ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product 3O8-Cz56 in 70% yield.

3O8-Cz56 (0.20 mmol, 1.0 eq), Pd(OAc)$_2$ (0.24 mmol, 1.2 eq) and n-Bu$_4$NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product Pd3O8-Cz56 in 10%~50% yield.

In one embodiment, an exemplary compound may be prepared according to the following scheme:

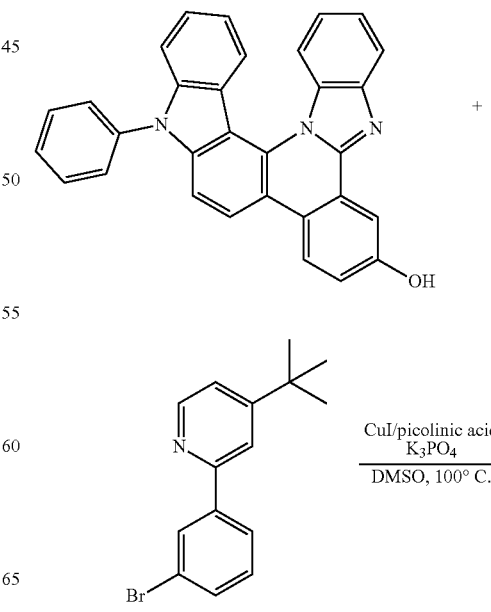

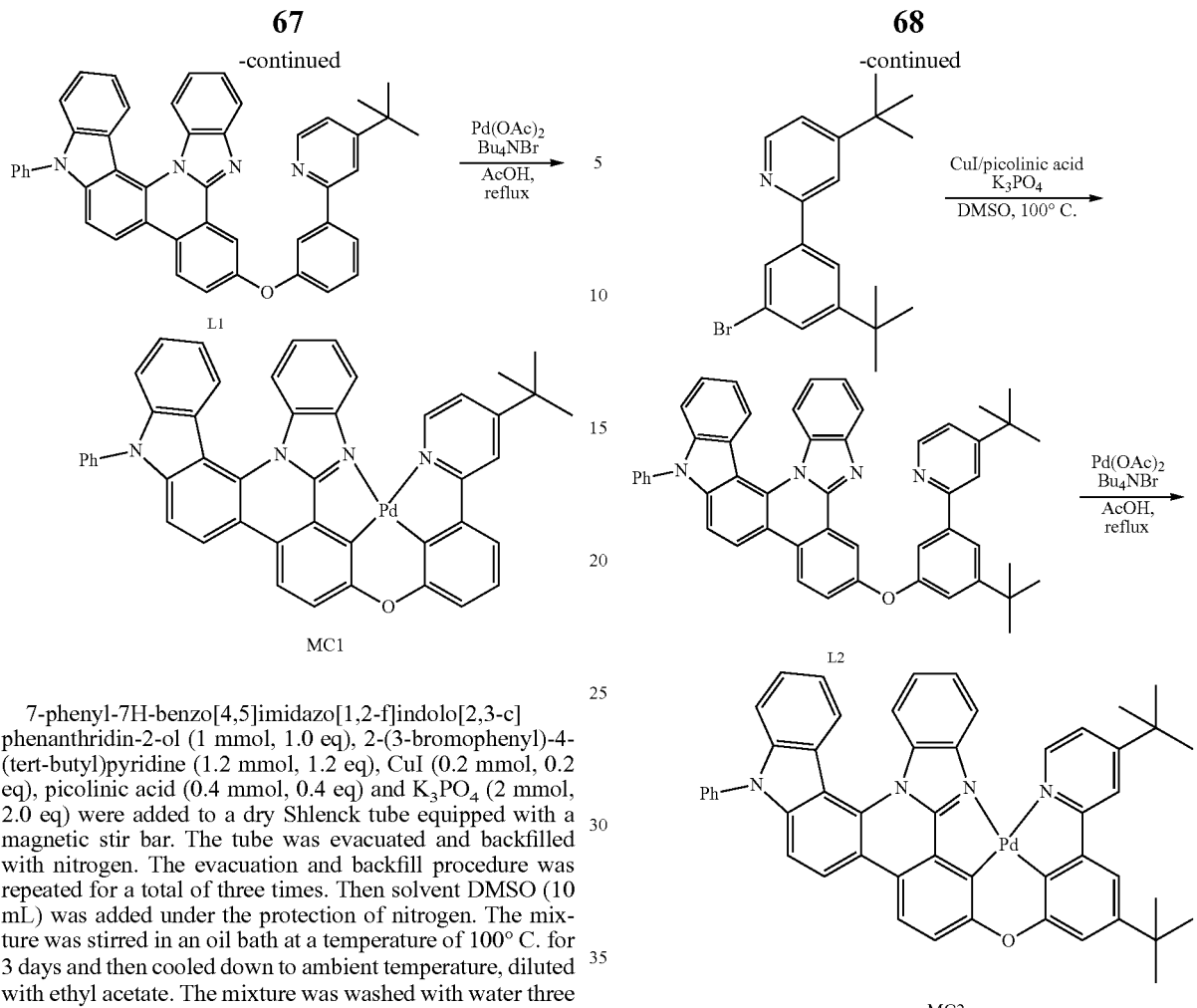

7-phenyl-7H-benzo[4,5]imidazo[1,2-f]indolo[2,3-c]phenanthridin-2-ol (1 mmol, 1.0 eq), 2-(3-bromophenyl)-4-(tert-butyl)pyridine (1.2 mmol, 1.2 eq), CuI (0.2 mmol, 0.2 eq), picolinic acid (0.4 mmol, 0.4 eq) and $K_3PO_4$ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product L1 in 30%~70% yield.

L1 (0.20 mmol, 1.0 eq), Pd(OAc)$_2$ (0.24 mmol, 1.2 eq) and n-Bu$_4$NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC1 in 10%~50% yield.

In one embodiment, an exemplary compound may be prepared according to the following scheme:

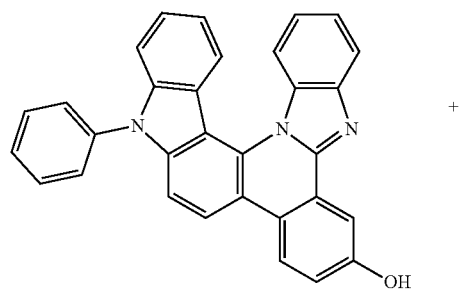

7-phenyl-7H-benzo[4,5]imidazo[1,2-f]indolo[2,3-c]phenanthridin-2-ol (1 mmol, 1.0 eq), 2-(3-bromo-5-(tert-butyl)phenyl)-4-(tert-butyl)pyridine (1.2 mmol, 1.2 eq), CuI (0.2 mmol, 0.2 eq), picolinic acid (0.4 mmol, 0.4 eq) and $K_3PO_4$ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product L2 in 30%~70% yield.

L2 (0.20 mmol, 1.0 eq), Pd(OAc)$_2$ (0.24 mmol, 1.2 eq) and n-Bu$_4$NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC2 in 10%~50% yield.

In one embodiment, an exemplary compound may be prepared according to the following scheme:

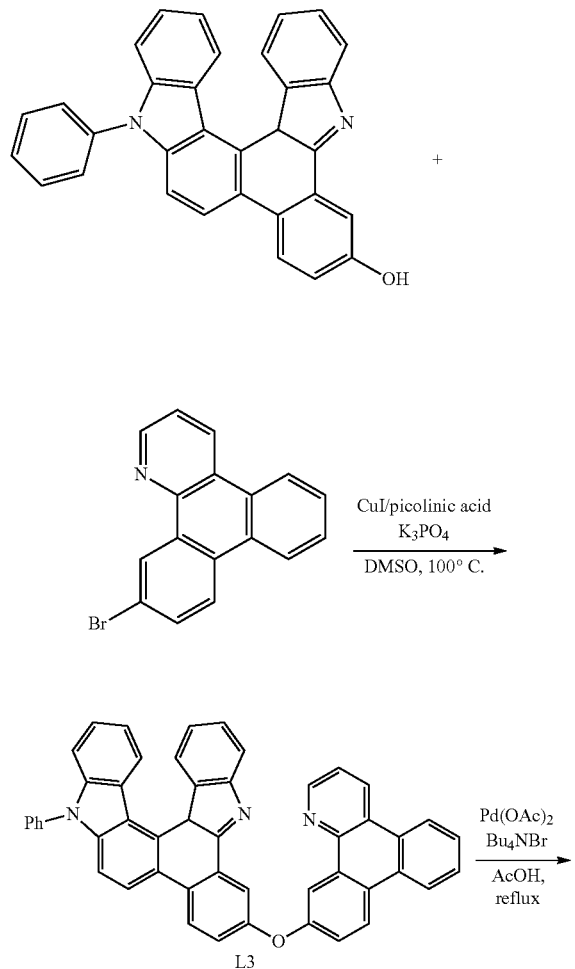

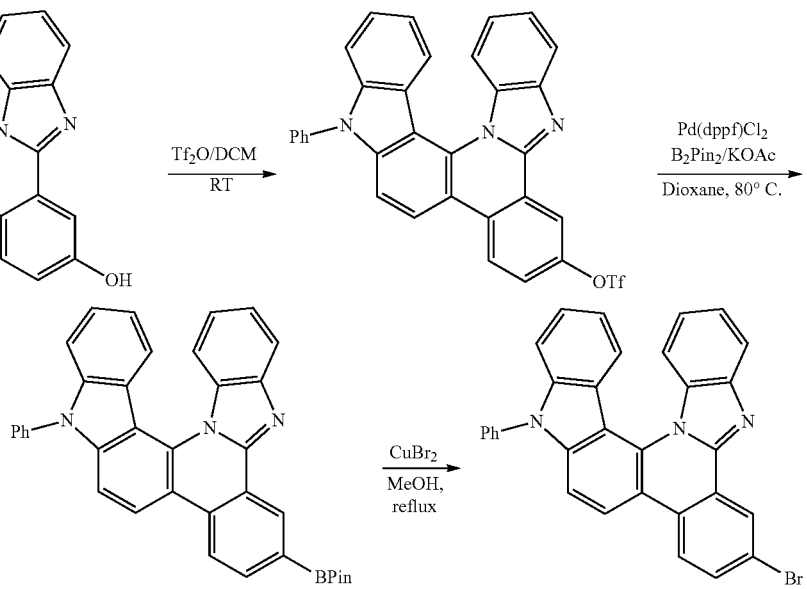

7-phenyl-7H-benzo[4,5]imidazo[1,2-f]indolo[2,3-c] phenanthridin-2-ol (1 mmol, 1.0 eq), 11-bromodibenzo[f,h] quinoline (1.2 mmol, 1.2 eq), CuI (0.2 mmol, 0.2 eq), picolinic acid (0.4 mmol, 0.4 eq) and $K_3PO_4$ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product L3 in 30%~70% yield.

L3 (0.20 mmol, 1.0 eq), Pd(OAc)$_2$ (0.24 mmol, 1.2 eq) and n-Bu$_4$NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC3 in 10%~50% yield.

In one embodiment, an exemplary compound may be prepared according to the following scheme:

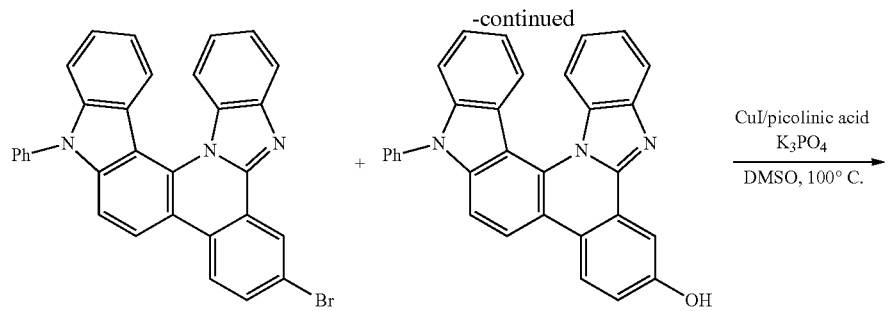

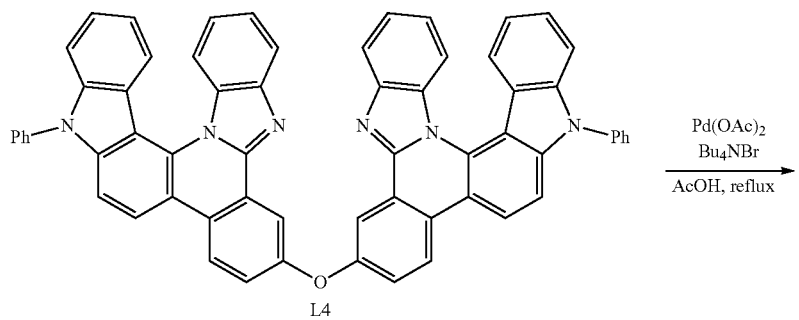

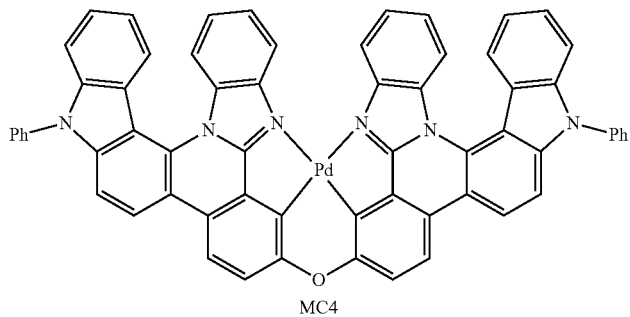

7-phenyl-7H-benzo[4,5]imidazo[1,2-f]indolo[2,3-c]phenanthridin-2-ol (1 mmol, 1.0 eq), 2-bromo-7-phenyl-7H-benzo[4,5]imidazo[1,2-f]indolo[2,3-c]phenanthridine (1.2 mmol, 1.2 eq), CuI (0.2 mmol, 0.2 eq), picolinic acid (0.4 mmol, 0.4 eq) and $K_3PO_4$ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product L4 in 30%~70% yield.

L4 (0.20 mmol, 1.0 eq), Pd(OAc)$_2$ (0.24 mmol, 1.2 eq) and n-Bu$_4$NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC4 in 10%~50% yield.

In one embodiment, an exemplary compound may be prepared according to the following scheme:

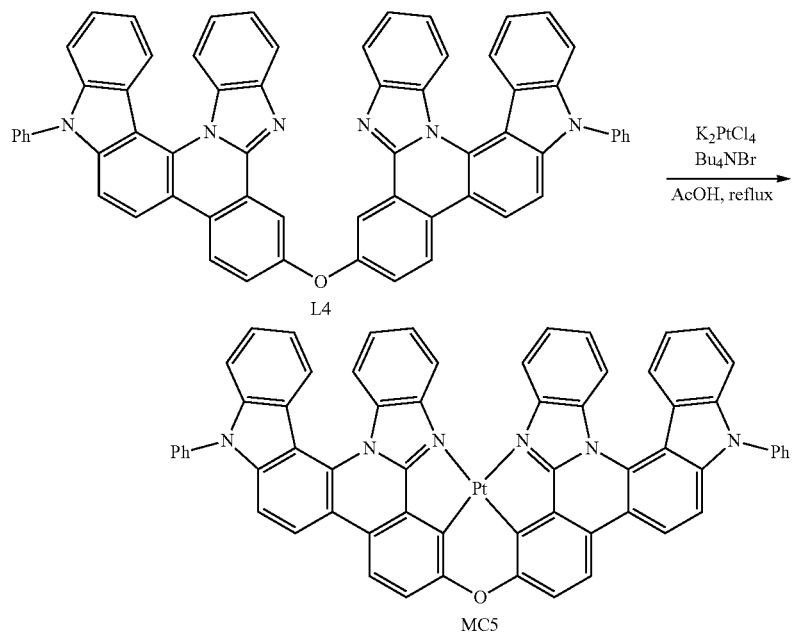

L4 (0.20 mmol, 1.0 eq), K₂PtCl₄ (0.24 mmol, 1.2 eq) and n-Bu₄NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC5 in 10%~50% yield.

In one embodiment, an exemplary compound may be prepared according to the following scheme:

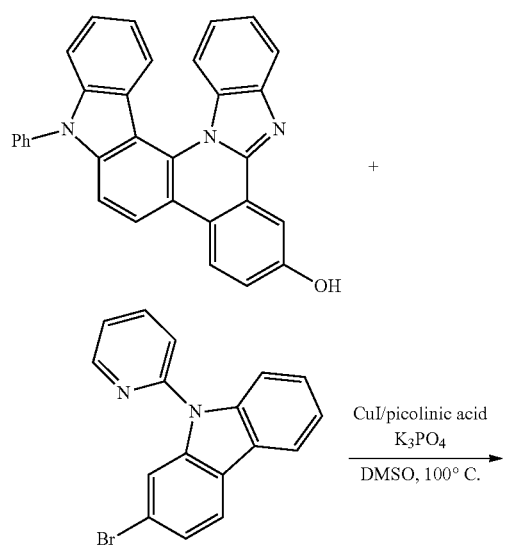

7-phenyl-7H-benzo[4,5]imidazo[1,2-f]indolo[2,3-c]phenanthridin-2-ol (1 mmol, 1.0 eq), 2-bromo-9-(pyridin-2-yl)-9H-carbazole (1.2 mmol, 1.2 eq), CuI (0.2 mmol, 0.2 eq), picolinic acid (0.4 mmol, 0.4 eq) and K₃PO₄ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product L6 in 30%~70% yield.

L6 (0.20 mmol, 1.0 eq), Pd(OAc)$_2$ (0.24 mmol, 1.2 eq) and n-Bu$_4$NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC6 in 10%~50% yield.

In one embodiment, an exemplary compound may be prepared according to the following scheme:

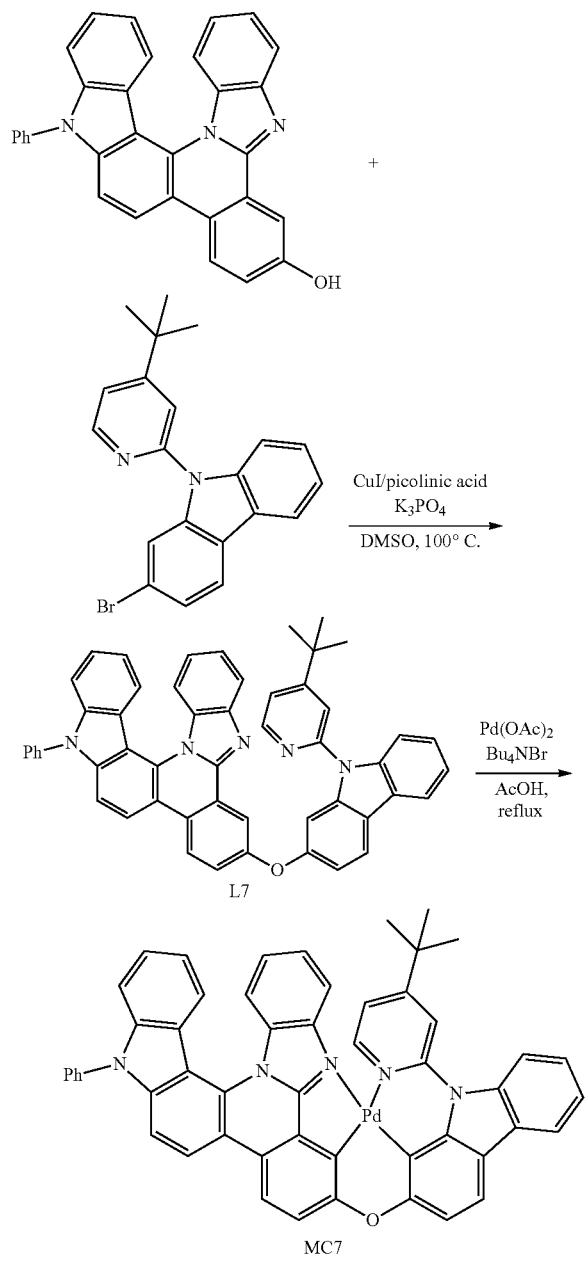

7-phenyl-7H-benzo[4,5]imidazo[1,2-f]indolo[2,3-c]phenanthridin-2-ol (1 mmol, 1.0 eq), 2-bromo-9-(4-(tert-butyl)pyridin-2-yl)-9H-carbazole (1.2 mmol, 1.2 eq), CuI (0.2 mmol, 0.2 eq), picolinic acid (0.4 mmol, 0.4 eq) and K$_3$PO$_4$ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product L7 in 30%~70% yield.

L7 (0.20 mmol, 1.0 eq), Pd(OAc)$_2$ (0.24 mmol, 1.2 eq) and n-Bu$_4$NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC7 in 10%~50% yield.

In one embodiment, an exemplary compound may be prepared according to the following scheme:

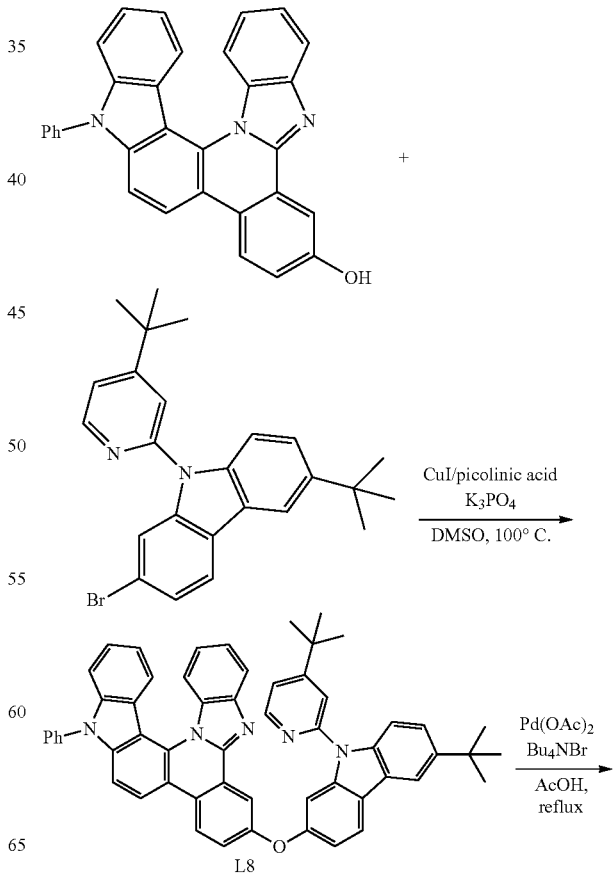

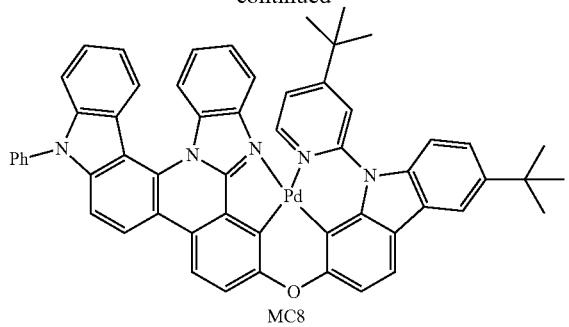

MC8

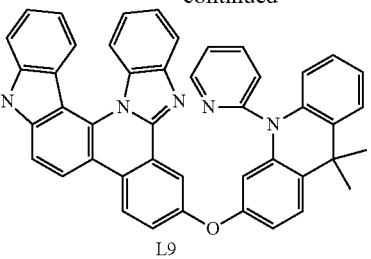

L9

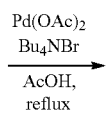

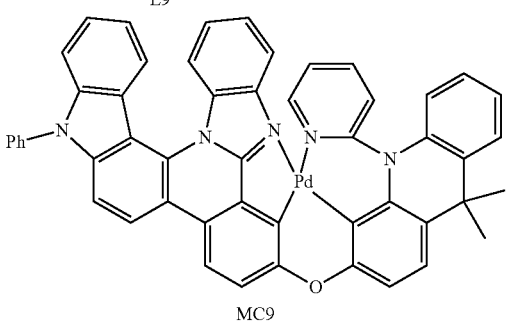

MC9

7-phenyl-7H-benzo[4,5]imidazo[1,2-f]indolo[2,3-c]phenanthridin-2-ol (1 mmol, 1.0 eq), 2-bromo-6-(tert-butyl)-9-(4-(tert-butyl)pyridin-2-yl)-9H-carbazole (1.2 mmol, 1.2 eq), CuI (0.2 mmol, 0.2 eq), picolinic acid (0.4 mmol, 0.4 eq) and $K_3PO_4$ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product L8 in 30%~70% yield.

L8 (0.20 mmol, 1.0 eq), $Pd(OAc)_2$ (0.24 mmol, 1.2 eq) and n-$Bu_4NBr$ (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC8 in 10%~50% yield.

In one embodiment, an exemplary compound may be prepared according to the following scheme:

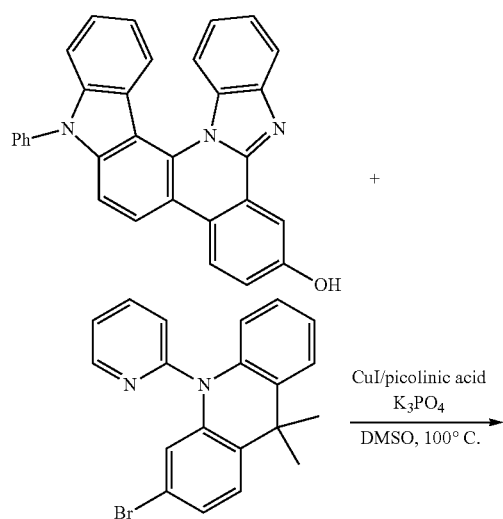

7-phenyl-7H-benzo[4,5]imidazo[1,2-f]indolo[2,3-c]phenanthridin-2-ol (1 mmol, 1.0 eq), 3-bromo-9,9-dimethyl-10-(pyridin-2-yl)-9,10-dihydroacridine (1.2 mmol, 1.2 eq), CuI (0.2 mmol, 0.2 eq), picolinic acid (0.4 mmol, 0.4 eq) and $K_3PO_4$ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product L9 in 30%~70% yield.

L9 (0.20 mmol, 1.0 eq), $Pd(OAc)_2$ (0.24 mmol, 1.2 eq) and n-$Bu_4NBr$ (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC9 in 10%~50% yield.

In one embodiment, an exemplary compound may be prepared according to the following scheme:

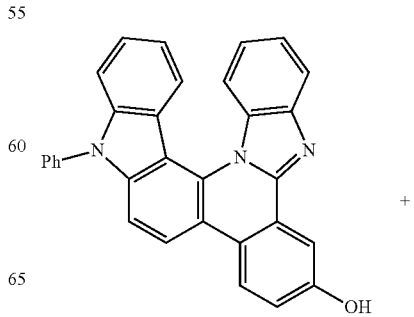

-continued

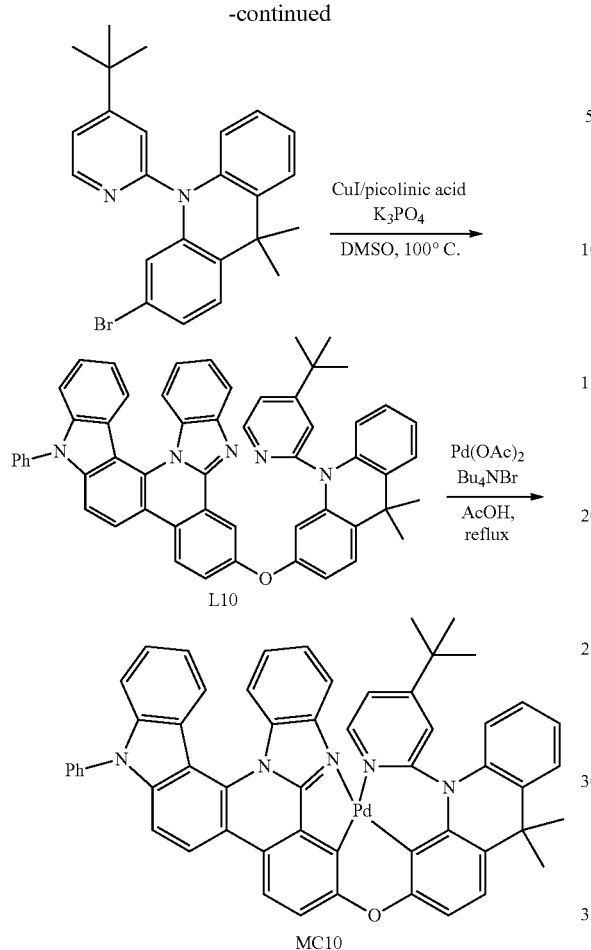

L10

MC10

7-phenyl-7H-benzo[4,5]imidazo[1,2-f]indolo[2,3-c]phenanthridin-2-ol (1 mmol, 1.0 eq), 3-bromo-10-(4-(tert-butyl)pyridin-2-yl)-9,9-dimethyl-9,10-dihydroacridine (1.2 mmol, 1.2 eq), CuI (0.2 mmol, 0.2 eq), picolinic acid (0.4 mmol, 0.4 eq) and K$_3$PO$_4$ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product L10 in 30%~70% yield.

L10 (0.20 mmol, 1.0 eq), Pd(OAc)$_2$ (0.24 mmol, 1.2 eq) and n-Bu$_4$NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC10 in 10%~50% yield.

In one embodiment, an exemplary compound may be prepared according to the following scheme:

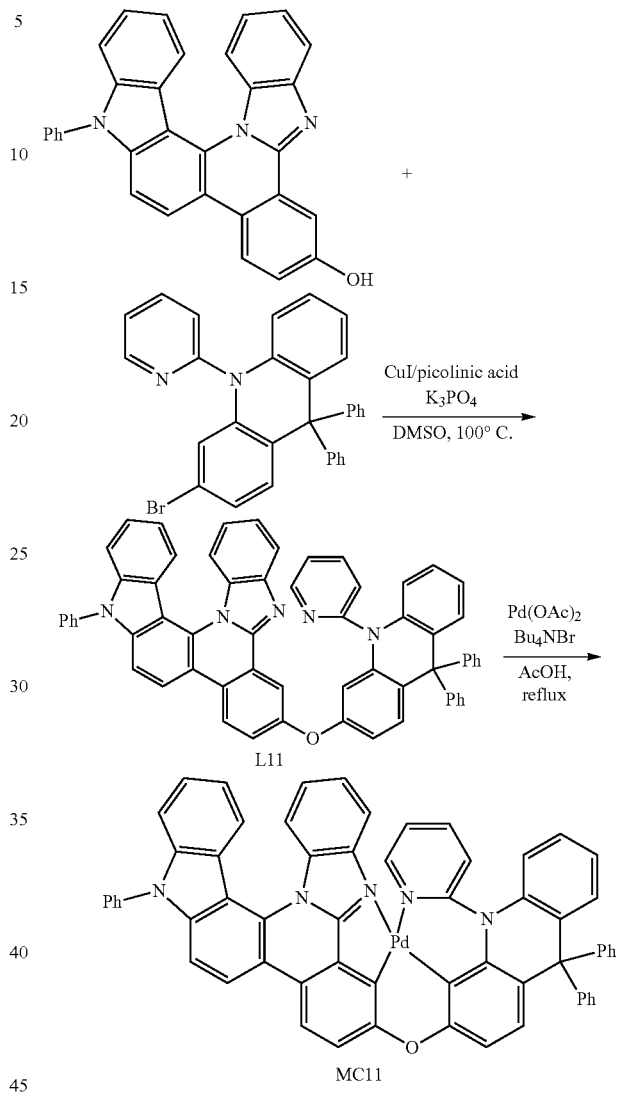

L11

MC11

7-phenyl-7H-benzo[4,5]imidazo[1,2-f]indolo[2,3-c]phenanthridin-2-ol (1 mmol, 1.0 eq), 3-bromo-9,9-diphenyl-10-(pyridin-2-yl)-9,10-dihydroacridine (1.2 mmol, 1.2 eq), CuI (0.2 mmol, 0.2 eq), picolinic acid (0.4 mmol, 0.4 eq) and K$_3$PO$_4$ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product L11 in 30%~70% yield.

L11 (0.20 mmol, 1.0 eq), Pd(OAc)$_2$ (0.24 mmol, 1.2 eq) and n-Bu$_4$NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC11 in 10%~50% yield.

In one embodiment, an exemplary compound may be prepared according to the following scheme:

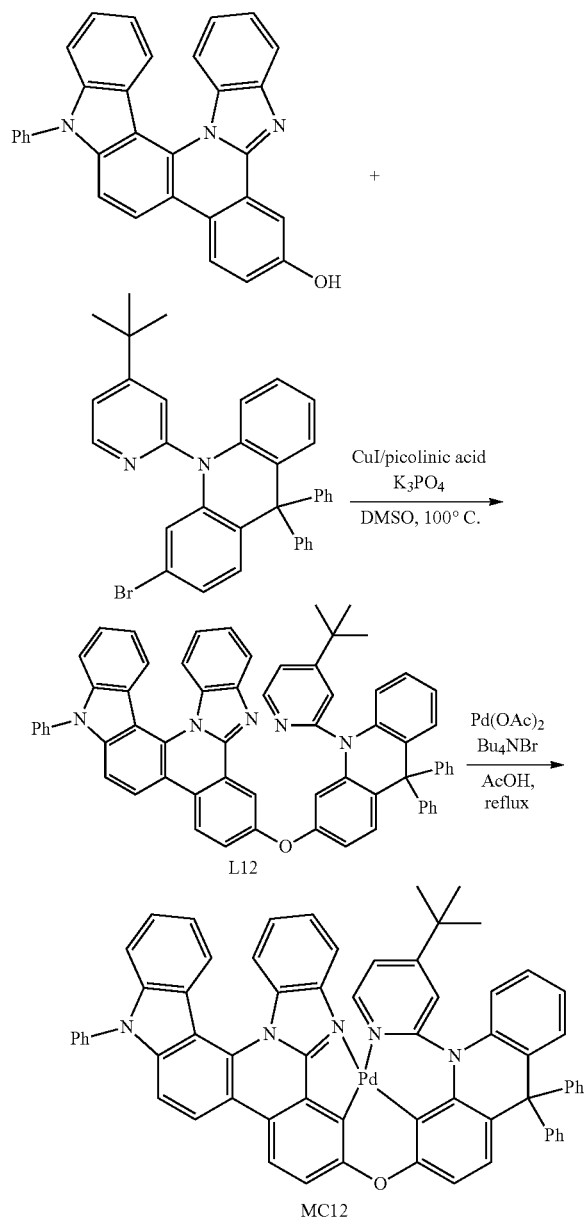

7-phenyl-7H-benzo[4,5]imidazo[1,2-f]indolo[2,3-c]phenanthridin-2-ol (1 mmol, 1.0 eq), 3-bromo-10-(4-(tert-butyl)pyridin-2-yl)-9,9-diphenyl-9,10-dihydroacridine (1.2 mmol, 1.2 eq), CuI (0.2 mmol, 0.2 eq), picolinic acid (0.4 mmol, 0.4 eq) and K$_3$PO$_4$ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product L12 in 30%~70% yield.

L12 (0.20 mmol, 1.0 eq), Pd(OAc)$_2$ (0.24 mmol, 1.2 eq) and n-Bu$_4$NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC12 in 10%~50% yield.

In one embodiment, an exemplary compound may be prepared according to the following scheme:

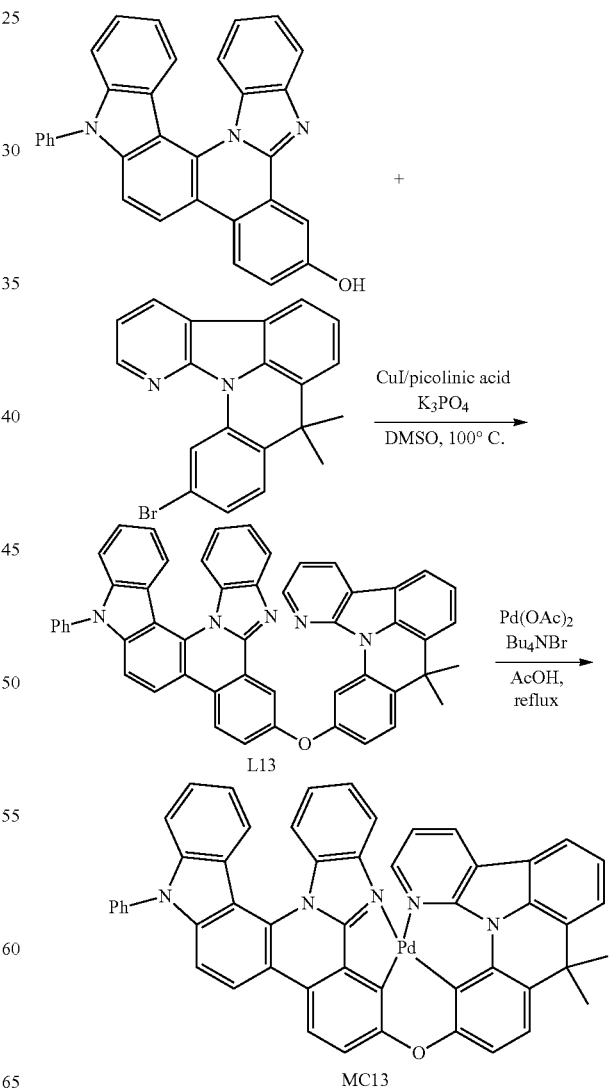

7-phenyl-7H-benzo[4,5]imidazo[1,2-f]indolo[2,3-c]phenanthridin-2-ol (1 mmol, 1.0 eq), 11-bromo-8,8-dimethyl-8H-pyrido[3',2':4,5]pyrrolo[3,2,1-de]acridine (1.2 mmol, 1.2 eq), CuI (0.2 mmol, 0.2 eq), picolinic acid (0.4 mmol, 0.4 eq) and K$_3$PO$_4$ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product L13 in 30%~70% yield.

L13 (0.20 mmol, 1.0 eq), Pd(OAc)$_2$ (0.24 mmol, 1.2 eq) and n-Bu$_4$NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC13 in 10%~50% yield.

In one embodiment, an exemplary compound may be prepared according to the following scheme:

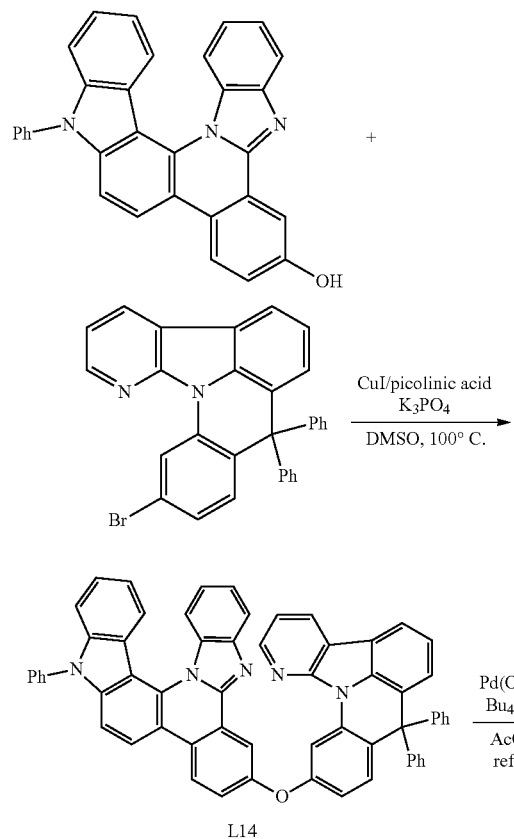

L14

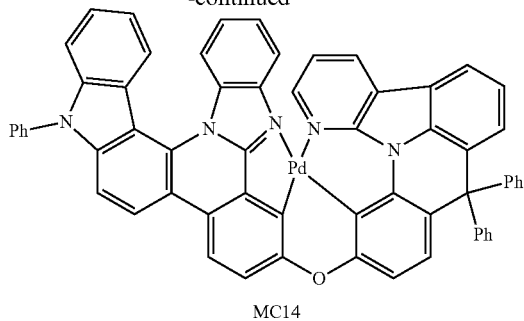

MC14

7-phenyl-7H-benzo[4,5]imidazo[1,2-f]indolo[2,3-c]phenanthridin-2-ol (1 mmol, 1.0 eq), 11-bromo-8,8-diphenyl-8H-pyrido[3',2':4,5]pyrrolo[3,2,1-de]acridine (1.2 mmol, 1.2 eq), CuI (0.2 mmol, 0.2 eq), picolinic acid (0.4 mmol, 0.4 eq) and K$_3$PO$_4$ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product L14 in 30%~70% yield.

L14 (0.20 mmol, 1.0 eq), Pd(OAc)$_2$ (0.24 mmol, 1.2 eq) and n-Bu$_4$NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC14 in 10%~50% yield.

In one embodiment, an exemplary compound may be prepared according to the following scheme:

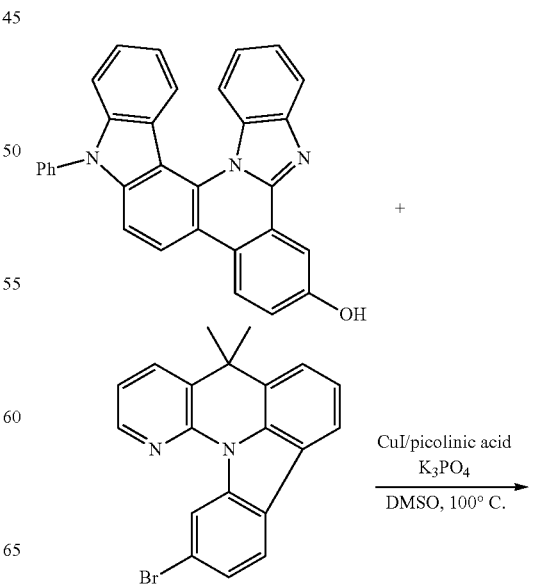

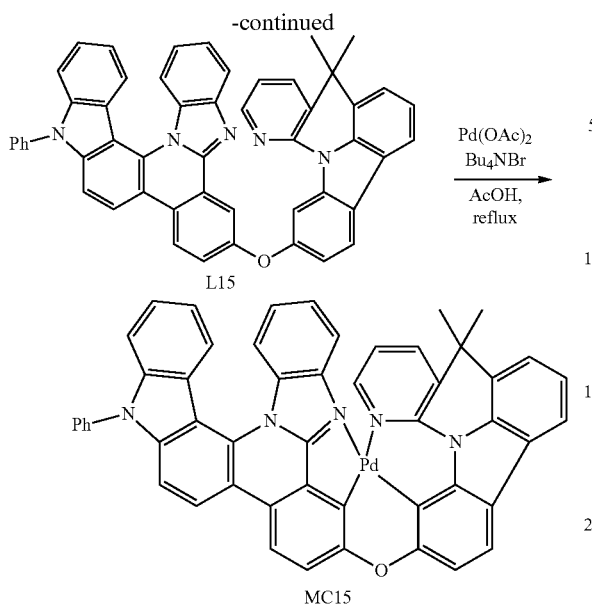

7-phenyl-7H-benzo[4,5]imidazo[1,2-f]indolo[2,3-c]phenanthridin-2-ol (1 mmol, 1.0 eq), 11-bromo-5,5-dimethyl-5H-[1,8]naphthyridino[3,2,1-jk]carbazole (1.2 mmol, 1.2 eq), CuI (0.2 mmol, 0.2 eq), picolinic acid (0.4 mmol, 0.4 eq) and $K_3PO_4$ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product L15 in 30%~70% yield.

L15 (0.20 mmol, 1.0 eq), $Pd(OAc)_2$ (0.24 mmol, 1.2 eq) and n-$Bu_4NBr$ (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC15 in 10%~50% yield.

In one embodiment, an exemplary compound may be prepared according to the following scheme:

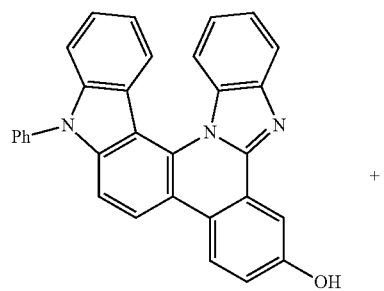

+

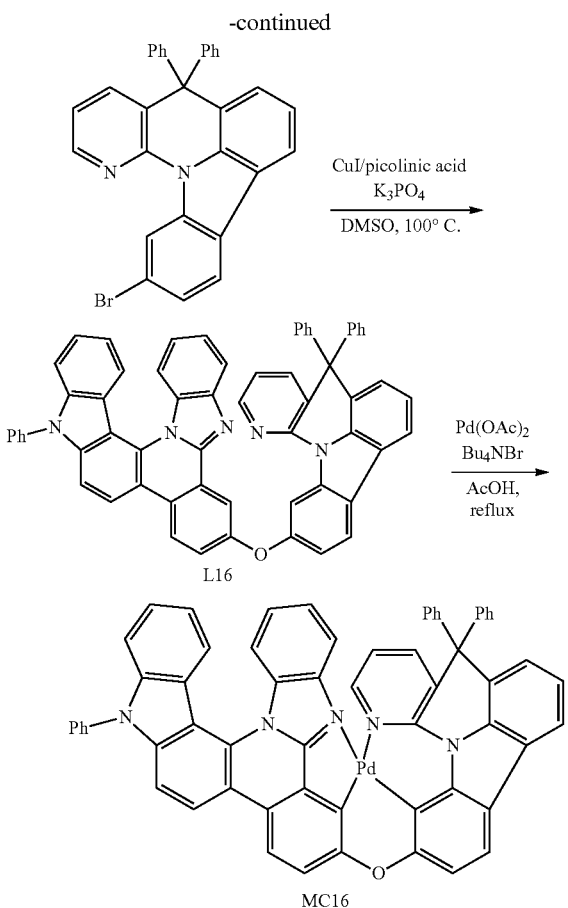

7-phenyl-7H-benzo[4,5]imidazo[1,2-f]indolo[2,3-c]phenanthridin-2-ol (1 mmol, 1.0 eq), 11-bromo-5,5-diphenyl-5H-[1,8]naphthyridino[3,2,1-jk]carbazole (1.2 mmol, 1.2 eq), CuI (0.2 mmol, 0.2 eq), picolinic acid (0.4 mmol, 0.4 eq) and $K_3PO_4$ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product L16 in 30%~70% yield.

L16 (0.20 mmol, 1.0 eq), $Pd(OAc)_2$ (0.24 mmol, 1.2 eq) and n-$Bu_4NBr$ (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC16 in 10%~50% yield.

In one embodiment, an exemplary compound may be prepared according to the following scheme:
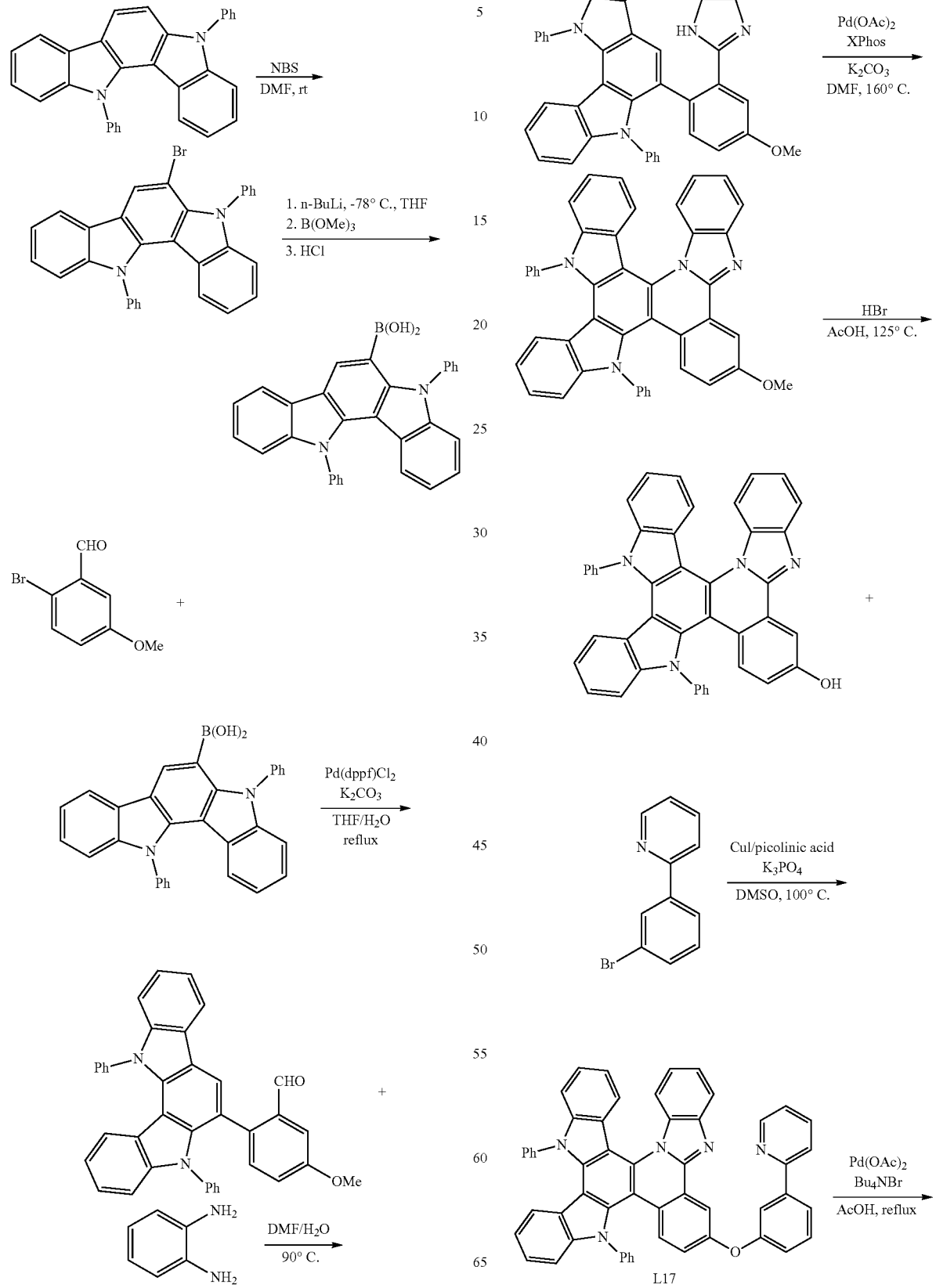

-continued

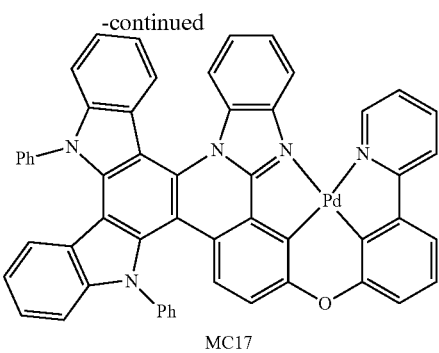

MC17

5,20-diphenyl-5,20-dihydrobenzo[4,5]imidazo[1,2-f]diindolo[2,3-a:2',3'-c]phenanthridin-8-ol (1 mmol, 1.0 eq), 2-(3-bromophenyl)pyridine (1.2 mmol, 1.2 eq), CuI (0.2 mmol, 0.2 eq), picolinic acid (0.4 mmol, 0.4 eq) and $K_3PO_4$ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product L17 in 30%~70% yield.

L17 (0.20 mmol, 1.0 eq), Pd(OAc)$_2$ (0.24 mmol, 1.2 eq) and n-Bu$_4$NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC17 in 10%~50% yield.

In one embodiment, an exemplary compound may be prepared according to the following scheme:

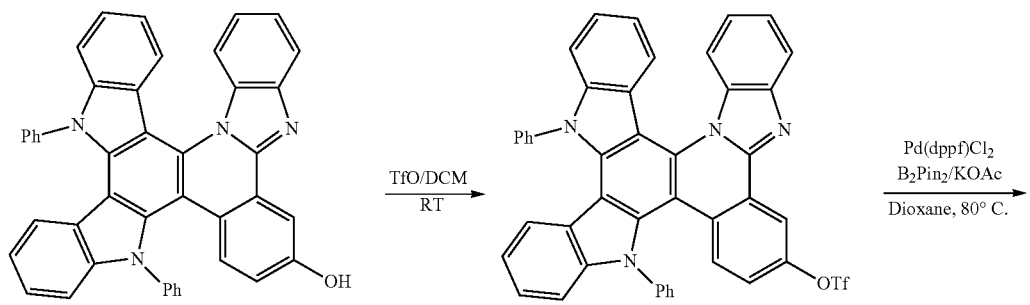

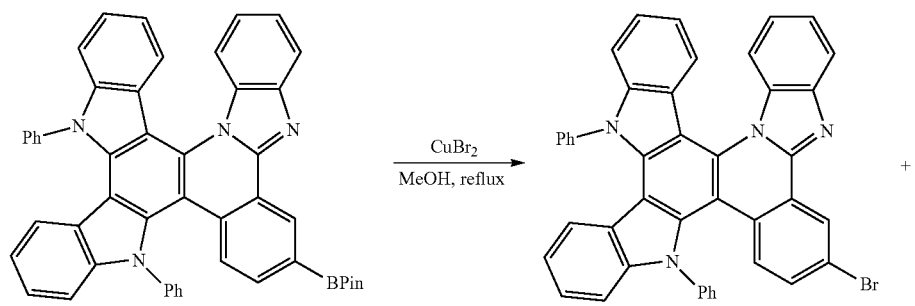

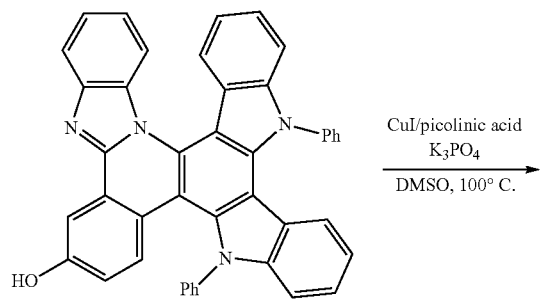

-continued

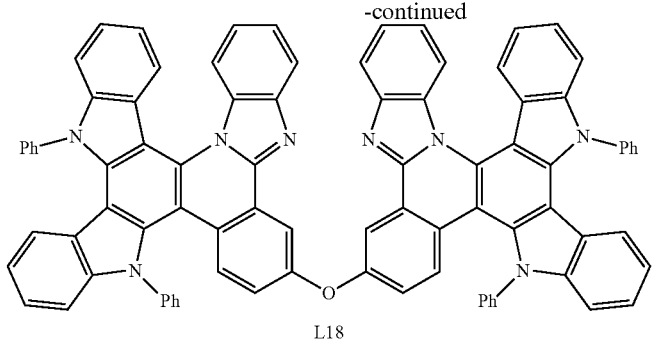
L18

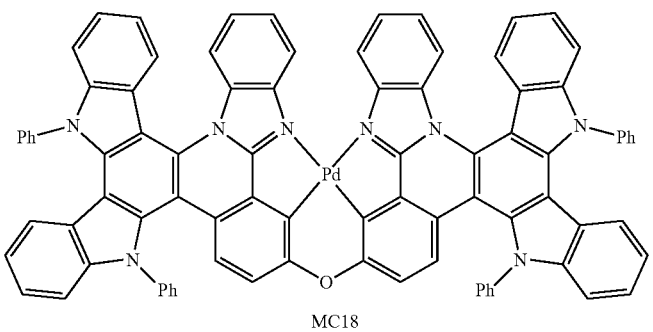
MC18

5,20-diphenyl-5,20-dihydrobenzo[4,5]imidazo[1,2-f]diindolo[2,3-a:2',3'-c]phenanthridin-8-ol (1 mmol, 1.0 eq), 8-bromo-5,20-diphenyl-5,20-dihydrobenzo[4,5]imidazo[1,2-f]diindolo[2,3-a:2',3'-c]phenanthridine (1.2 mmol, 1.2 eq), CuI (0.2 mmol, 0.2 eq), picolinic acid (0.4 mmol, 0.4 eq) and K₃PO₄ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product L18 in 30%~70% yield.

L18 (0.20 mmol, 1.0 eq), Pd(OAc)₂ (0.24 mmol, 1.2 eq) and n-Bu₄NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC18 in 10%~50% yield.

In one embodiment, an exemplary compound may be prepared according to the following scheme:

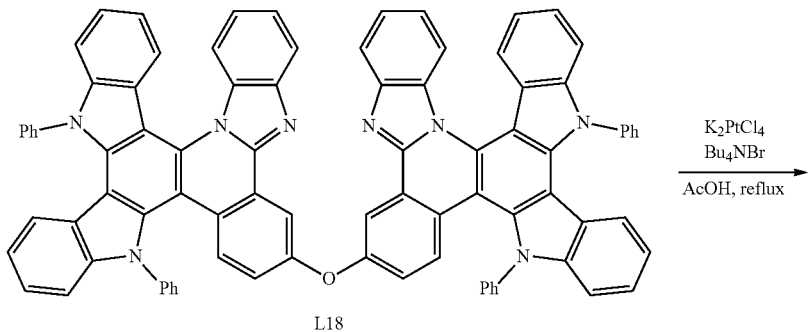
L18

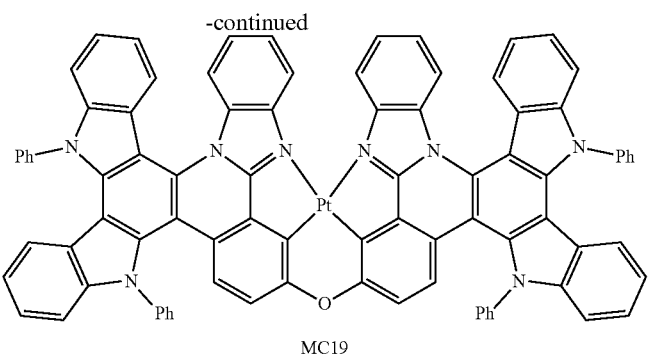

MC19

L18 (0.20 mmol, 1.0 eq), K₂PtCl₄ (0.24 mmol, 1.2 eq) and n-Bu₄NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC19 in 10%~50% yield.

In one embodiment, an exemplary compound may be prepared according to the following scheme:

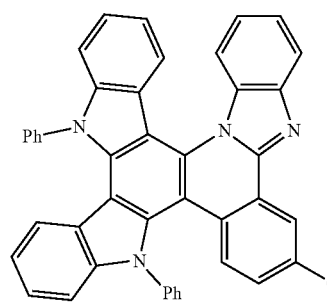

+

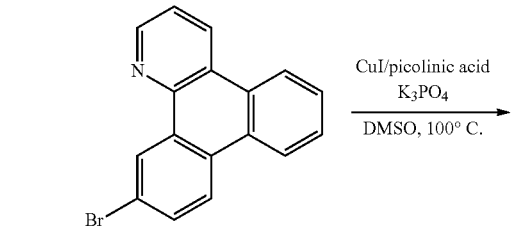

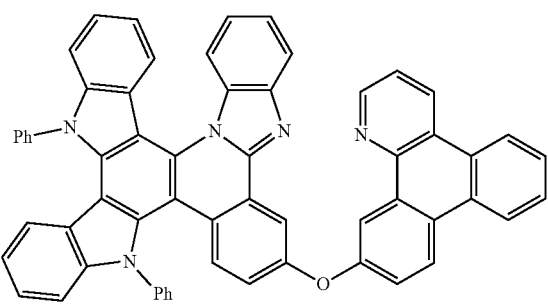

L20

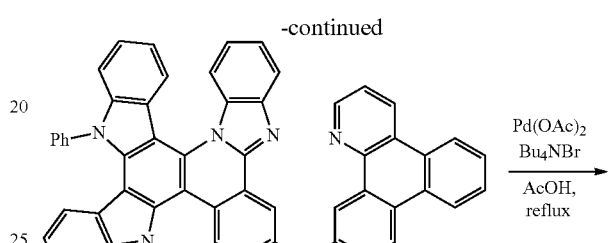

L20

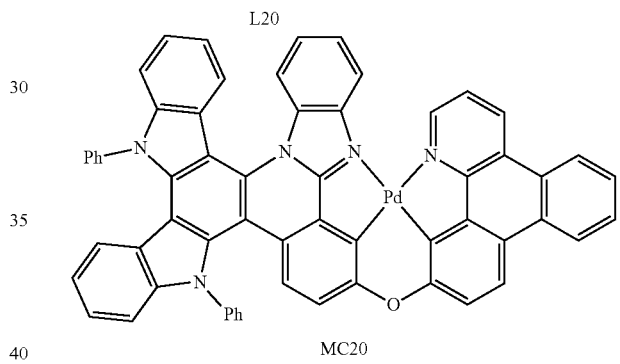

MC20

5,20-diphenyl-5,20-dihydrobenzo[4,5]imidazo[1,2-f]diindolo[2,3-a:2',3'-c]phenanthridin-8-ol (1 mmol, 1.0 eq), 11-bromodibenzo[f,h]quinoline (1.2 mmol, 1.2 eq), CuI (0.2 mmol, 0.2 eq), picolinic acid (0.4 mmol, 0.4 eq) and K₃PO₄ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product L20 in 30%~70% yield.

L20 (0.20 mmol, 1.0 eq), Pd(OAc)₂ (0.24 mmol, 1.2 eq) and n-Bu₄NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC20 in 10%~50% yield.

In one embodiment, an exemplary compound may be prepared according to the following scheme:

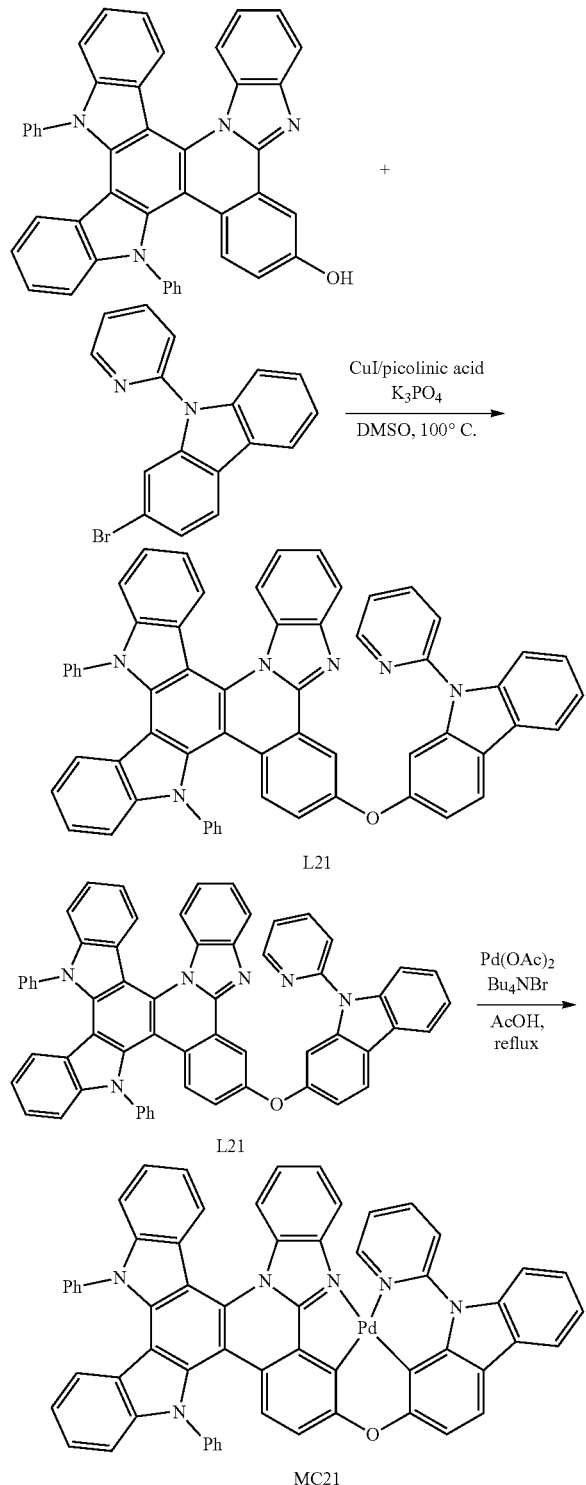

L21

L21

MC21

5,20-diphenyl-5,20-dihydrobenzo[4,5]imidazo[1,2-f]diindolo[2,3-a:2',3'-c]phenanthridin-8-ol (1 mmol, 1.0 eq), 2-bromo-9-(pyridin-2-yl)-9H-carbazole (1.2 mmol, 1.2 eq), CuI (0.2 mmol, 0.2 eq), picolinic acid (0.4 mmol, 0.4 eq) and $K_3PO_4$ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product L21 in 30%~70% yield.

L21 (0.20 mmol, 1.0 eq), Pd(OAc)$_2$ (0.24 mmol, 1.2 eq) and n-Bu$_4$NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC21 in 10%~50% yield.

In one embodiment, an exemplary compound may be prepared according to the following scheme:

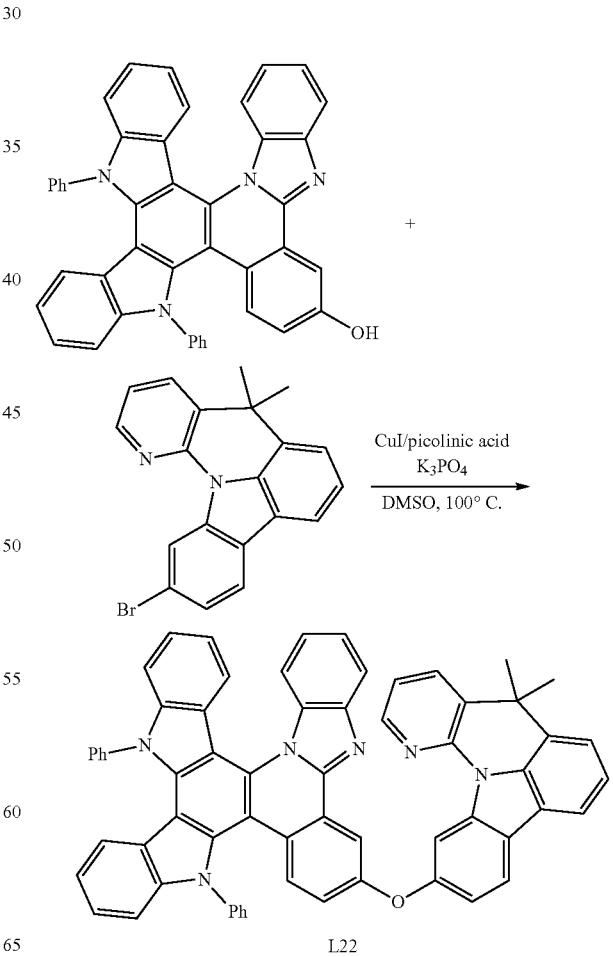

L22

-continued

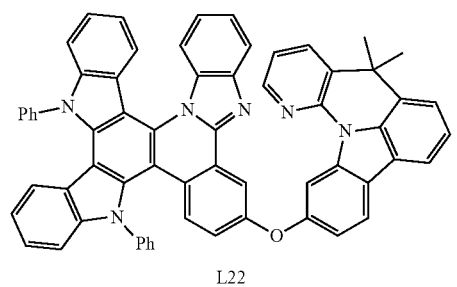
L22

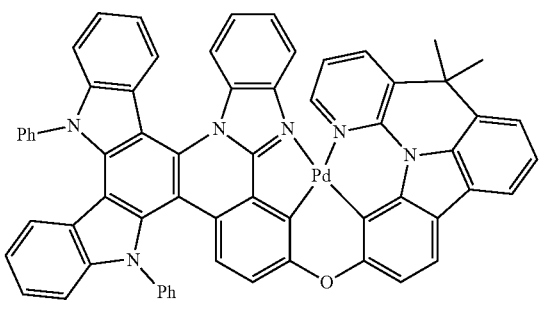
MC22

5,20-diphenyl-5,20-dihydrobenzo[4,5]imidazo[1,2-f]diindolo[2,3-a:2',3'-c]phenanthridin-8-ol (1 mmol, 1.0 eq), 11-bromo-5,5-dimethyl-5H-[1,8]naphthyridino[3,2,1-jk]carbazole (1.2 mmol, 1.2 eq), CuI (0.2 mmol, 0.2 eq), picolinic acid (0.4 mmol, 0.4 eq) and K₃PO₄ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product L22 in 30%~70% yield.

L22 (0.20 mmol, 1.0 eq), Pd(OAc)₂ (0.24 mmol, 1.2 eq) and n-Bu₄NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC22 in 10%~50% yield.

In one embodiment, an exemplary compound may be prepared according to the following scheme:

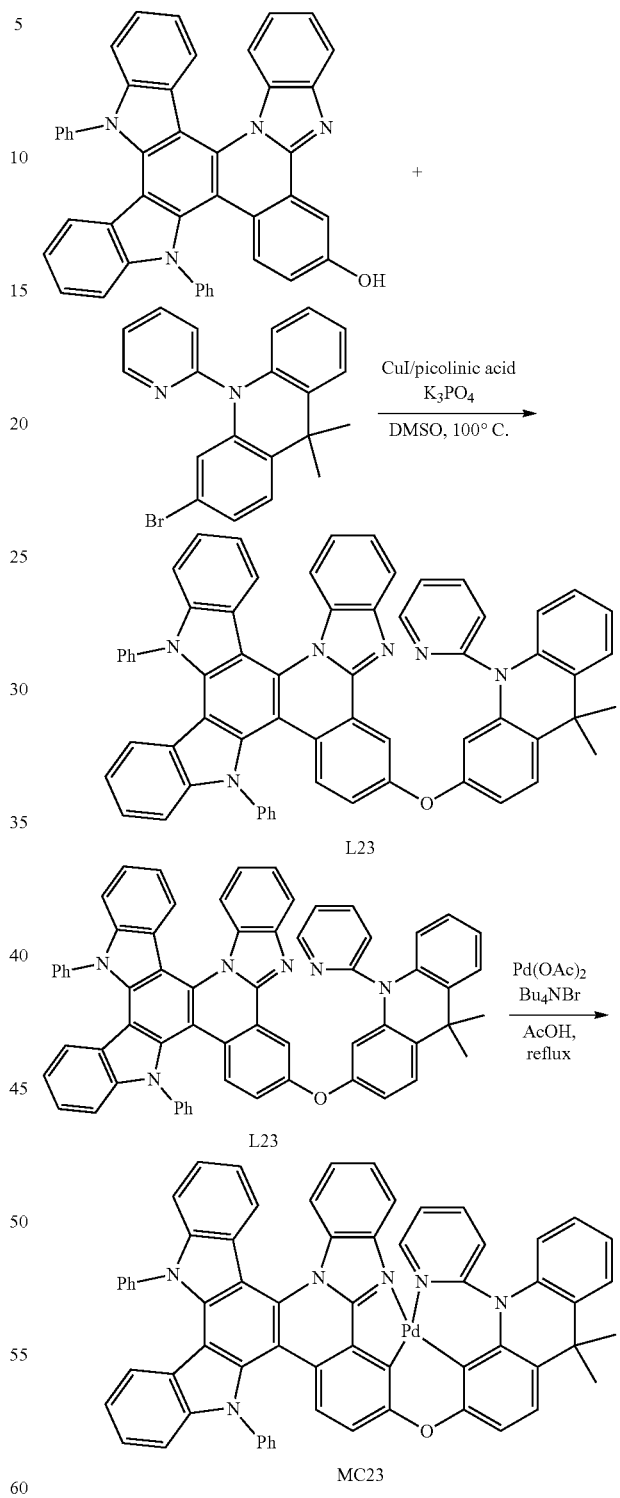

5,20-diphenyl-5,20-dihydrobenzo[4,5]imidazo[1,2-f]diindolo[2,3-a:2',3'-c]phenanthridin-8-ol (1 mmol, 1.0 eq), 3-bromo-9,9-dimethyl-10-(pyridin-2-yl)-9,10-dihydroacridine (1.2 mmol, 1.2 eq), CuI (0.2 mmol, 0.2 eq), picolinic acid (0.4 mmol, 0.4 eq) and K₃PO₄ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product L23 in 30%~70% yield.

L23 (0.20 mmol, 1.0 eq), Pd(OAc)$_2$ (0.24 mmol, 1.2 eq) and n-Bu$_4$NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC23 in 10%~50% yield.

In one embodiment, an exemplary compound may be prepared according to the following scheme:

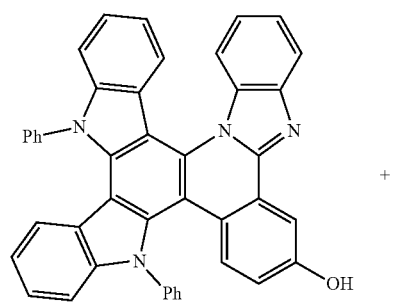

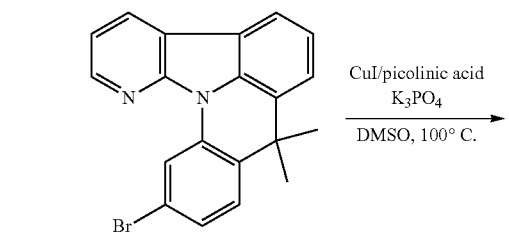

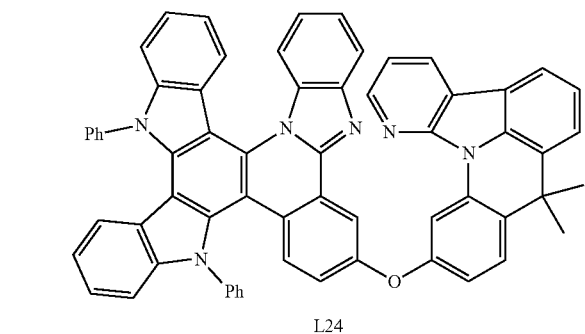

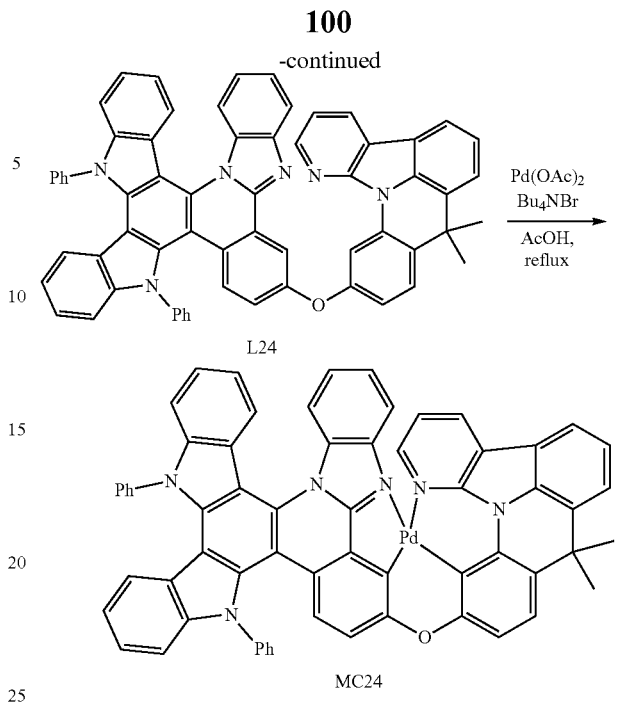

5,20-diphenyl-5,20-dihydrobenzo[4,5]imidazo[1,2-f]diindolo[2,3-a:2',3'-c]phenanthridin-8-ol (1 mmol, 1.0 eq), 11-bromo-8,8-dimethyl-8H-pyrido[3',2':4,5]pyrrolo[3,2,1-de]acridine (1.2 mmol, 1.2 eq), CuI (0.2 mmol, 0.2 eq), picolinic acid (0.4 mmol, 0.4 eq) and K$_3$PO$_4$ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product L24 in 30%~70% yield.

L24 (0.20 mmol, 1.0 eq), Pd(OAc)$_2$ (0.24 mmol, 1.2 eq) and n-Bu$_4$NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC24 in 10%~50% yield.

In one embodiment, an exemplary compound may be prepared according to the following scheme:

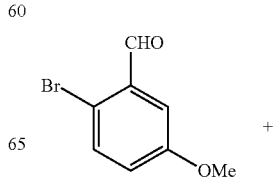

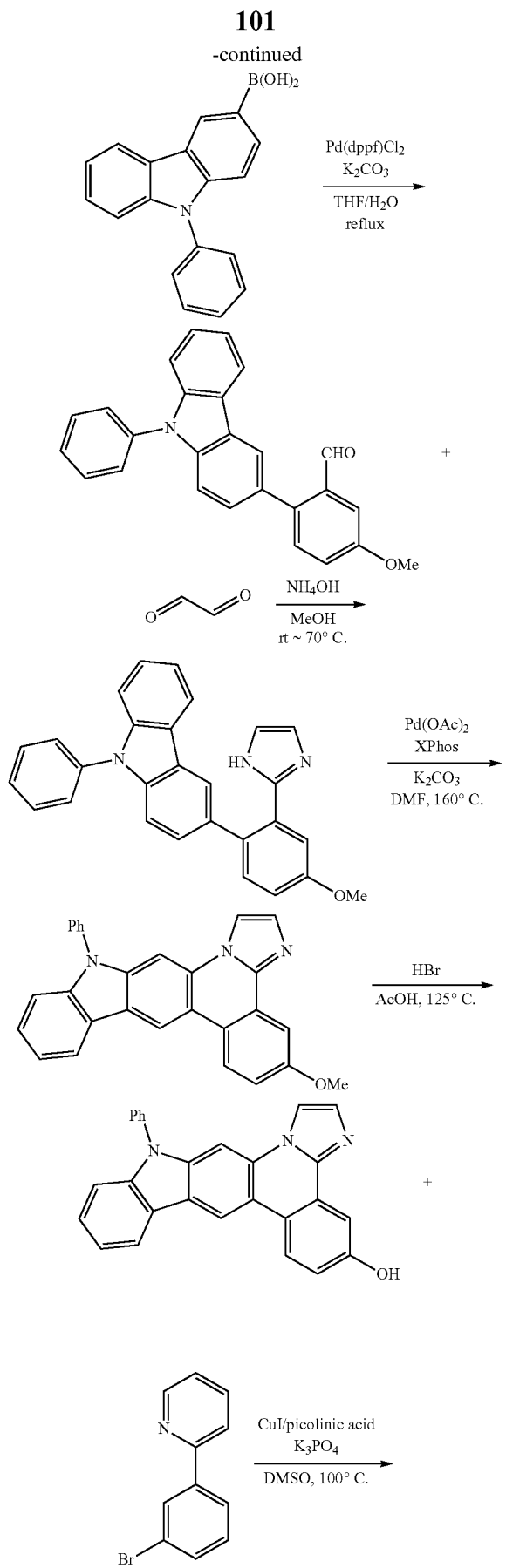

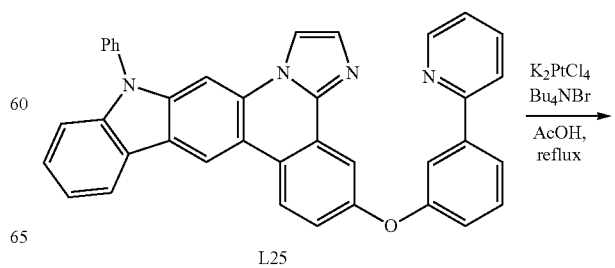

13-phenyl-13H-imidazo[1,2-f]indolo[3,2-b]phenanthridin-5-ol (1 mmol, 1.0 eq), 2-(3-bromophenyl)pyridine (1.2 mmol, 1.2 eq), CuI (0.2 mmol, 0.2 eq), picolinic acid (0.4 mmol, 0.4 eq) and $K_3PO_4$ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product L25 in 30%~70% yield.

L25 (0.20 mmol, 1.0 eq), $Pd(OAc)_2$ (0.24 mmol, 1.2 eq) and n-$Bu_4NBr$ (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC25 in 10%~50% yield.

In one embodiment, an exemplary compound may be prepared according to the following scheme:

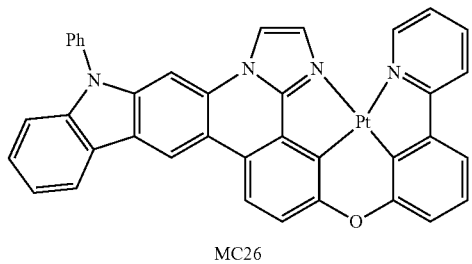

MC26

L25 (0.20 mmol, 1.0 eq), K$_2$PtCl$_4$ (0.24 mmol, 1.2 eq) and n-Bu$_4$NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC26 in 10%~50% yield.

In one embodiment, an exemplary compound may be prepared according to the following scheme:

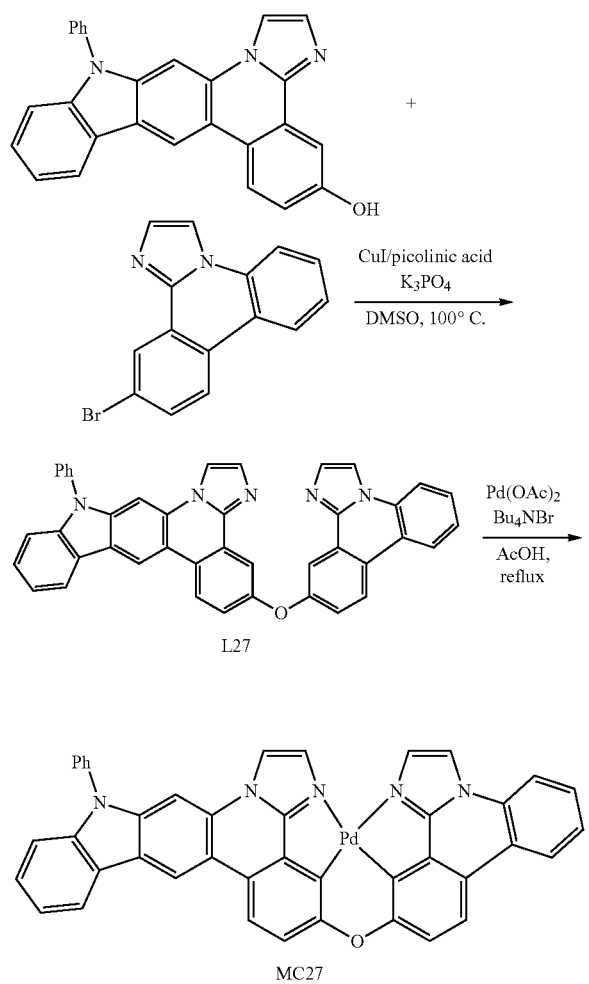

13-phenyl-13H-imidazo[1,2-f]indolo[3,2-b]phenanthridin-5-ol (1 mmol, 1.0 eq), 11-bromoimidazo[1,2-f]phenanthridine (1.2 mmol, 1.2 eq), CuI (0.2 mmol, 0.2 eq), picolinic acid (0.4 mmol, 0.4 eq) and K$_3$PO$_4$ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product L27 in 30%~70% yield.

L27 (0.20 mmol, 1.0 eq), Pd(OAc)$_2$ (0.24 mmol, 1.2 eq) and n-Bu$_4$NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC27 in 10%~50% yield.

In one embodiment, an exemplary compound may be prepared according to the following scheme:

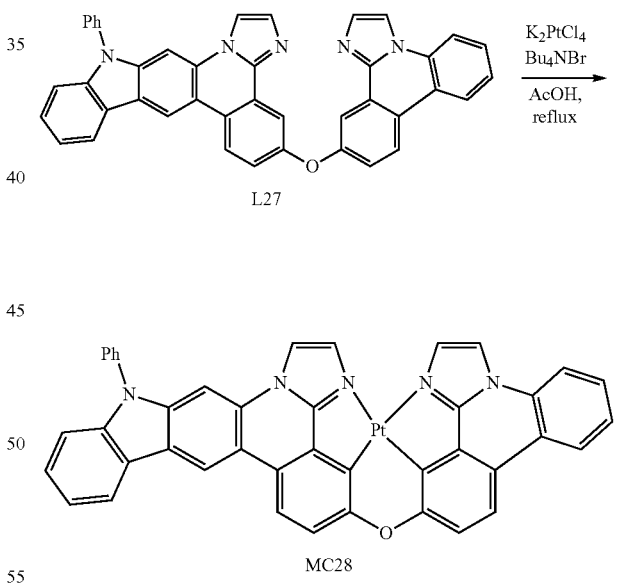

L27 (0.20 mmol, 1.0 eq), K$_2$PtCl$_4$ (0.24 mmol, 1.2 eq) and n-Bu$_4$NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC28 in 10%~50% yield.

In one embodiment, an exemplary compound may be prepared according to the following scheme:

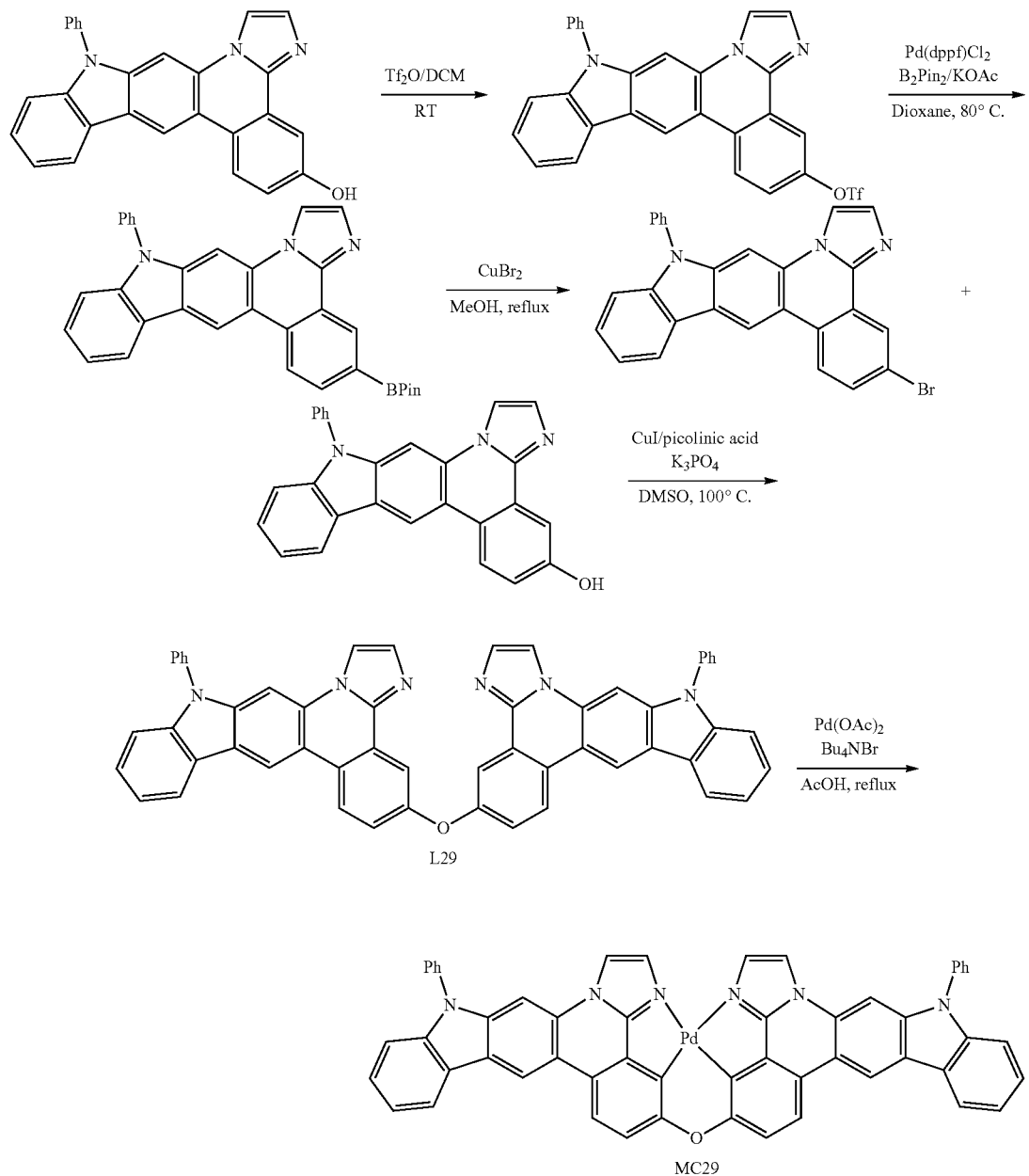

13-phenyl-13H-imidazo[1,2-f]indolo[3,2-b]phenanthridin-5-ol (1 mmol, 1.0 eq), 5-bromo-13-phenyl-13H-imidazo[1,2-f]indolo[3,2-b]phenanthridine (1.2 mmol, 1.2 eq), CuI (0.2 mmol, 0.2 eq), picolinic acid (0.4 mmol, 0.4 eq) and K$_3$PO$_4$ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product L29 in 30%~70% yield.

L29 (0.20 mmol, 1.0 eq), Pd(OAc)$_2$ (0.24 mmol, 1.2 eq) and n-Bu$_4$NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC29 in 10%~50% yield.

In one embodiment, an exemplary compound may be prepared according to the following scheme:

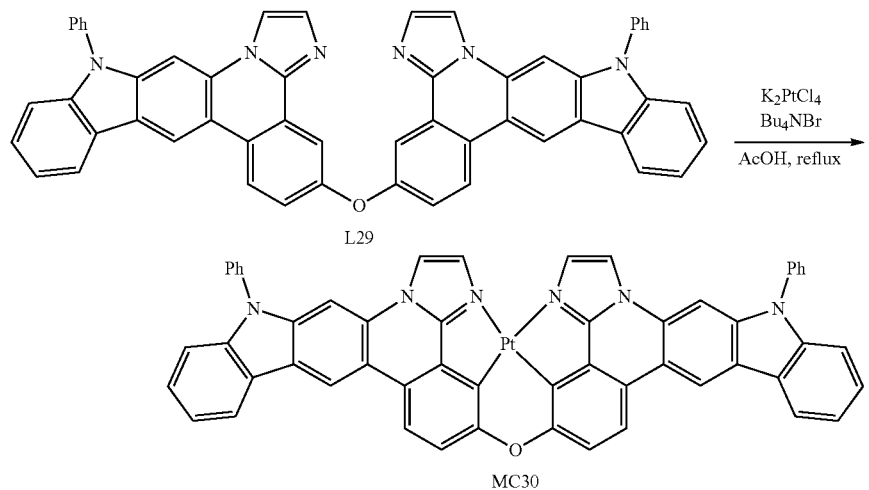

L29 (0.20 mmol, 1.0 eq), K₂PtCl₄ (0.24 mmol, 1.2 eq) and n-Bu₄NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC30 in 10%~50% yield.

In one embodiment, an exemplary compound may be prepared according to the following scheme:

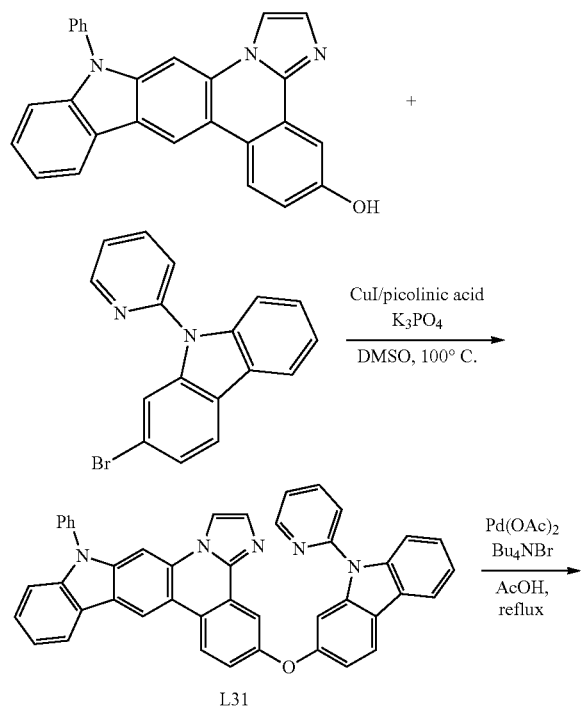

-continued

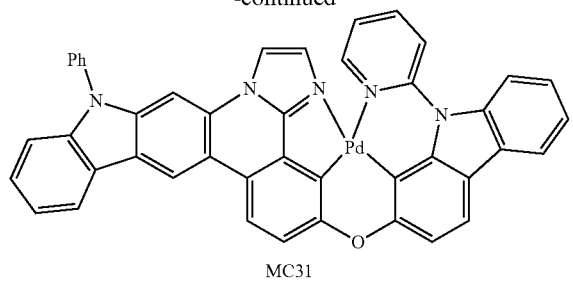

13-phenyl-13H-imidazo[1,2-f]indolo[3,2-b]phenanthridin-5-ol (1 mmol, 1.0 eq), 2-bromo-9-(pyridin-2-yl)-9H-carbazole (1.2 mmol, 1.2 eq), CuI (0.2 mmol, 0.2 eq), picolinic acid (0.4 mmol, 0.4 eq) and K₃PO₄ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product L31 in 30%~70% yield.

L31 (0.20 mmol, 1.0 eq), Pd(OAc)₂ (0.24 mmol, 1.2 eq) and n-Bu₄NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC31 in 10%~50% yield.

In one embodiment, an exemplary compound may be prepared according to the following scheme:

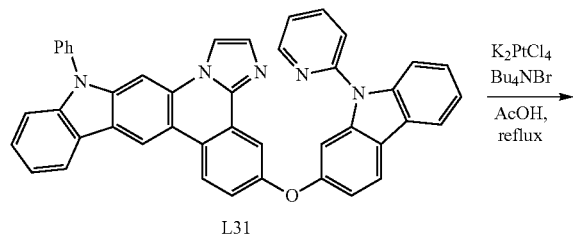

L31

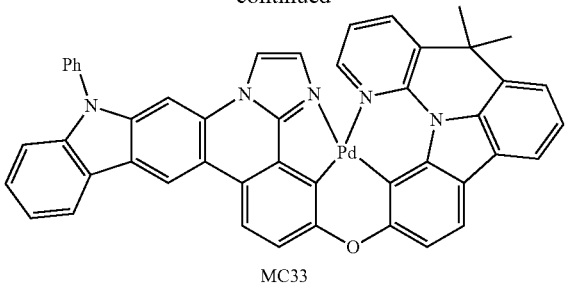

MC33

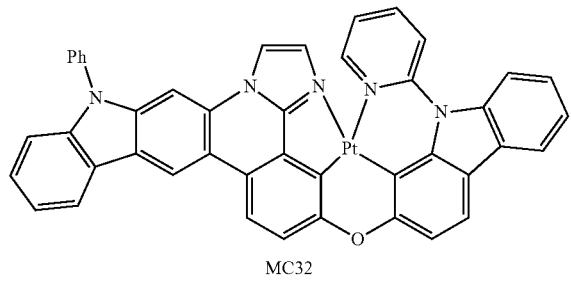

MC32

L31 (0.20 mmol, 1.0 eq), K₂PtCl₄ (0.24 mmol, 1.2 eq) and n-Bu₄NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC32 in 10%~50% yield.

In one embodiment, an exemplary compound may be prepared according to the following scheme:

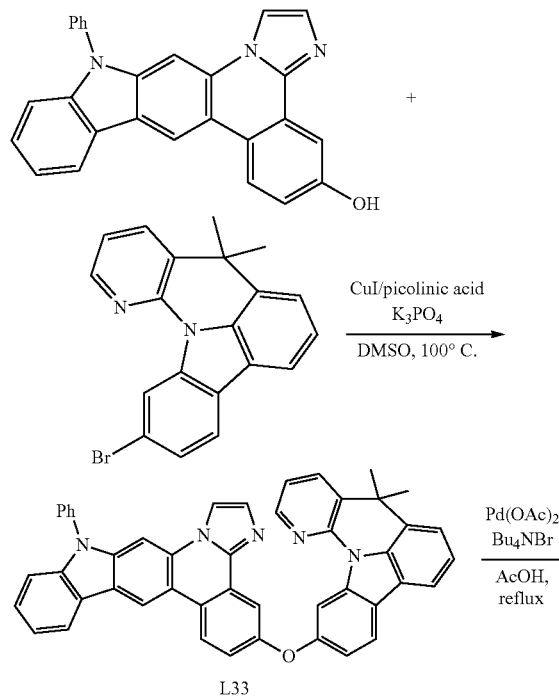

L33

13-phenyl-13H-imidazo[1,2-f]indolo[3,2-b]phenanthridin-5-ol (1 mmol, 1.0 eq), 11-bromo-5,5-dimethyl-5H-[1,8]naphthyridino[3,2,1-jk]carbazole (1.2 mmol, 1.2 eq), CuI (0.2 mmol, 0.2 eq), picolinic acid (0.4 mmol, 0.4 eq) and K₃PO₄ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product L33 in 30%~70% yield.

L33 (0.20 mmol, 1.0 eq), Pd(OAc)₂ (0.24 mmol, 1.2 eq) and n-Bu₄NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC34 in 10%~50% yield.

In one embodiment, an exemplary compound may be prepared according to the following scheme:

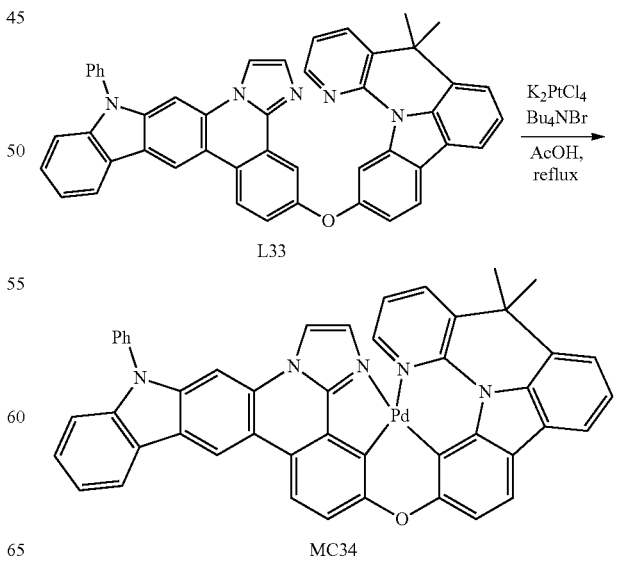

MC34

L33 (0.20 mmol, 1.0 eq), K$_2$PtCl$_4$ (0.24 mmol, 1.2 eq) and n-Bu$_4$NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC34 in 10%~50% yield.

In one embodiment, an exemplary compound may be prepared according to the following scheme:

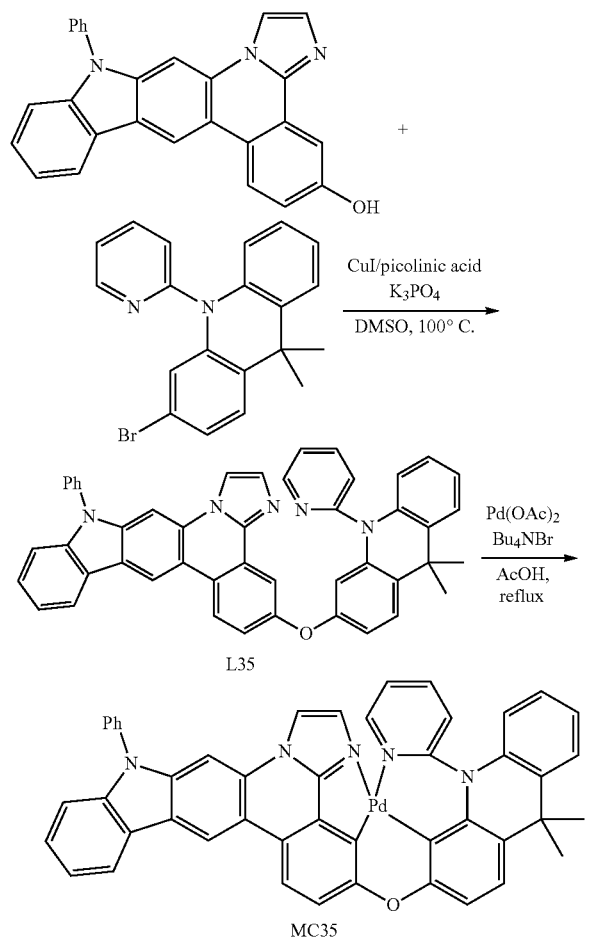

13-phenyl-13H-imidazo[1,2-f]indolo[3,2-b]phenanthridin-5-ol (1 mmol, 1.0 eq), 3-bromo-9,9-dimethyl-10-(pyridin-2-yl)-9,10-dihydroacridine (1.2 mmol, 1.2 eq), CuI (0.2 mmol, 0.2 eq), picolinic acid (0.4 mmol, 0.4 eq) and K$_3$PO$_4$ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product L35 in 30%~70% yield.

L35 (0.20 mmol, 1.0 eq), Pd(OAc)$_2$ (0.24 mmol, 1.2 eq) and n-Bu$_4$NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC35 in 10%~50% yield.

In one embodiment, an exemplary compound may be prepared according to the following scheme:

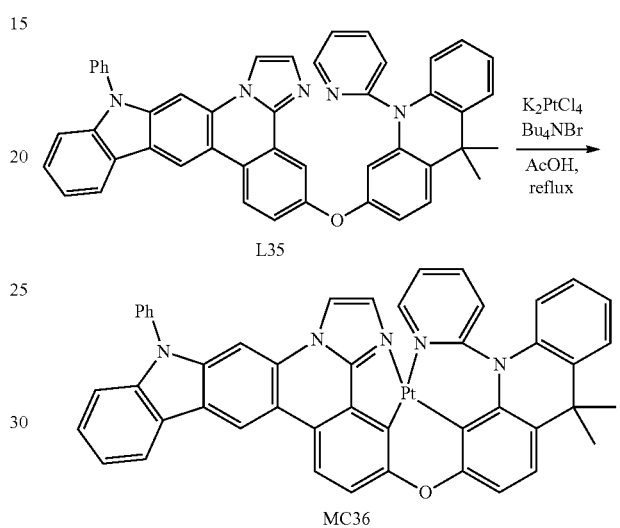

L35 (0.20 mmol, 1.0 eq), K$_2$PtCl$_4$ (0.24 mmol, 1.2 eq) and n-Bu$_4$NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC36 in 10%~50% yield.

In one embodiment, an exemplary compound may be prepared according to the following scheme:

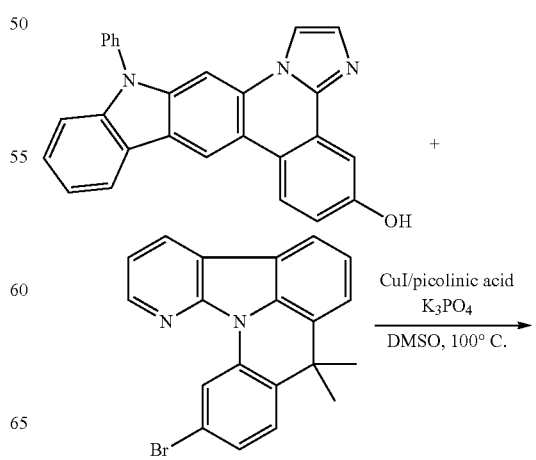

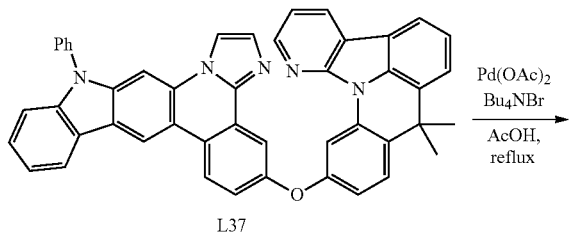

L37

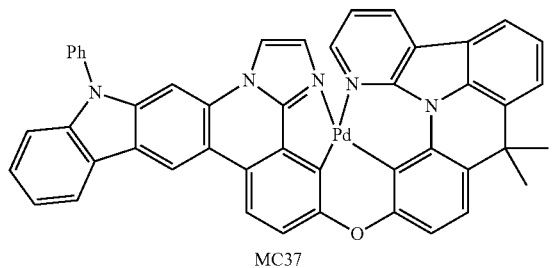

MC37

13-phenyl-13H-imidazo[1,2-f]indolo[3,2-b]phenanthridin-5-ol (1 mmol, 1.0 eq), 11-bromo-8,8-dimethyl-8H-pyrido[3',2':4,5]pyrrolo[3,2,1-de]acridine (1.2 mmol, 1.2 eq), CuI (0.2 mmol, 0.2 eq), picolinic acid (0.4 mmol, 0.4 eq) and $K_3PO_4$ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product L37 in 30%~70% yield.

L37 (0.20 mmol, 1.0 eq), Pd(OAc)$_2$ (0.24 mmol, 1.2 eq) and n-Bu$_4$NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC37 in 10%~50% yield.

In one embodiment, an exemplary compound may be prepared according to the following scheme:

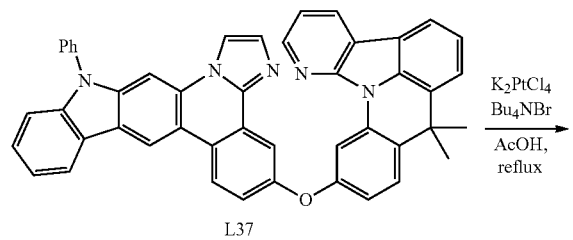

L37

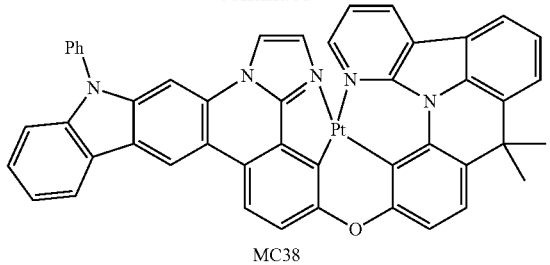

MC38

L37 (0.20 mmol, 1.0 eq), K$_2$PtCl$_4$ (0.24 mmol, 1.2 eq) and n-Bu$_4$NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC38 in 10%~50% yield.

In one embodiment, an exemplary compound may be prepared according to the following scheme:

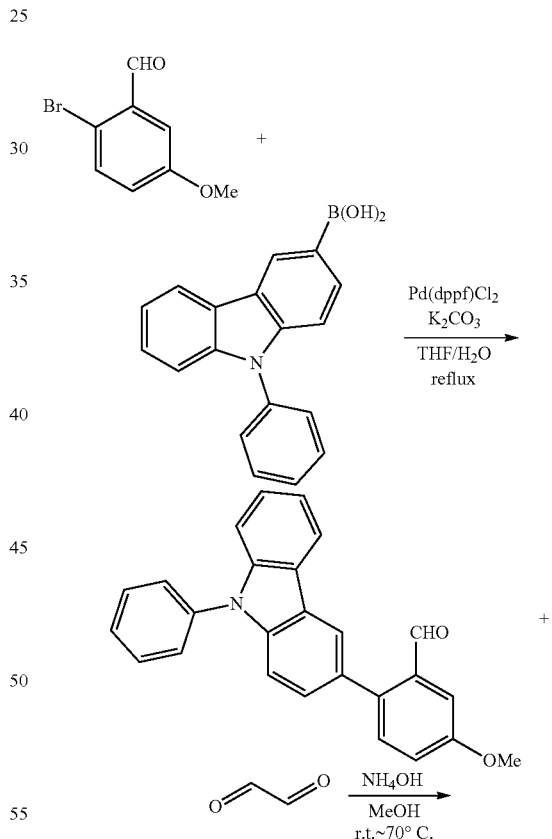

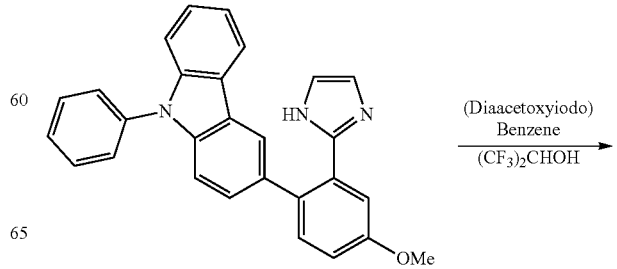

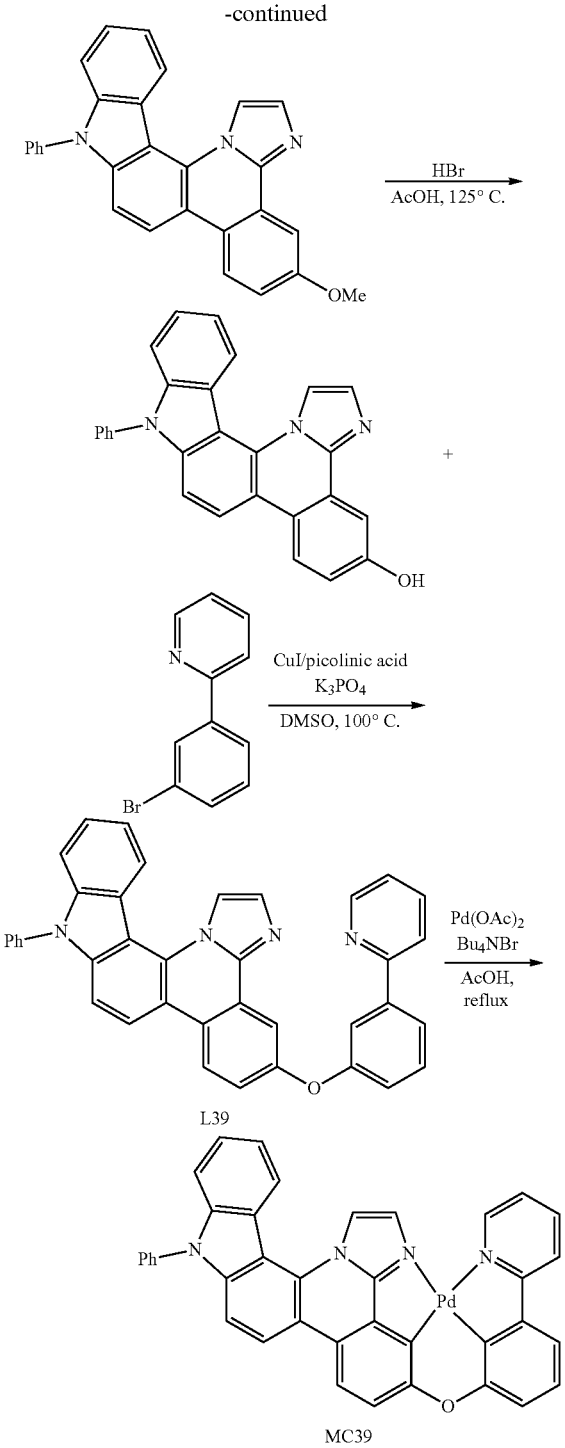

mixture was washed with water three times and then dried over sodium sulfate and filtered. The solvent was removed under reduced pressure, and the residue was purified through column chromatography on silica gel using hexane/ethyl acetate as eluent to obtain the desired product L39 in 30%~70% yield.

L39 (0.20 mmol, 1.0 eq), Pd(OAc)₂ (0.24 mmol, 1.2 eq) and n-Bu₄NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC39 in 10%~50% yield.

In one embodiment, an exemplary compound may be prepared according to the following scheme:

7-phenyl-7H-imidazo[1,2-f]indolo[2,3-c]phenanthridin-2-ol (1 mmol, 1.0 eq), 2-(3-bromophenyl)pyridine (1.2 mmol, 1.2 eq), CuI (0.2 mmol, 0.2 eq), picolinic acid (0.4 mmol, 0.4 eq) and K₃PO₄ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The 7-phenyl-7H-imidazo[1,2-f]indolo[2,3-c]phenanthridin-2-ol (1 mmol, 1.0 eq), 2-bromo-9-(pyridin-2-yl)-9H-carbazole (1.2 mmol, 1.2 eq), CuI (0.2 mmol, 0.2 eq), picolinic acid (0.4 mmol, 0.4 eq) and K₃PO₄ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ON2-Cz56 in 30%~70% yield.

ON2-Cz56 (0.20 mmol, 1.0 eq), Pd(OAc)₂ (0.24 mmol, 1.2 eq) and n-Bu₄NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product PdON2-CZ56 in 10%~50% yield.

Figure 5:
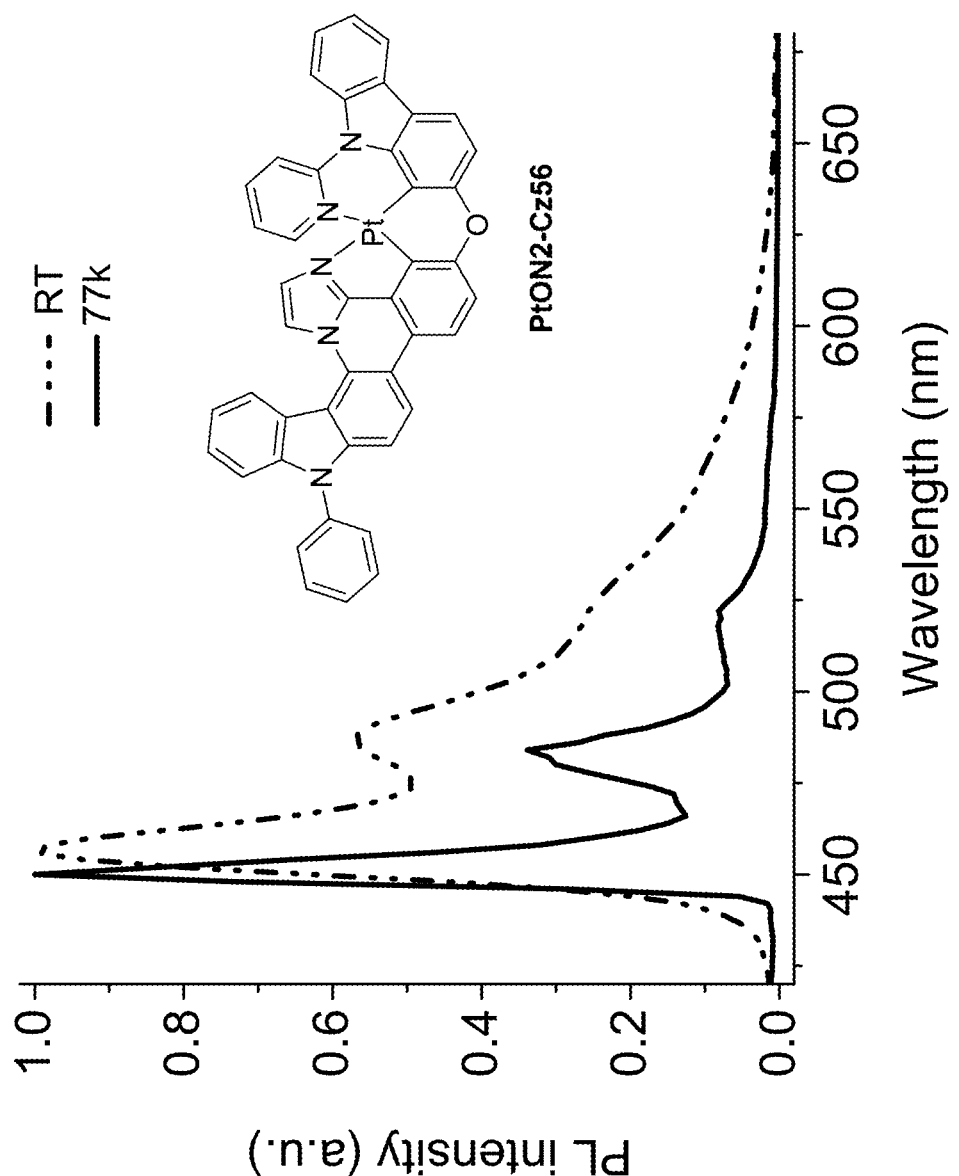
FIG. 5 is a graph of photoluminescence of exemplary compound PtON2-Cz56.
Figure 6:
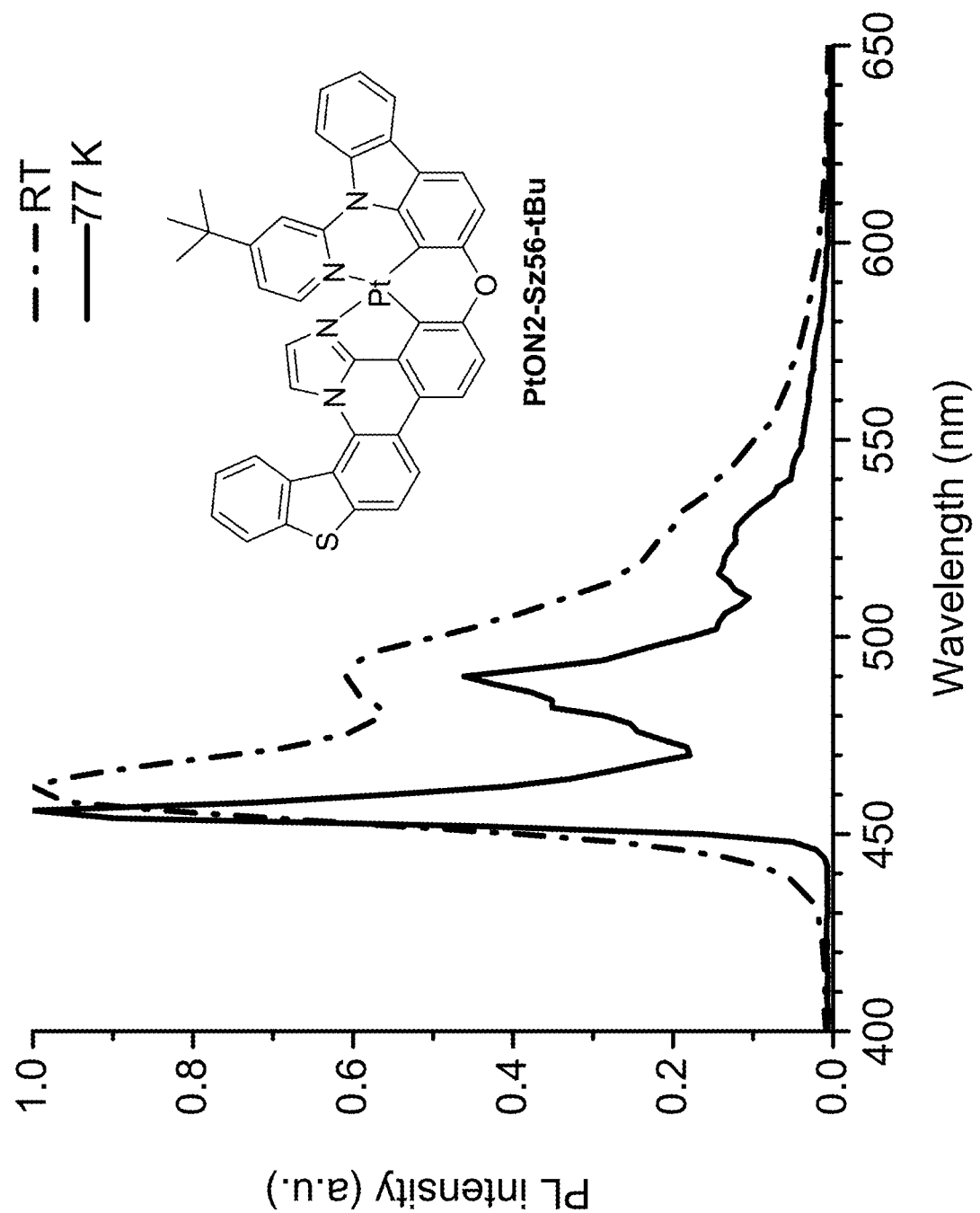
FIG. 6 is a graph of photoluminescence of exemplary compound PtON2-Sz56.
Figure 7:
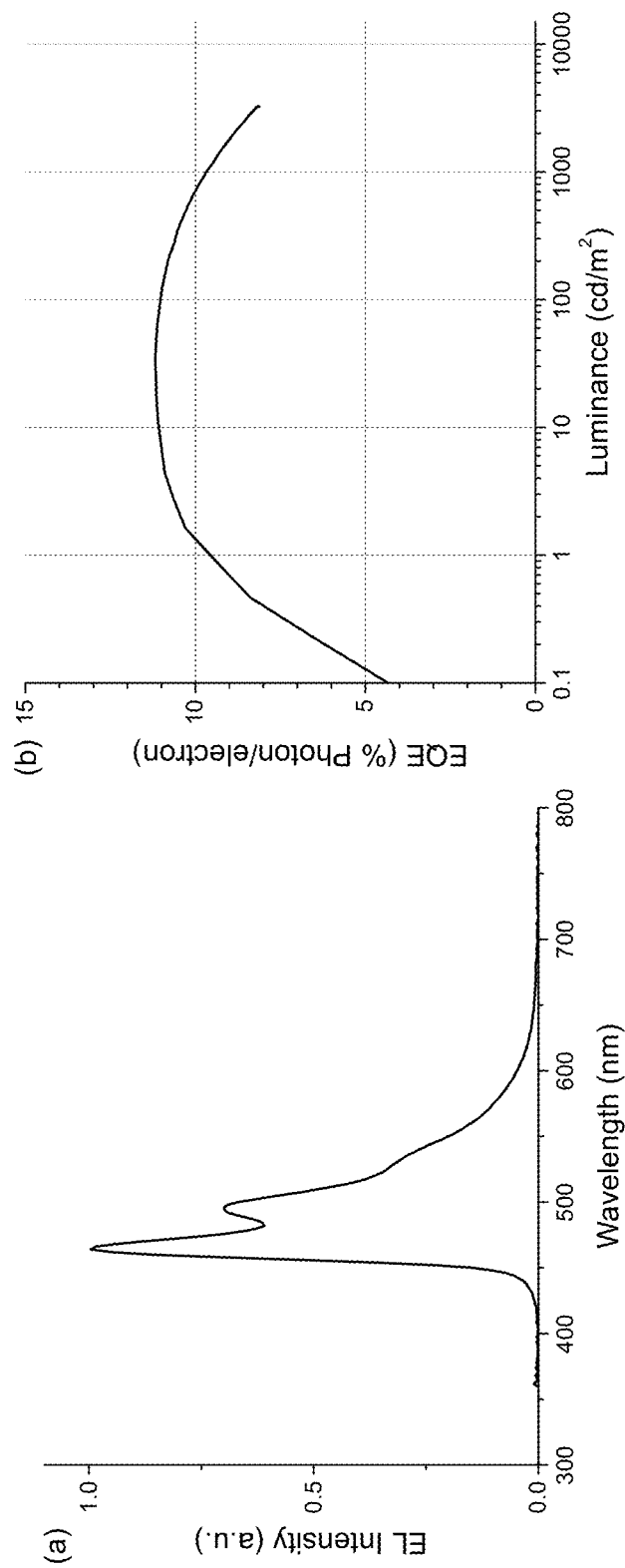
FIG. 7 is a graph of electroluminescent spectra (a) and EQE versus luminance (b) of device utilizing PtON2-Cz56-tbu as an emitter. The general device structure is HATCN (10 nm)/NPD (40 nm)/BCN34 (10 nm)/6% PtON2-Cz56-tbu:mCBP (20 nm)/BAlq (10 nm)/BPyTP (40 nm)/Liq (2 nm)/Al.

In one embodiment, an exemplary compound may be prepared according to the following scheme. The photoluminescence spectrum of this compound is presented in FIG. 5.

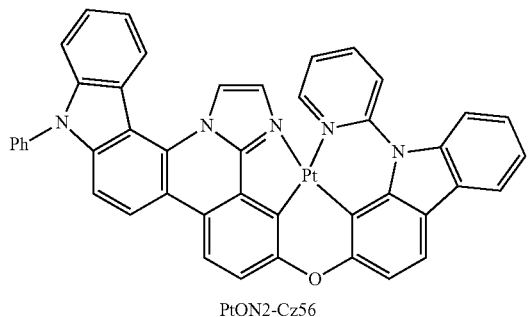

PtON2-Cz56

ON2-CZ56 (0.20 mmol, 1.0 eq), K₂PtCl₄ (0.24 mmol, 1.2 eq) and n-Bu₄NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product PtON2-CZ56 in 10%~50% yield.

In one embodiment, an exemplary compound may be prepared according to the following scheme:

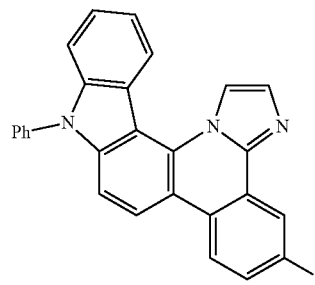

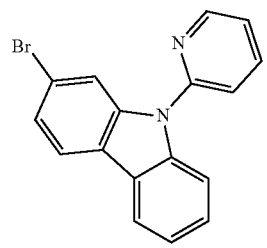

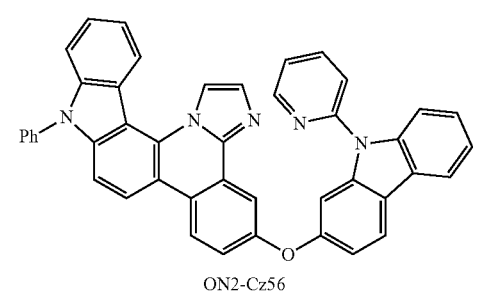

ON2-Cz56

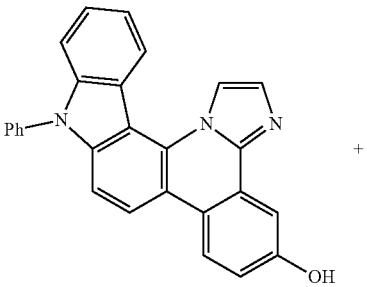

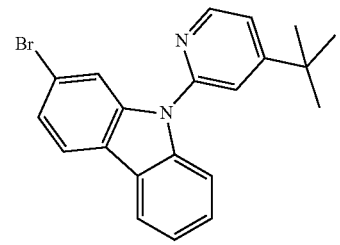

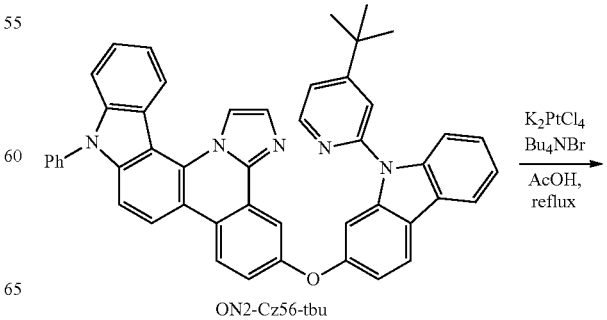

ON2-Cz56-tbu

-continued

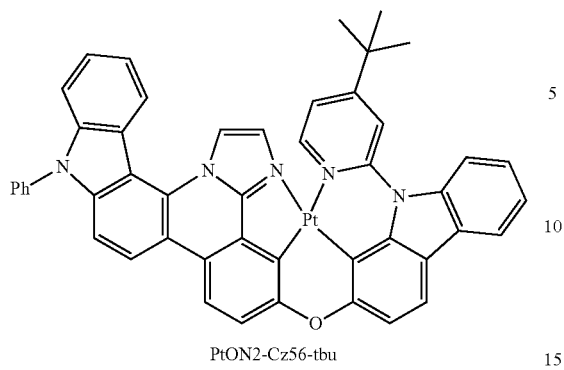

PtON2-Cz56-tbu 7-phenyl-7H-imidazo[1,2-f]indolo[2,3-c]phenanthridin-2-ol (1 mmol, 1.0 eq), 2-bromo-9-(4-(tert-butyl)pyridin-2-yl)-9H-carbazole (1.2 mmol, 1.2 eq), CuI (0.2 mmol, 0.2 eq), picolinic acid (0.4 mmol, 0.4 eq) and K$_3$PO$_4$ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ON2-Cz56-tbu in 30%~70% yield.

ON2-Cz56-tbu (0.20 mmol, 1.0 eq), K$_2$PtCl$_4$ (0.24 mmol, 1.2 eq) and n-Bu$_4$NBr (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product PtON2-CZ56-tbu in 10%~50% yield.

In one embodiment, an exemplary compound may be prepared according to the following scheme:

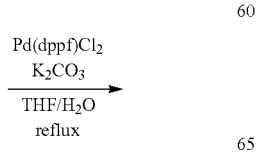

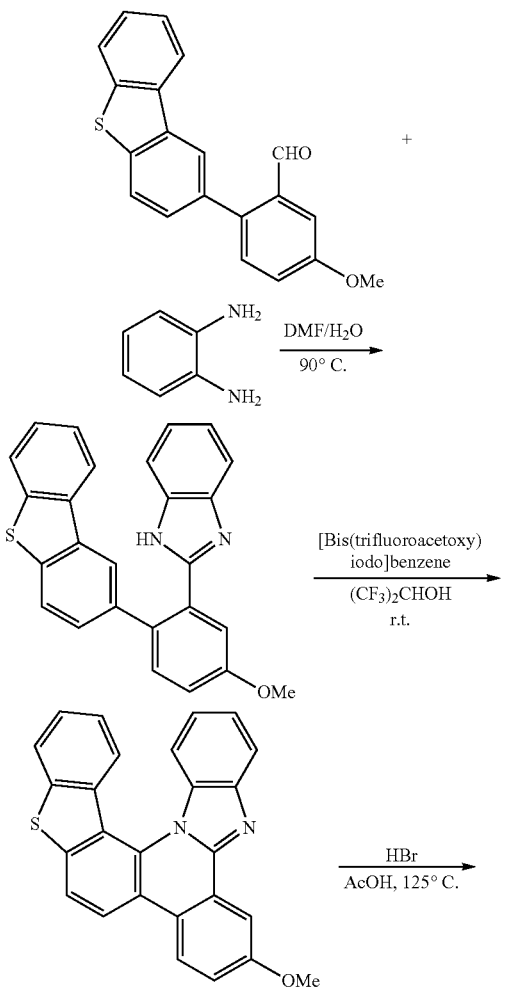

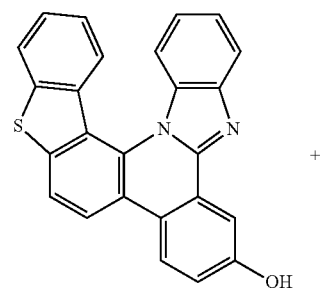

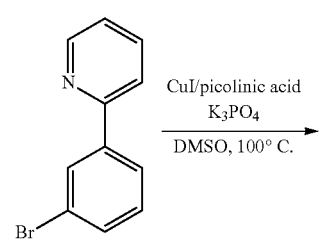

-continued

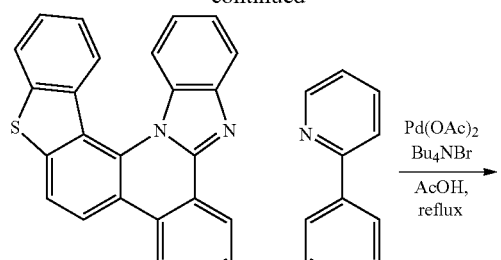
L40

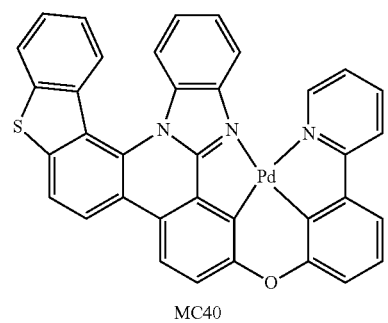
MC40

Benzo[4,5]imidazo[1,2-f]benzo[4,5]thieno[2,3-c]phenanthridin-2-ol (1 mmol, 1.0 eq), 2-(3-bromophenyl)pyridine (1.2 mmol, 1.2 eq), CuI (0.2 mmol, 0.2 eq), picolinic acid (0.4 mmol, 0.4 eq) and $K_3PO_4$ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product L40 in 56% yield.

L40 (0.20 mmol, 1.0 eq), $K_2PtCl_4$ (0.24 mmol, 1.2 eq) and n-$Bu_4NBr$ (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC40 in 59% yield.

In one embodiment, an exemplary compound may be prepared according to the following scheme:

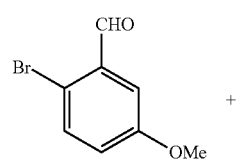

-continued

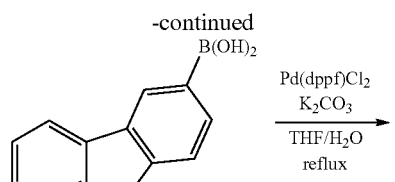

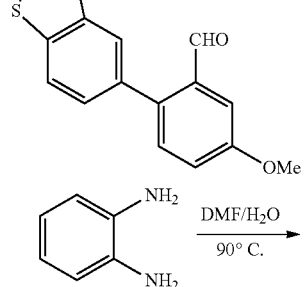
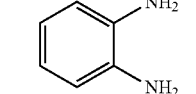
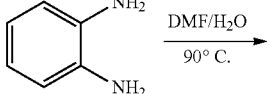

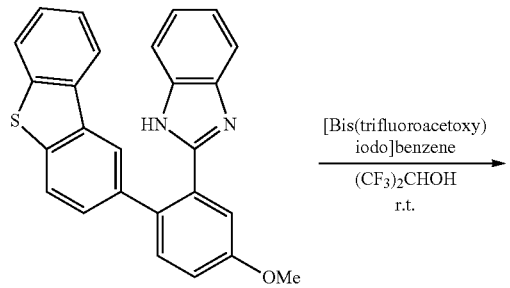

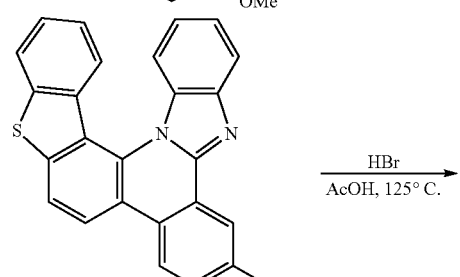

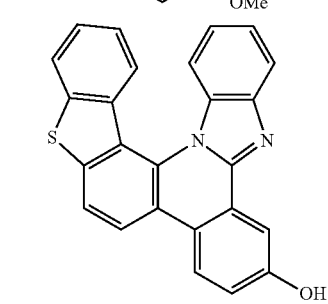

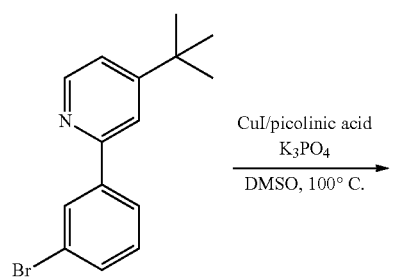

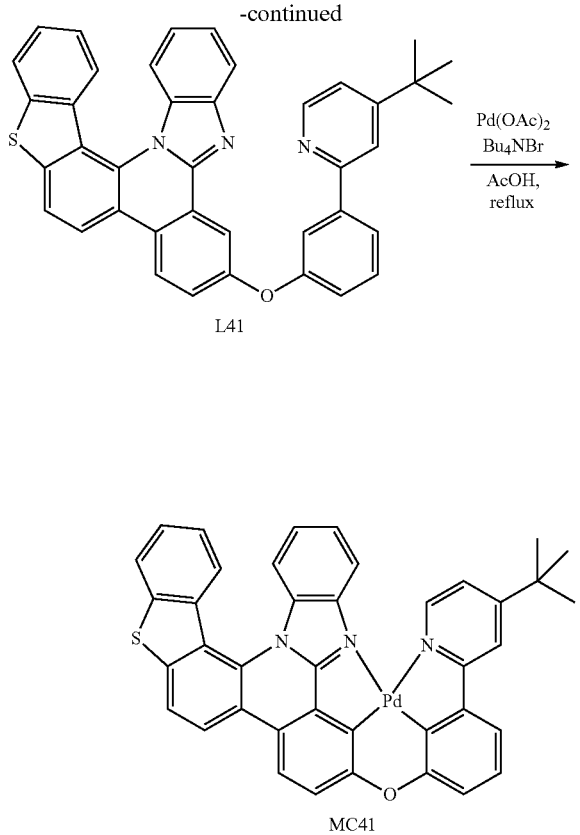

L41

MC41

Benzo[4,5]imidazo[1,2-f]benzo[4,5]thieno[2,3-c]phenanthridin-2-ol (1 mmol, 1.0 eq), 2-(3-bromophenyl)-4-(tert-butyl)pyridine (1.2 mmol, 1.2 eq), CuI (0.2 mmol, 0.2 eq), picolinic acid (0.4 mmol, 0.4 eq) and $K_3PO_4$ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product L41 in 30%~70% yield.

L41 (0.20 mmol, 1.0 eq), $K_2PtCl_4$ (0.24 mmol, 1.2 eq) and n-$Bu_4NBr$ (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC41 in 10%~50% yield.

In one embodiment, an exemplary compound may be prepared according to the following scheme:

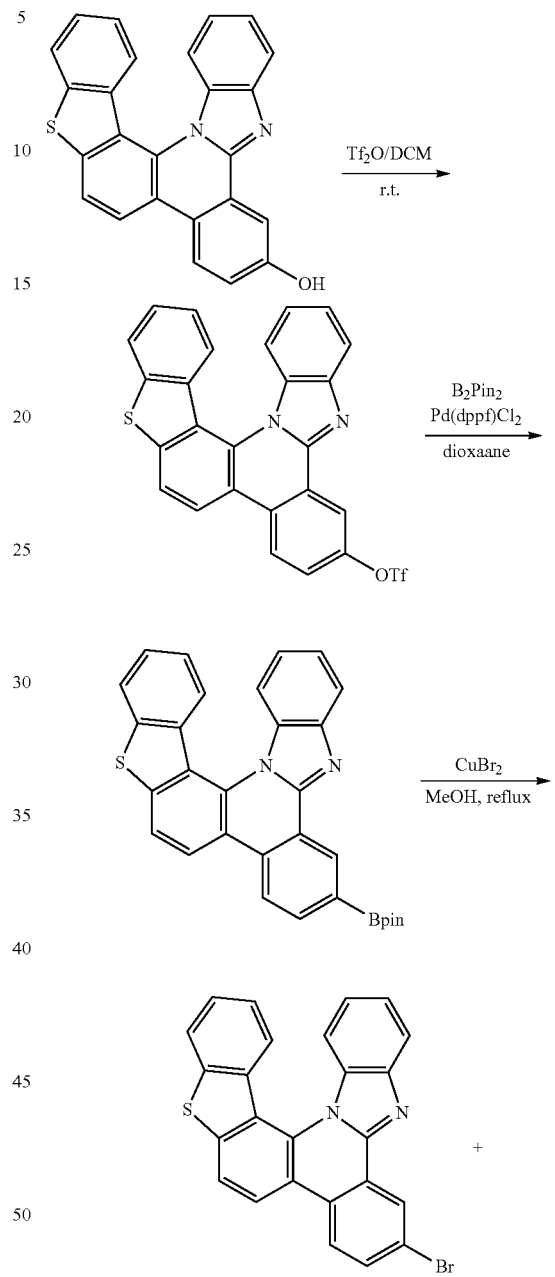

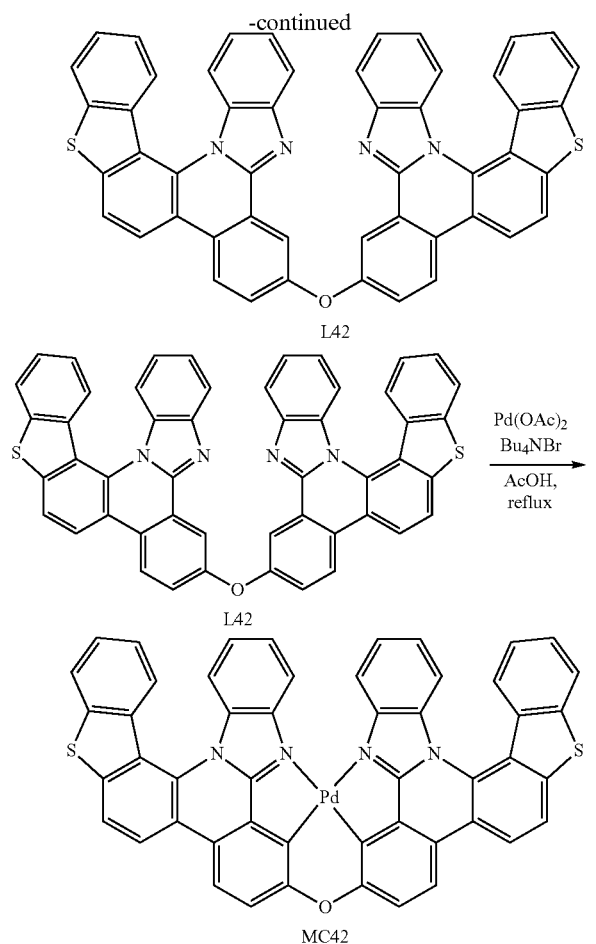

L42

L42

MC42

Benzo[4,5]imidazo[1,2-f]benzo[4,5]thieno[2,3-c]phenanthridin-2-ol (1 mmol, 1.0 eq), 2-bromobenzo[4,5]imidazo[1,2-f]benzo[4,5]thieno[2,3-c]phenanthridine (1.2 mmol, 1.2 eq), CuI (0.2 mmol, 0.2 eq), picolinic acid (0.4 mmol, 0.4 eq) and $K_3PO_4$ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product L42 in 30%~70% yield.

L42 (0.20 mmol, 1.0 eq), $K_2PtCl_4$ (0.24 mmol, 1.2 eq) and n-$Bu_4NBr$ (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC42 in 10%~50% yield.

In one embodiment, an exemplary compound may be prepared according to the following scheme:

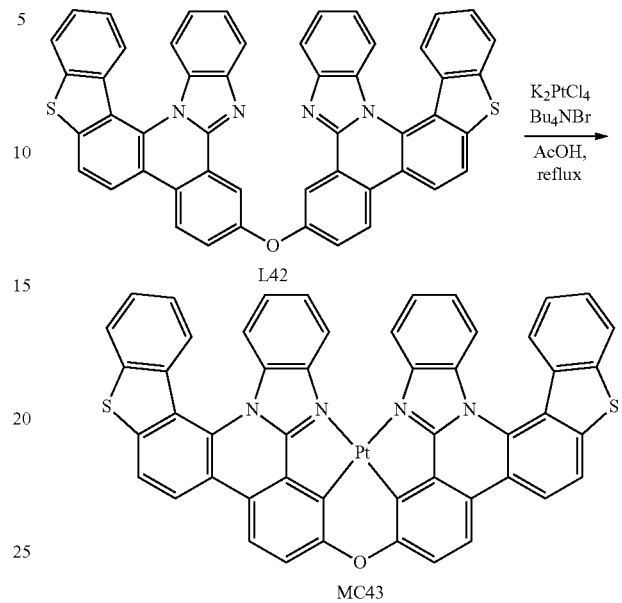

L42

MC43

L42 (0.20 mmol, 1.0 eq), $K_2PtCl_4$ (0.24 mmol, 1.2 eq) and n-$Bu_4NBr$ (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC43 in 10%~50% yield.

In one embodiment, an exemplary compound may be prepared according to the following scheme:

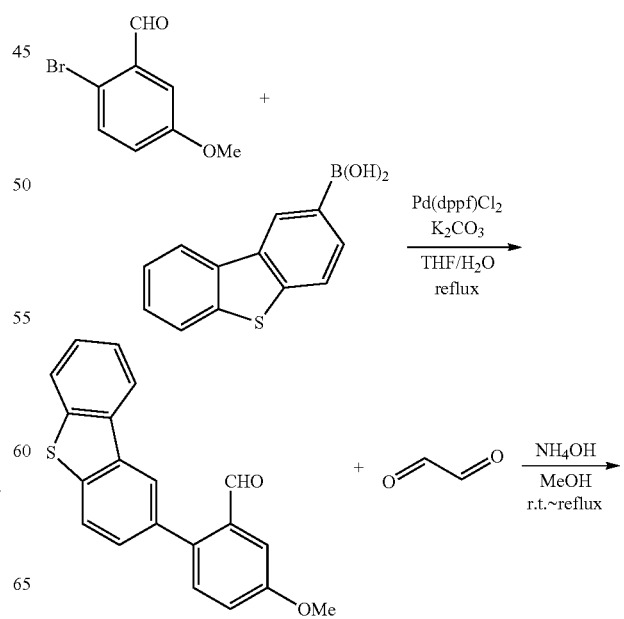

-continued

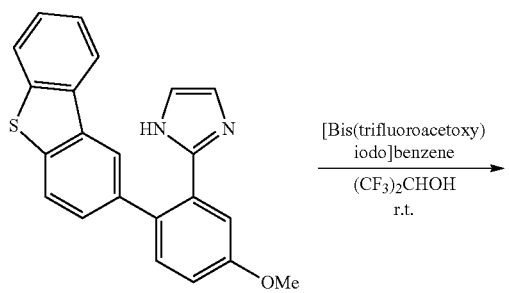

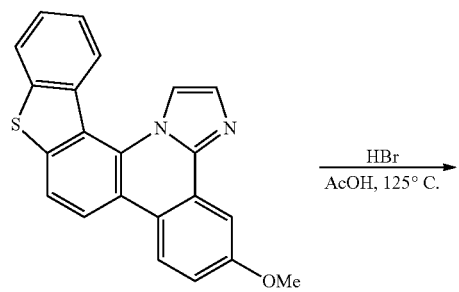

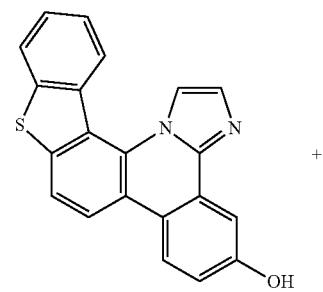

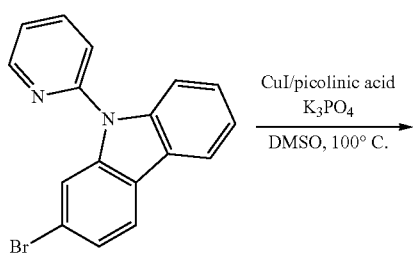

-continued

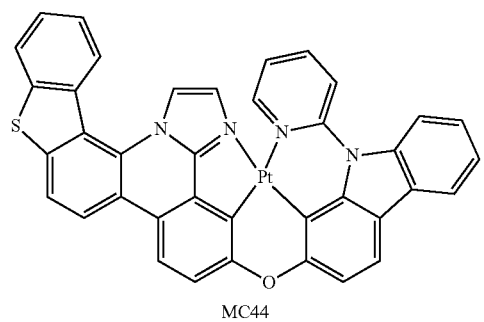

MC44

Benzo[4,5]thieno[2,3-c]imidazo[1,2-f]phenanthridin-2-ol (1 mmol, 1.0 eq), 2-bromo-9-(pyridin-2-yl)-9H-carbazole (1.2 mmol, 1.2 eq), CuI (0.2 mmol, 0.2 eq), picolinic acid (0.4 mmol, 0.4 eq) and $K_3PO_4$ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product L44 in 30%~70% yield.

L44 (0.20 mmol, 1.0 eq), $K_2PtCl_4$ (0.24 mmol, 1.2 eq) and n-$Bu_4NBr$ (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product MC44 in 10%~50% yield.

In one embodiment, an exemplary compound may be prepared according to the following scheme:

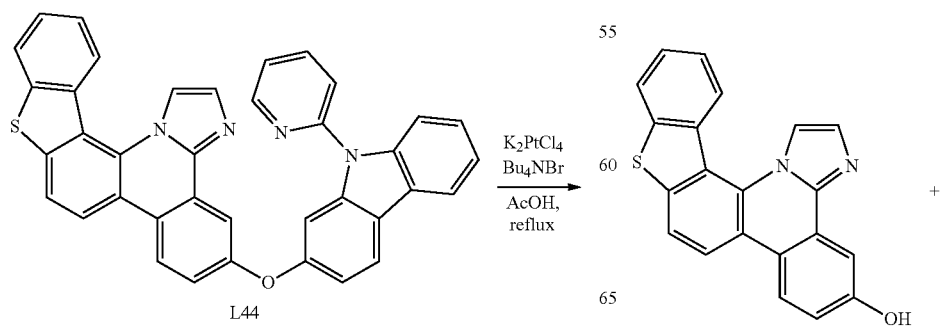

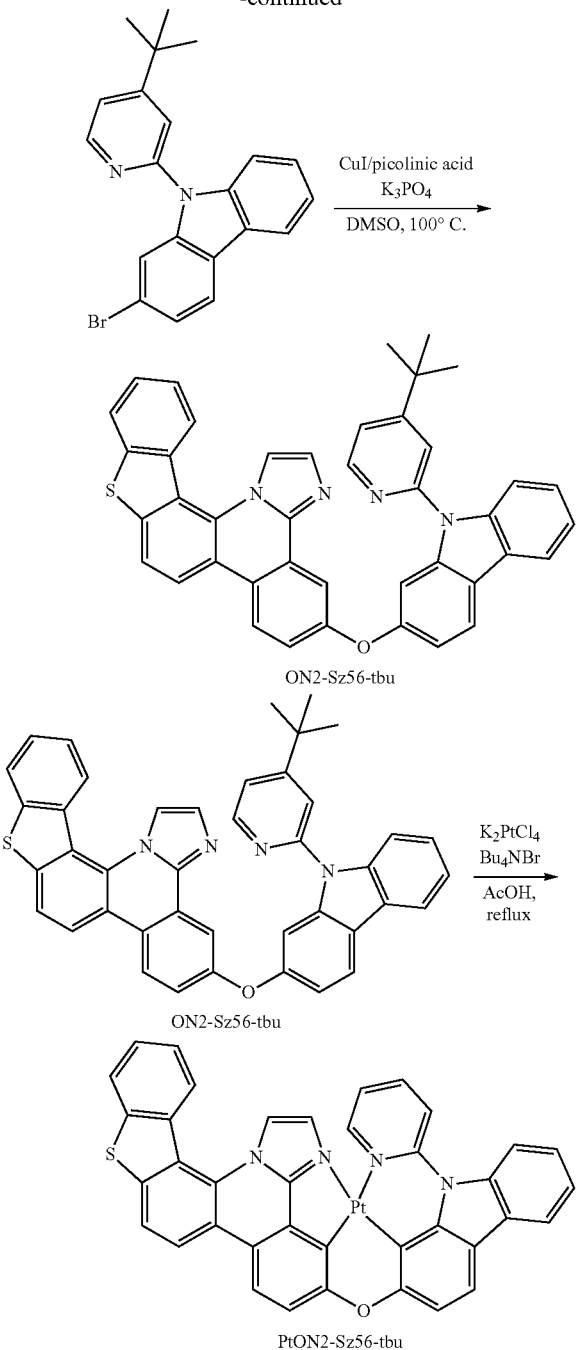

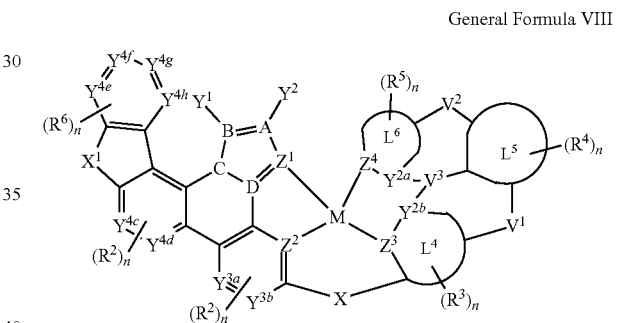

Benzo[4,5]thieno[2,3-c]imidazo[1,2-f]phenanthridin-2-ol (1 mmol, 1.0 eq), 2-bromo-9-(4-(tert-butyl)pyridin-2-yl)-9H-carbazole (1.2 mmol, 1.2 eq), CuI (0.2 mmol, 0.2 eq), picolinic acid (0.4 mmol, 0.4 eq) and $K_3PO_4$ (2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 100° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ON2-Sz56-tbu in 30%~70% yield.

ON2-Sz56-tbu (0.20 mmol, 1.0 eq), $K_2PtCl_4$ (0.24 mmol, 1.2 eq) and n-$Bu_4NBr$ (0.02 mmol, 0.1 eq) were added to a dry three-necked flask. Then the flask underwent the procedure of the evacuation and backfill with nitrogen for three times. Solvent of HOAc (10 mL) was added under the protection of nitrogen. Then the mixture was stirred in an oil bath under reflux for 3 days, then cooled down to ambient temperature. Then the solid was purified through column chromatography on silica gel using dichloromethane as eluent to obtain to obtain the desired product PtON2-Sz56-tbu in 10%~50% yield.

The disclosures of each and every patent, patent application, and publication cited herein are hereby incorporated herein by reference in their entirety. While this invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

We claim:

1. A compound represented by General Formula VIII:

General Formula VIII wherein:

M represents Pt(II) or (Pd(II);

$Y^{2a}$, $Y^{2b}$, $Y^{3a}$, $Y^{3b}$, $Y^{4c}$, $Y^{4d}$, $Y^{4e}$, $Y^{4f}$, $Y^{4g}$, and $Y^{4h}$ each independently represents C or N;

$Z^1$, $Z^2$, $Z^3$ and $Z^4$ each independently represents C or N;

A, B, C and D each independently represents C, N, O, or S;

X represents a single bond, O, S, Se, P=O, As=O, Bi=O, $CR^7R^8$, C=O, $SiR^7R^8$, $GeR^7R^8$, $NR^7$, $PR^7$, $PR^7R^8$, $R^7P$=O, $AsR^7$, $R^7As$=O, S=O, $SO_2$, Se=O, $SeO_2$, $BR^7$, $BR^7R^8$, $AlR^7$, $AlR^7R^8$, $R^7Bi$=O, or $BiR^7$, or X is not present, wherein when X is not present, no bond exists between $L^4$ and the ring comprising $Z^2$;

$X^1$ represents a single bond, O, S, Se, P=O, As=O, Bi=O, $CR^7R^8$, C=O, $SiR^7R^8$, $GeR^7R^8$, $NR^7$, $PR^7$, $PR^7R^8$, $R^7P$=O, $AsR^7$, $R^7As$=O, S=O, $SO_2$, Se=O, $SeO_2$, $BR^7$, $BR^7R^8$, $AlR^7$, $AlR^7R^8$, $R^7Bi$=O, or $BiR^7$;

$Y^1$ and $Y^2$ each independently represents hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof, wherein $Y^1$ and $Y^2$ may optionally together form a fused aromatic or heteroaromatic ring;

each of $R^1$, $R^2$, $R^3$, $R^4$, $R^5$, $R^6$, $R^7$, and $R^8$ is independently absent or present as a single substituent or multiple substituents, valency permitting, and each of $R^1$, $R^3$, $R^4$, $R^5$, $R^6$, $R^7$, and $R^8$ independently represents deuterium, halogen, hydroxyl, thiol, nitro, cyano, nitrile, isonitrile, sulfinyl, mercapto, sulfo, carboxyl, hydrazine; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof, or any two of $R^1$, $R^2$, $R^3$, $R^4$, $R^5$, $R^6$, $R^7$, and $R^8$ represent a covalent bond;

any two $R^1$ may together form a fused ring, any two $R^2$ may together form a fused ring, any two $R^3$ may together form a fused ring, any two $R^4$ may together form a fused ring, any two $R^5$ may together form a fused ring, any two $R^6$ may together form a fused ring, and any R may form a ring with an $R^7$ bound to the same atom;

$L^4$, $L^5$ and $L^6$ each independently represents a 5- to 10-membered aryl, heteroaryl, fused aryl, or fused heteroaryl;

$L^5$ is present or absent;

$V^1$ and $V^2$ are independently present or absent; wherein each of $V^1$ and $V^2$, if present, independently represents a covalent bond, O, S, Se, P=O, As=O, Bi=O, $CR^7R^8$, C=O, $SiR^7R^8$, $GeR^7R^8$, $NR^7$, $PR^7$, $PR^7R^8$, $R^7P$=O, $AsR^7$, $R^7As$=O, S=O, $SO_2$, Se=O, $SeO_2$, $BR^7$, $BR^7R^8$, $AlR^7$, $AlR^7R^8$, $R^7Bi$=O, or $BiR^7$; wherein when $V^1$ is not present, then $L^4$ is not bound to $L^5$; and when $V^2$ is not present, then $L^6$ is not bound to $L^5$;

$V^3$ is present or absent, wherein $V^3$, if present, represents a covalent bond, C, N, Si, O, S, Ge, P, As, Se, B, Al, or Bi, or if valency permits, each independently represents $CR^7$, $SiR^7$, $GeR^7$, $NR^7$, P=O, As=O, B, $BR^7$, $AlR^7$, Bi=O, $CR^7R^8$, C=O, $SiR^7R^8$, $GeR^7R^8$, $NR^7$, $PR^7$, $PR^7R^8$, $R^7P$=O, $AsR^7$, $R^7As$=O, S=O, $SO_2$, Se=O, $SeO_2$, $BR^7$, $BR^7R^8$, $AlR^7$, $AlR^7R^8$, $R^7Bi$=O, or $BiR^7$; wherein when $V^3$ is not present, then a $Y^{2a}$ is directly bound to $Y^{2b}$; and each n is independently an integer, valency permitting.

2. The compound of claim 1, wherein two additional adjacent groups $R^2$ together are represented by Formula B:

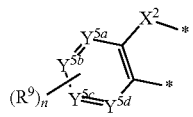

Formula B wherein $X^2$ represents a single bond, O, S, Se, P=O, As=O, Bi=O, $CR^7R^8$, C=O, $SiR^7R^8$, $GeR^7R^8$, $NR^7$, $PR^7$, $PR^7R^8$, $R^7P$=O, $AsR^7$, $R^7As$=O, S=O, $SO_2$, Se=O, $SeO_2$, $BR^7$, $BR^7R^8$, $AlR^7$, $AlR^7R^8$, $R^7Bi$=O, or $BiR^7$;

$Y^{5a}$, $Y^{5b}$, $Y^{5c}$, $Y^{5d}$ each independently represents C or N;

$R^9$ represents hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof, or any two of $R^1$, $R^2$, $R^3$, $R^4$, $R^5$, $R^6$, $R^7$, and $R^8$ represent a covalent bond; and each n is independently an integer, valency permitting.

3. The compound of claim 1, wherein the compound is represented by General Formula II:

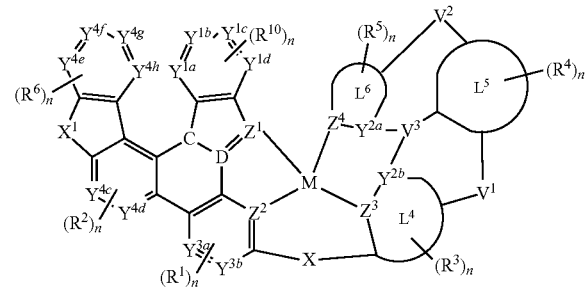

General Formula II wherein:

M represents Pt(II) or (Pd(II);

$Y^{1a}$, $Y^{1b}$, $Y^{1c}$, $Y^{1d}$, $Y^{2a}$, $Y^{2b}$, $Y^{3a}$, $Y^{3b}$, $Y^{4c}$, $Y^{4d}$, $Y^{4e}$, $Y^{4f}$, $Y^{4g}$, and $Y^{4h}$ each independently represents C or N;

$Z^1$, $Z^2$, $Z^3$ and $Z^4$ each independently represents C or N;

C and D each independently represents C, N, O, or S;

X represents a single bond, O, S, Se, P=O, As=O, Bi=O, $CR^7R^8$, C=O, $SiR^7R^8$, $GeR^7R^8$, $NR^7$, $PR^7$, $PR^7R^8$, $R^7P$=O, $AsR^7$, $R^7As$=O, S=O, $SO_2$, Se=O, $SeO_2$, $BR^7$, $BR^7R^8$, $AlR^7$, $AlR^7R^8$, $R^7Bi$=O, or $BiR^7$, or X is not present, wherein when X is not present, no bond exists between $L^4$ and the ring comprising $Z^2$;

$X^1$ represents a single bond, O, S, Se, P=O, As=O, Bi=O, $CR^7R^8$, C=O, $SiR^7R^8$, $GeR^7R^8$, $NR^7$, $PR^7$, $PR^7R^8$, $R^7P$=O, $AsR^7$, $R^7As$=O, S=O, $SO_2$, Se=O, $SeO_2$, $BR^7$, $BR^7R^8$, $AlR^7$, $AlR^7R^8$, $R^7Bi$=O, or $BiR^7$;

each of $R^1$, $R^2$, $R^3$, $R^4$, $R^5$, $R^6$, $R^7$, $R^8$, and $R^{10}$ is independently absent or present as a single substituent or multiple substituents, valency permitting, and each of $R^1$, $R^3$, $R^4$, $R^5$, $R^6$ and $R^7$ independently represents deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof, or any two of $R^1$, $R^2$, $R^3$, $R^4$, $R^5$, $R^6$, $R^7$, $R^8$, and $R^{10}$ represent a covalent bond;

any two $R^1$ may together form a fused ring, any two $R^2$ may together form a fused ring, any two $R^3$ may together form a fused ring, any two R⁴ may together form a fused ring, any two R⁵ may together form a fused ring, any two R⁶ may together form a fused ring, any two R¹⁰ may together form a fused ring, and any R⁸ may form a ring with an R⁷ bound to the same atom;

L⁴, L⁵ and L⁶ each independently represents a 5- to 10-membered aryl, heteroaryl, fused aryl, or fused heteroaryl;

L⁵ is present or absent;

V¹ and V² are independently present or absent; wherein each of V¹ and V², if present, independently represents a covalent bond, O, S, Se, P═O, As═O, Bi═O, CR⁷R⁸, C═O, SiR⁷R⁸, GeR⁷R⁸, NR⁷, PR⁷, PR⁷R⁸, R⁷P═O, AsR⁷, R⁷As═O, S═O, SO₂, Se═O, SeO₂, BR⁷, BR⁷R⁸, AlR⁷, AlR⁷R⁸, R⁷Bi═O, or BiR⁷; wherein when V¹ is not present, then L⁴ is not bound to L⁵; and when V² is not present, then L⁶ is not bound to L⁵;

V³ is present or absent, wherein V³, if present, represents a covalent bond, C, N, Si, O, S, Ge, P, As, Se, B, Al, or Bi, or if valency permits, each independently represents CR⁷, SiR⁷, GeR⁷, NR⁷, P═O, As═O, B, BR⁷, AlR⁷, Bi═O, CR⁷R⁸, C═O, SiR⁷R⁸, GeR⁷R⁸, NR⁷, PR⁷, PR⁷R⁸, R⁷P═O, AsR⁷, R⁷As═O, S═O, SO₂, Se═O, SeO₂, BR⁷, BR⁷R⁸, AlR⁷, AlR⁷R⁸, R⁷Bi═O, or BiR⁷; wherein when V³ is not present, then a Y²ᵃ is directly bound to Y²ᵇ; and each n is independently an integer, valency permitting.

4. The compound of claim 2, wherein the compound is represented by General Formula XIV or General Formula XV, General Formula XIV

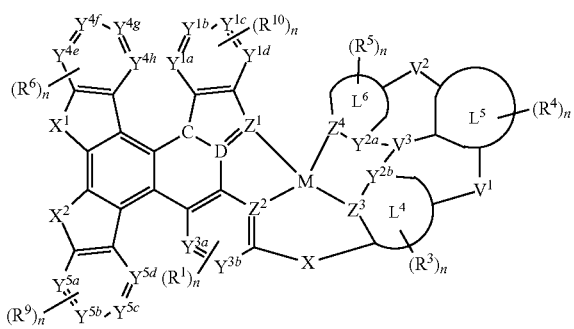

General Formula XV

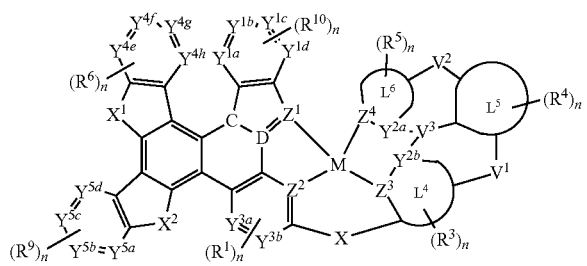

wherein:

$Y^{1a}$, $Y^{1b}$, $Y^{1c}$, $Y^{1d}$, $Y^{2a}$, $Y^{2b}$, $Y^{3a}$, $Y^{3b}$, $Y^{4e}$, $Y^{4f}$, $Y^{4g}$, $Y^{4h}$, $Y^{5a}$, $Y^{5b}$, $Y^{5c}$, and $Y^{5d}$ each independently represents C or N;

Z¹, Z², Z³ and Z⁴ each independently represents C or N;

C and D each independently represents C, N, O, or S;

X represents a single bond, O, S, Se, P═O, As═O, Bi═O, CR⁷R⁸, C═O, SiR⁷R⁸, GeR⁷R⁸, NR⁷, PR⁷, PR⁷R⁸, R⁷P═O, AsR⁷, R⁷As═O, S═O, SO₂, Se═O, SeO₂, BR⁷, BR⁷R⁸, AlR⁷, AlR⁷R⁸, R⁷Bi═O, or BiR⁷, or X is not present, wherein when X is not present, no bond exists between L⁴ and the ring comprising Z²;

X¹ and X² each independently represents a single bond, O, S, Se, P═O, As═O, Bi═O, CR⁷R⁸, C═O, SiR⁷R⁸, GeR⁷R⁸, NR⁷, PR⁷, PR⁷R⁸, R⁷P═O, AsR⁷, R⁷As═O, S═O, SO₂, Se═O, SeO₂, BR⁷, BR⁷R⁸, AlR⁷, AlR⁷R⁸, R⁷Bi═O, or BiR⁷;

each of R¹, R³, R⁴, R⁵, R⁶, R⁷, R⁸, R⁹, and R¹⁰ is independently absent or present as a single substituent or multiple substituents, valency permitting, and each of R¹, R³, R⁴, R⁵, R⁶, R⁷, R⁸, R⁹, and R¹⁰ independently represents hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof, or any two of R¹, R³, R⁴, R⁵, R⁶, R⁷, R⁸, R⁹, and R¹⁰ represent a covalent bond;

any two R¹ may together form a fused ring, any two R³ may together form a fused ring, any two R⁴ may together form a fused ring, any two R⁵ may together form a fused ring, any two R⁶ may together form a fused ring, any two R⁹ may together form a fused ring, any two R¹⁰ may together form a fused ring, and any R⁸ may form a ring with an R⁷ bound to the same atom;

L⁴, L⁵ and L⁶ each independently represents a 5- to 10-membered aryl, heteroaryl, fused aryl, or fused heteroaryl;

L⁵ is present or absent;

V¹ and V² are independently present or absent; wherein each of V¹ and V², if present, independently represents a covalent bond, O, S, Se, P═O, As═O, Bi═O, CR⁷R⁸, C═O, SiR⁷R⁸, GeR⁷R⁸, NR⁷, PR⁷, PR⁷R⁸, R⁷P═O, AsR⁷, R⁷As═O, S═O, SO₂, Se═O, SeO₂, BR⁷, BR⁷R⁸, AlR⁷, AlR⁷R⁸, R⁷Bi═O, or BiR⁷; wherein when V¹ is not present, then L⁴ is not bound to L⁵; and when V² is not present, then L⁶ is not bound to L⁵;

V³ is present or absent, wherein V³, if present, represents a covalent bond, C, N, Si, O, S, Ge, P, As, Se, B, Al, or Bi, or if valency permits, each independently represents CR⁷, SiR⁷, GeR⁷, NR⁷, P═O, As═O, B, BR⁷, AlR⁷, Bi═O, CR⁷R⁸, C═O, SiR⁷R⁸, GeR⁷R⁸, NR⁷, PR⁷, PR⁷R⁸, R⁷P═O, AsR⁷, R⁷As═O, S═O, SO₂, Se═O, SeO₂, BR⁷, BR⁷R⁸, AlR⁷, AlR⁷R⁸, R⁷Bi═O, or BiR⁷; wherein when V³ is not present, then a Y²ᵃ is directly bound to Y²ᵇ; and each n is independently an integer, valency permitting.

5. The compound of claim 2, wherein the compound is represented by General Formula XVIII or General Formula XIX:

General Formula XVIII

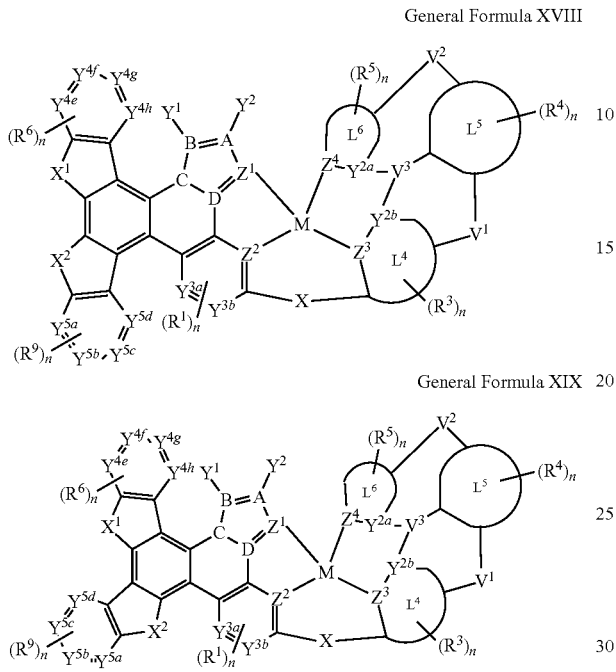

General Formula XIX wherein:

$Y^{2a}$, $Y^{2b}$, $Y^{3a}$, $Y^{3b}$, $Y^{4e}$, $Y^{4f}$, $Y^{4g}$, $Y^{4h}$, $Y^{5a}$, $Y^{5b}$, $Y^{5c}$ and $Y^{5d}$ each independently represents C or N;

$Z^1$, $Z^2$, $Z^3$ and $Z^4$ each independently represents C or N;

A, B, C and D each independently represents C, N, O, or S;

X represents a single bond, O, S, Se, P=O, As=O, Bi=O, $CR^7R^8$, C=O, $SiR^7R^8$, $GeR^7R^8$, $NR^7$, $PR^7$, $PR^7R^8$, $R^7P$=O, $AsR^7$, $R^7As$=O, S=O, $SO_2$, Se=O, $SeO_2$, $BR^7$, $BR^7R^8$, $AlR^7$, $AlR^7R^8$, $R^7Bi$=O, or $BiR^7$, or X is not present, wherein when X is not present, no bond exists between $L^4$ and the ring comprising $Z^2$;

$X^1$ and $X^2$ each independently represents a single bond, O, S, Se, P=O, As=O, Bi=O, $CR^7R^8$, C=O, $SiR^7R^8$, $GeR^7R^8$, $NR^7$, $PR^7$, $PR^7R^8$, $R^7P$=O, $AsR^7$, $R^7As$=O, S=O, $SO_2$, Se=O, $SeO_2$, $BR^7$, $BR^7R^8$, $AlR^7$, $AlR^7R^8$, $R^7Bi$=O, or $BiR^7$;

$Y^1$ and $Y^2$ each independently represents hydrogen, deuterium, halogen, hydroxyl, thiol, nitro, cyano, nitrile, isonitrile, sulfinyl, mercapto, sulfo, carboxyl, 10ydrazine; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof; wherein $Y^1$ and $Y^2$ may optionally together form a fused aromatic or heteroaromatic ring;

each of $R^1$, $R^3$, $R^4$, $R^5$, $R^6$, $R^7$, $R^8$, and $R^9$ is independently absent or present as a single substituent or multiple substituents, valency permitting, and each of $R^1$, $R^3$, $R^4$, $R^5$, $R^6$, $R^7$, $R^8$, and $R^9$ independently represents hydrogen, deuterium, halogen, hydroxyl, thiol, nitro, cyano, nitrile, isonitrile, sulfinyl, mercapto, sulfo, carboxyl, 10ydrazine; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof; or any two of $R^1$, $R^3$, $R^4$, $R^5$, $R^6$, $R^7$, $R^8$, and $R^9$ represent a covalent bond;

any two $R^1$ may together form a fused ring, any two $R^3$ may together form a fused ring, any two $R^4$ may together form a fused ring, any two $R^5$ may together form a fused ring, any two $R^6$ may together form a fused ring, any two $R^9$ together form a fused ring and any $R^8$ may form a ring with an $R^7$ bound to the same atom;

$L^4$, $L^5$ and $L^6$ each independently represents a 5- to 10-membered aryl, heteroaryl, fused aryl, or fused heteroaryl;

$L^5$ is present or absent;

$V^1$ and $V^2$ are independently present or absent; wherein each of $V^1$ and $V^2$, if present, independently represents a covalent bond, O, S, Se, P=O, As=O, Bi=O, $CR^7R^8$, C=O, $SiR^7R^8$, $GeR^7R^8$, NR, $PR^7$, $PR^7R^8$, $R^7P$=O, $AsR^7$, $R^7As$=O, S=O, $SO_2$, Se=O, $SeO_2$, $BR^7$, $BR^7R^8$, $AlR^7$, $AlR^7R^8$, $R^7Bi$=O, or $BiR^7$; wherein when $V^1$ is not present, then $L^4$ is not bound to $L^5$; and when $V^2$ is not present, then $L^6$ is not bound to $L^5$;

$V^3$ is present or absent, wherein $V^3$, if present, represents a covalent bond, C, N, Si, O, S, Ge, P, As, Se, B, Al, or Bi, or if valency permits, each independently represents $CR^7$, $SiR^7$, $GeR^7$, $NR^7$, P=O, As=O, B, $BR^7$, $AlR^7$, Bi=O, $CR^7R^8$, C=O, $SiR^7R^8$, $GeR^7R^8$, $NR^7$, $PR^7$, $PR^7R^8$, $R^7P$=O, $AsR^7$, $R^7As$=O, S=O, $SO_2$, Se=O, $SeO_2$, $BR^7$, $BR^7R^8$, $AlR^7$, $AlR^7R^8$, $R^7Bi$=O, or $BiR^7$; wherein when $V^3$ is not present, then a $Y^{2a}$ is directly bound to $Y^{2b}$; and each n is independently an integer, valency permitting.

6. The compound of claim 1, wherein

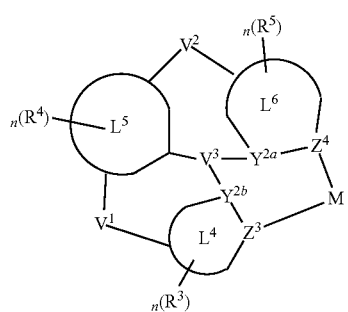

is represented by one of the following structures:

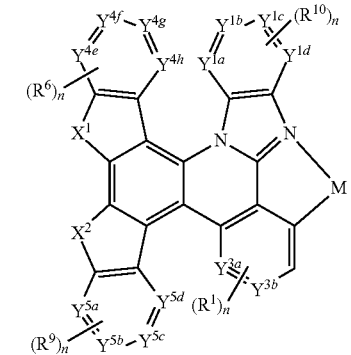

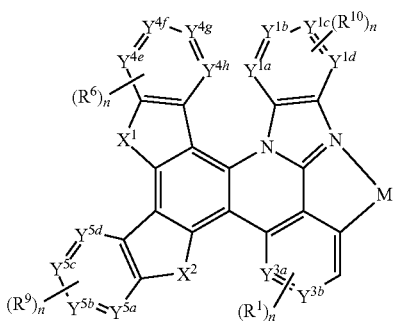

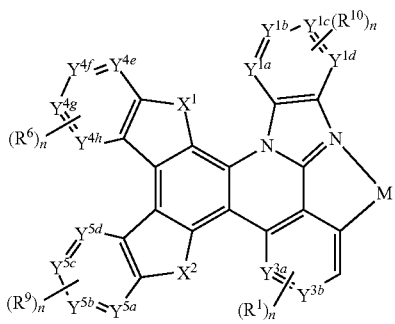

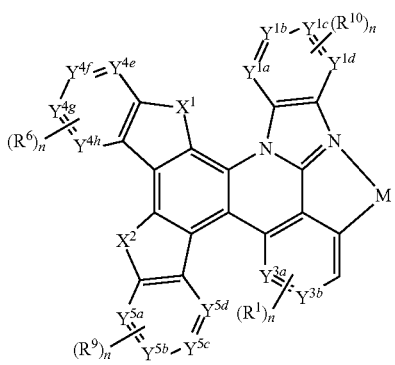

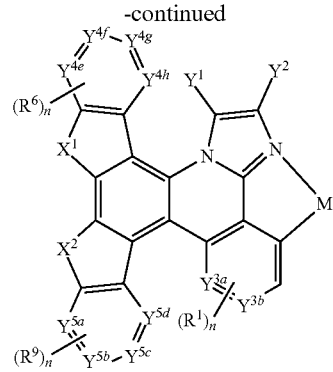

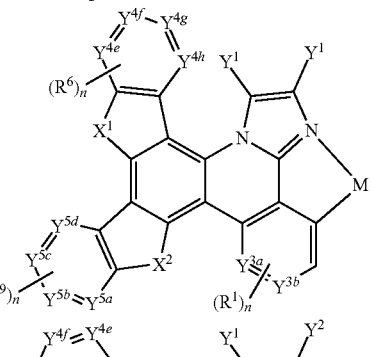

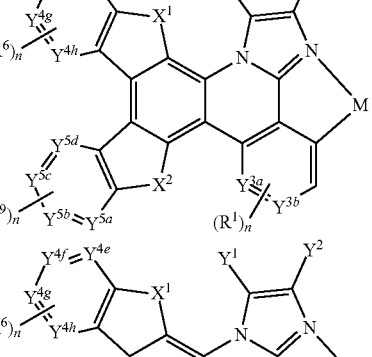

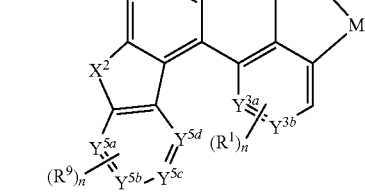

wherein:
M represents Pt(II) or Pd(II);
$Y^{1a}$, $Y^{1b}$, $Y^{1c}$, $Y^{1d}$, $Y^{3a}$, $Y^{3b}$, $Y^{4e}$, $Y^{4f}$, $Y^{4g}$, $Y^{4h}$, $Y^{5a}$, $Y^{5b}$, $Y^{5c}$ and $Y^{5d}$ each independently represents C or N;
$X^1$ and $X^2$ each independently represents a single bond, O, S, Se, P=O, As=O, Bi=O, $CR^7R^8$, C=O, $SiR^7R^8$, $GeR^7R^8$, $NR^7$, $PR^7$, $PR^7R^8$, $R^7P=O$, $AsR^7$, $R^7As=O$, S=O, $SO_2$, Se=O, $SeO_2$, $BR^7$, $BR^7R^8$, $AlR^7$, $AlR^7R^8$, $R^7Bi=O$, or $BiR^7$;
each of $R^1$, $R^6$, $R^7$, $R^8$, $R^9$, and $R^{10}$ is independently absent or present as a single substituent or multiple substituents, valency permitting, and each of $R^1$, $R^6$, $R^9$, and $R^{10}$ independently represents hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof, or any two of $R^1$, $R^6$, $R^9$, and $R^{10}$ represent a covalent bond; any two of $R^1$, $R^6$, $R^9$, and $R^{10}$ may together form a fused ring;

each n is independently an integer, valency permitting.

7. The compound of claim 1, wherein

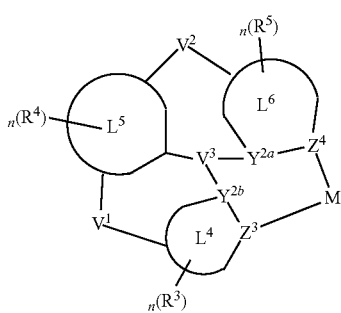

is represented by one of the following structures:

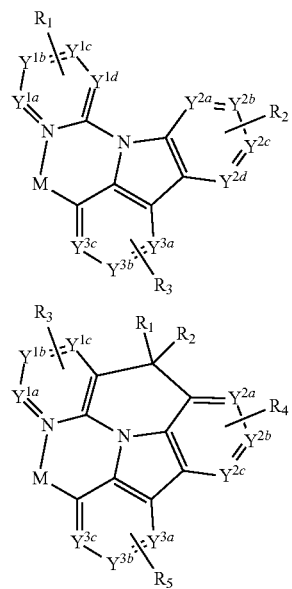

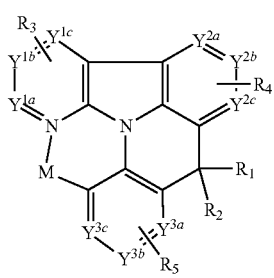

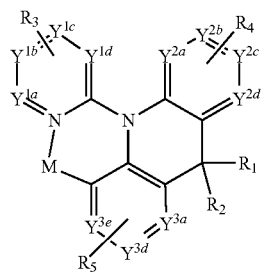

wherein:

$Y^{1a}$, $Y^{1b}$, $Y^{1c}$, $Y^{1d}$, $Y^{2a}$, $Y^{2b}$, $Y^{2c}$, $Y^{2d}$, $Y^{3a}$, $Y^{3b}$ and $Y^{3c}$ each independently represents C or N;

each of $R^1$, $R^2$, $R^3$, $R^4$, $R^5$ is independently absent or present as a single substituent or multiple substituents, valency permitting, and each of $R^1$, $R^3$, $R^4$, $R^5$, $R^6$ and $R^7$ independently represents deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof.

8. The compound of claim 1, wherein

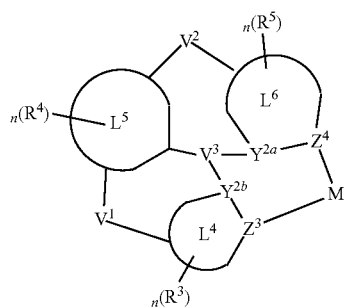

is represented by one of the following structures:

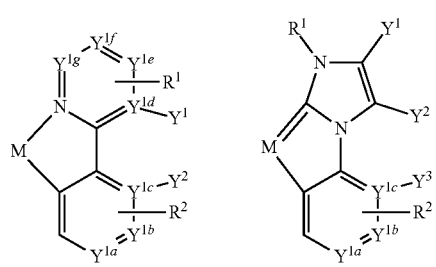

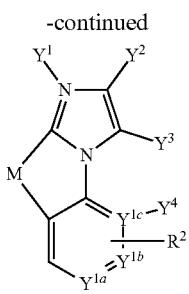

wherein:

$Y^{1a}$, $Y^{1b}$, $Y^{1c}$, $Y^{1d}$, $Y^{1e}$, $Y^{1f}$, and $Y^{1g}$ each independently represents C or N; each of $R^1$ and $R^2$ is independently absent or present as a single substituent or multiple substituents, valency permitting, and each of $R^1$ and $R^2$ independently represents deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof, and any two of $R^1$ and $R^2$ may together join to form a ring;

each of $Y^1$, $Y^2$, $Y^3$ and $Y^4$ is independently absent or present, and each of $Y^1$, $Y^2$, $Y^3$ and $Y^4$ independently represents hydrogen, deuterium, halogen, hydroxyl, thiol, nitro, cyano, nitrile, isonitrile, sulfinyl, mercapto, sulfo, carboxyl, 15ydrazine; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof; and any two of $Y^1$, $Y^2$, $Y^3$, and $Y^4$ may together join to form a ring.

9. The compound of claim 1, wherein the compound is selected from the following structures:

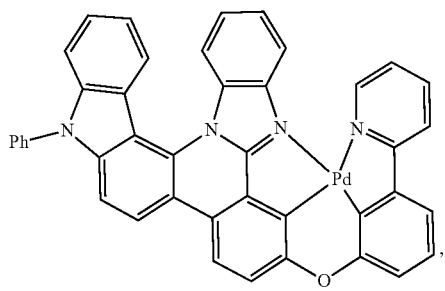

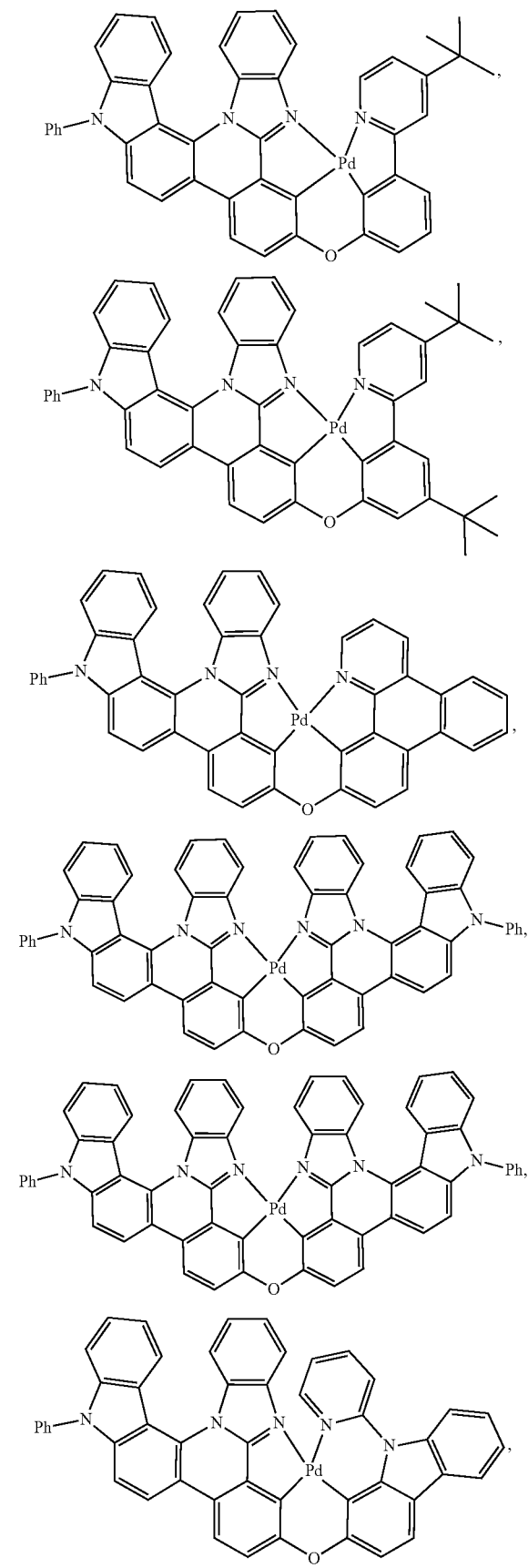

143
-continued
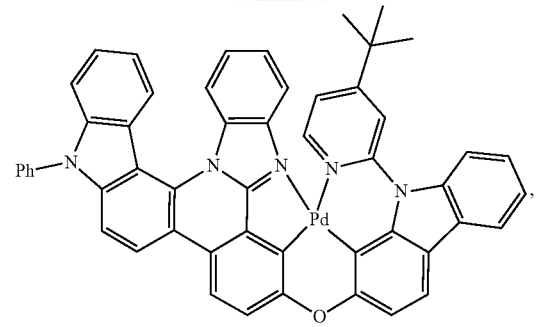
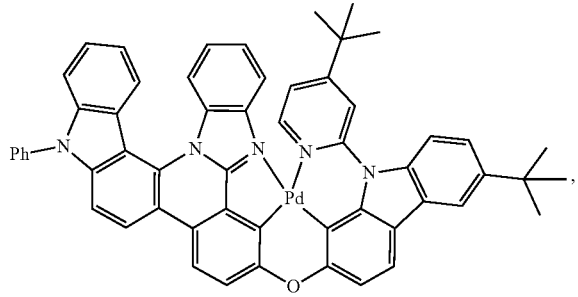
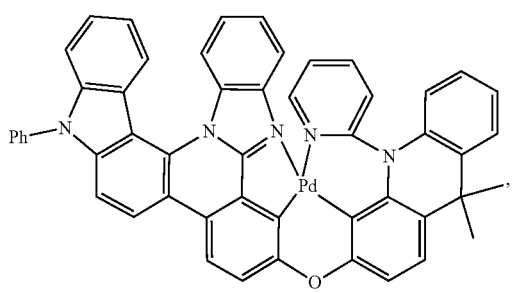
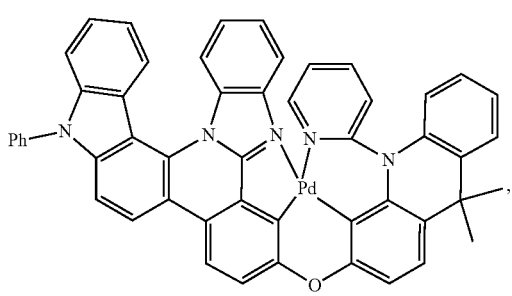
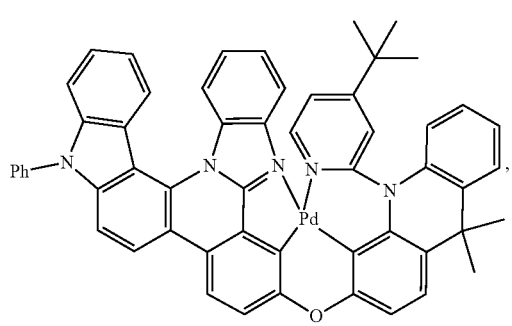
144
-continued
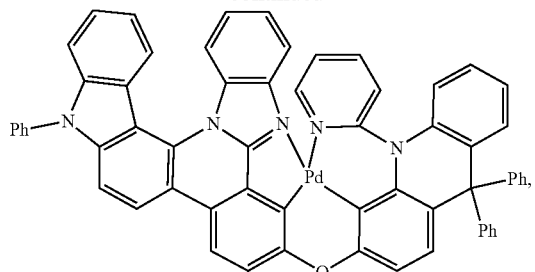
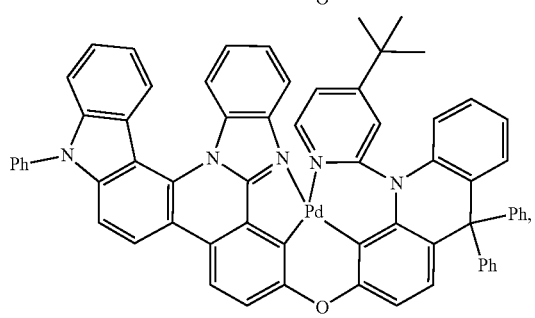
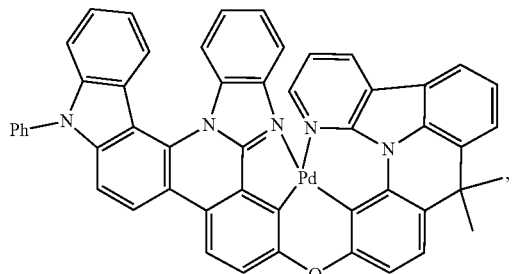
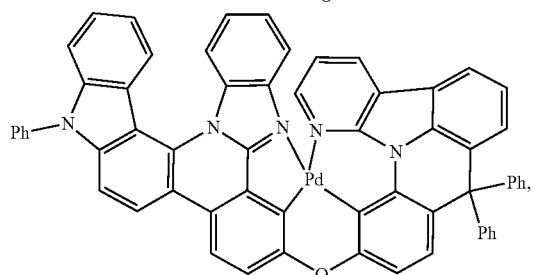
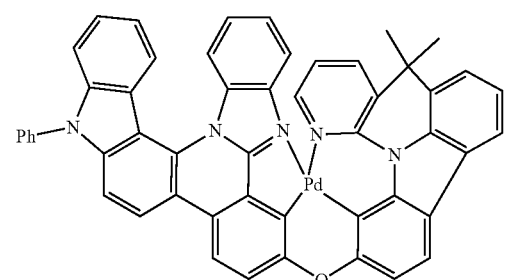
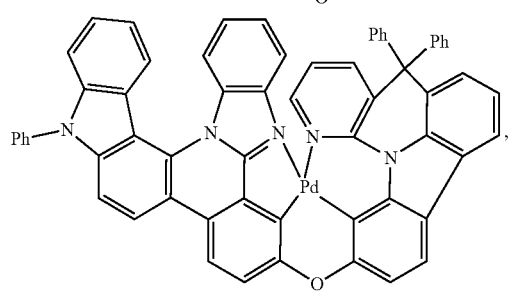

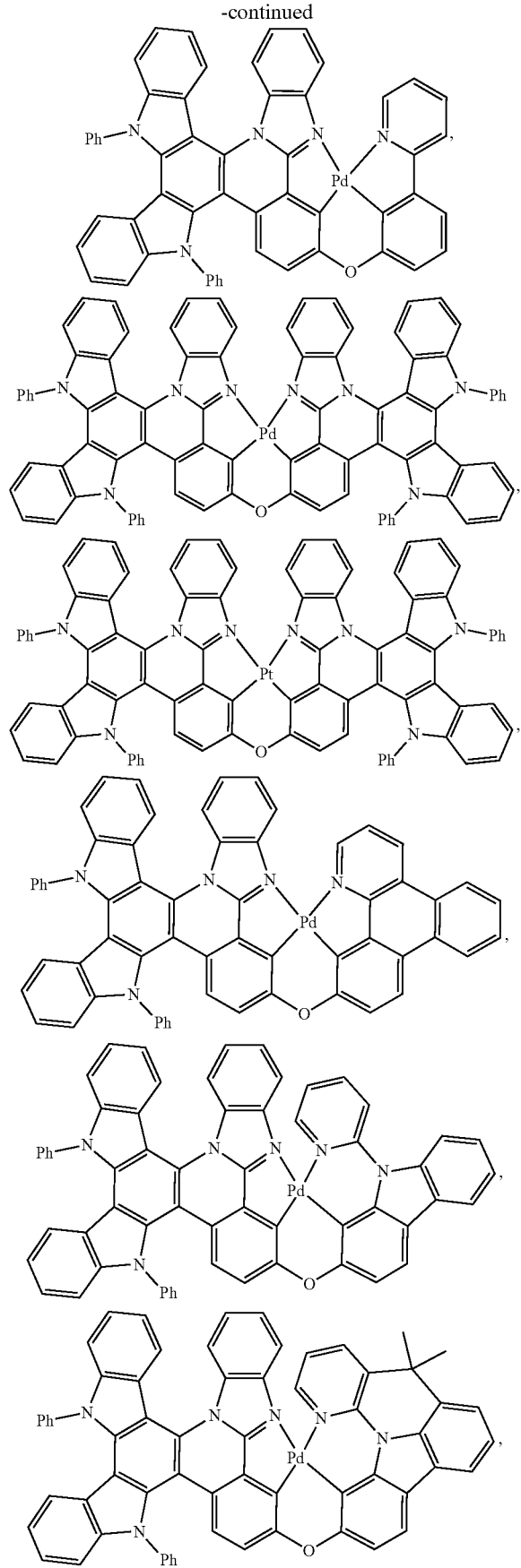
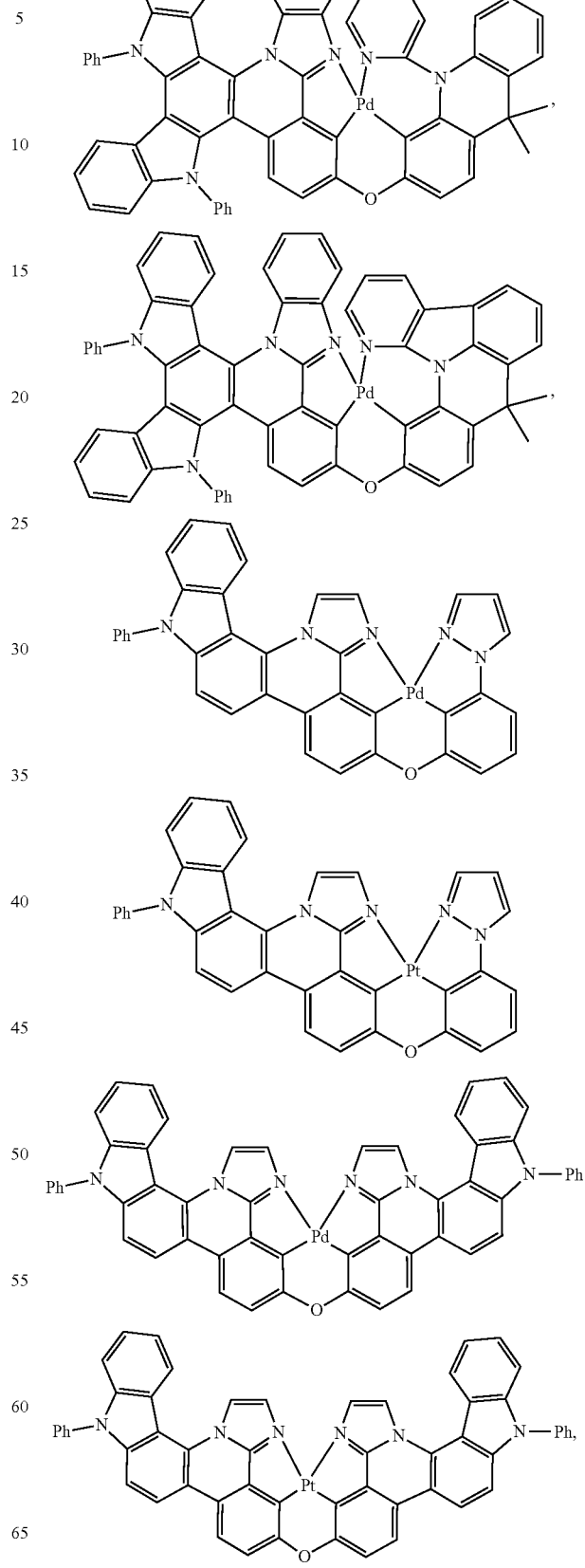

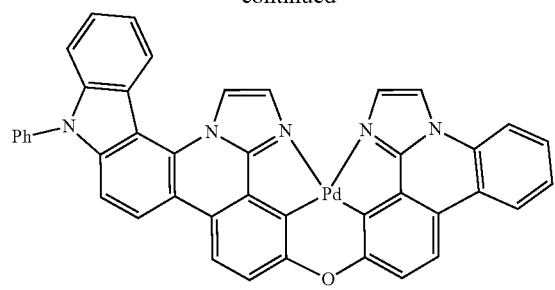
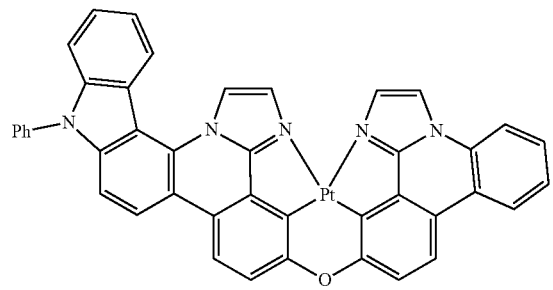
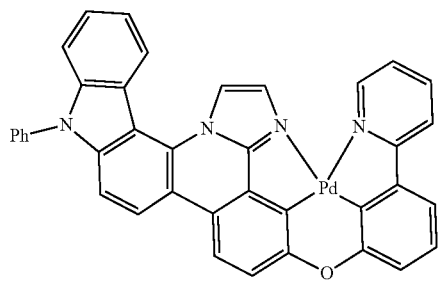
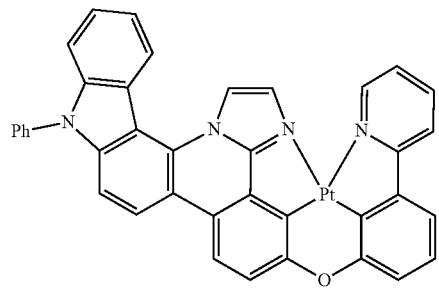
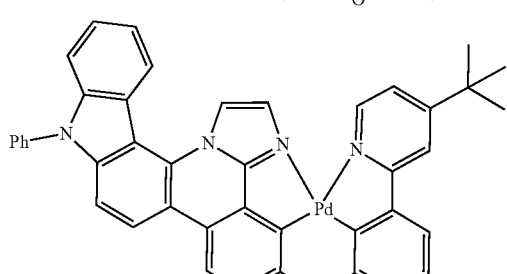
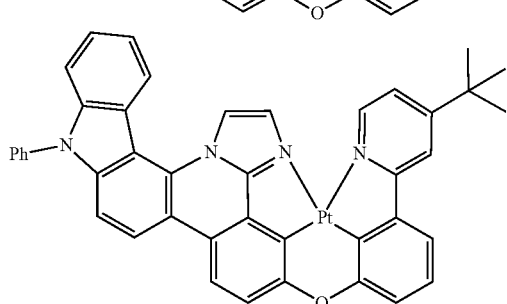
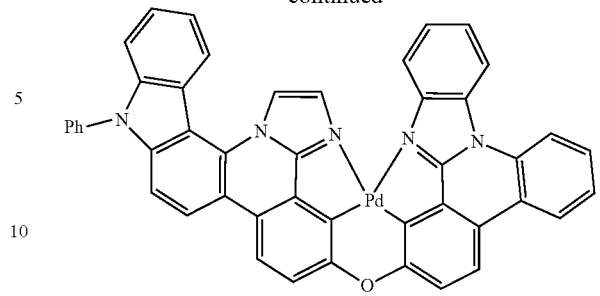
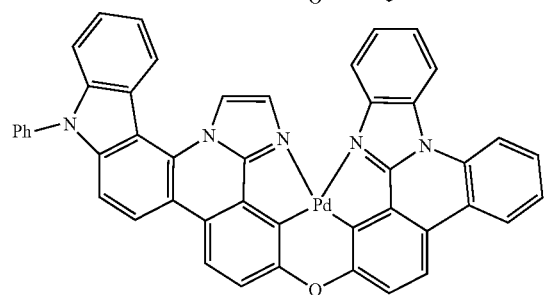
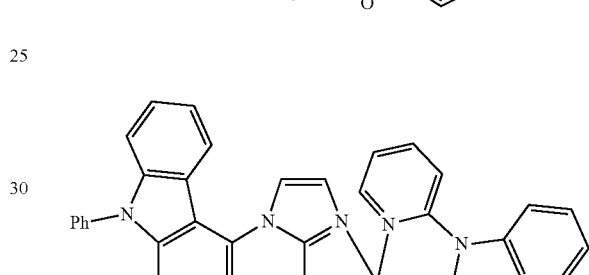
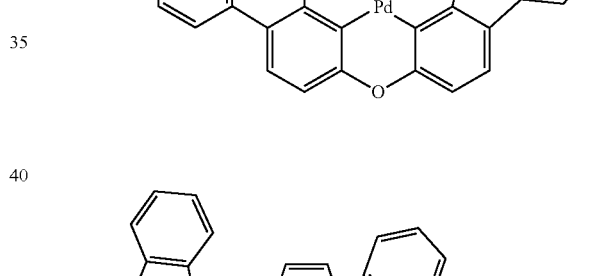
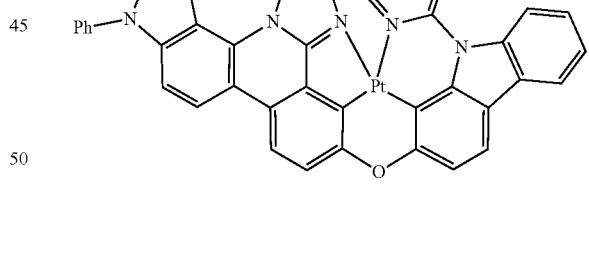
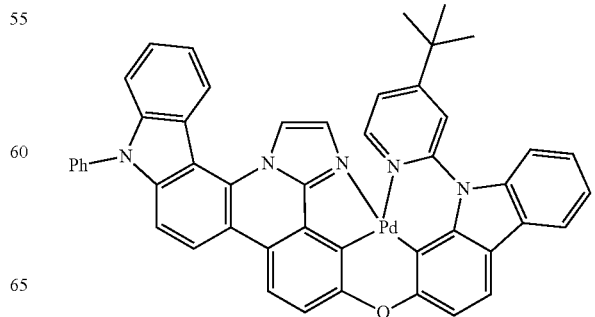

149
-continued
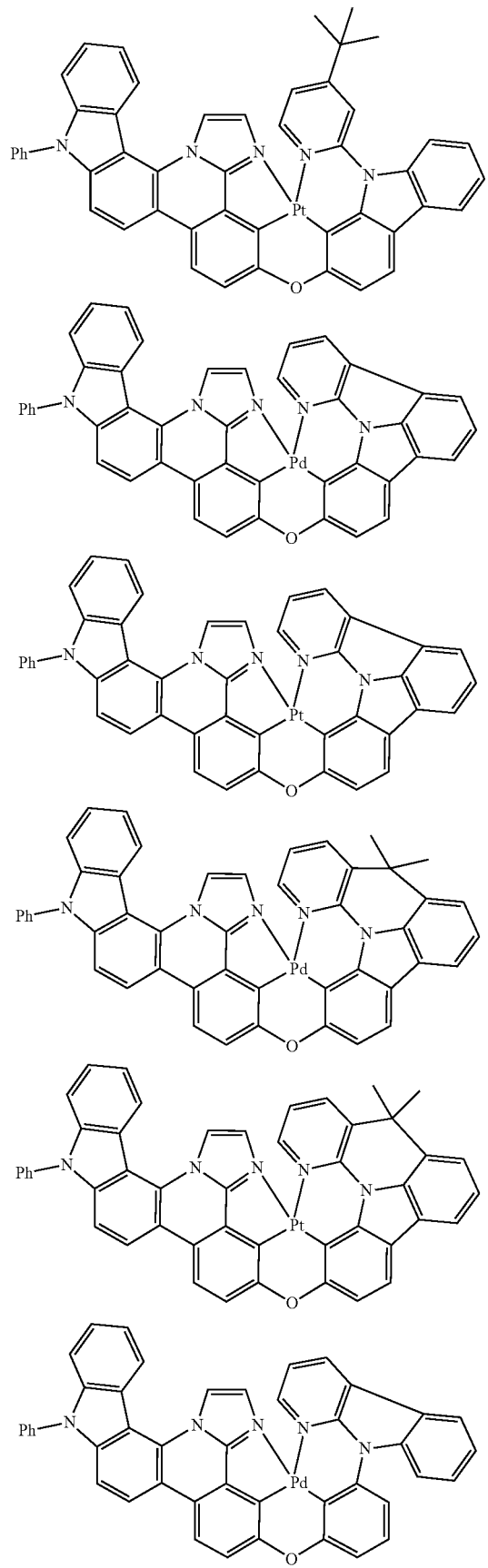
150
-continued
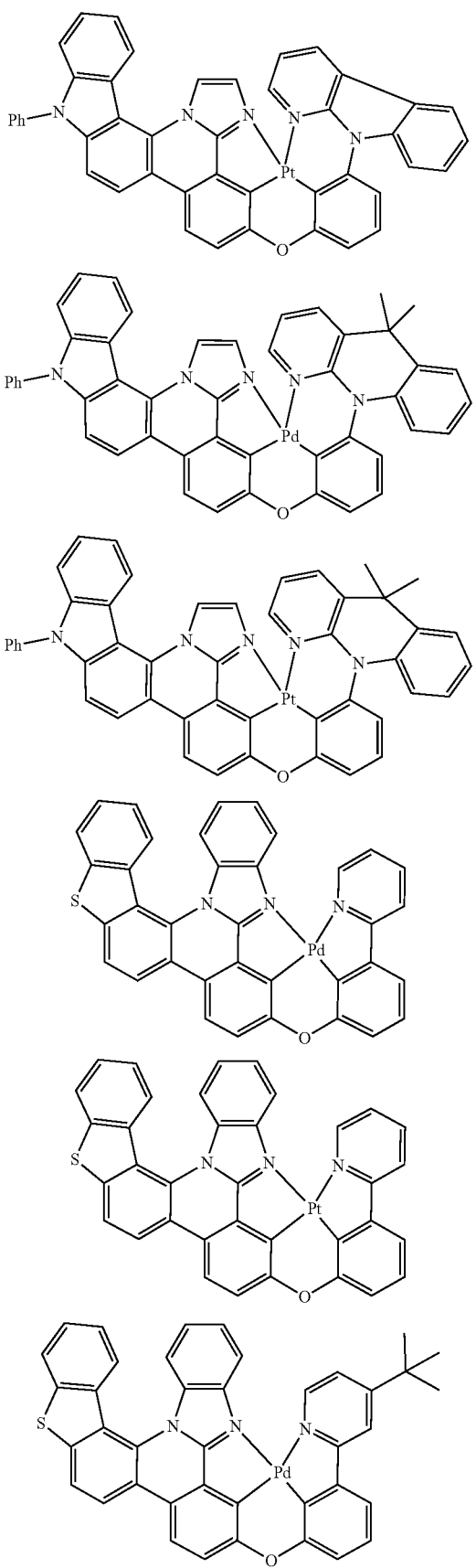

151
-continued
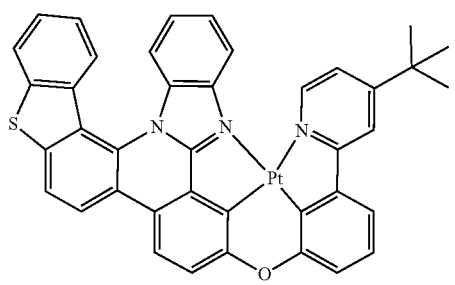
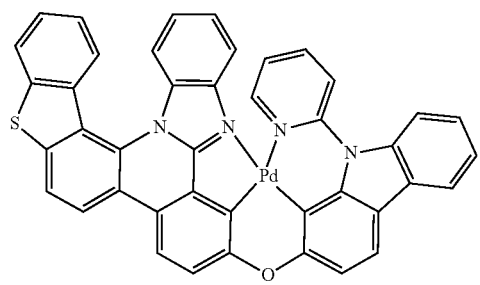
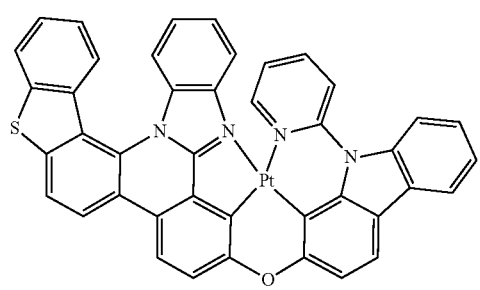
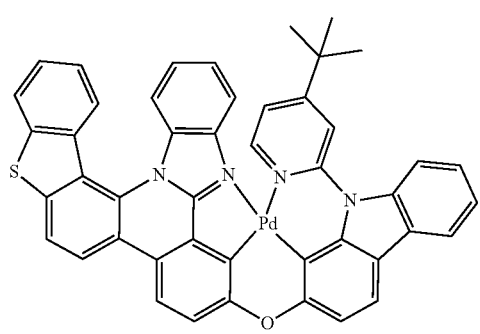
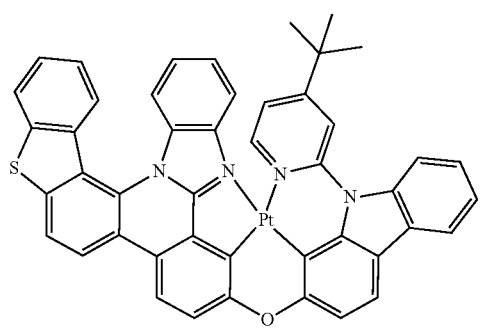
152
-continued
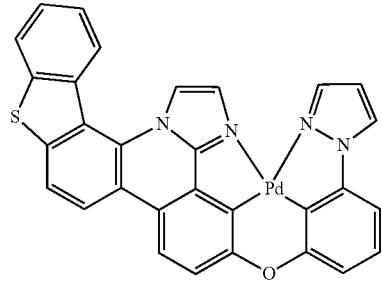
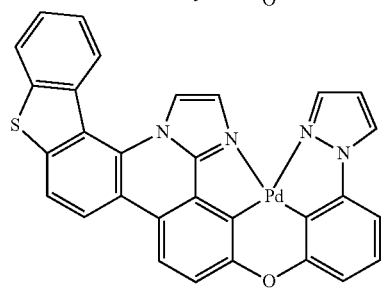
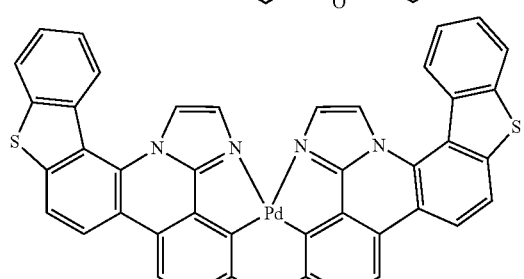
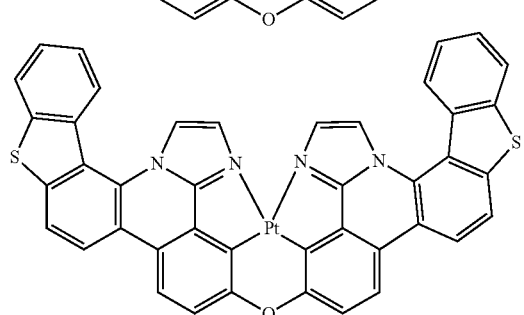
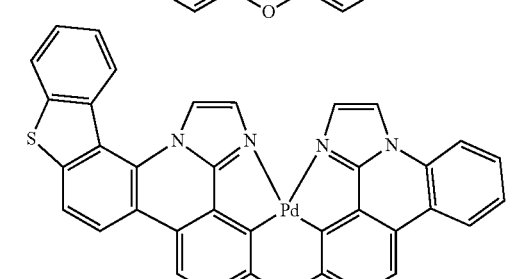
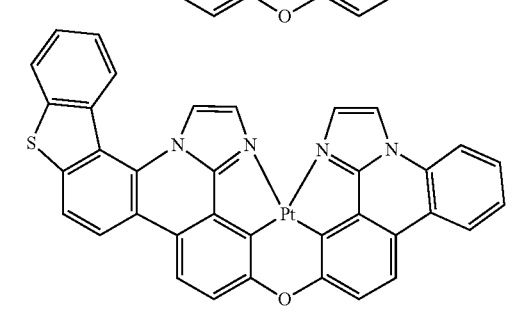

153
-continued
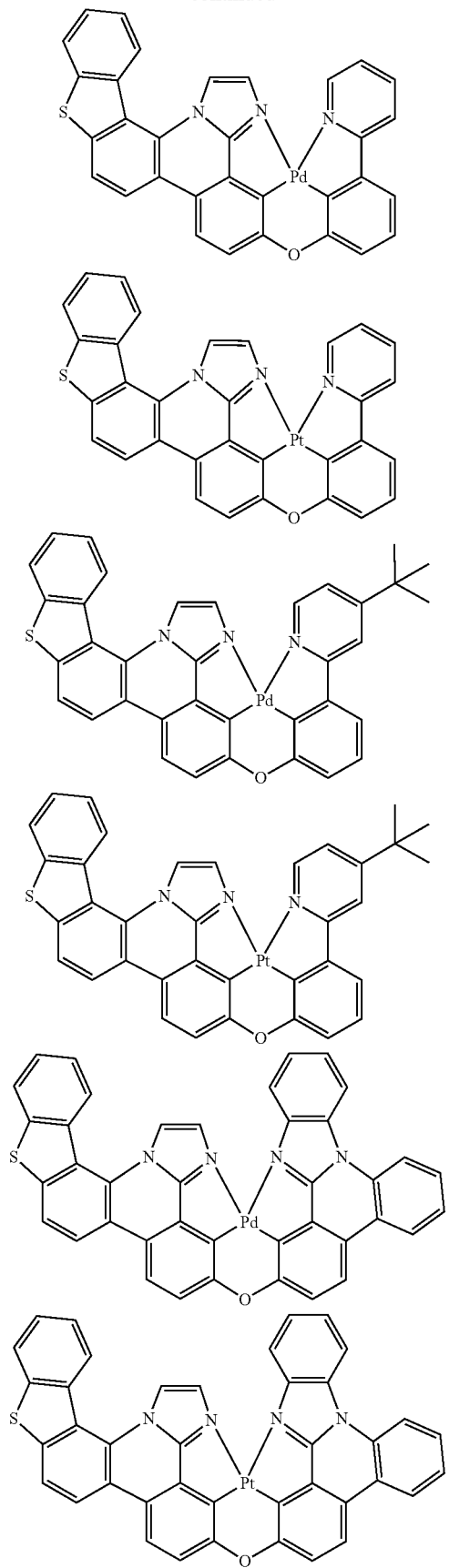
154
-continued
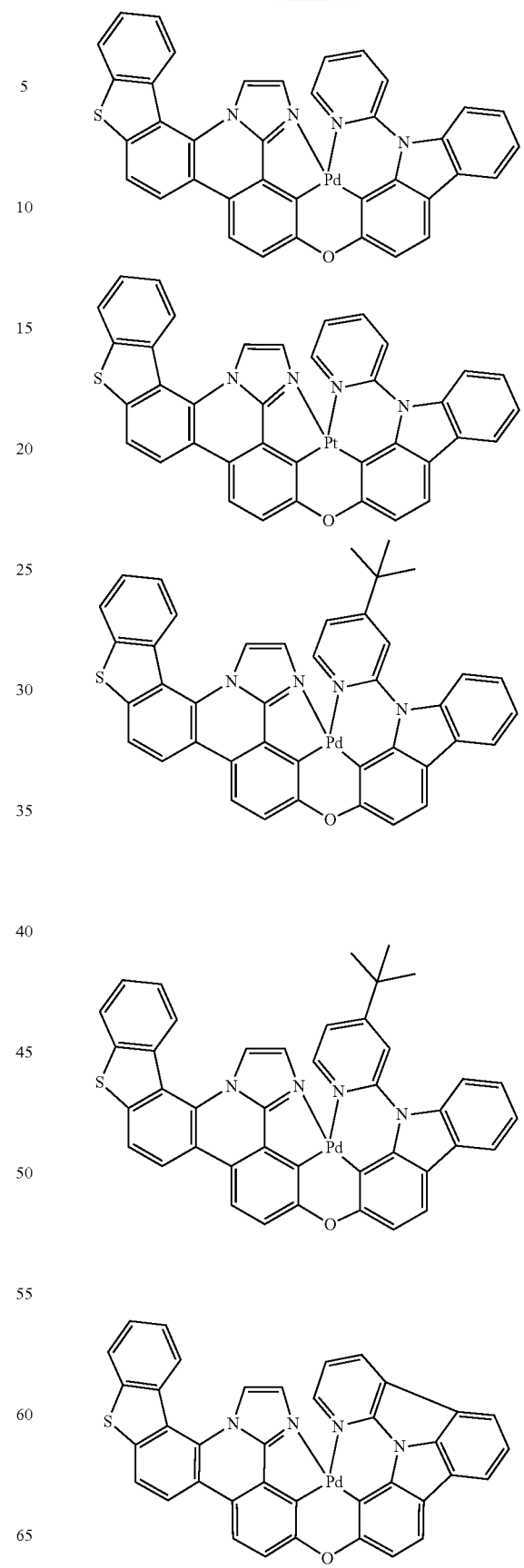

-continued

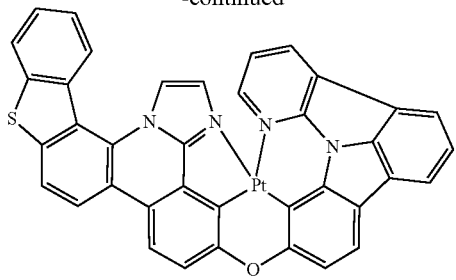

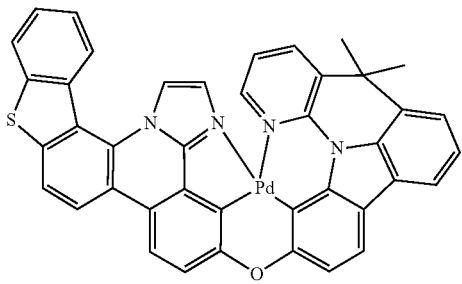

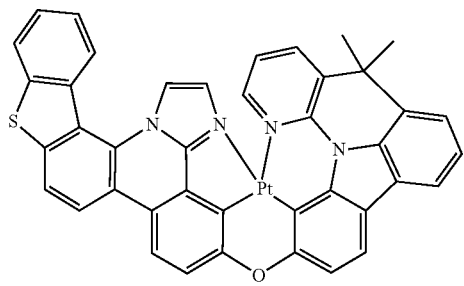

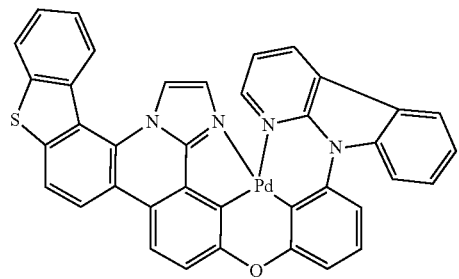

-continued

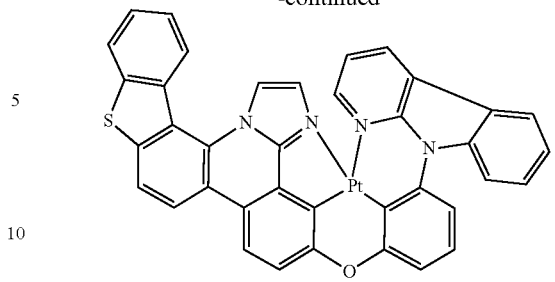

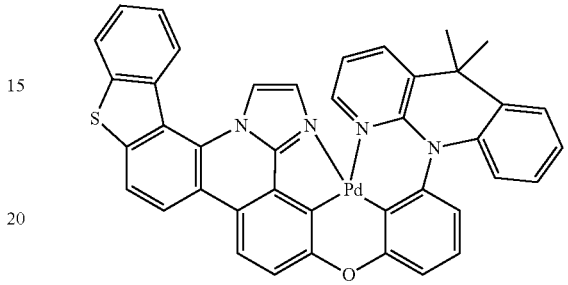

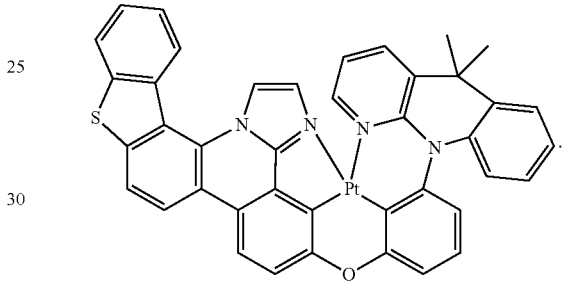

10. An organic light emitting diode comprising the compound of claim 3.

11. An organic light emitting diode comprising the compound of claim 1.

12. An organic light emitting diode comprising the compound of claim 4.

13. An organic light emitting diode comprising the compound of claim 5.

14. A light emitting device comprising the light emitting diode of claim 10.

15. A light emitting device comprising the light emitting diode of claim 11.

16. A light emitting device comprising the light emitting diode of claim 12.

17. A light emitting device comprising the light emitting diode of claim 13.

* * * * *